US009502489B2

(12) United States Patent
Funaya et al.

(10) Patent No.: US 9,502,489 B2
(45) Date of Patent: Nov. 22, 2016

(54) METHOD OF MANUFACTURING SEMICONDUCTOR DEVICE

(71) Applicant: Renesas Electronics Corporation, Kawasaki-shi, Kanagawa (JP)

(72) Inventors: Takuo Funaya, Kanagawa (JP); Takayuki Igarashi, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/594,063

(22) Filed: Jan. 9, 2015

(65) Prior Publication Data

US 2015/0206934 A1 Jul. 23, 2015

(30) Foreign Application Priority Data

Jan. 22, 2014 (JP) ................................ 2014-009403

(51) Int. Cl.
*H01L 21/44* (2006.01)
*H01L 49/02* (2006.01)
(Continued)

(52) U.S. Cl.
CPC ........... *H01L 28/10* (2013.01); *H01L 21/0217* (2013.01); *H01L 21/02164* (2013.01); *H01L 21/02274* (2013.01); *H01L 21/31111* (2013.01); *H01L 21/31144* (2013.01); *H01L 21/78* (2013.01); *H01L 22/32* (2013.01); *H01L 22/34* (2013.01); *H01L 23/5227* (2013.01); *H01L 24/06* (2013.01); *H01L 24/49* (2013.01); *H01L 22/14* (2013.01); *H01L 24/45* (2013.01); *H01L 2224/05554* (2013.01); *H01L 2224/32245* (2013.01); *H01L 2224/45124* (2013.01); *H01L 2224/45144* (2013.01); *H01L 2224/45147* (2013.01); *H01L 2224/48091* (2013.01); *H01L 2224/48137* (2013.01);
(Continued)

(58) Field of Classification Search
CPC ............................ H01L 28/00; H01L 23/5227
USPC ............................................ 438/3, 128, 612
See application file for complete search history.

(56) References Cited

U.S. PATENT DOCUMENTS 7,947,600 B2 5/2011 Iwaya et al.
2005/0142778 A1 6/2005 Park
(Continued)

FOREIGN PATENT DOCUMENTS

JP 2008-270465 A 11/2008
JP 2008-277564 A 11/2008

OTHER PUBLICATIONS

Extended European search report issued Sep. 1, 2015, in European Patent Application No. 15151971.7.

*Primary Examiner* — Julia Slutsker
(74) *Attorney, Agent, or Firm* — Shapiro, Gabor and Rosenberger, PLLC

(57) ABSTRACT

Provided is a semiconductor device having improved reliability. Over a semiconductor substrate, a first coil is formed via a first insulating film. A second insulating film is formed so as to cover the first insulating film and the first coil. Over the second insulating film, a pad is formed. Over the second insulating film, a multi-layer film having an opening exposing a part of the pad is formed. Over the multi-layer insulating film, a second coil is formed. The second coil is placed over the first coil. The second and first coils are magnetically coupled to each other. The multi-layer film includes a silicon dioxide film, a silicon nitride film over the silicon dioxide film, and a resin film over the silicon nitride film.

16 Claims, 87 Drawing Sheets

(51) Int. Cl.

| | |
|---|---|
| ***H01L 21/66*** | (2006.01) |
| ***H01L 21/02*** | (2006.01) |
| ***H01L 21/311*** | (2006.01) |
| ***H01L 21/78*** | (2006.01) |
| ***H01L 23/522*** | (2006.01) |
| ***H01L 23/00*** | (2006.01) |

(52) U.S. Cl.
CPC ................ *H01L 2224/48247* (2013.01); *H01L 2224/49113* (2013.01); *H01L 2224/73265* (2013.01); *H01L 2924/12041* (2013.01); *H01L 2924/181* (2013.01)

(56) References Cited

U.S. PATENT DOCUMENTS

| | | | |
|---|---|---|---|
| 2006/0263727 | A1 | 11/2006 | Lee et al. |
| 2007/0279176 | A1 | 12/2007 | Chen et al. |
| 2010/0295044 | A1 | 11/2010 | Homma et al. |
| 2012/0104541 | A1 | 5/2012 | Chiu |

METHOD OF MANUFACTURING SEMICONDUCTOR DEVICE

CROSS-REFERENCE TO RELATED APPLICATIONS

The disclosure of Japanese Patent Application No. 2014-009403 filed on Jan. 22, 2014 including the specification, drawings and abstract is incorporated herein by reference in its entirety.

BACKGROUND

The present invention relates to a method of manufacturing a semiconductor device and can be used appropriately for, e.g., a method of manufacturing a semiconductor device including a coil.

Examples of a technique for transmitting electric signals between two circuits to which electric signals at different potentials are input include a technique using a photocoupler. The photocoupler includes a light emitting element such as a light emitting diode, and a light receiving element such as a phototransistor. The photocoupler converts the electric signal input thereto to light using the light emitting element and converts the light again to the electric signal using the light receiving element to transmit the electric signal.

On the other hand, a technique has been developed which magnetically couples (inductively couples) two inductors to each other to transmit an electric signal.

Each of Japanese Unexamined Patent Publications Nos. 2008-270465 (Patent Document 1) and 2008-277564 (Patent Document 2) discloses a technique related to a microtransformer.

RELATED ART DOCUMENTS

Patent Documents

Patent Document 1

Japanese Unexamined Patent Publication No. 2008-270465

Patent Document 2

Japanese Unexamined Patent Publication No. 2008-277564

SUMMARY

Examples of a technique for transmitting electric signals between two circuits to which electric signals at different potentials are input include a technique using a photocoupler. However, since the photocoupler includes a light emitting element and a light receiving element, it is difficult to reduce the size thereof. In addition, when the frequencies of the electric signals are high, the photocoupler cannot follow the electric signals so that the use thereof is limited.

On the other hand, in a semiconductor device which transmits an electric signal using magnetically coupled inductors, the inductors can be formed using a microfabrication technique for the semiconductor device. This allows a reduction in the size of the device and the electric properties thereof are also excellent. Accordingly, it is desired to promote the development thereof.

As a result, for even such a semiconductor device including inductors, it is desired to have maximized reliability, or it is desired to improve the manufacturing yield of the semiconductor device. Alternatively, it is desired to improve the reliability of the semiconductor device and the manufacturing yield of the semiconductor device.

Other problems and novel features of the present invention will become apparent from a statement in the present specification and the accompanying drawings.

According to an embodiment, a semiconductor device includes a first coil and a first pad which are placed over a semiconductor substrate, a second coil placed over the first coil, and a multi-layer insulating film interposed between the first and second coils. The multi-layer insulating film includes a silicon dioxide film, a silicon nitride film over the silicon dioxide film, and a resin film over the silicon nitride film. The first pad is partly covered with the multi-layer insulating film.

According to another embodiment, a method of manufacturing a semiconductor device includes the steps of forming a first insulating film over a semiconductor substrate, forming a first coil over the first insulating film, forming a second insulating film over the first insulating film so as to cover the first coil therewith, and forming a first pad over the second insulating film. The method of manufacturing a semiconductor device further includes the steps of forming a multi-layer insulating film having a first opening exposing the first pad over the first insulating film, and forming a second coil and a first wire over the multi-layer insulating film. The second coil is placed over the first coil. The multi-layer insulating film includes a silicon dioxide film, a silicon nitride film over the silicon dioxide film, and a resin film over the silicon nitride film.

According to still another embodiment, a method of manufacturing a semiconductor device includes the steps of forming a first insulating film over a semiconductor substrate, forming a first coil over the first insulating film, forming a second insulating film over the first insulating film so as to cover the first coil therewith, and forming a first pad over the second insulating film. The method of manufacturing a semiconductor device further includes the steps of forming a third insulating film having a first opening exposing the first pad over the first insulating film, and forming a second coil and a first wire over the third insulating film. The second coil is placed over the first coil. The first and second coils are not coupled to each other via a conductor, but are magnetically coupled to each other. The first wire is formed to extend from over the first pad to over the third insulating film, while being electrically coupled to the first pad. In the step of forming the second coil and the first wire, a seed film is formed, then a resist layer is formed over the seed film, the resist layer is subjected to first exposure treatment and second exposure treatment and then to development treatment to form a resist pattern. Thereafter, over the seed film exposed from the resist pattern, a conductive film for the second coil and the first wire is formed by an electrolytic plating method. In the first exposure treatment, a pattern of the first wire is transferred by exposure. In the second exposure treatment, a pattern of the second coil is transferred by exposure. A dose in the first exposure treatment is higher than the dose in the second exposure treatment.

According to the embodiment, the reliability of the semiconductor device can be improved. Alternatively, the manufacturing yield of the semiconductor device can be improved. Otherwise, the reliability of the semiconductor device and the manufacturing yield of the semiconductor device can be improved.

DETAILED DESCRIPTION

Figure 1:
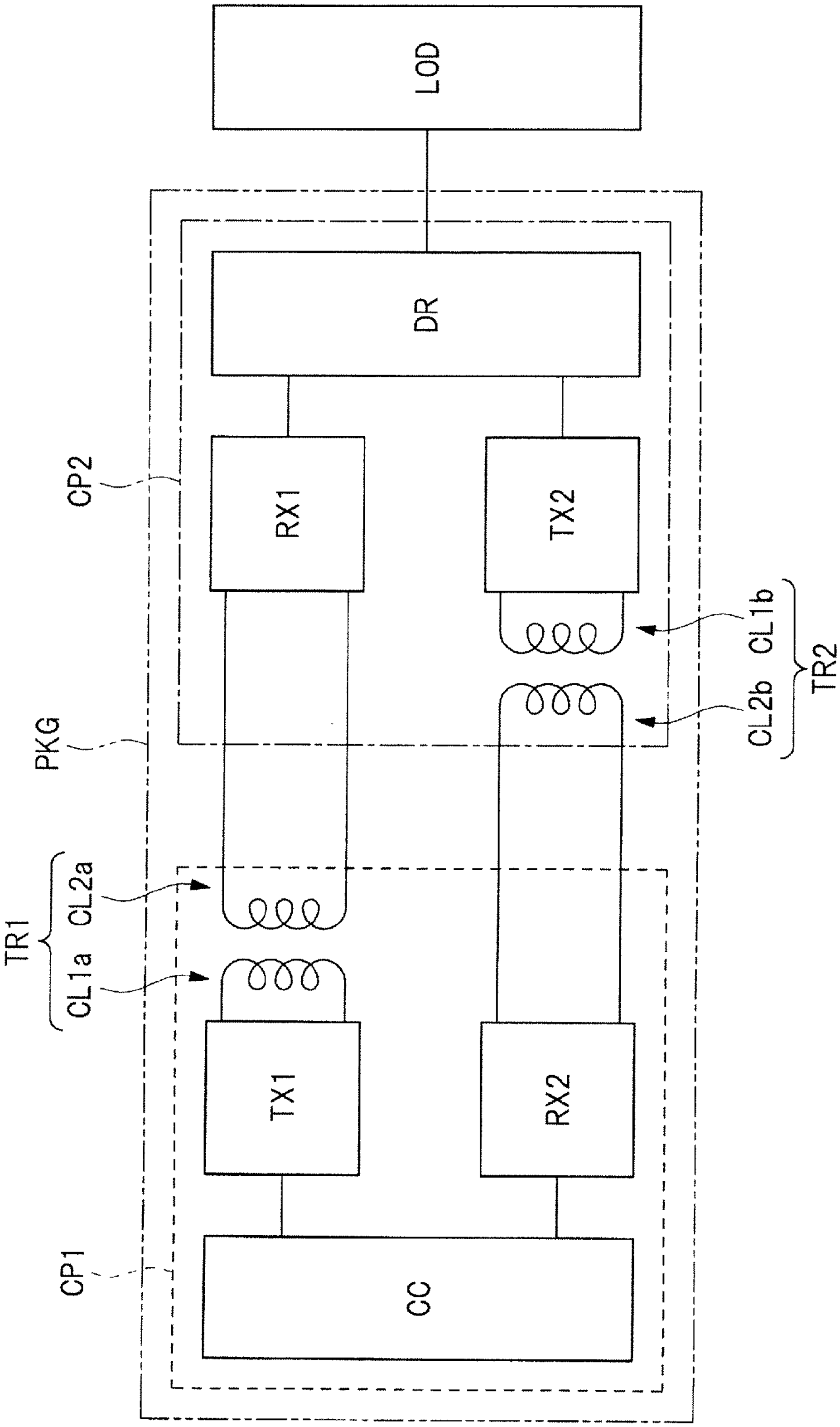
FIG. 1 is a circuit diagram showing an example of an electronic device using semiconductor devices in an embodiment.

In the following embodiments, if necessary for the sake of convenience, each of the embodiments will be described by being divided into a plurality of sections or embodiments. However, they are by no means irrelevant to each other unless particularly explicitly described otherwise, but are related to each other such that one of the sections or embodiments is modifications, details, supplementary explanation, and so forth of part or the whole of the others. Also, in the following embodiments, when the number and the like (including the number, numerical value, amount, range, and the like) of elements are mentioned, they are not limited to the specified numbers unless particularly explicitly described otherwise or unless they are obviously limited to specific numbers in principle. The number and the like of the elements may be not less than or not more than the specified numbers. Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are mentioned in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing numerical value and range.

Hereinbelow, the embodiments will be described in detail on the basis of the drawings. Note that, throughout all the drawings for illustrating the embodiments, members having the same functions are designated by the same reference numerals, and the repeated description thereof is omitted. Also, in the following embodiments, a description of the same or like parts will not be repeated in principle unless particularly necessary.

In the drawings used in the embodiments, hatching may be omitted even in a cross-sectional view for improved clarity of illustration, while even a plan view may be hatched for improved clarity of illustration.

Embodiment 1

About Circuit Configuration

FIG. 1 is a circuit diagram showing an example of an electronic device (semiconductor device) using semiconductor devices (semiconductor chips) in an embodiment. Note that, in FIG. 1 the portion enclosed in the dotted line is formed in a semiconductor chip CP1, the portion enclosed in the dot-dash line is formed in a semiconductor chip CP2, and the portion enclosed in the two-dot-dash line is formed in a semiconductor package PKG.

The electronic device shown in FIG. 1 includes the semiconductor package PKG in which the semiconductor chips CP1 and CP2 are embedded. In the semiconductor chip CP1, a transmission circuit TX1, a reception circuit RX2, and a control circuit CC are formed. In the semiconductor chip CP2, a reception circuit RX1, a transmission circuit TX2, and a drive circuit DR are formed.

The transmission circuit TX1 and the reception circuit RX1 are circuits for transmitting a control signal from the control circuit CC to the drive circuit DR. The transmission circuit TX2 and the reception circuit RX2 are circuits for transmitting a signal from the drive circuit DR to the control circuit CC. The control circuit CC controls or drives the drive circuit DR. The drive circuit DR drives a load LOD. The semiconductor chips CP1 and CP2 are embedded in the semiconductor package PKG. The load LOD is provided outside the semiconductor package PKG.

Between the transmission circuit TX1 and the reception circuit RX1, a transformer (transforming element, converter, magnetic coupling element, or an electromagnetic coupling element) TR1 including electromagnetically coupled (inductively coupled) coils (inductors) CL1*a* and CL2*a* is interposed. From the transmission circuit TX1 to the reception circuit RX1, a signal can be transmitted via the transformer TR1 (i.e., via the magnetically coupled coils CL1*a* and CL2*a*). Consequently, the reception circuit RX1 in the semiconductor chip CP2 can receive the signal transmitted from the transmission circuit TX1 in the semiconductor chip CP1. This allows the control circuit CC to transmit a signal (control signal) to the drive circuit DR via the transmission circuit TX1, the transformer TR1, and the reception circuit RX1. The transformer TR1 (coils CL1*a* and CL2*a*) are formed in the semiconductor chip CP1. Each of the coils CL1*a* and CL2*a* can also be regarded as an inductor. On the other hand, the transformer TR1 can also be regarded as a magnetic coupling element.

Between the transmission circuit TX2 and the reception circuit RX2, a transformer (transforming element, converter, magnetic coupling element, or an electromagnetic coupling element) TR2 including electromagnetically coupled (inductively coupled) coils (inductors) CL1*b* and CL2*b* is interposed. From the transmission circuit TX2 to the reception circuit RX2, a signal can be transmitted via the transformer TR2 (i.e., via the magnetically coupled via coils CL1*b* and CL2*b*). Consequently, the reception circuit RX2 in the semiconductor chip CP1 can receive the signal transmitted from the transmission circuit TX2 in the semiconductor chip CP2. This allows the drive circuit DR to transmit a signal to the control circuit CC via the transmission circuit TX2, the transformer TR2, and the reception circuit RX2. The transformer TR2 (coils CL1*b* and CL2*b*) are formed in the semiconductor chip CP2. Each of the coils CL1*b* and CL2*b* can also be regarded as an inductor. On the other hand, the transformer TR2 can also be regarded as a magnetic coupling element.

The transformer TR1 is formed of the coils CL1*a* and CL2*a* formed in the semiconductor chip CP1. The coils CL1*a* and CL2*a* are not connected via a conductor, but are magnetically coupled to each other. As a result, when a current flows in the coil CL1*a*, an induced electromotive force is generated in the coil CL2*a* in response to a change in the current to allow an induced current to flow. The coil CL1*a* is a primary coil, and the coil CL2*a* is a secondary coil. Using the mechanism, a signal is transmitted from the transmission circuit TX1 to the coil CL1*a* (primary coil) of the transformer TR1 to allow a current to flow, and an induced current (or induced electromotive force) accordingly generated in the coil CL2*a* (secondary coil) of the transformer TR1 is sensed (received) by the reception circuit RX1. This allows the signal corresponding to the signal transmitted from the transmission circuit TX1 to be received by the reception circuit RX1.

The transformer TR2 is formed of the coils CL1*b* and CL2*b* formed in the semiconductor chip CP2. The coils CL1*b* and CL2*b* are not connected via a conductor, but are magnetically coupled to each other. As a result, when a current flows in the coil CL1*b*, an induced electromotive force is generated in the coil CL2*b* in response to a change in the current to allow an induced current to flow. The coil CL1*b* is a primary coil, and the coil CL2*b* is a secondary coil. Using the mechanism, a signal is transmitted from the transmission circuit TX2 to the coil CL1*b* (primary coil) of the transformer TR2 to allow a current to flow, and an induced current (or induced electromotive force) accordingly generated in the coil CL2*b* (secondary coil) of the transformer TR2 is sensed (received) by the reception circuit RX2. This allows the signal corresponding to the signal transmitted from the transmission circuit TX2 to be received by the reception circuit RX2.

Using a path extending from the control circuit CC to the drive circuit DR via the transmission circuit TX1, the transformer TR1, and the reception circuit RX1 and a path extending from the drive circuit DR to the control circuit CC via the transmission circuit TX2, the transformer TR2, and the reception circuit RX2, signal transmission/reception is performed between the semiconductor chips CP1 and CP2. That is, the signal transmitted from the transmission circuit TX1 is received by the reception circuit RX1 and the signal transmitted from the transmission circuit TX2 is received by the reception circuit RX2. This allows signal transmission/ reception to be performed between the semiconductor chips CP1 and CP2. As described above, the signal transmission from the transmission circuit TX1 to the reception circuit RX1 is performed via the transformer TR1 (i.e., magnetically coupled coils CL1*a* and CL2*a*). Also, the signal transmission from the transmission circuit TX2 to the reception circuit RX2 is performed via the transformer TR2 (i.e., magnetically coupled coils CL1*b* and CL2*b*). The drive circuit DR can drive the load LOD in response to the signal transmitted from the semiconductor chip CP1 to the semiconductor chip CP2 (i.e., signal transmitted from the transmission signal TX1 to the reception circuit RX1 via the transformer TR1). As the load LOD, there are various loads depending on the use purpose thereof. For instance, a motor or the like can be shown as an example thereof.

The semiconductor chips CP1 and CP2 have different voltage levels (reference potentials). For example, the semiconductor chip CP1 is coupled to a low-voltage region having a circuit operated or driven with a low voltage (e.g., several volts to several tens of volts) via bonding wires BW, leads LD, or the like described later. On the other hand, the semiconductor chip CP2 is coupled to a high-voltage region having a circuit operated or driven with a high voltage (e.g., not less than 100 V) via the bonding wires BW, the leads LD, or the like described later. However, since the signal transmission between the semiconductor chips CP1 and CP2 is performed via the transformers TR1 and TR2, signal transmission between circuits of different voltages is possible.

In each of the transformers TR1 and TR2, between the primary and secondary coils, a large potential difference may be produced. Conversely, since a large potential difference may be produced, the primary and secondary coils which are not connected via a conductor, but are magnetically coupled to each other are used for signal transmission. Accordingly, in forming the transformer TR1 in the semiconductor chip CP1, it is important to maximize the dielectric breakdown voltage between the coils CL1*a* and CL2*a* in terms of improving the reliability of the semiconductor chip CP1, the semiconductor package PKG in which the semiconductor chip CP1 is embedded, or an electronic device using the semiconductor package PKG. Also, in forming the transformer TR2 in the semiconductor chip CP2, it is important to maximize the dielectric breakdown voltage between the coils CL1*b* and CL2*b* in terms of improving the reliability of the semiconductor chip CP2, the semiconductor package PKG in which the semiconductor chip CP2 is embedded, or the electronic device using the semiconductor package PKG. In view of this, in the present embodiment, the configuration of an insulating film (multi-layer film LF described later) interposed between the primary and secondary coils in each of the semiconductor chips (CP1 and CP2) has been inventively improved, which will be described later in detail.

Note that, in the case shown in FIG. 1, the control circuit CC is embedded in the semiconductor chip CP1. However, in another embodiment, it is also possible to embed the control circuit CC in a semiconductor chip other than the semiconductor chips CP1 and CP2. Also, in the case shown in FIG. 1, the drive circuit DR is embedded in the semiconductor chip CP2. However, in another embodiment, it is also possible to embed the drive circuit DR in a semiconductor chip other than the semiconductor chips CP1 and CP2.

<About Example of Signal Transmission>

Figure 2:
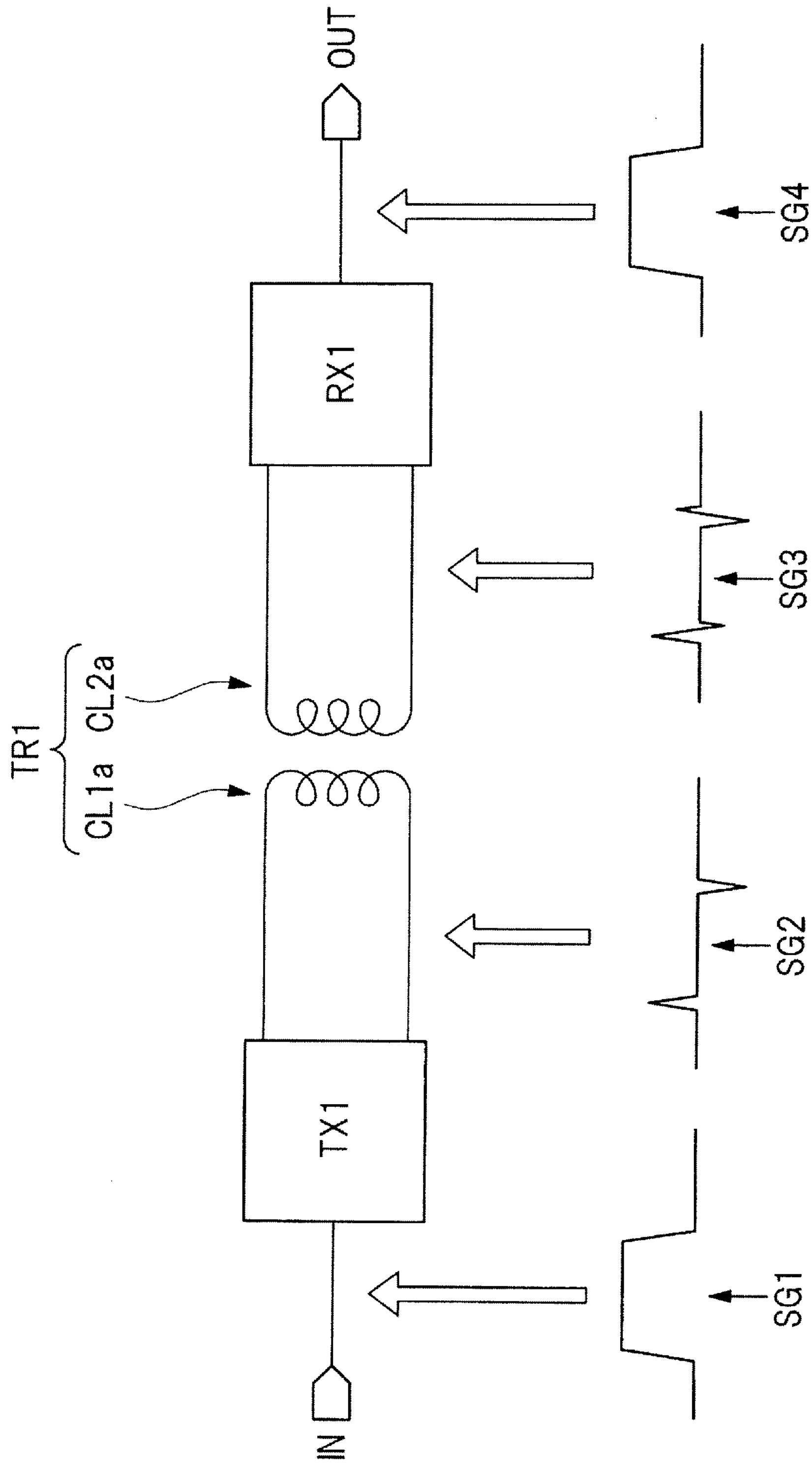
FIG. 2 is an illustrative view showing an example of the transmission of signals.

FIG. 2 is an illustrative view showing an example of signal transmission.

The transmission circuit TX1 modulates a square-wave signal SG1 input to the transmission circuit TX1 to a differential-wave signal SG2 and transmits the signal SG2 to the coil CL1*a* (primary coil) of the transformer TR1. When a current resulting from the differential-wave signal SG2 flows in the coil CL1*a* (primary coil) of the transformer TR1, a signal SG3 corresponding thereto flows in the coil CL2*a* (secondary coil) of the transformer TR1 due to an induced electromotive force. The signal SG3 is amplified in the reception circuit RX1 and further modulated to a square wave so that a square-wave signal SG4 is output from the reception circuit RX1. Thus, it is possible to output the signal SG4 corresponding to the signal SG1 input to the transmission circuit TX1 from the reception circuit RX1. In this manner, the signal is transmitted from the transmission circuit TX1 to the reception circuit RX1. Signal transmission from the transmission circuit TX2 to the reception circuit RX2 can similarly be performed.

FIG. 2 shows an example of signal transmission from a transmission circuit to a reception circuit. However, signal transmission is not limited thereto and can variously be modified as long as a method which transmits a signal via the magnetically coupled coils (primary and secondary coils) is used.

<About Structure of Semiconductor Chip>

Figure 3:
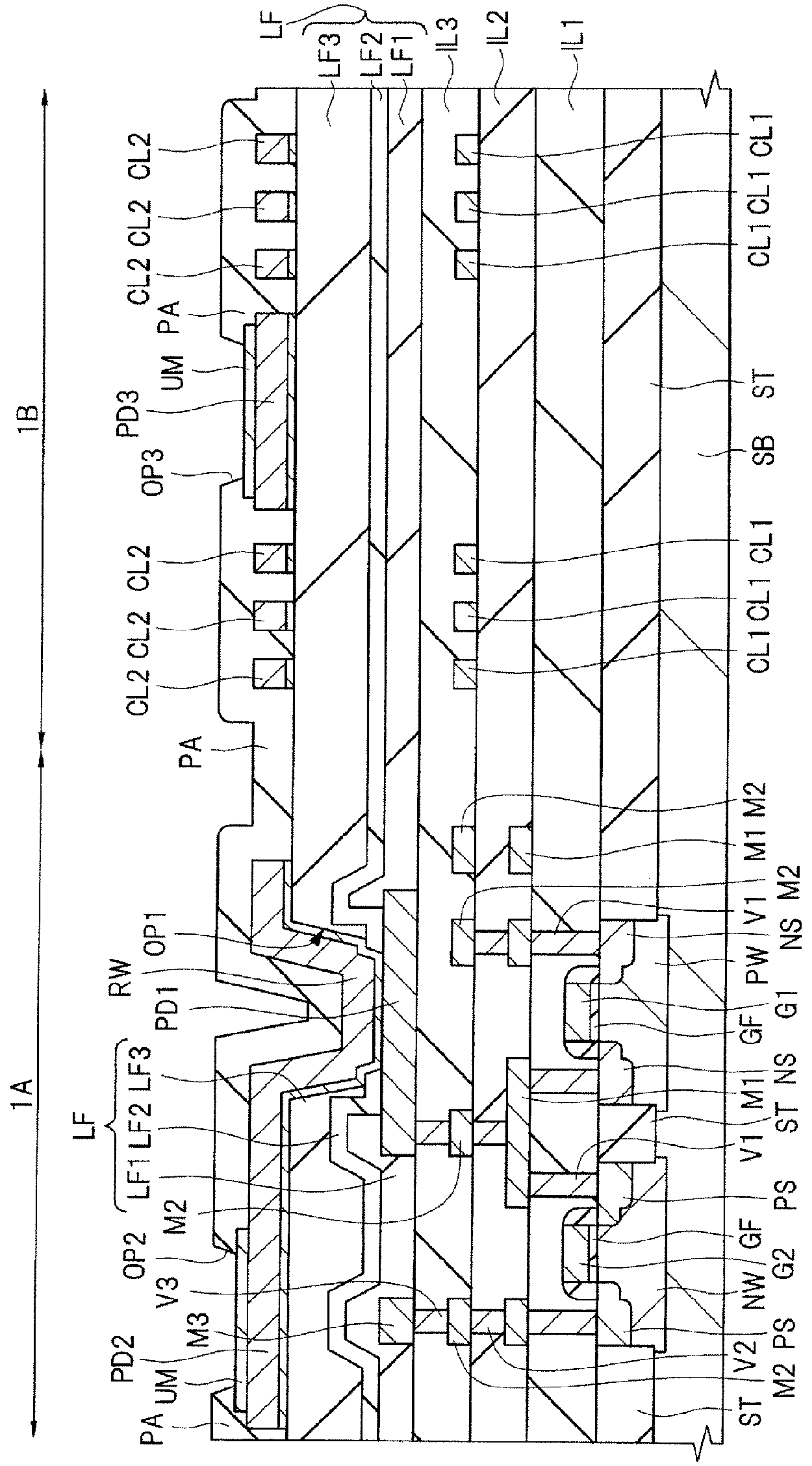
FIG. 3 is a main-portion cross-sectional view of a semiconductor device in the embodiment.
Figure 4:
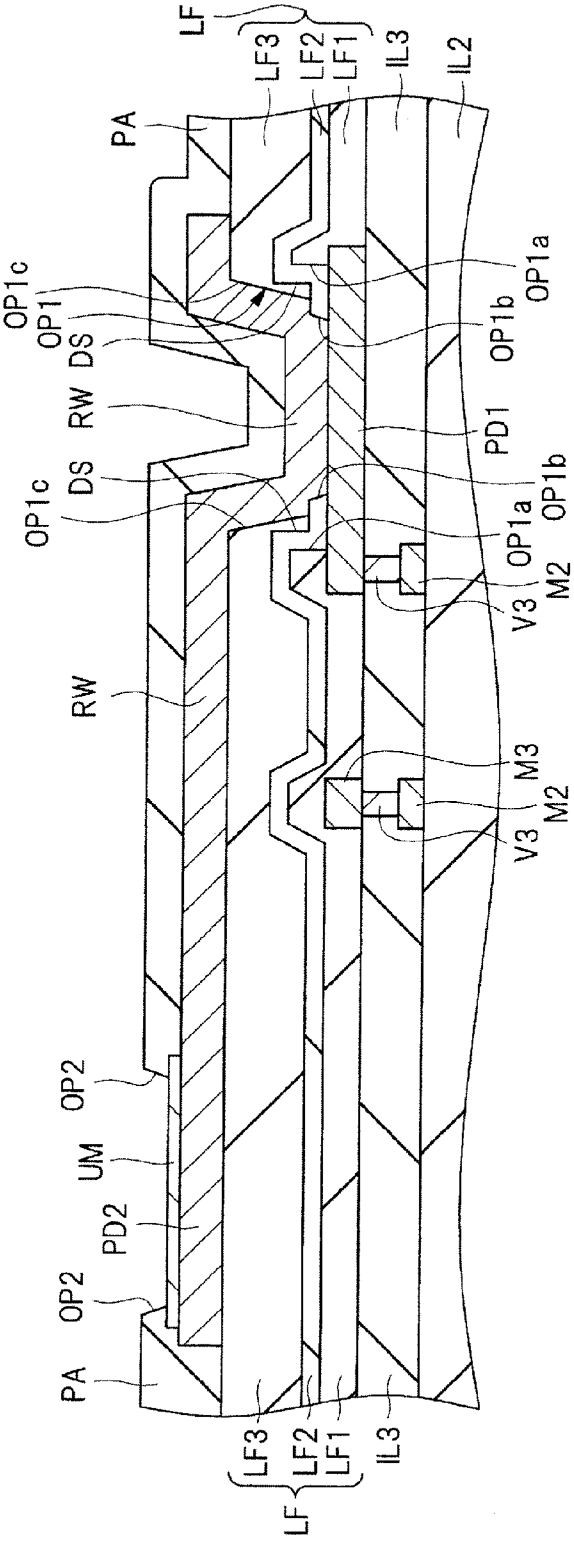
FIG. 4 is a main-portion cross-sectional view of the semiconductor device in the embodiment.
Figure 5:
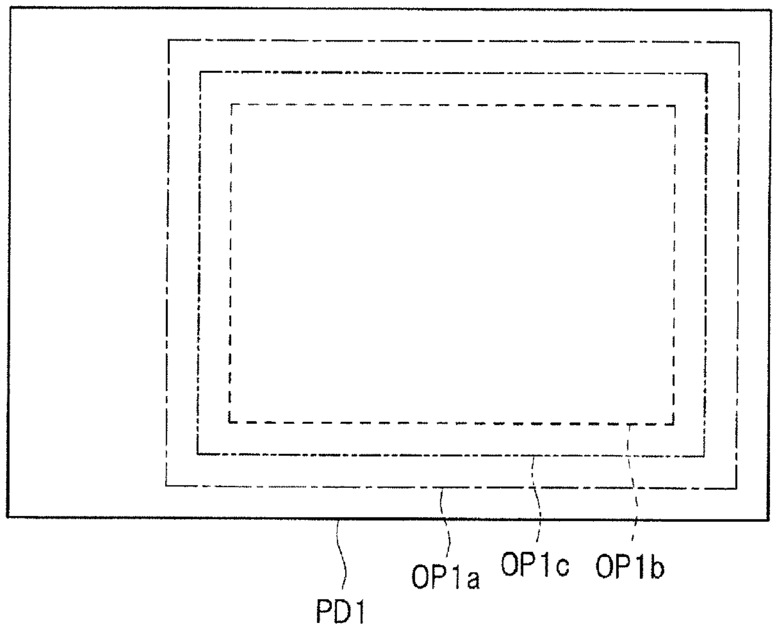
FIG. 5 is a plan view of a pad.
Figure 6:
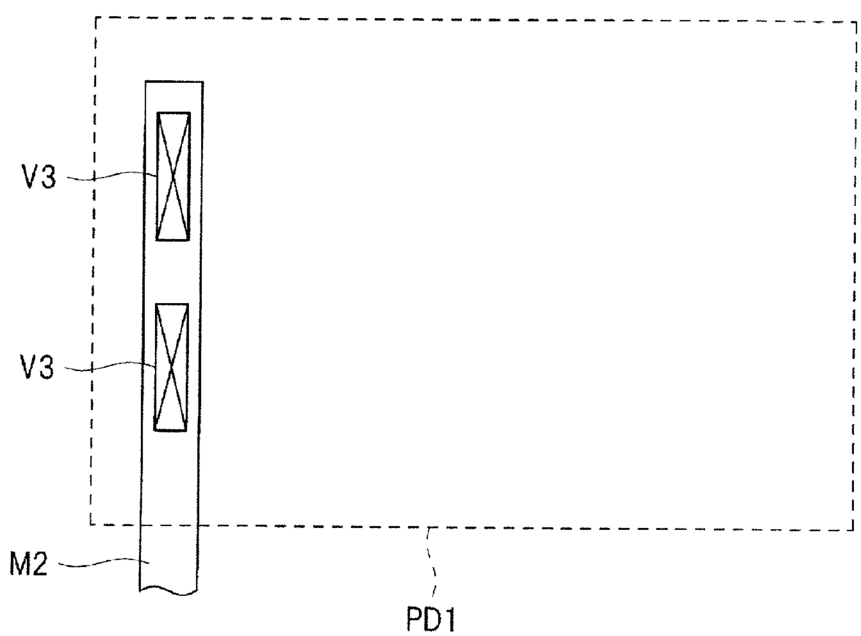
FIG. 6 is a plan view showing a layer under the pad.
Figure 7:
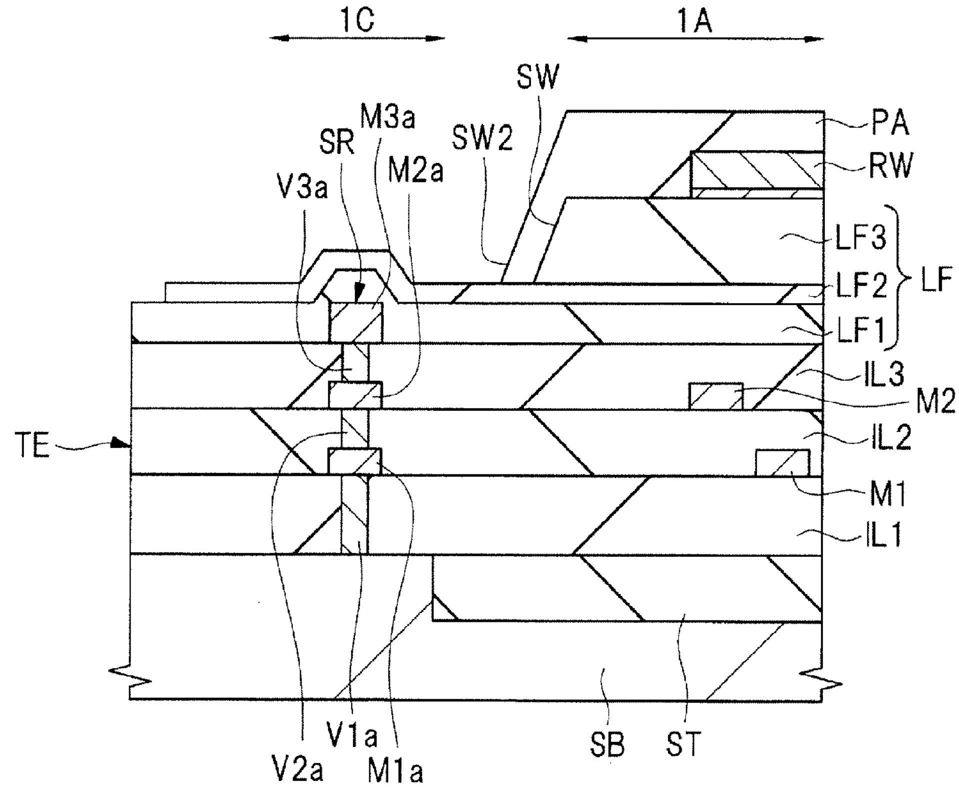
FIG. 7 is a main-portion cross-sectional view of the semiconductor device in the embodiment.
Figure 8:
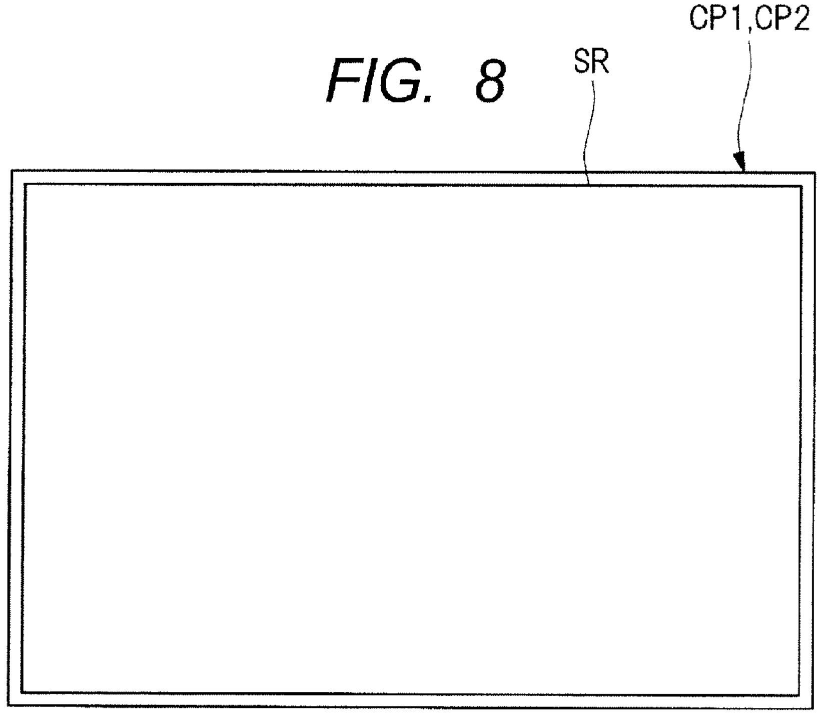
FIG. 8 is an overall plan view of the semiconductor device in the embodiment.

FIG. 3 is a main-portion cross-sectional view showing a cross-sectional structure of the semiconductor device in the present embodiment. The semiconductor device shown in FIG. 3 is a semiconductor device (semiconductor chip) corresponding to the foregoing semiconductor chip CP1 or the foregoing semiconductor chip CP2. FIG. 4 is a main-portion cross-sectional view of the semiconductor device in the present embodiment and shows a cross-sectional view showing a structure of layers located over an interlayer insulating film IL2 in a peripheral circuit formation region 1A. FIG. 5 is a plan view of a pad PD1 in which, for easier understanding, the position of an opening OP1*a* of a silicon dioxide film LF1 is shown by the dot-dash line, the position of an opening OP1*b* of a silicon nitride film LF2 is shown by the dotted line, and the position of an opening OP1*c* of a resin film LF3 is shown by a two-dot-dash line. FIG. 6 is a plan view showing a layer under the pad PD1 in which, for easier understanding, the outer peripheral position of the pad PD1 is shown by the dotted line. FIG. 7 is a main-portion cross-sectional view of the semiconductor device in the present embodiment and shows a cross-sectional view of the vicinity of the outer peripheral portion of the semiconductor device. FIG. 8 is an overall plan view of the semiconductor device in the present embodiment and shows the position where a seal ring SR is formed in a see-through state.

The semiconductor device in the present embodiment is a semiconductor device (semiconductor chip) formed using a semiconductor substrate SB made of monocrystalline silicon or the like and has a peripheral circuit region 1A, a transformer formation region 1B, and a seal ring formation region 1C. Note that the peripheral circuit formation region 1A, the transformer formation region 1B, and the seal ring formation region 1C correspond to mutually different two-dimensional regions in the main surface of the same semiconductor substrate SB.

As shown in FIG. 3, the semiconductor substrate SB made of monocrystalline silicon or the like and forming the semiconductor device (semiconductor chip) in the present embodiment is formed with semiconductor elements such as MISFETs (Metal Insulator Semiconductor Field Effect Transistors) or the like. The semiconductor elements are formed in the peripheral circuit formation region 1A.

For example, in the semiconductor substrate SB in the peripheral circuit formation region 1A, a p-type well PW and an n-type well NW are formed. Over the p-type well PW, a gate electrode G1 for an n-channel MISFET is formed via a gate insulating film GF. Over the n-type well NW, a gate electrode G2 for a p-channel MISFET is formed via the gate insulating film GF. Each of the gate insulating films GF is formed of, e.g., a silicon dioxide film or the like. Each of the gate electrodes G1 and G2 is formed of, e.g., a polycrystalline silicon film (doped polysilicon film) into which an impurity has been introduced.

In the p-type well PW of the semiconductor substrate SB, n-type semiconductor regions NS for the source/drain of the n-channel MISFET are formed. In the n-type well NW of the semiconductor substrate SB, p-type semiconductor regions PS for the source/drain of the p-channel MISFET are formed. The gate electrode G1, the gate insulating film GF under the gate electrode G1, and the n-type semiconductor regions NS (source/drain regions) on both sides of the gate electrode G1 form the n-channel MISFET. On the other hand, the gate electrode G2, the gate insulating film GF under the gate electrode G2, and the p-type semiconductor regions PS (source/drain regions) on both sides of the gate electrode G2 form the p-channel MISFET. Each of the n-type semiconductor regions NS can also have an LDD (lightly doped Drain) structure. In this case, over the side walls of the gate electrode G1, side-wall insulating films referred to also as sidewall spacers are formed. Likewise, each of the p-type semiconductor regions PS can also have an LDD (lightly doped Drain) structure. In this case, over the side walls of the gate electrode G2, side-wall insulating films referred to also as sidewall spacers are formed.

In the description given herein, the MISFETs are used as an example of the semiconductor elements formed in the peripheral circuit formation region 1A. Besides, a capacitor element, a resistor element, a memory element, a transistor having another configuration, and the like may also be formed in the peripheral circuit region 1A. In the case of the foregoing semiconductor chip CP1, the semiconductor elements formed in the peripheral circuit formation region 1A form the foregoing control circuit CC, the transmission circuit TX1, and the reception circuit RX2. In the case of the foregoing semiconductor chip CP2, the semiconductor elements formed in the peripheral circuit formation region 1A form the foregoing drive circuit DR, the reception circuit RX1, and the transmission circuit TX2.

In the description given herein, the monocrystalline silicon substrate is used as an example of the semiconductor substrate SB. However, in another embodiment, as the semiconductor substrate SB, a SOI (Silicon On insulator) substrate or the like can also be used.

Over the semiconductor substrate SB, a multi-layer wiring structure is formed of a plurality of interlayer insulating films and a plurality of wiring layers.

That is, over the semiconductor substrate SB, a plurality of interlayer insulating films IL1, IL2, and IL3 are formed, and the plurality of insulating films IL1, IL2, and IL3 are formed with plugs V1, via portions V2 and V3, and wires M1, M2, and M3.

Specifically, over the semiconductor substrate SB, the interlayer insulating film IL1 is formed as an insulating film over the semiconductor substrate SB so as to cover the foregoing MISFETs and, over the interlayer insulating film IL1, the wires M1 are formed. The wires M1 are in a first wiring layer (lowermost wiring layer). Over the interlayer insulating film IL1, the interlayer insulating film IL2 is formed as an insulating film so as to cover the wires M1. Over the interlayer insulating film IL2, the wires M2 are formed. The wires M2 are in a second wiring layer located immediately over the first wiring layer. Over the interlayer insulating film IL2, the interlayer insulating film IL3 is formed as an insulating film so as to cover the wires M2. Over the interlayer insulating film IL3, the wires M3 are formed. The wires M3 are in a third interconnect layer located immediately over the second wiring layer.

The plugs V1 are each made of a conductor and formed in a layer under the wires M1, i.e., formed in the interlayer insulating film IL1 so as to extend through the interlayer insulating film IL1. The plugs V1 have the upper surfaces thereof in contact with the lower surfaces of the wires M1 to be electrically coupled to the wires M1. The plugs V1 have the bottom portions thereof coupled to the various semiconductor regions (such as, e.g., the n-type semiconductor region NS and the p-type semiconductor region PS) formed in the semiconductor substrate SB, the gate electrodes G1 and G2, and the like. Thus, the wires M1 are electrically coupled to the various semiconductor regions formed in the semiconductor substrate SB, the gate electrodes G1 and G2, and the like via the plugs V1.

The via portions V2 are each made of a conductor and formed between the wires M2 and M1, i.e., formed in the interlayer insulating film IL2 to couple the wires M2 to the wires M1. The via portions V2 can also be formed integrally with the wires M2. On the other hand, the via portions V3 are each made of a conductor and formed between the wires M3 and M2, i.e., formed in the interlayer insulating film IL3 to couple the wires M3 to the wires M2. The via portions V3 can also be formed integrally with the wires M3.

In the semiconductor device in the present embodiment, the third wiring layer, i.e., the wires M3 are the uppermost wires. That is, the first wiring layer (wires M1), the second wiring layer (wires M2), and the third wiring layer (wires M3) provide intended wire coupling between the semiconductor, elements (e.g., the foregoing MISFETs) formed in the semiconductor substrate SB. Accordingly, an intended operation can be performed.

The third wiring layer as the uppermost wires forms the pad (pad region or pad electrode) PD1. That is, the pad PD1 is formed in the same layer as the layer of the wires M3. In short, the wires M3 and the pad PD1 are each formed of the same conductive layer in the same step. Accordingly, the pad PD1 is formed over the interlayer insulating film IL3. The pad PD1 can also be regarded as one of the wires M3. However, while the wires M3 are covered with the multi-layer film LF, the pad PD1 has at least a portion thereof exposed from the opening OP1 of the multi-layer film LF. However, the pad PD1 is partly covered with the multi-layer film LF. In other words, the pad PD1 is exposed from the opening OP1, but the portion of the pad PD1 which does not overlap the opening OP1 in plan view is covered with the multi-layer film LF. Specifically, the center portion of the pad PD1 is not covered with the multi-layer film LF, while the outer peripheral portion of the pad PD1 is covered with the multi-layer film LF. Prior to forming a redistribution wire RW, using the pad PD1, a test (testing process corresponding to a probe test described later) for determining whether or not the semiconductor device performs an intended operation can be performed. Preferably, the pad PD1 is made of a conductive material (conductive material showing metal conduction) containing aluminum as a main component (main content). Preferred examples of the material of the pad PD1 include a compound or alloy of Al (aluminum) and Si (silicon), a compound or alloy of Al (aluminum) and Cu (copper), and a compound or alloy of Al (aluminum), Si (silicon), and Cu (copper). Preferably, the composition ratio of Al (aluminum) is higher than 50 at %

(i.e., the material is Al-rich). FIG. 3 shows only one pad PD1 but, actually, one or more pads PD1 are formed. Preferably, a plurality of the pads PD1 are formed.

As shown in FIGS. 4 to 6, it is possible to provide the via portion V3 immediately under the pad PD1 and electrically couple the pad PD1 to the wire M2 via the via portion V3. In another embodiment, it is also possible to provide the wire M3 integrally formed with the pad PD1, couple the wire M3 integrally formed with the pad PD1 to the wire M2 via the via portion V3 provided immediately under the wire M3, and thus electrically couple the pad PD1 to the wire M2.

FIG. 3 shows the case where the number of the wiring layers (not including the redistribution wire RW) formed over the semiconductor substrate SB is three (the case where the total of three layers of the wires M1, M2, M3 are formed). However, the number of the wiring layers (not including the redistribution wire RW) is not limited to three and can variously be changed but, preferably, the number of the wiring layers is not less than two. When the number of the wiring layers (not including the redistribution wire RW) is not less than three, a coil CL1 formed in the same layer as the second wiring layer can be led out using the wire (led-out wire) in the first wiring layer. This allows easy layout of the coils and the wires.

As shown in FIGS. 3 and 4, over the interlayer insulating film IL3, the multi-layer film (multi-layer insulating film) LF is formed so as to cover the wires M3 and, over the multi-layer film LF, the redistribution wire RW is formed. The multi-layer film LF includes the silicon dioxide film LF1, the silicon nitride film LF2 over the silicon dioxide film LF1, and the resin film LF3 over the silicon nitride film LF2. Since each of the silicon dioxide film LF1, the silicon nitride film LF2, and the resin film LF3 is an insulating film, the multi-layer film LF can also be regarded as a multi-layer insulating film in which the plurality of insulating films (specifically, the three insulating films of the silicon dioxide film LF1, the silicon nitride film LF2, and the resin film LF3) are stacked.

The pad PD1 is exposed from the opening OP1 of the multi-layer film LF. Over the pad PD1 exposed from the opening OP1 also, the redistribution wire RW is formed. That is, the redistribution wire RW is formed over the multi-layer film LF including the pad PD1 exposed from the opening OP1 and electrically coupled to the pad PD1. The redistribution wire RW is wiring which leads the pad PD1 as a part of the uppermost-layer wire (which is the third wiring layer herein) to the intended region (pad PD2) of the semiconductor chip. That is, the redistribution wire RW is formed so as to extend over the multi-layer film LF from over the pad PD1 exposed from the opening OP1 of the multi-layer film LF to the pad PD2 over the multi-layer film LF.

The pad (pad region, pad electrode, or bonding pad) PD2 is formed of the same conductive layer as that of the redistribution wire RW to be integral with the redistribution wire RW. Accordingly, the pad PD2 is also formed over the multi-layer film LF (i.e., over the resin film LF3 of the multi-layer film LF) and electrically coupled to the redistribution wire RW. Consequently, the pad PD2 is electrically coupled to the pad PD1 through the redistribution wire RW. FIG. 3 shows only one pad PD2 but, actually, one or more pads PD2 are formed. Preferably, a plurality of the pads PD2 are formed.

Note that, in plan view, the region where the pad PD2, the redistribution wire RW, and the pad PD1 are placed is different from the region where the coils CL1 and CL2 and the pad PD3 are placed. That is, the pad PD2, the redistribution wire RW, and the pad PD1 are placed at positions which do not two-dimensionally overlap the coils CL1 and CL2 and the pad PD3 in plan view.

The multi-layer film LF has the opening OP1 which exposes at least a portion of the pad PD1. Since the multi-layer film LF includes the silicon dioxide film LF1, the silicon nitride film LF2, and the resin film LF3, the opening OP1 of the multi-layer film LF is formed of the opening OP1*c* of the resin film LF3, the opening OP1*b* of the silicon nitride film LF2, and the opening OP1*a* of the silicon dioxide film LF1 (see FIGS. 4 and 5). The relationships between the openings OP1*a*, OP1*b*, and OP1*c* are as shown in FIGS. 4 and 5, which will be described later.

Note that, in FIG. 4, for improved clarity of illustration, in each of the redistribution wire RW and the pad PD2, a copper film CF and a seed film SE which will be described later are shown integrally, not separately.

As shown in FIG. 3, in the transformer formation region 1B, the transformer including the coil (inductor) CL1 and the coil (inductor) CL2 is formed. That is, in the transformer formation region 1B, over the semiconductor substrate SB, the coil CL1 as the primary coil of the transformer and the coil CL2 as the second coil of the transformer are formed. In the case of the foregoing semiconductor chip CP1, the coil CL1 corresponds to the foregoing coil CL1*a*, the coil CL2 corresponds to the foregoing coil CL2*a*, and the transformer formed of the coils CL1 and CL2 corresponds to the foregoing transformer TR1. In the case of the semiconductor chip CP2, the coil CL1 corresponds to the foregoing coil CL1*b*, the coil CL2 corresponds to the foregoing coil CL2*b*, and the transformer formed of the coils CL1 and CL2 corresponds to the foregoing transformer TR2.

The coils CL1 and CL2 are not formed in the same layer, but are formed in mutually different layers. Between the coils CL1 and CL2, the insulating layers are interposed. The lower-layer coil CL1 is not formed in contact with the semiconductor substrate SB, but is formed over the semiconductor substrate SB via the insulating layers. Specifically, over, the interlayer insulating film (which is the interlayer insulating film IL2 herein) formed over the semiconductor substrate SB, the coil CL1 is formed.

The coil CL1 is formed in the layer located under the coil CL2, while the coil CL2 is formed in the layer located over the coil CL1. In the present embodiment, of the coils CL1 and CL2, the upper-layer coil CL2 is formed over the multi-layer film LF. That is, the coil CL2 is formed over the multi-layer film LF and placed over the coil CL1. Specifically, the coil CL2 is formed over the resin film LF3 of the multi-layer film LF. Accordingly, the coil CL2 is in contact with the resin film LF3.

The coil CL2 is formed of the same conductive layer as that of the redistribution wire RW in the same step. That is, the coil CL2 is formed in the same layer as that of the redistribution wire RW. Accordingly, the coil CL2 and the redistribution wire RW are each formed of the same material.

In the transformer formation region 1B, over the multi-layer film LF, the coil CL2 is formed, and the pad (pad region, pad electrode, or bonding pad) PD3 is also formed. The pad PD3 is formed of the same conductive layer as that of the coil CL2 to be integral with the coil CL2. Accordingly, the pad PD3 is also formed over the multi-layer film LF (i.e., over the resin film LF3 of the multi-layer film LF) and electrically coupled to the coil CL2.

Consequently, the pad PD2, the redistribution wire RW, the pad PD3, and the coil CL2 are each formed of the same conductive layer. The pad PD2 is formed integrally with the redistribution wire RW to be electrically coupled thereto, while the pad PD3 is formed integrally with the coil CL2 to be electrically coupled thereto. However, the redistribution wire RW and the coil CL2 are isolated from each other and are not connected via a conductor. Also, the pads PD2 and PD3 are isolated from each other and are not connected via a conductor. Also, the pad PD2 and the coil CL2 are isolated from each other and are not connected via a conductor. Also, the pad PD3 and the redistribution wire RW are isolated from each other and are not connected via a conductor. The pad PD2 is electrically coupled to the pad PD1 via the redistribution wire RW, but the pad PD3 is not connected to the pad PD1 via a conductor. In the transformer formation region 1B, the coils CL1 and CL2 and the pad PD3 are formed, but the pad PD1, the redistribution wire RW, and the pad PD2 are not formed.

Of the coils CL1 and CL2, the lower-layer coil CL1 is formed of the wiring layer located under the uppermost wiring layer (which is the third wiring layer) in the multi-layer wiring structure, except for the redistribution wire RW. Here, the coil CL1 is formed of the second wiring layer located under the third wiring layer as the uppermost wiring layer. That is, the coil CL1 is formed in the same layer as that of the wires M2.

Since the coil CL1 is formed of the second wiring layer, the coil CL1 can be formed of the same conductive layer as that of the wires M2 in the same step. For example, in the case of forming the wires M2 by patterning the conductive film formed over the interlayer insulating film IL2, when the conductive film is patterned, not only the wires M2, but also the coil CL1 can be formed. Also, for example, in the case of forming the wires M2 using a damascene method, the coil CL1 can also be formed in the same step of forming the wires M2 using the damascene method. In this case, the wires M2 and the coil CL1 are each formed of a conductive film (e.g., conductive film containing copper as a main component) embedded in the trenches of the interlayer insulating film IL2.

Between the coils CL2 and CL1, the plurality of insulating layers are interposed. Specifically, the interlayer insulating film IL3 and the multi-layer film LF are interposed. That is, between the coils CL2 and CL1, the interlayer insulating film IL3, the silicon dioxide film LF1, the silicon nitride film LF2, and the resin film LF3, which are listed in ascending order, are interposed. Consequently, the coils CL2 and CL1 are not connected via a conductor, but are in an electrically insulated state. However, the coils CL2 and CL1 are magnetically coupled to each other.

Thus, the lower-layer coil CL1 is formed in the same layer as that of the wires M2 in the second wiring layer. This provides a state where, over the coil CL1, the coil CL2 is formed via the interlayer insulating film IL3, the silicon dioxide film LF1, the silicon nitride film LF2, and the resin film IL3.

Preferably, the resin film LF3 is a polyimide film. A polyimide film is a type of organic insulating film made of a polymer containing a polyimide bond as a repeating unit. As the resin film LF3, instead of the polyimide film, another organic insulating film made of, e.g., an epoxy-based resin, a PBO-based resin, an acrylic resin, a WRP-based resin, or the like can also be used. A polyimide-based resin is an organic resin used appropriately in a device required to have high resistance to heat at 200° C. or higher, which can be used selectively depending on the mechanical strength of the material such as the heat expansion coefficient or ductility thereof, the curing temperature thereof, or the like.

Over the multi-layer film LF, i.e., over the resin film LF3, an insulating protective film (surface protective film, insulating film, or protective insulating film) PA is formed so as to cover the redistribution wire RW and the coil CL2. The protective film PA, which is an insulating film, can also be regarded as a protective insulating film. The protective film PA covers and protects the redistribution wire RW and the coil CL2. As the protective film PA, a resin film is preferred. For example, a polyimide film can be used appropriately as the protective film PA. The protective film PA serves as the uppermost surface film of the semiconductor chip (semiconductor device).

The pads PD2 and PD3 are exposed from the respective openings OP2 and OP3 of the protective film PA. That is, by providing the opening OP2 over the pad PD2, the pad PD2 is exposed from the opening OP2 of the protective film PA. Also, by providing the opening OP3 over the pad PD3, the pad PD3 is exposed from the opening OP3 of the protective film PA. This allows conductive coupling members such as the bonding wires BW described later to be coupled to the pads PD2 and PD3 exposed from the respective openings OP2 and OP3 of the protective film PA.

Over each of the pads PD2 and PD3, an underlying metal film UM is preferably formed. That is, over the pad PD2, the underlying metal film UM is formed and the underlying metal film UM over the pad PD2 is exposed from the opening OP2 of the protective film PA. Also, over the pad PD3, the underlying metal film UM is formed and the underlying metal film UM over the pad PD3 is exposed from the opening OP3 of the protective film PA. As a result, the conductive coupling members such as the bonding wires BW described later are coupled to the underlying metal films UM exposed from the respective openings OP2 and OP3 of the protective film PA. This allows the coupling members (bonding wires BW) to be easily coupled. Each of the underlying metal films UM is made of a multi-layer film including, e.g., a nickel (Ni) film and a gold (Au) film over the nickel (Ni) film.

Note that the protective film PA is preferably formed, but can also be omitted. However, when the protective film PA is formed, the redistribution wire RW and the coil CL2 can be covered with and protected by the protective film PA. This offers such advantages as allowing a further improvement in reliability and allowing easy handling of the semiconductor chip.

As shown in FIGS. 7 and 8, in the outer peripheral portion of the semiconductor device (semiconductor chip), a seal ring (guard ring) SR is formed. The seal ring SR is formed in the outer peripheral portion of the semiconductor device (semiconductor chip) so as to circle around the semiconductor device (semiconductor chip) along the outer periphery thereof. Consequently, in plan view, the peripheral circuit formation region 1A and the transformer formation region 1B are formed in the region surrounded by the seal ring SR. In other words, in plan view, the seal ring SR is provided so as to surround the peripheral circuit formation region 1A and the transformer formation region 1B. Note that, in FIG. 7, the left end of the semiconductor device is a side surface TE of the semiconductor device and corresponds to a cut surface when cutting is performed along a scribe region.

The seal ring SR is formed of seal ring wires (metal pattern) M1*a*, M2*a*, and M1*a*, seal ring via portions (metal pattern) V3*a* and V2*a*, and a seal ring plug (metal pattern) V1*a*. The seal ring wire M1*a* is formed of the same material as that of the wire M1 in the same step to be included in the same layer. The seal ring wire M2*a* is formed of the same material as that of the wire M2 in the same step to be included in the same layer. The seal ring wire M3*a* is formed of the same material as that of the wire M3 in the same step to be included in the same layer. The seal ring plug V1*a* is formed of the same material as that of the plugs V1 in the same step to be included in the same layer. The seal ring via portion V2*a* is formed of the same material as that of the via portions V2 in the same step to be included in the same layer. The seal ring via portion V3*a* is formed of the same material as that of the via portions V3 in the same step to be included in the same layer. Accordingly, the seal ring wires M1*a*, M2*a*, and M3*a*, the seal ring via portions V3*a* and V2*a*, and the seal ring plug V1*a* are each formed mainly of a metal material, similarly to the wires M1, M2, and M3, the via portions V3, V2, and the plugs V1. Each of the seal ring plug V1*a*, the seal ring wire M1*a*, the seal ring via portion V2*a*, the seal ring wire M2*a*, the seal ring via portion V3*a*, and the seal ring wire M3*a* can also be regarded as a metal pattern for the seal ring SR.

The seal ring SR is formed of the seal ring wires M1*a*, M2*a*, and M3*a*, the seal ring via portions V3*a* and V2*a*, and the seal ring plug V1*a* to have a metal wall shape. That is, the seal ring SR is formed of the seal ring wire M3*a*, the seal ring via portion V3*a*, the seal ring wire M2*a*, the seal ring via portion V2*a*, the seal ring wire M1*a*, and the seal ring plug V1*a* which are vertically arranged to have the metal wall shape. Specifically, the seal ring plug V1*a*, the seal ring wire M1*a*, the seal ring via portion V2*a*, the seal ring wire M2*a*, the seal ring via portion V3*a*, and the seal ring wire M3*a* are formed in different layers, successively stacked in ascending order, and located at positions which substantially overlap (coincide with) each other in plan view. Consequently, each of the seal ring plug V1*a*, the seal ring wire M1*a*, the seal ring via portion V2*a*, the seal ring wire M2*a*, the seal ring via portion V3*a*, and the seal ring wire M3*a* is formed in the outer peripheral portion of the semiconductor device (semiconductor chip) so as to circle around the semiconductor device (semiconductor chip) along the outer periphery thereof.

By providing the seal ring SR, when a crack is formed in a cut surface by a dicing blade in a dicing step (cutting step) during the manufacturing of the semiconductor device, the sealing ring SR can stop the extension of the crack. The seal ring SR can also stop the entrance of moisture from the cut surface (side surface) of the semiconductor device. That is, the seal ring SR has the function of a barrier against the extension of the crack or the entrance of moisture from the cut surface resulting from dicing. Therefore, by providing the seal ring SR, it is possible to improve the reliability of the semiconductor device.

Thus, the seal ring wires M1*a*, M2*a*, and M3*a*, the plug V1*a*, and the via portions V2*a* and V3*a* are formed not for providing wire coupling between elements or circuits, but for forming the seal ring SR.

In the case of applying the semiconductor device of FIG. 3 to the foregoing semiconductor chip CP1, in the semiconductor chip CP1, the foregoing transmission circuit TX1 and the coils CL1 and CL2 (corresponding to the foregoing coils CL1*a* and CL2*a*) are formed. In the semiconductor chip CP1, the transmission circuit TX1 formed therein is electrically coupled to the coil CL1 via internal wiring. Also, in the case of applying the semiconductor device of FIG. 3 to the foregoing semiconductor chip CP2, in the semiconductor chip CP2, the foregoing transmission circuit TX2 and the coils CL1 and CL2 (corresponding to the foregoing coils CL1*b* and CL2*b*) are formed. In the semiconductor chip CP2, the transmission circuit TX2 formed therein is electrically coupled to the coil CL1 via internal wiring.

In this case, from the transmission circuit TX1 in the semiconductor chip CP1 to the coil CL1 in the semiconductor chip CP1, a transmission signal can be transmitted via the internal wiring in the semiconductor chip CP1. The pad PD3 coupled to the coil CL2 in the semiconductor chip CP1 is electrically coupled to the pad PD2 (pad PD2 coupled to the redistribution wire RW) of the semiconductor chip CP2 via conductive coupling members such as the bonding wires BW described later and further electrically coupled to the reception circuit RX1 in the semiconductor chip CP2 via the internal wiring of the semiconductor chip CP2. As a result, in the semiconductor chip CP1, it is possible to transmit the signal (reception signal) received by the coil CL2 from the coil CL1 by electromagnetic induction to the reception circuit RX1 in the semiconductor chip CP2 via the bonding wires BW (coupling members) described later and the internal wiring of the semiconductor chip CP2.

Likewise, it is possible to transmit a transmission signal from the transmission circuit TX2 in the semiconductor chip CP2 to the coil CL1 in the semiconductor chip CP2 via the internal wiring in the semiconductor chip CP2. The pad PD3 coupled to the coil CL2 in the semiconductor chip CP2 is electrically coupled to the pad PD2 (pad PD2 coupled to the redistribution wire RW) of the semiconductor chip CP1 via conductive coupling members such as the bonding wires BW described later. As a result, in the semiconductor chip CP2, it is possible to transmit the signal (reception signal) received by the coil CL2 from the coil CL1 by electromagnetic induction to the reception circuit RX2 in the semiconductor chip CP1 via the bonding wires BW (coupling members) described later and the internal wiring of the semiconductor chip CP1.

<About Manufacturing Steps>

Next, a description will be given of the manufacturing steps of the semiconductor device in the present embodiment. By the following manufacturing steps, the semiconductor device of FIGS. 3 to 8 described above is manufactured.

FIGS. 9 to 59 are main-portion cross-sectional views of the semiconductor device in the present embodiment during the manufacturing steps thereof. Among FIGS. 9 to 59, FIGS. 9, 11 to 13, 15, 17, 19, 20, 22, 24, 25, 27, 29, 31, 33, 35, 37, 39, 41, 43, 45, 47, and 49 to 57 show cross-sectional views of cross-sectional regions each corresponding to FIG. 3 described above. Also, among FIGS. 9 to 59, FIGS. 10, 14, 16, 18, 21, 23, 26, 28, 30, 32, 34, 36, 38, 40, 42, 44, 46, 48, and 58 show cross-sectional regions (regions located on the right side of the scribe region 1D in each of the cross-sectional views) each corresponding to FIG. 7 described above. FIG. 59 corresponds to the structure of FIG. 58 from which the scribe region 1D has been cut and removed. FIG. 59 corresponds to FIG. 7 described above.

Figure 9:
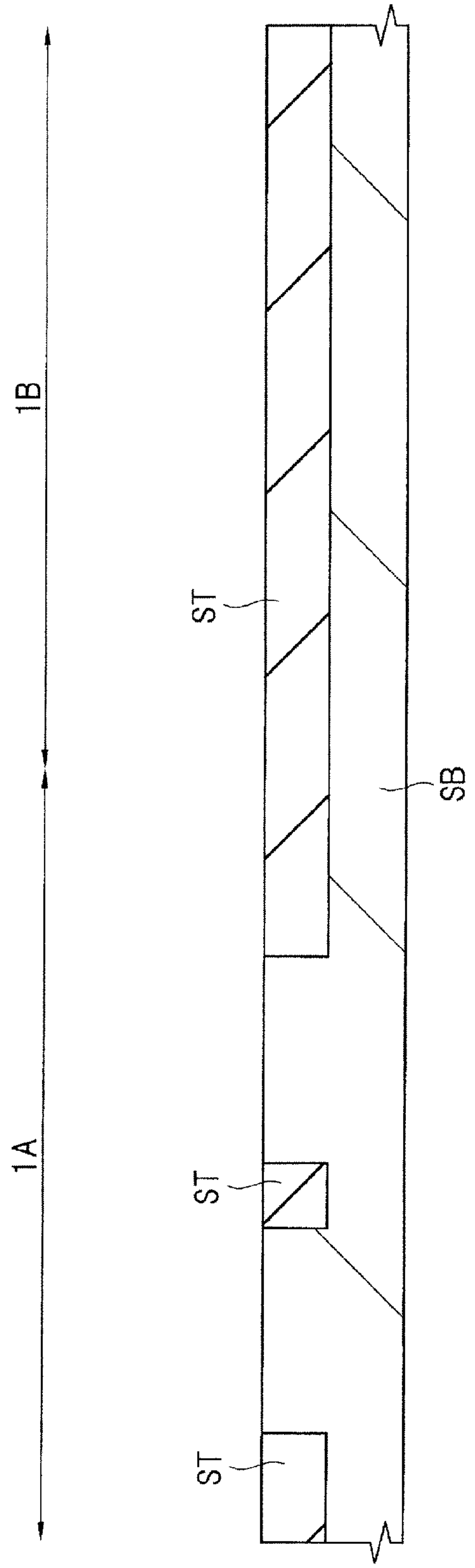
FIG. 9 is a main-portion cross-sectional view of the semiconductor device in the embodiment during a manufacturing step.
Figure 10:
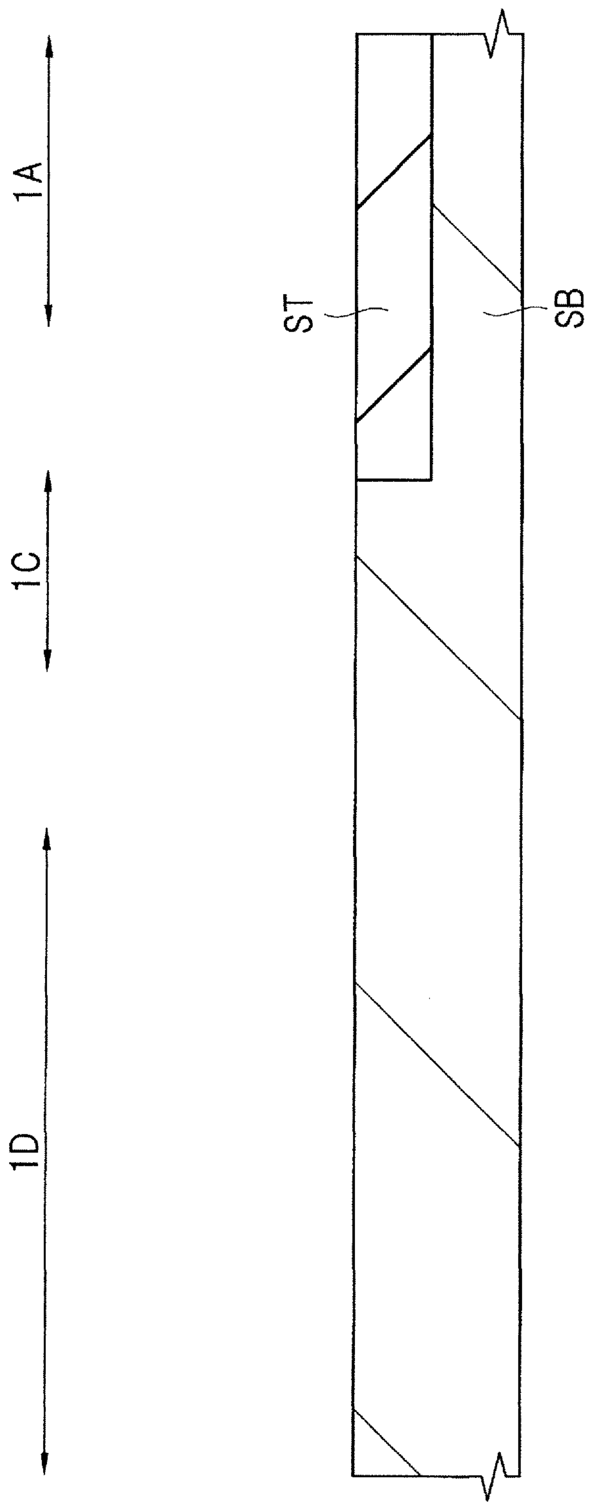
FIG. 10 is a main-portion cross-sectional view of the semiconductor device during the same manufacturing step as that shown in FIG. 9.

First, as shown in FIGS. 9 and 10, the semiconductor substrate (semiconductor wafer) SB made of p-type monocrystalline silicon having a specific resistance of, e.g., about 1 to 10 Ω·cm or the like is provided (prepared).

The semiconductor substrate SB has the peripheral circuit formation region 1A where peripheral circuits are to be formed, the transformer formation region 1B where the transformer is to be formed, the seal ring formation region 1C where the seal ring SR is to be formed, and the scribe region (dicing region or cutting region) 1D to be cut in the dicing step. The peripheral circuit formation region 1A, the transformer formation region 1B, the seal ring formation region 1C, and the scribe region 1D correspond to the mutually different two-dimensional regions in the main surface of the same semiconductor substrate (semiconductor wafer) SB.

The semiconductor substrate (semiconductor wafer) has chip regions (semiconductor chip regions) from which semiconductor chips (semiconductor devices) are to be obtained, and the scribe region between the individual chip regions. Each of the chip regions is surrounded by the scribe region in plan view. In the dicing step described later, the semiconductor substrate (semiconductor wafer) is subjected to cutting or dicing along the scribe region to be singulated into the individual chip regions and provide the semiconductor chips (semiconductor devices). In the semiconductor substrate (semiconductor wafer), the peripheral circuit formation region 1A, the transformer formation region 1B, and the seal ring formation region 1C are provided in each of the chip regions. The seal ring formation region 1C is provided in the outer peripheral portion of each of the chip regions, while the peripheral circuit formation region 1A and the transformer formation region 1B are provided in the area of the chip region which is surrounded by the seal ring formation region 1C. That is, in each of the chip regions, the seal ring formation region 1C is provided so as to circle around the semiconductor chip along the outer periphery thereof, while the peripheral circuit formation region 1A and the transformer formation region 1B are provided in the area surrounded by the seal ring formation region 1C.

Note that, in the case of the foregoing semiconductor chip CP1, the peripheral circuits formed in the peripheral circuit formation region 1A are the foregoing control circuit CC, the transmission circuit TX1, the reception circuit RX2, and the like. In the case of the foregoing semiconductor chip CP2, the peripheral circuits formed in the peripheral circuit formation region 1A are the foregoing drive circuit DR, the reception circuit RX1, the transmission circuit TX2, and the like. In the case of the foregoing semiconductor chip CP1, the transformer formed in the transformer formation region 1B is the foregoing transformer TR1. In the case of the foregoing semiconductor chip CP2, the transformer formed in the transformer formation region 1D is the foregoing transformer TR2. Accordingly, in the case of the foregoing semiconductor chip CP1, the coils CL1 and CL2 formed in the transformer formation region 1B are the foregoing coils CL1*a* and CL2*a* and, in the case of the foregoing semiconductor chip CP2, the coils CL1 and CL2 formed in the transformer formation region 1B are the foregoing coils CL1*b* and CL2*b*.

Next, in the main surface of the semiconductor substrate SB, isolation regions ST are formed by, e.g., an STI (Shallow Trench Isolation) method or the like. The isolation regions ST are formed by forming trenches in the semiconductor substrate SB and embedding an insulating film in each of the trenches. In the semiconductor substrate SB, in active regions defined (demarcated) by the isolation regions ST, MISFETs are formed, as will be described later.

Next, in the semiconductor substrate SB (in the active regions thereof) in the peripheral circuit formation region 1A, semiconductor elements such as MISFETs are formed. A description will be given below of the steps of forming the MISFETs.

Figure 11:
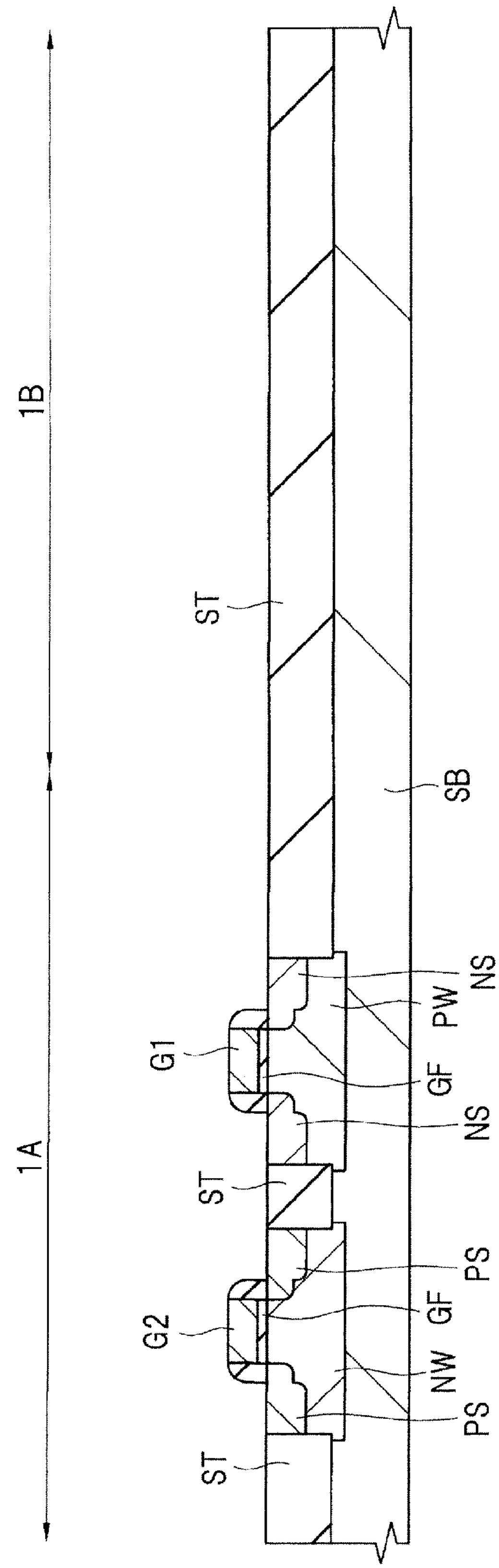
FIG. 11 is a main-portion cross-sectional view of the semiconductor device during a manufacturing step subsequent to that shown in FIG. 9.

First, as shown in FIG. 11, in the semiconductor substrate SB, a p-type well PW and an n-type well NW are formed. Each of the p-type well PW and the n-type well NW is formed by ion implantation to extend from the main surface of the semiconductor substrate SB to a predetermined depth.

Then, over the main surface of the semiconductor substrate SE, the gate electrodes G1 and G2 are formed via the gate insulating films GF. The gate electrode G1 is formed over the p-type well PW via the gate insulating film GF. The gate electrode G2 is formed over the n-type well via the gate insulating film GF.

Specifically, the gate electrodes G1 and G2 can be formed via the gate insulating films GF as follows. That is, the main surface of the semiconductor substrate SB is cleaned first by washing treatment or the like. Then, over the main surface of the semiconductor substrate SB, an insulating film for the gate insulating films GF is formed. Then, over the insulating film, a polycrystalline silicon film for the gate electrodes G1 and G2 is formed. The insulating film for the gate insulating films GF is made of, e.g., a silicon dioxide film, a silicon oxynitride film, or the like and can be formed by, e.g., a thermal oxidation method or the like. The polycrystalline silicon film for the gate electrodes G1 and G2 can be formed by, e.g., a CVD (Chemical Vapor Deposition) method or the like. The polycrystalline silicon film is doped with an impurity during the deposition thereof or, after the deposition thereof, an impurity is introduced into the polycrystalline silicon film by ion implantation. Thus, the polycrystalline silicon film is changed to a doped polysilicon film to provide a low-resistance semiconductor film (conductive material film). Alternatively, it is also possible to deposit an amorphous silicon film and change the amorphous silicon film to the polycrystalline silicon film by heat treatment after the deposition thereof. Then, by patterning the polycrystalline silicon film using a photolithographic technique and an etching technique, it is possible to form the gate electrodes G1 and G2 each made of the patterned polycrystalline silicon film. The insulating film for the gate insulating films GF remaining under the gate electrodes G1 and G2 serves as each of the gate insulating films GF.

Next, in the p-type well of the semiconductor substrate SB, the n-type semiconductor regions NS for the source/drain of the n-channel MISFET are formed while, in the n-type well NW of the semiconductor substrate WB, the p-type semiconductor regions PS for the source/drain of the p-channel MISFET are formed. Each of the n-type semiconductor regions NS and the p-type semiconductor regions PS can be formed by ion implantation. Since the regions immediately under the gate electrodes G1 and G2 are protected from the ion implantation, the n-type semiconductor regions NS are formed in the regions of the p-type well PW which are located on both sides of the gate electrode GE1, and the p-type semiconductor regions PS are formed in the regions of the n-type well NW which are located on both sides of the gate electrode GE2.

When each of the n-type semiconductor regions NS and the p-type semiconductor regions PS is formed to have an LDD structure, lower-impurity-concentration $n^-$-type semiconductor regions and lower-impurity-concentration $p^-$-type semiconductor regions are each formed by ion implantation first. Then, side-wall insulating films (sidewall spacers) are formed over the side walls of the gate electrodes G1 and G2. Thereafter, higher-impurity-concentration $n^+$-type semiconductor regions and higher-impurity-concentration $p^+$-type semiconductor regions are each formed by ion implantation. Thus, each of the n-type semiconductor regions NS can be formed as an n-type semiconductor region having an LDD structure including the lower-impurity-concentration $n^-$-type semiconductor region, and the higher-impurity-concentration $n^+$-type semiconductor region. Also, each of the p-type semiconductor regions PS can be formed as a p-type semiconductor region having an LDD structure including the lower-impurity-concentration $p^-$-type semiconductor region, and the higher-impurity-concentration $p^+$-type semiconductor region.

Next, annealing treatment (heat treatment) for activating the impurities introduced thus far by ion implantation is performed.

In this manner, in the semiconductor substrate SB in the peripheral circuit formation region 1A, the n-channel MISFET and the p-channel MISFET are formed. The gate electrode G1, the gate insulating film GF under the gate electrode G1, and the n-type semiconductor regions NS function as the gate electrode, the gate insulating film, and the source/drain regions of the n-channel MISFET. On the other hand, the gate electrode G2, the gate insulating film GF under the gate electrode G2, and the p-type semiconductor regions PS function as the gate electrode, the gate insulating film, and the source/drain regions of the p-channel MISFET.

Next, using a salicide (Self Aligned Silicide) technique, low-resistance metal silicide layers (not shown) can also be formed in the respective upper portions (top surface layer portions) of the n-type semiconductor regions NS, the p-type semiconductor regions PS, and the gate electrodes G1 and G2. For example, after a metal film for forming the metal silicide layers is formed over the semiconductor substrate SB, heat treatment is performed to cause the metal film to react with the respective upper layer portions of the n-type semiconductor regions NS, the p-type semiconductor regions PS, and the gate electrodes G1 and G2. Then, the unreacted portions of the metal film are removed. In this manner, in the respective upper portions (top surface layer portions) of the n-type semiconductor regions NS, the p-type semiconductor regions PS, and the gate electrodes G1 and G2, the metal silicide layers (not shown) can be formed. By forming the metal silicide layers, it is possible to reduce the contact resistance, the diffusion resistance, and the like of each of the n-type semiconductor regions NS, the p-type semiconductor regions PS, and the gate electrodes G1 and G2. It may also be possible not to form the metal silicide layers. Alternatively, it is also possible to form the metal silicide layers in some of the n-type semiconductor regions NS, the p-type semiconductor regions PS, and the gate electrodes G1 and G2 and leave the others without the metal silicide layers.

Figure 12:
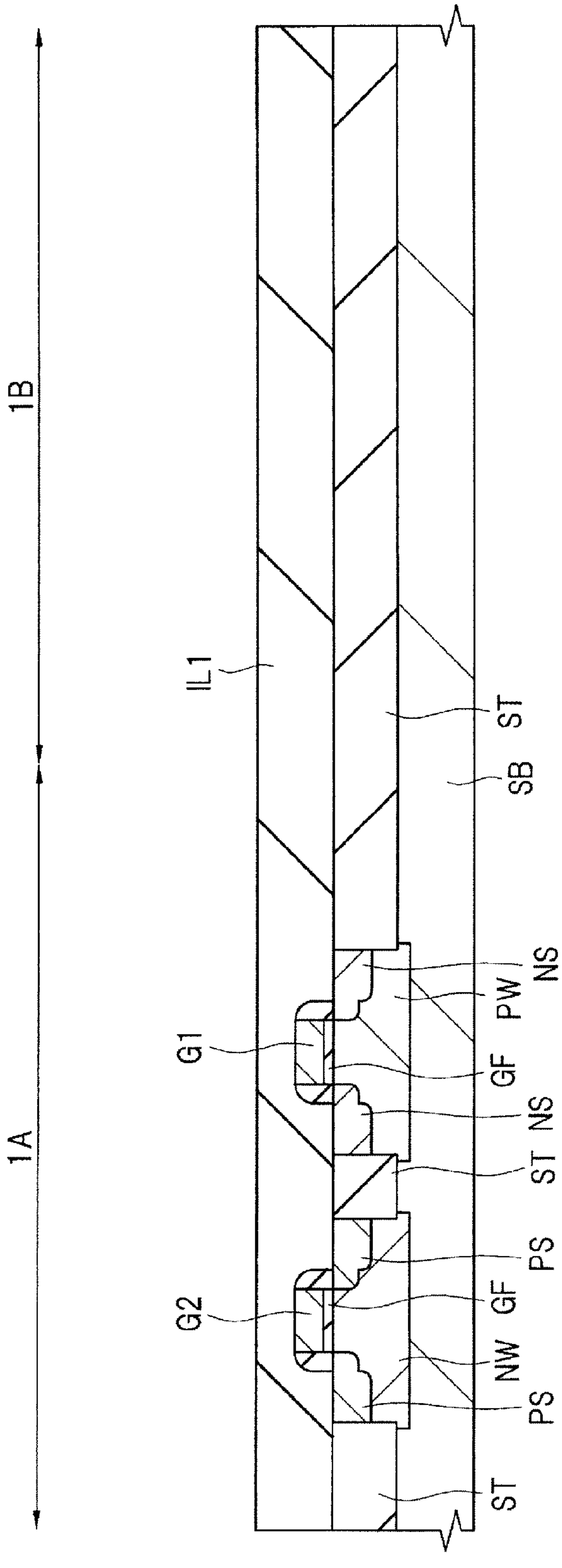
FIG. 12 is a main-portion cross-sectional view of the semiconductor device during a manufacturing step subsequent to that shown in FIG. 11.

Next, as shown in FIG. 12, over the main surface (entire main surface) of the semiconductor substrate SB, the interlayer insulating film IL1 is formed. The interlayer insulating film IL1 is formed so as to cover the MISFETs formed in the semiconductor substrate SB. That is, the interlayer insulating film IL1 is formed over the main surface of the semiconductor substrate SB so as to cover the n-type semiconductor regions NS, the p-type semiconductor regions PS, and the gate electrodes G1 and G2. Since the interlayer insulating film IL1 is formed over the entire main surface of the semiconductor substrate SB, the interlayer insulating film IL1 is formed in the peripheral circuit formation region 1A, the transformer formation region 1B, the seal ring formation region 1C, and the scribe region 1D. The interlayer insulating film IL1 is made of, e.g., a single-layer silicon dioxide film, a multi-layer film including a silicon nitride film and a silicon dioxide film thicker than the silicon nitride film (lower-layer silicon nitride film and upper-layer silicon dioxide film), or the like.

After the deposition of the interlayer insulating film IL1, by polishing the top surface (upper surface) of the interlayer insulating film IL1 by a CMP (Chemical Mechanical Polishing) method, the upper surface of the interlayer insulating film IL1 is planarized. Even when the top surface of the interlayer insulating film IL1 is formed in a depressed/projecting shape resulting from an underlying level difference, by polishing the top surface of the interlayer insulating film IL1 by a CMP method, the interlayer insulating film IL1 having the planarized top surface can be obtained.

Next, over the interlayer insulating film IL1, a photoresist layer (not shown) is formed using a photolithographic technique. Then, using the photoresist layer as an etching mask, the interlayer insulating film IL1 is dry-etched to be formed with contact holes (through holes or bores). Then, in each of the contact holes, a conductive film is embedded to form the conductive plugs (coupling conductor portions) V1, as shown in FIG. 13.

To form the plugs V1, e.g., over the interlayer insulating film IL1 including the interiors the contact holes (over the bottom portions and side walls thereof), a barrier conductor film (e.g., a titanium film, a titanium nitride film, or a multi-layer film thereof) is formed by a sputtering method, a plasma CVD method, or the like. Then, a main conductor film made of a tungsten film or the like is formed over the barrier conductor film by a CVD method or the like so as to be embedded in the contact holes. Then, the unneeded portions of the main conductor film and the barrier conductor film which are located outside the contact holes (over the interlayer insulating film IL1) are removed by a CMP method, an etch-back method, or the like. As a result, the upper surface of the interlayer insulating film IL1 is exposed, and the barrier conductor film and the main conductor film each embedded and remaining in the contact holes of the interlayer insulating film IL1 form the plugs V1. In FIGS. 13 and 14, for simplified illustration, in each of the plugs V1 and V1*a*, the main conductor film and the barrier conductor film are integrally shown. The plugs V1 are electrically coupled to the n-type semiconductor regions NS, the p-type semiconductor regions PS, the gate electrode G1 or G2, and the like at the bottom portions thereof.

Figure 13:
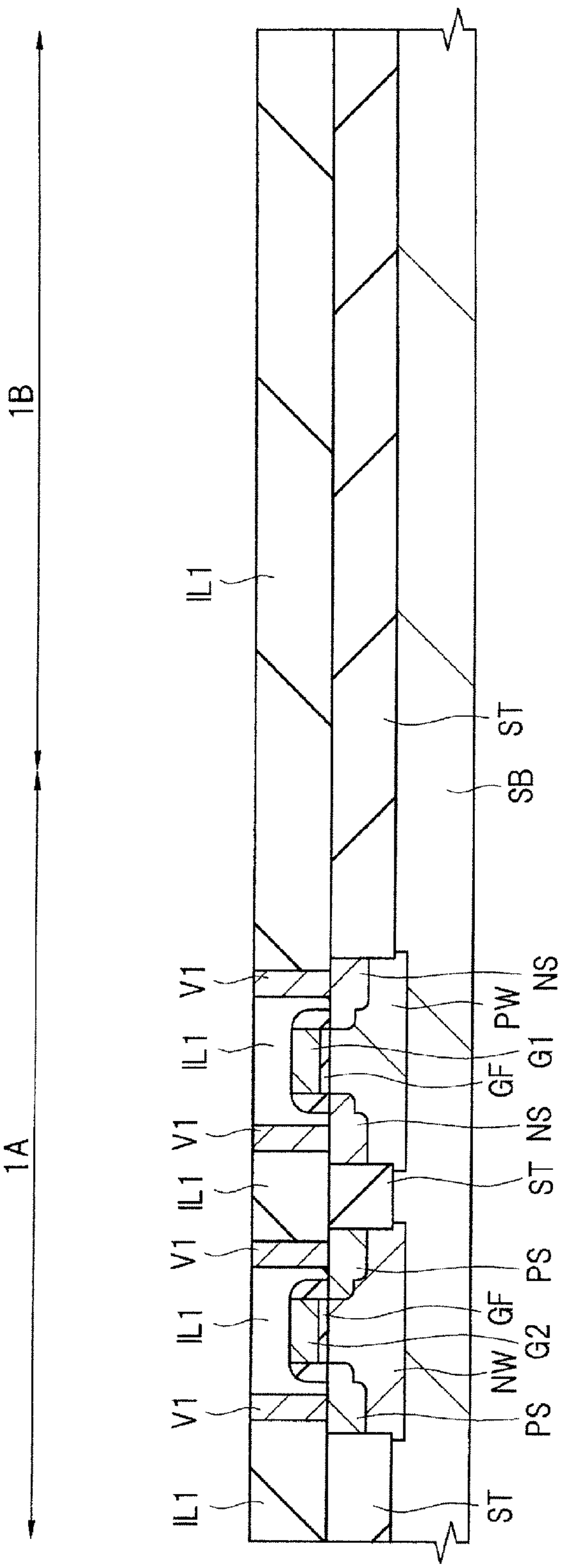
FIG. 13 is a main-portion cross-sectional view of the semiconductor device during a manufacturing step subsequent to that shown in FIG. 12.
Figure 14:
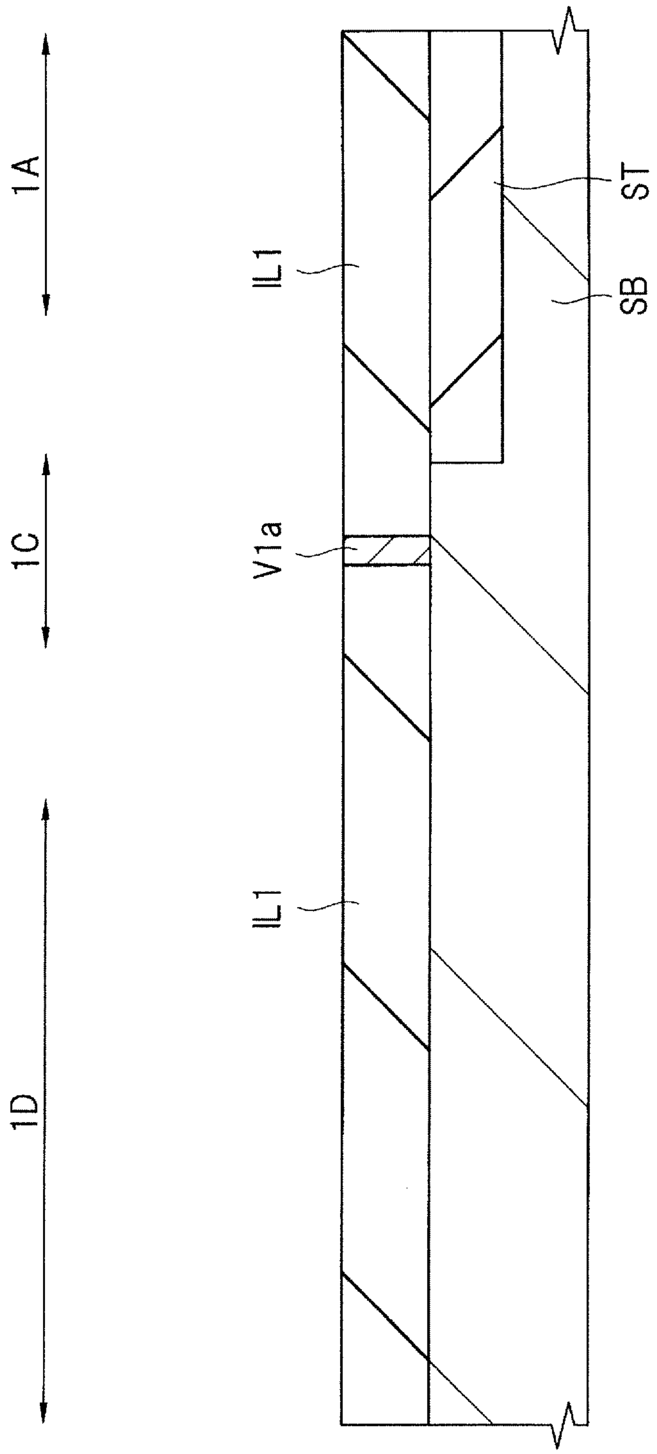
FIG. 14 is a main-portion cross-sectional view of the semiconductor device during the same manufacturing step as that shown in FIG. 13.

FIG. 14 corresponds to the same process stage as shown in FIG. 13. As shown in FIGS. 13 and 14, in the same step of forming the plugs V1, the seal ring plug (metal pattern) V1*a* is formed in the seal ring formation region 1C. That is, in the step of forming the contact holes for the plugs V1 in the interlayer insulating film IL1, in the seal ring formation region 1C, a trench for the plug V1*a* is formed in the interlayer insulating film IL1. In the step of forming the plugs V1 in the contact holes for the plugs V1, in the seal ring formation region 1C, the seal ring plug V1*a* is formed in the trench for the plug V1*a*. Consequently, the seal ring plug 1*a* is embedded in the trench formed in the interlayer insulating film IL1.

Figure 15:
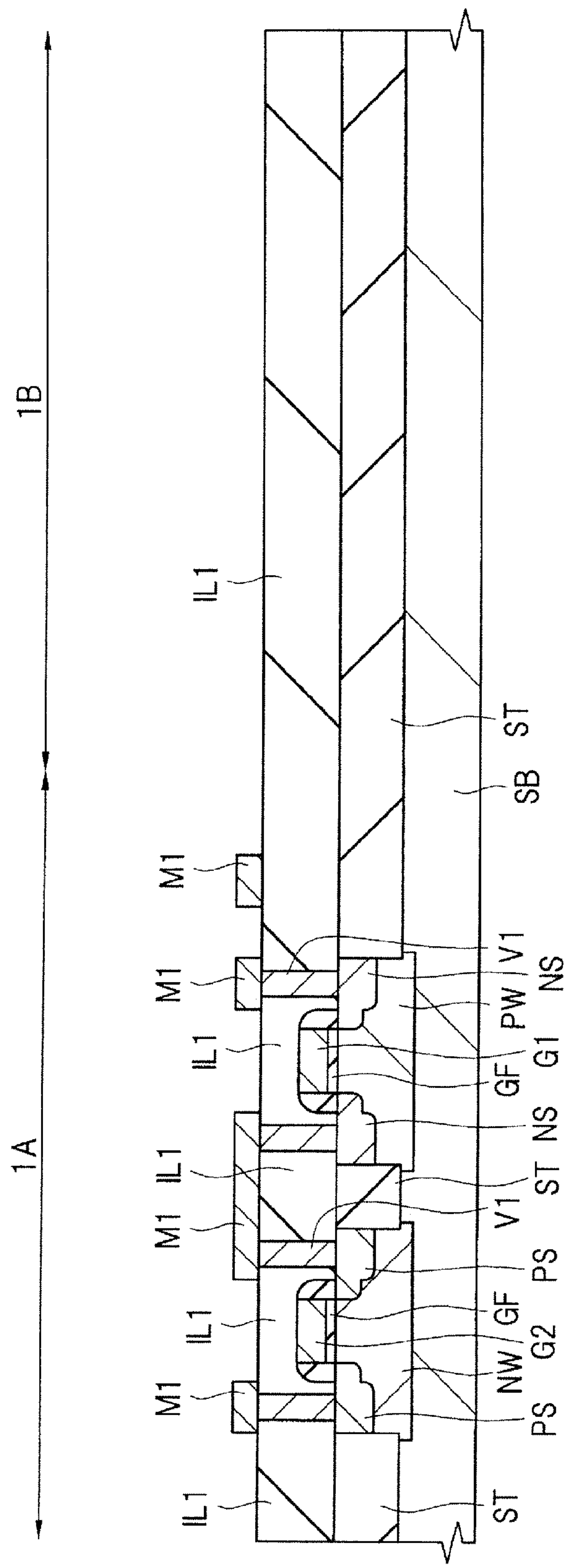
FIG. 15 is a main-portion cross-sectional view of the semiconductor device during a manufacturing step subsequent to that shown in FIG. 13.

Next, as shown in FIG. 15, over the interlayer insulating film IL1 in which the plugs V1 are embedded, the wires M1 in the first wiring layer as the lowermost wiring layer are formed. To form the wires M1, first, over the interlayer insulating film IL1 in which the plugs V1 are embedded, a conductive film for the first wiring layer is formed. The conductive film is made of a multi-layer film including a barrier conductor film (e.g., a titanium film, a titanium nitride film, or a multi-layer film thereof), an aluminum film, and a barrier conductor film (e.g., a titanium film, a titanium nitride film, or a multi-layer film thereof) which are stacked successively in ascending order). The conductive film can be formed using a sputtering method or the like. The foregoing aluminum film in the conductive film can be regarded as an aluminum for forming the wires M1. Then, by patterning the conductive film using a photolithographic technique and an etching technique, the wires M1 can be formed. The plugs V1 have the upper surfaces thereof in contact with the wires M1 to be electrically coupled to the wires M1.

The foregoing aluminum film for forming the wires M1 is not limited to a pure aluminum film. As the foregoing aluminum film for forming the wires M1, a conductive material film (only a conductive material film showing metallic conduction) containing aluminum as a main component can be used. For example, a compound film or alloy film of Al (aluminum) and Si (silicon), a compound film or alloy film of Al (aluminum) and Cu (copper), or a compound film or alloy film of Al (aluminum), Si (silicon), and Cu (copper) can be used appropriately as the aluminum film for forming the wires M1. The composition ratio of Al (aluminum) in the aluminum film is preferably higher than 50 at % (i.e., the aluminum film is Al-rich). The same also applies to each of an aluminum film (i.e., aluminum film forming a conductive film CD1 described later) for forming the wires M2 and an aluminum film (i.e., aluminum film forming a conductive film CD2 described later) for forming the wires M3.

Not only the wires M1 in the first wiring layer are formed in the peripheral circuit formation region 1A, but also the wires M1 in the first wiring layer can be formed in the transformer formation region 1B. Examples of the wires M1 formed in the transformer formation region 1B include a wire electrically coupling the coil CL1 to the peripheral circuit (such as the foregoing transmission circuit TX1 or TX2).

Figure 16:
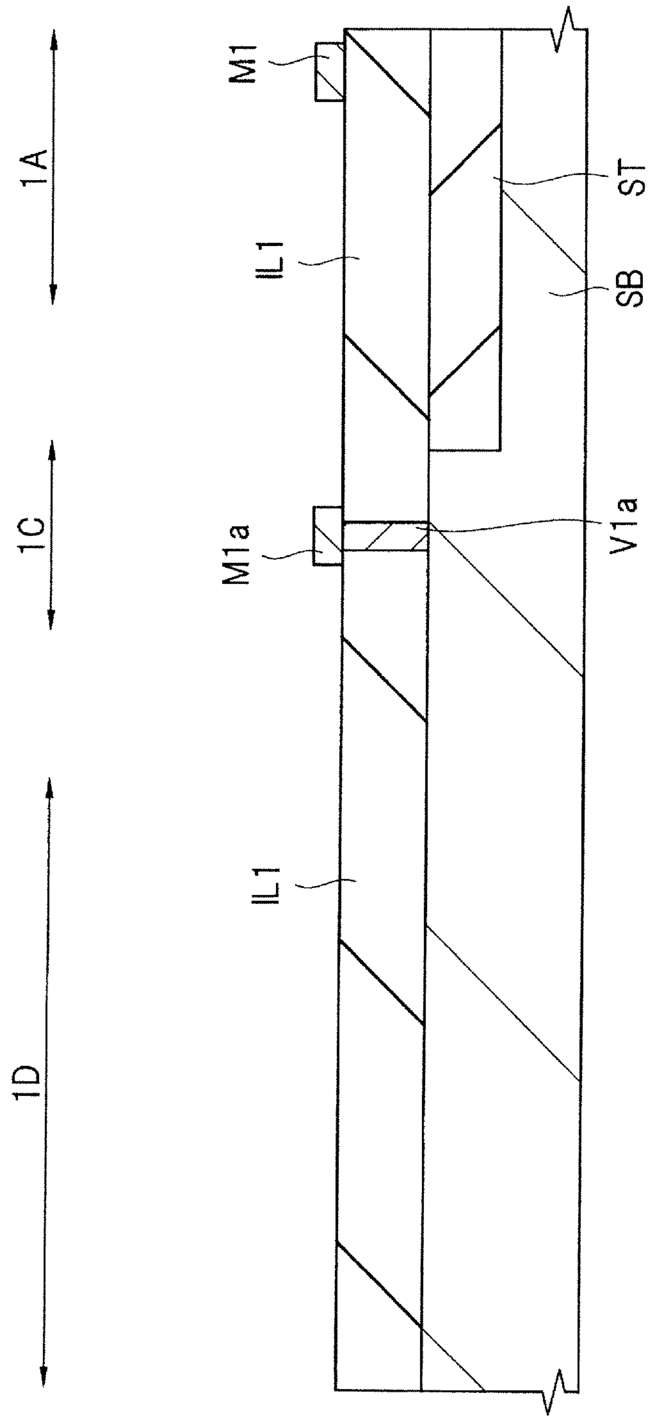
FIG. 16 is a main-portion cross-sectional view of the semiconductor device during the same manufacturing step as that shown in FIG. 15.

FIG. 16 corresponds to the same process stage as shown in FIG. 15. As shown in FIGS. 15 and 16, in the step of forming the wires M1, in the seal ring formation region 1C, the seal ring wire (metal pattern) M1*a* is formed. The seal ring wire M1*a* is formed at a position overlapping the seal ring plug V1*a* in plan view.

The description has been given heretofore of the case where the wires M1 are formed by a method which patterns the conductive film. In another embodiment, the wires M1 can also be formed by a damascene method. In this case, by forming an insulating film over the interlayer insulating film IL1 in which the plugs V1 are embedded, then forming wire trenches in the insulating film, and embedding a conductive film in each of the wire trenches, the wires M1 as embedded wires (e.g., embedded copper wires) can be formed. In this case, the seal ring wire M1*a* is also formed by the damascene method.

Figure 17:
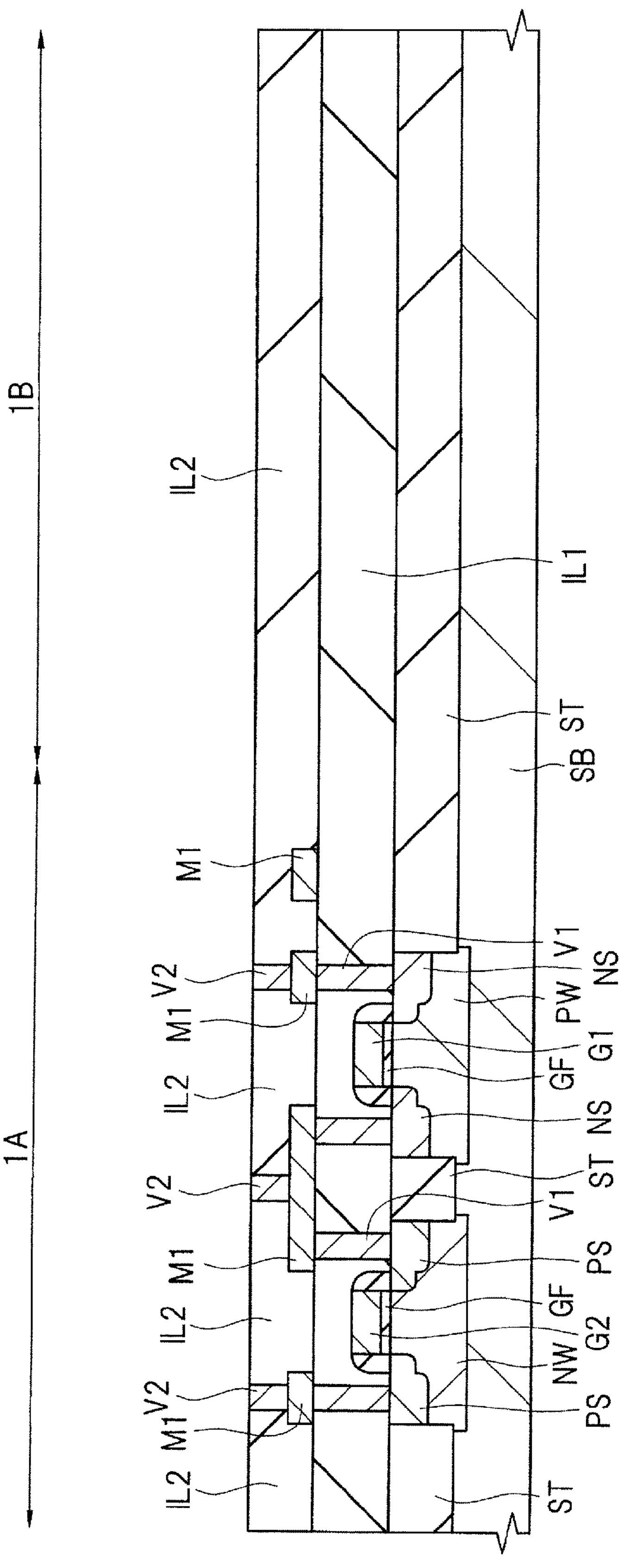
FIG. 17 is a main-portion cross-sectional view of the semiconductor device during a manufacturing step subsequent to that shown in FIG. 15.

Next, as shown in FIG. 17, over the main surface (entire main surface) of the semiconductor substrate SB, i.e., over the interlayer insulating film ILL the interlayer insulating film IL2 is formed so as to cover the wires M1. The interlayer insulating film IL2 is formed of a silicon dioxide film or the like and can be formed using a CVD method or the like. After the deposition of the interlayer insulating film IL2, it is also possible to subject the top surface (upper surface) of the interlayer insulating film IL2 to polishing using a CMP method or the like as necessary and enhance the planarity of the upper surface of the interlayer insulating film IL2.

Next, over the interlayer insulating film IL2, a photoresist layer (not shown) is formed using a photolithographic technique. Then, using the photoresist layer as an etching mask, the interlayer insulating film IL2 is dry-etched to be formed with through holes (penetrating holes or bores). Then, in each of the through holes, a conductive film is embedded to form the conductive via portions (coupling conductor portions) V2. The via portions V2 can also be regarded as conductive plugs. The via portions V2 can be formed by the same method as used to form the plugs V1. However, the via portions V2 can also be formed of a conductive film made of a material different from that of the conductive film forming each of the plugs V1. For example, each of the plugs V1 can be formed mainly of a tungsten film, while each of the via portions V2 can be formed mainly of an aluminum film.

Figure 18:
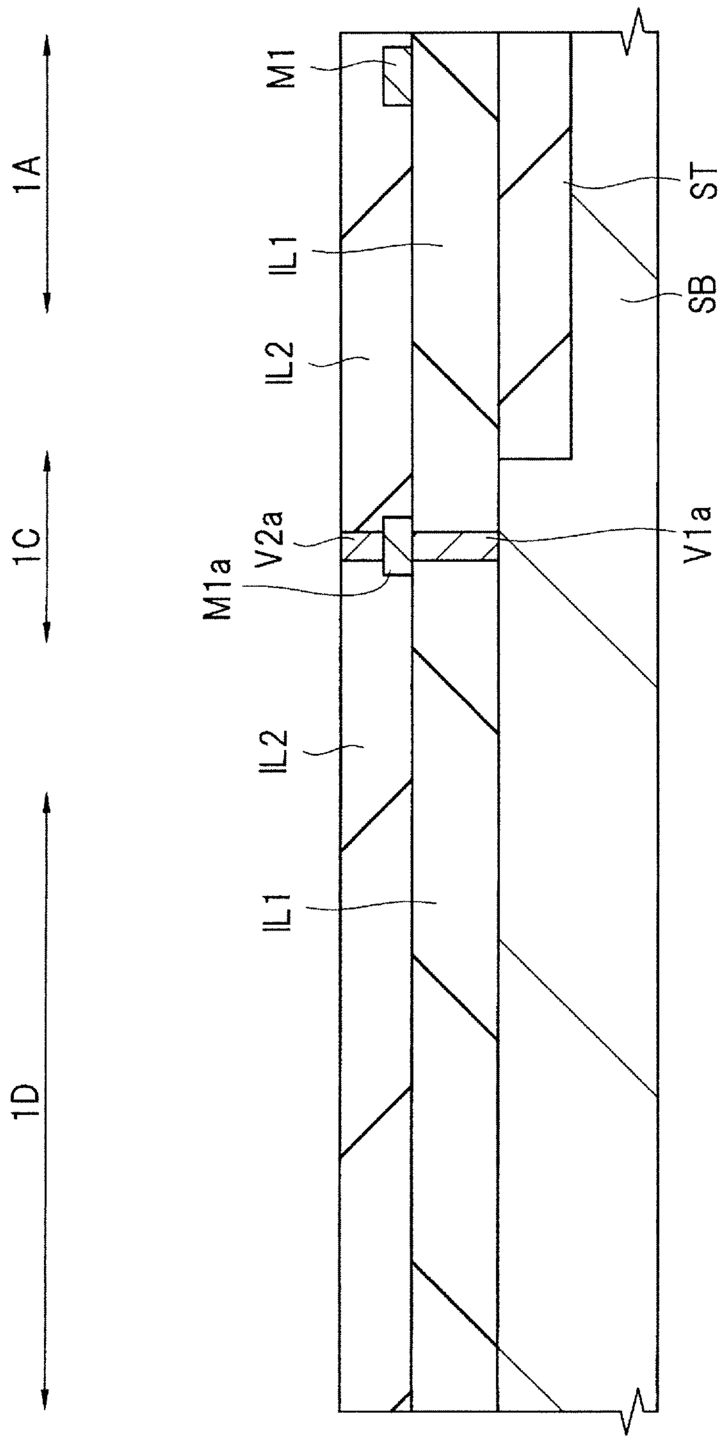
FIG. 18 is a main-portion cross-sectional view of the semiconductor device during the same manufacturing step as that shown in FIG. 17.

FIG. 18 corresponds to the same process stage as shown in FIG. 17. As shown in FIGS. 17 and 18, in the same step of forming the via portions V2, the seal ring via portion (metal pattern) V2*a* is formed in the seal ring formation region 1C. That is, in the step of forming the through holes for the via portions V2 in the interlayer insulating film IL2, in the seal ring formation region 1C, a trench for the via portion V2*a* is formed in the interlayer insulating film IL2. In the step of forming the via portions V2 in the through holes for the via portions V2, in the seal ring formation region 1C, the seal ring via portion V2*a* is formed in the trench for the via portion V2*a*. Consequently, the seal ring via portion V2*a* is embedded in the trench formed in the interlayer insulating film IL2. The seal ring via portion V2*a* is formed at a position overlapping the seal ring wire M1*a* in plan view.

Figure 19:
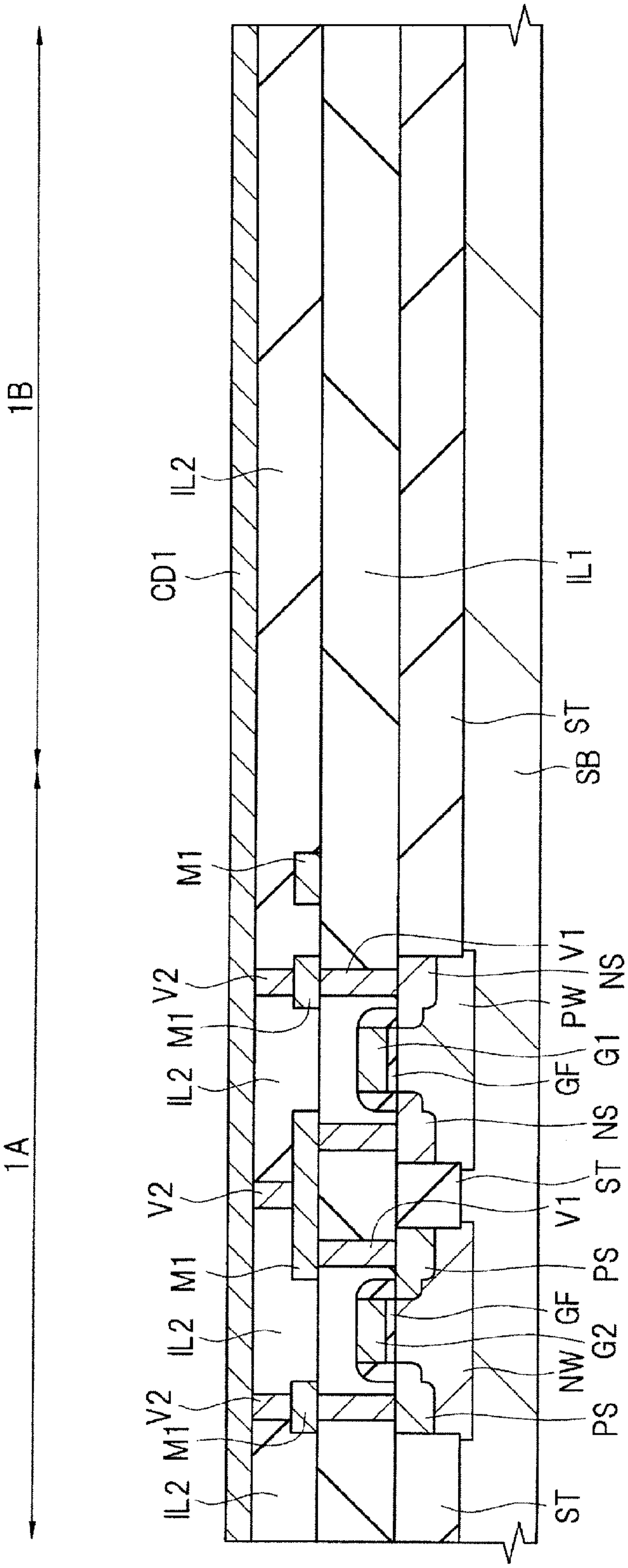
FIG. 19 is a main-portion cross-sectional view of the semiconductor device during a manufacturing step subsequent to that shown in FIG. 17.
Figure 20:
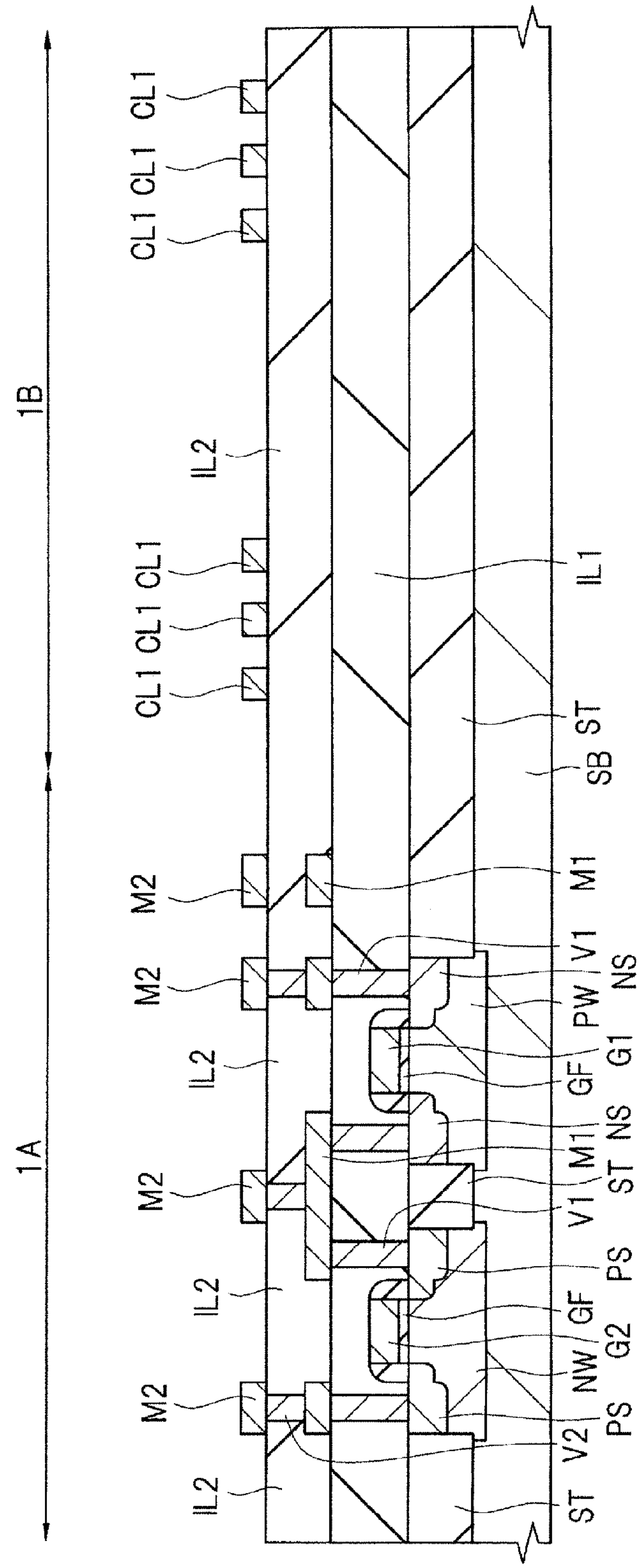
FIG. 20 is a main-portion cross-sectional view of the semiconductor device during a manufacturing step subsequent to that shown in FIG. 19.

Next, over the interlayer insulating film IL2 in which the via portions V2 are embedded, the wires M2 in the second wiring layer are formed. To form the wires M2, first, as shown in FIG. 19, over the interlayer insulating film IL2 in which the via portions V2 are embedded, the conductive film CD1 for the second wiring layer is formed. The conductive film CD1 is made of a multi-layer film including a barrier conductor film (e.g., a titanium film, a titanium nitride film, or a multi-layer film thereof), an aluminum film, and a barrier conductor film (e.g., a titanium film, a titanium nitride film, or a multi-layer film thereof) which are stacked successively in ascending order). The conductive film CD1 can be formed using a sputtering method or the like. The conductive film CD1 is the conductive film for the second wiring layer, but serves also as a conductive film for forming the coil CL1. Then, by patterning the conductive film CD1 using a photolithographic technique and an etching technique, the wires M2 and the coil CL1 can be formed, as shown in FIG. 20. Each of the wires M2 and the coil CL1 is made of the patterned conductive film CD1. The via portions V2 have the lower surfaces thereof in contact with the wires M1 to be electrically coupled to the wires M1, while having the upper surfaces thereof in contact with the wires M2 to be electrically coupled to the wires M2. That is, the via portions V2 electrically couple the wires M1 and M2 to each other.

Figure 21:
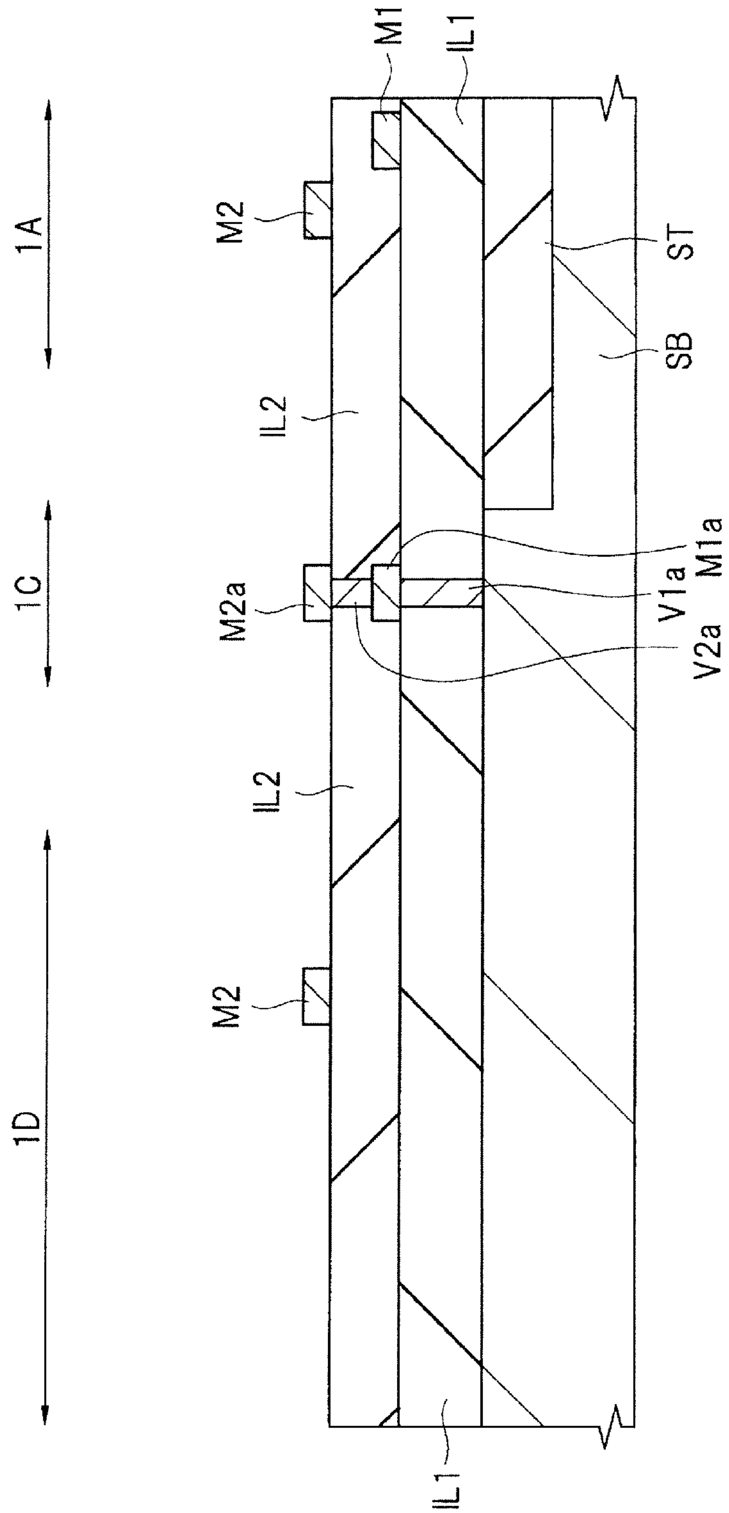
FIG. 21 is a main-portion cross-sectional view of the semiconductor device during the same manufacturing step as that shown in FIG. 20.

FIG. 21 corresponds to the same process stage as shown in FIG. 20. As shown in FIGS. 20 and 21, in the step of forming the wires M2, in the seal ring formation region 1C, the seal ring wire (metal pattern) M2*a* is formed. The seal ring wire M2*a* is formed at a position overlapping the seal ring via portion V2*a* in plan view.

Here, in the transformer formation region 1D, the coil CL1 and the wires M2 in the second wiring layer are formed in the same step to be included in the same layer. That is, when the conductive film CL1 for the second wiring layer is patterned, in the transformer formation region 1B, the coil CL1 is formed. In other words, the conductive film CD1 for the second wiring layer serves as each of the conductive film for forming the wires M2, the conductive film for forming the seal ring wire M2*a*, and the conductive film for forming the coil CL1. By forming the conductive film CD1 and then patterning the conductive film CD1 using a photolithographic technique and an etching technique, the wires M2 in the second wiring layer, the seal ring wire M2*a*, and the coil CL1 are formed.

The description has been given heretofore of the case where the via portions V2 and the wires M2 are formed in the different steps. In another embodiment, the via portions V2 and the wires M2 can also be formed in the same step. In this case, each of the via portions V2 is formed integrally with the wire M2 or the coil CL1. In this case, after the through holes for the via portions V2 are formed in the interlayer insulating film IL2, the conductive film CD1 is formed over the interlayer insulating film IL2 so as to be embedded in each of the through holes and then patterned using a photolithographic technique and an etching technique to form the wires M2 and the coil CL1. In this manner, the wires M2 and the coil CL1 are formed, while each of the via portions V2 is formed integrally with the wire M2 or the coil CL1. In this case, the seal ring via portion V2*a* is formed integrally with the seal ring wire M2*a*.

The description has also be given heretofore of the case where the wires M2 and the coil CL1 are formed by a method which patterns the conductive film. In another embodiment, the wires M2 and the coil CL1 can also be formed by a damascene method. In this case, by forming an insulating film over the interlayer insulating film IL2, then forming wire trenches in the insulating film, and embedding a conductive film in each of the wire trenches, the wires M2 as the embedded wires (e.g., embedded copper wires) and the coil CL1 can be formed. Alternatively, by forming the wire trenches in the interlayer insulating film IL2 and embedding a conductive film in each of the wire trenches, the wires M2 as the embedded wires (e.g., embedded copper wires) and the coil CL1 can also be formed. In this case, the seal ring wire M2*a* is also formed by a damascene method.

Figure 22:
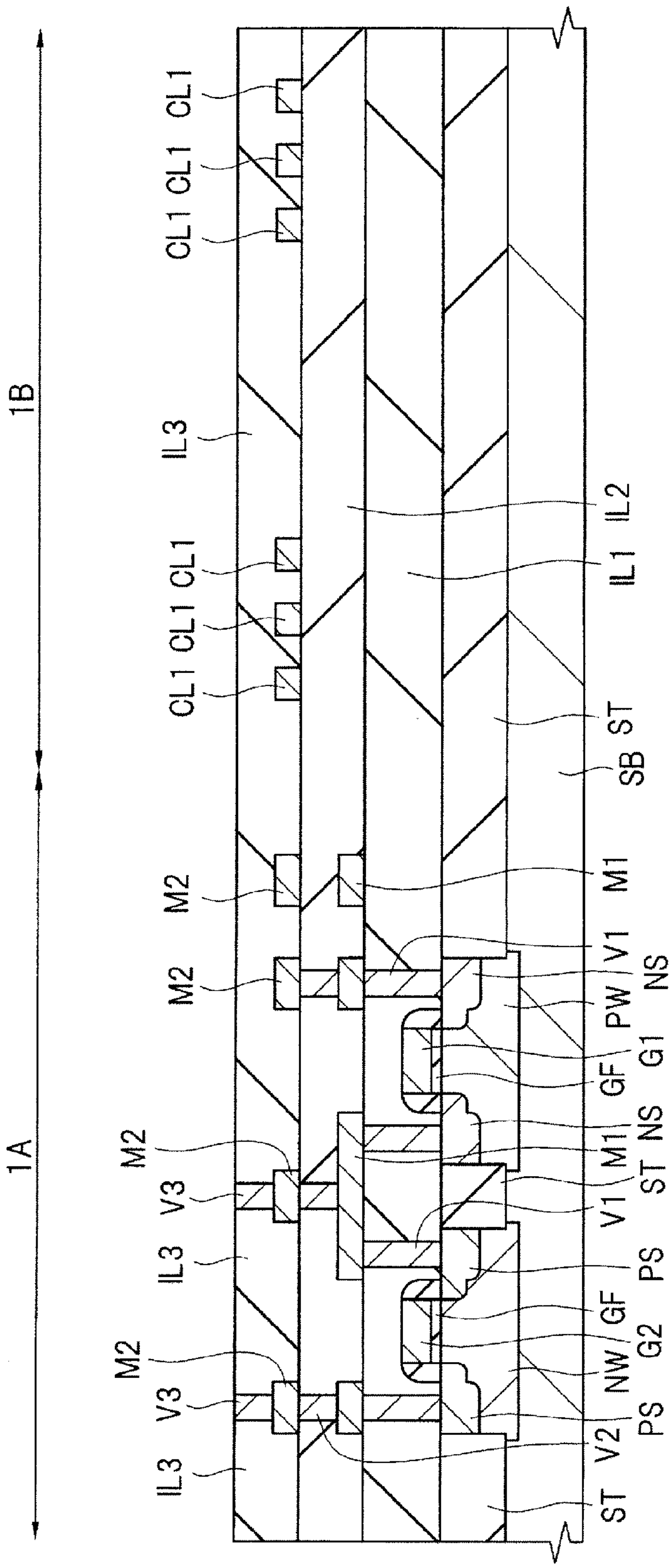
FIG. 22 is a main-portion cross-sectional view of the semiconductor device during a manufacturing step subsequent to that shown in FIG. 20.

Next, as shown in FIG. 22, over the main surface (entire main surface) of the semiconductor substrate SB, i.e., over the interlayer insulating film IL2, the interlayer insulating film IL3 is formed so as to cover the wire M2. The interlayer insulating film IL3 is made of a silicon dioxide film or the like and can be formed using a CVD method or the like. After the deposition of the interlayer insulating film IL3, it is also possible to subject the top surface (upper surface) of the interlayer insulating film IL3 to polishing using a CMP method or the like as necessary and enhance the planarity of the upper surface of the interlayer insulating film IL3.

Next, over the interlayer insulating film IL3, a photoresist layer (not shown) is formed using a photolithographic technique. Then, using the photoresist layer as an etching mask, the interlayer insulating film IL3 is subjected to dry etching to be formed with through holes (penetrating holes or bores). Then, in each of the through holes, a conductive film is embedded to form the conductive via portions (coupling conductor portions) V3. The via portions V3 can also be regarded as conductive plugs. The via portions V3 can be formed of the same conductive material as that of the via portions V2 by the same method.

Figure 23:
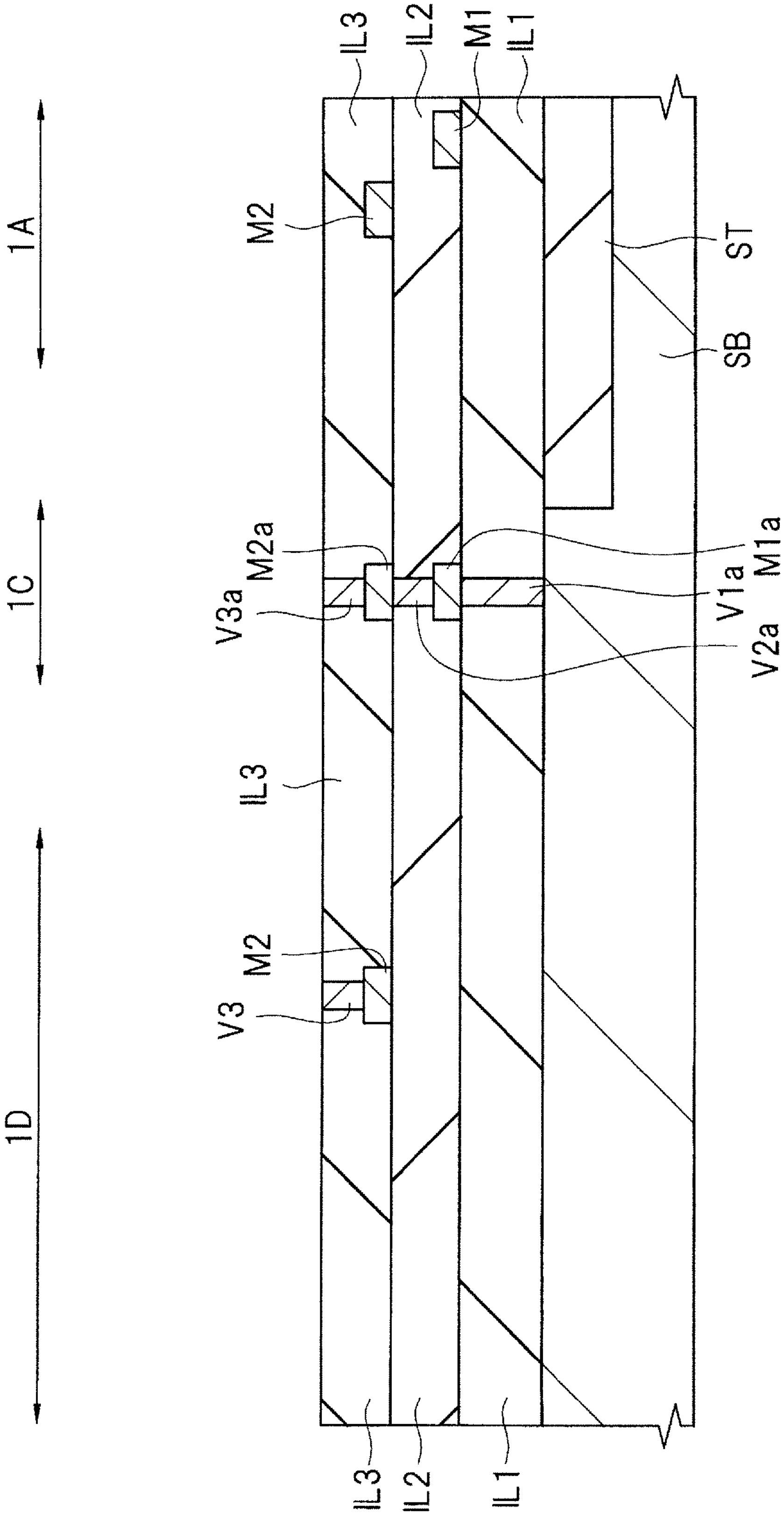
FIG. 23 is a main-portion cross-sectional view of the semiconductor device during the same manufacturing step as that shown in FIG. 22.

FIG. 23 corresponds to the same process stage as shown in FIG. 22. As shown in FIGS. 22 and 23, in the same step of forming the via portions V3, the seal ring via portion (metal pattern) V3*a* is formed in the seal ring formation region 1C. That is, in the step of forming the through holes for the via portions V3 in the interlayer insulating film IL3, in the seal ring formation region 1C, a trench for the via portion V3*a* is formed in the interlayer insulating film IL3. In the step of forming the via portions V3 in the through holes for the via portions V3, in the seal ring formation region 1C, the seal ring via portion V3*a* is formed in the trench for the via portion V3*a*. Consequently, the seal ring via portion V3*a* is embedded in the trench formed in the interlayer insulating film IL3. The seal ring via portion V3*a* is formed at a position overlapping the seal ring wire M2*a* in plan view.

Figure 24:
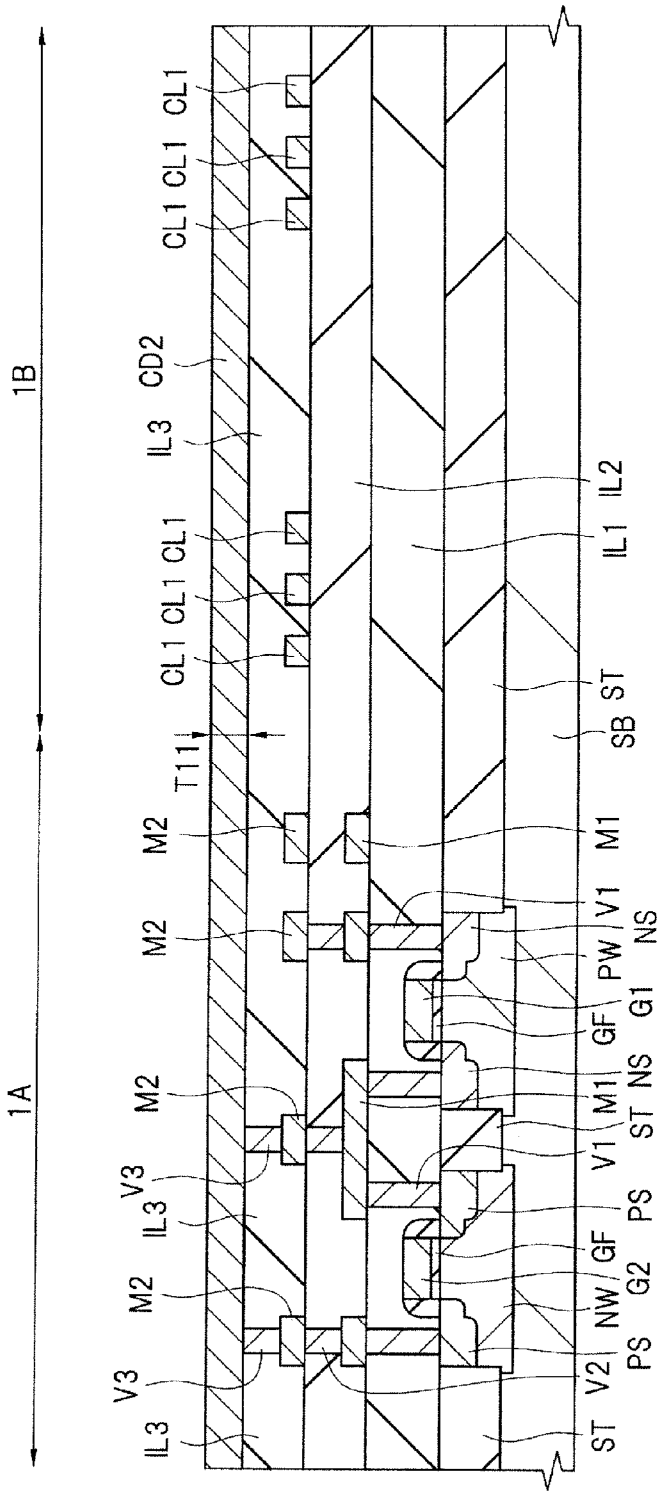
FIG. 24 is a main-portion cross-sectional view of the semiconductor device during a manufacturing step subsequent to that shown in FIG. 22.
Figure 25:
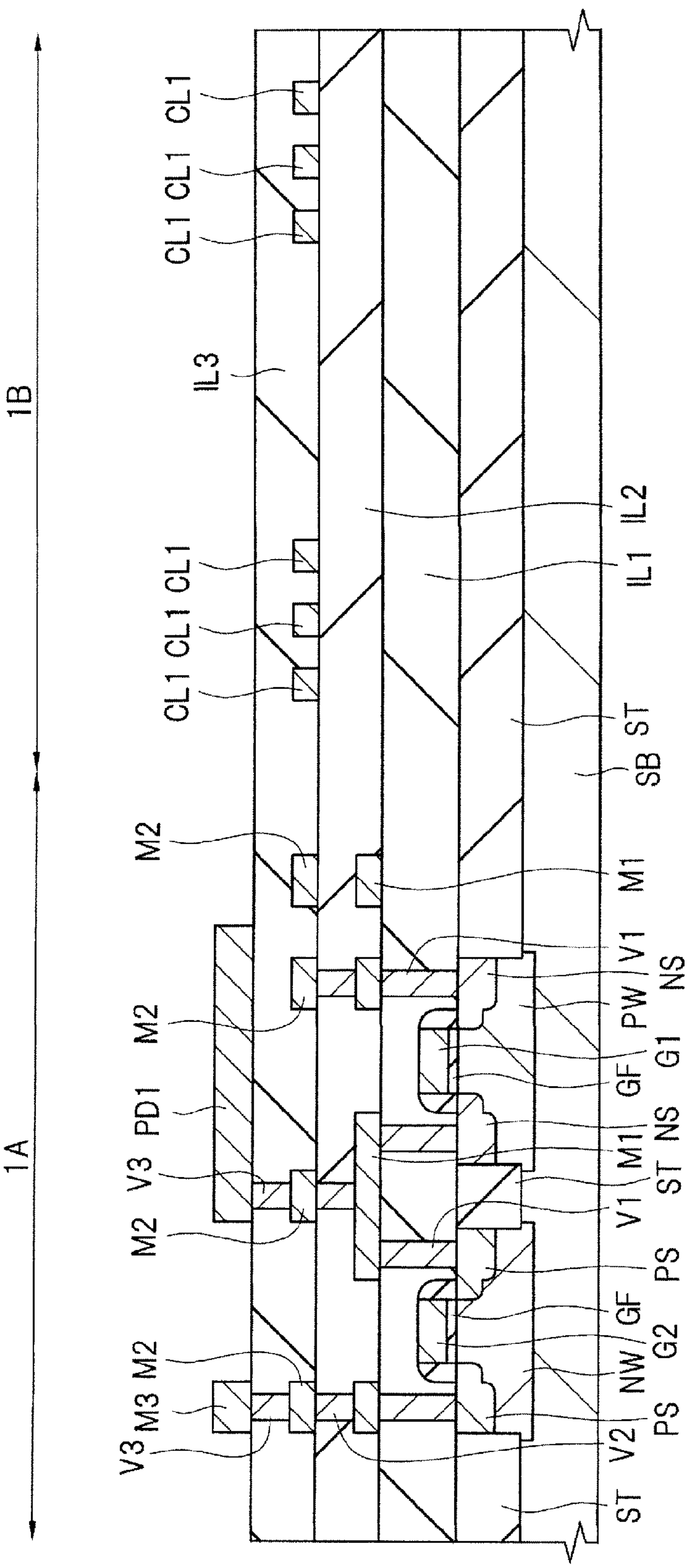
FIG. 25 is a main-portion cross-sectional view of the semiconductor device during a manufacturing step subsequent to that shown in FIG. 24.

Next, over the interlayer insulating film IL3 in which the via portions V3 are embedded, the wires M3 in the third wiring layer are formed. To form the wires M3, first, as shown in FIG. 24, over the interlayer insulating film IL3 in which the via portions V3 are embedded, the conductive film CD2 for the third wiring layer is formed. The conductive film CD2 is made of a multi-layer film including a barrier conductor film (e.g., a titanium film, a titanium nitride film, or a multi-layer film thereof), an aluminum film, and a barrier conductor film (e.g., a titanium film, a titanium nitride film, or a multi-layer film thereof) which are stacked successively in ascending order). The conductive film CD2 can be formed using a sputtering method or the like. The conductive film CD2 is the conductive film for the third wiring layer, but serves also as a conductive film for forming the pad PD1. Then, by patterning the conductive film CD2 using a photolithographic technique and an etching technique, the wires M3 and the pad PD1 can be formed, as shown in FIG. 25. Each of the wires M3 and the pad PD1 is made of the patterned conductive film CD2. The via portions V3 have the lower surfaces thereof in contact with the wires M2 to be electrically coupled to the wires M2, while having' the upper surfaces thereof in contact with the wires M3 and the pad PD1 to be electrically coupled to the wires M3 or the pad PD1. That is, the via portions V3 electrically couple the wires M2 and M3 to each other or electrically couples the wire M2 to the pad PD1.

Figure 26:
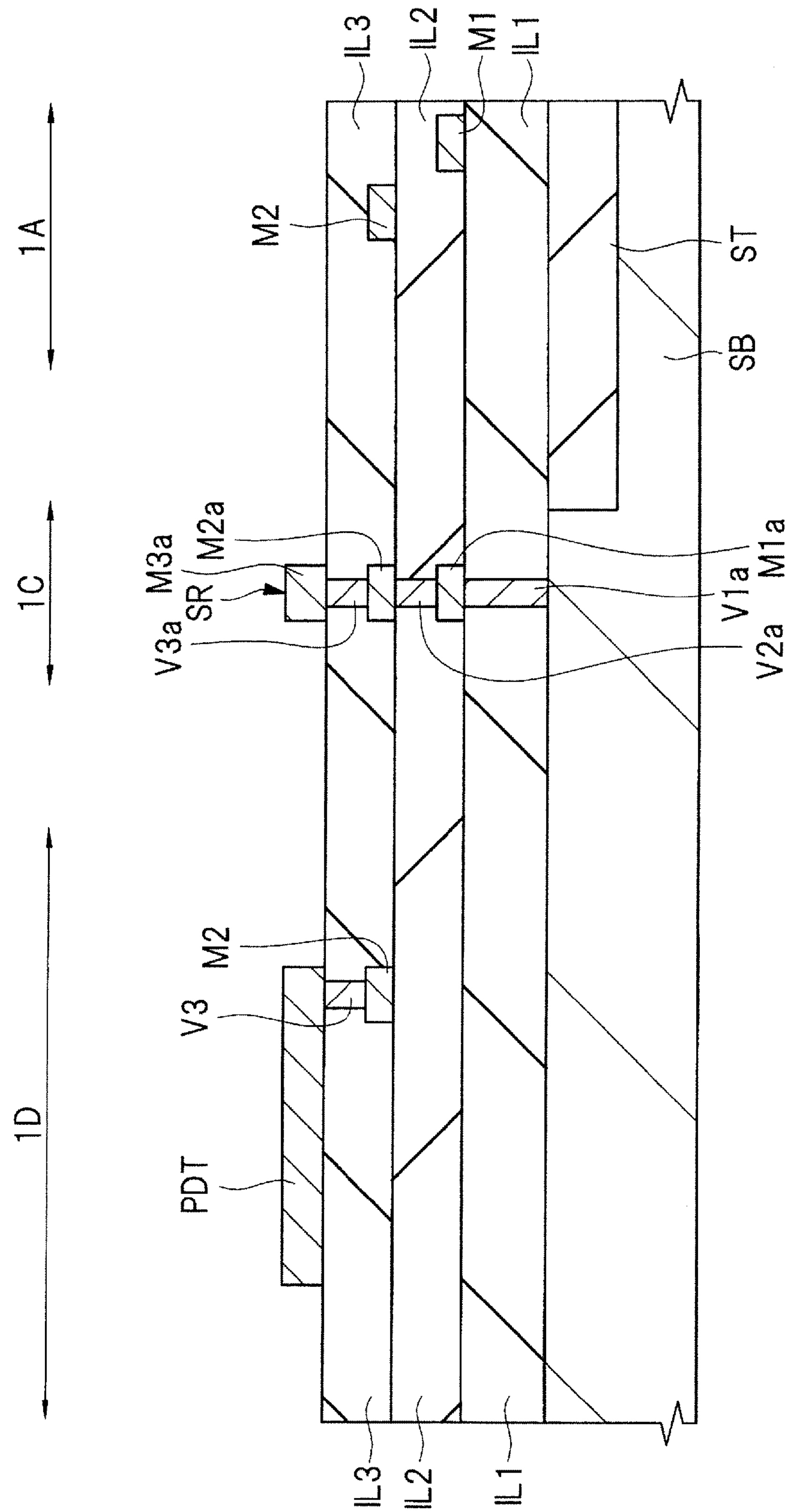
FIG. 26 is a main-portion cross-sectional view of the semiconductor device during the same manufacturing step as that shown in FIG. 25.

FIG. 26 corresponds to the same process stage as shown in FIG. 25. As shown in FIGS. 25 and 26, in the step of forming the wires M3, in the seal ring formation region 1C, the seal ring wire (metal pattern) M3*a* is formed. The seal ring wire M3*a* is formed at a position overlapping the seal ring via portion V3*a* in plan view. In the seal ring formation region 1C, the seal ring wires M3*a*, M2*a*, and M1*a*, the seal ring via portions V3*a* and V2*a*, and the seal ring plug V1*a* form the seal ring SR.

The description has been given heretofore of the case where the via portions V3 and the wires M3 are formed in the different steps. In another embodiment, the via portions V3, the wires M3, and the pad PD1 can also be formed in the same step. In this case, each of the via portions V3 is formed integrally with the wire M3 or the pad PD1. In this case, after the through holes for the via portions V3 are formed in the interlayer insulating film IL3, the conductive film CD2 is formed over the interlayer insulating film IL3 so as to be embedded in each of the through holes and then patterned using a photolithographic technique and an etching technique to form the wires M3 and the pad PD1. In this manner, the wires M3 and the pad PD1 are formed, while each of the via portions V3 is formed integrally with the wire M3 or the pad PD1. In this case, the seal ring via portion V3*a* is formed integrally with the seal ring wire M3*a*.

The pad PD1 can have a generally rectangular two-dimensional shape having four sides each larger than the wire width of each of the wires M3. The pad PD1 is preferably an aluminum pad containing aluminum as a main component. The wires M3 are preferably aluminum wires each containing aluminum as a main component.

Note that, as the aluminum film used for each of the aluminum pad and the aluminum wires, a compound film or alloy film of Al (aluminum) and Si (silicon), a compound film or alloy film of Al (aluminum) and Cu (copper), a compound film or alloy film of Al (aluminum), Si (silicon), and Cu (copper), or the like can be used appropriately. The composition ratio of Al (aluminum) is preferably higher than 50 at % (i.e., the aluminum film is Al-rich).

In the step of forming the wires M3 and the pad PD1, as shown in FIG. 26, a test pad PDT is formed in the scribe region 1D. Note that the pad PD1 is formed in the chip region, not in the scribe region 1D, while the test pad PDT is formed in the scribe region 1D, not in the chip region.

The test pad PDT, the wires M3, and the pad PD1 are formed of the same material and in the same step to be included in the same layer. Specifically, the foregoing conductive film CD2 serves as each of the conductive film for forming the wires M3, the conductive film for forming the pad PD1, the conductive film for forming the seal ring wire M3*a*, and the conductive film for forming the test pad PDT. The foregoing conductive film CD2 is formed and then patterned using a photolithographic technique and an etching technique to form the wires M3, the pad PD1, and the seal ring wire M3*a* in the chip region and also form the test pad PDT in the scribe region 1D. As a result, similarly to the wires M3, the pad PD1, and the seal ring wire M3*a*, the test pad PDT is also made of the patterned conductive film CD2. The via portion V3 is provided also under the test pad PDT. The test pad PDT is electrically coupled to the wire M2 via the via portion V3 located under the test pad PDT, while the wire M2 is led from the scribe region 1D into the chip region. Note that, in the region where the wire M2 coupled to the test pad PDT via the via portion V3 laterally traverses the seal ring formation region 1C, the seal ring wire M2*a* and the via portion V2*a* and V3*a* are kept from being formed. This can prevent the wire M2 coupled to the test pad PDT from being short-circuited to the seal ring SR.

The test pad PDT can have a generally rectangular two-dimensional shape having four sides each larger than the wire width of each of the wires M3. Since each of the wires M3, the pad PD1, and the test pad PDT is formed of the same conductive film, when the wires M3 are aluminum wires each containing aluminum as a main component, the pad PD1 is an aluminum pad containing aluminum as a main component, and the test pad PDT is also an aluminum pad containing aluminum as a main component.

Figure 27:
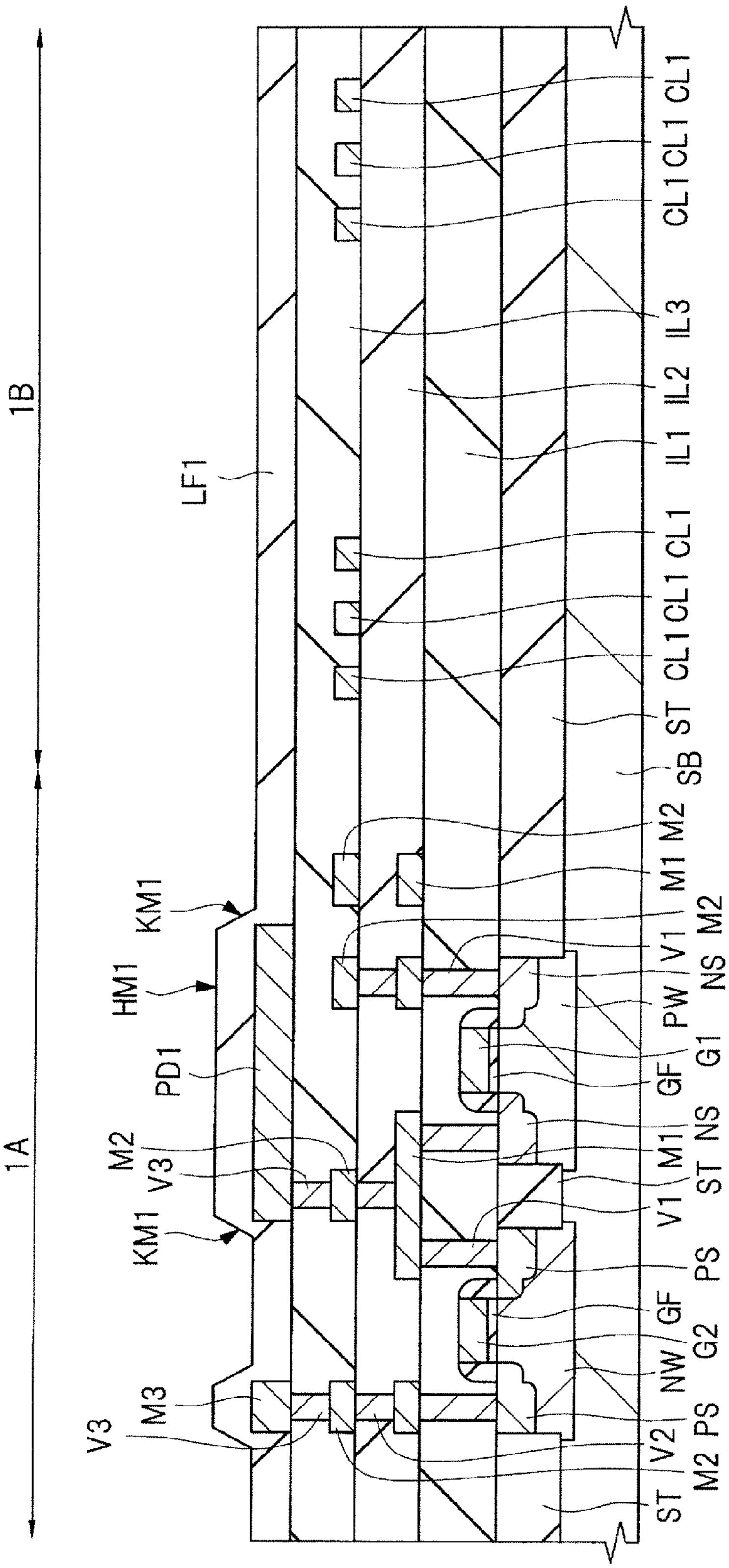
FIG. 27 is a main-portion cross-sectional view of the semiconductor device during a manufacturing step subsequent to that shown in FIG. 25.
Figure 28:
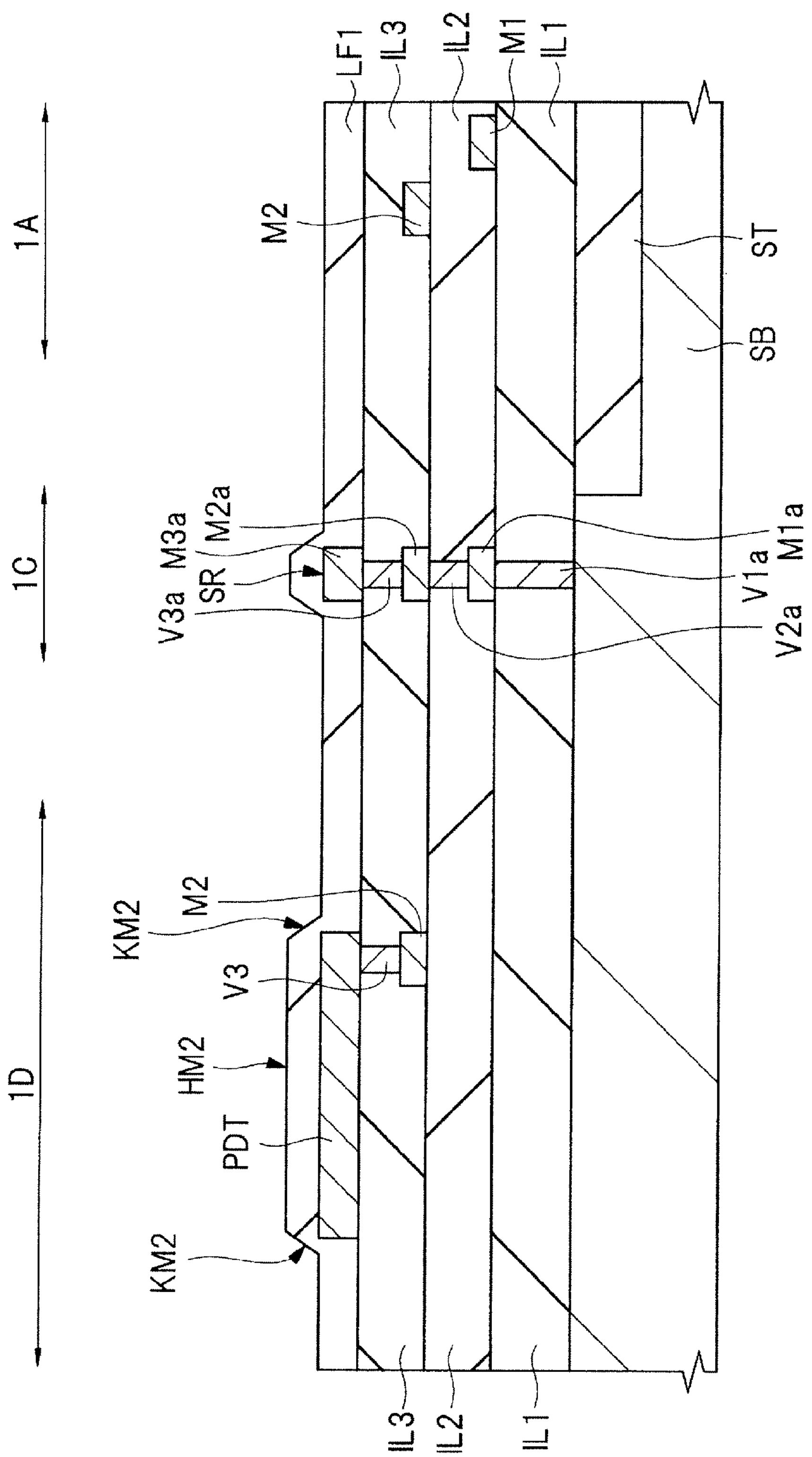
FIG. 28 is a main-portion cross-sectional view of the semiconductor device during the same manufacturing step as that shown in FIG. 27.

Next, as shown in FIGS. 27 and 28, over the main surface (entire main surface) of the semiconductor substrate SB, i.e., over the interlayer insulating film IL3, the silicon dioxide film LF1 is formed so as to cover the wires M3 and M3*a* and the pads PD1 and PDT. The silicon dioxide film LF1 can be formed by a CVD method or the like. As a method of depositing the silicon dioxide film LF1, an HDP-CVD method (where HDP stands for High Density Plasma) is particularly appropriate. The thickness of the silicon dioxide film LF1 (formed film thickness) can be controlled to, e.g., about 1 to 6 μm.

At the stage prior to the deposition of the silicon dioxide film LF1, the wires M3 and M3*a* and the pads PD1 and PDT are exposed. However, when the silicon dioxide film LF1 is deposited, the wires M3 and M3*a* and the pads PD1 and PDT are covered with the silicon dioxide film LF1. This brings each of the wires M3 and M3*a* and the pads PD1 and PDT into an unexposed state.

Next, in the silicon dioxide film LF1, the openings OP1*a* and OPTa are formed. The openings OP1*a* and OPTa are formed by selectively removing the silicon dioxide film LF1 over the pad PD1. The opening OP1*a* is formed so as to be included in the pad PD1 in plan view. The opening OPTa is formed so as to be included in the pad PDT in plan view.

Figure 29:
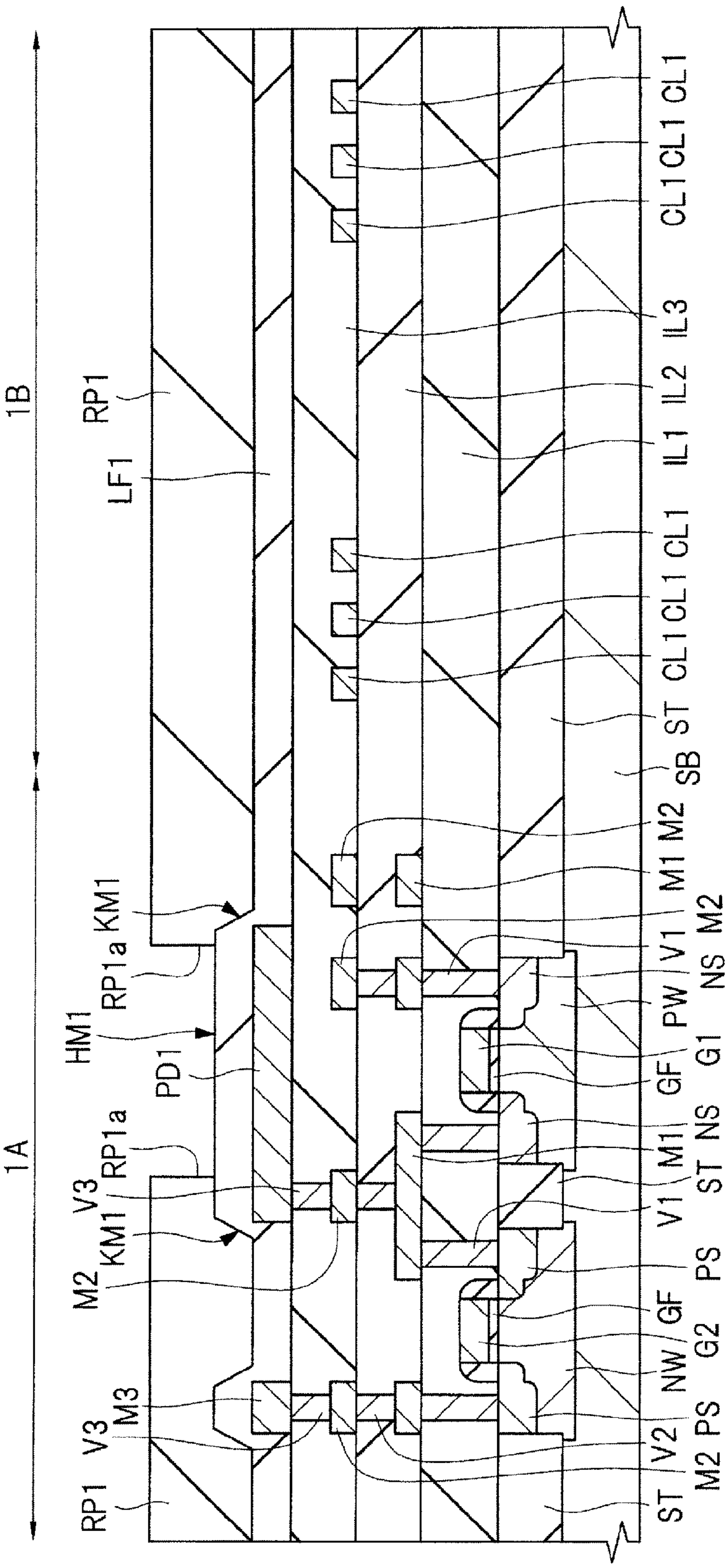
FIG. 29 is a main-portion cross-sectional view of the semiconductor device during a manufacturing step subsequent to that shown in FIG. 27.
Figure 30:
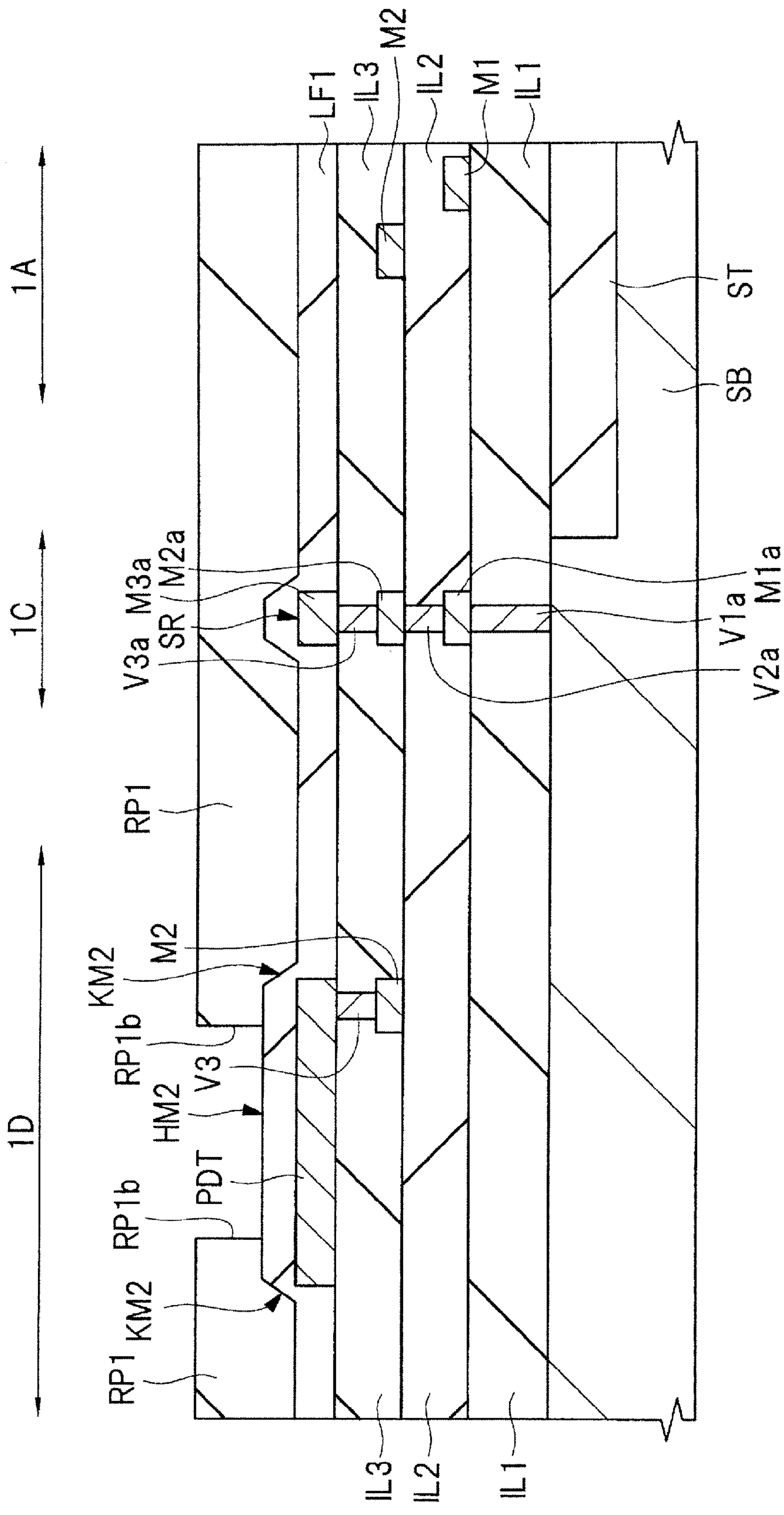
FIG. 30 is a main-portion cross-sectional view of the semiconductor device during the same manufacturing step as that shown in FIG. 29.
Figure 31:
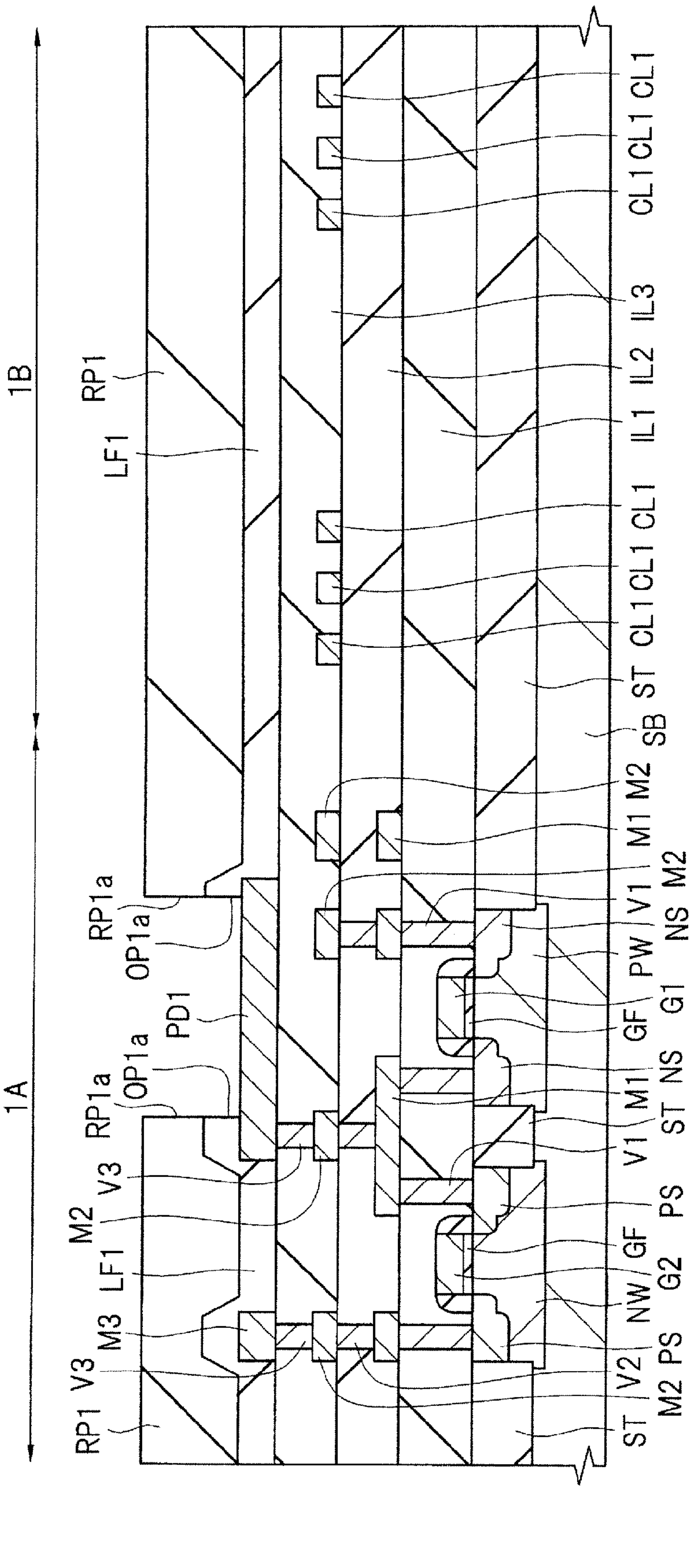
FIG. 31 is a main-portion cross-sectional view of the semiconductor device during a manufacturing step subsequent to that shown in FIG. 29.
Figure 32:
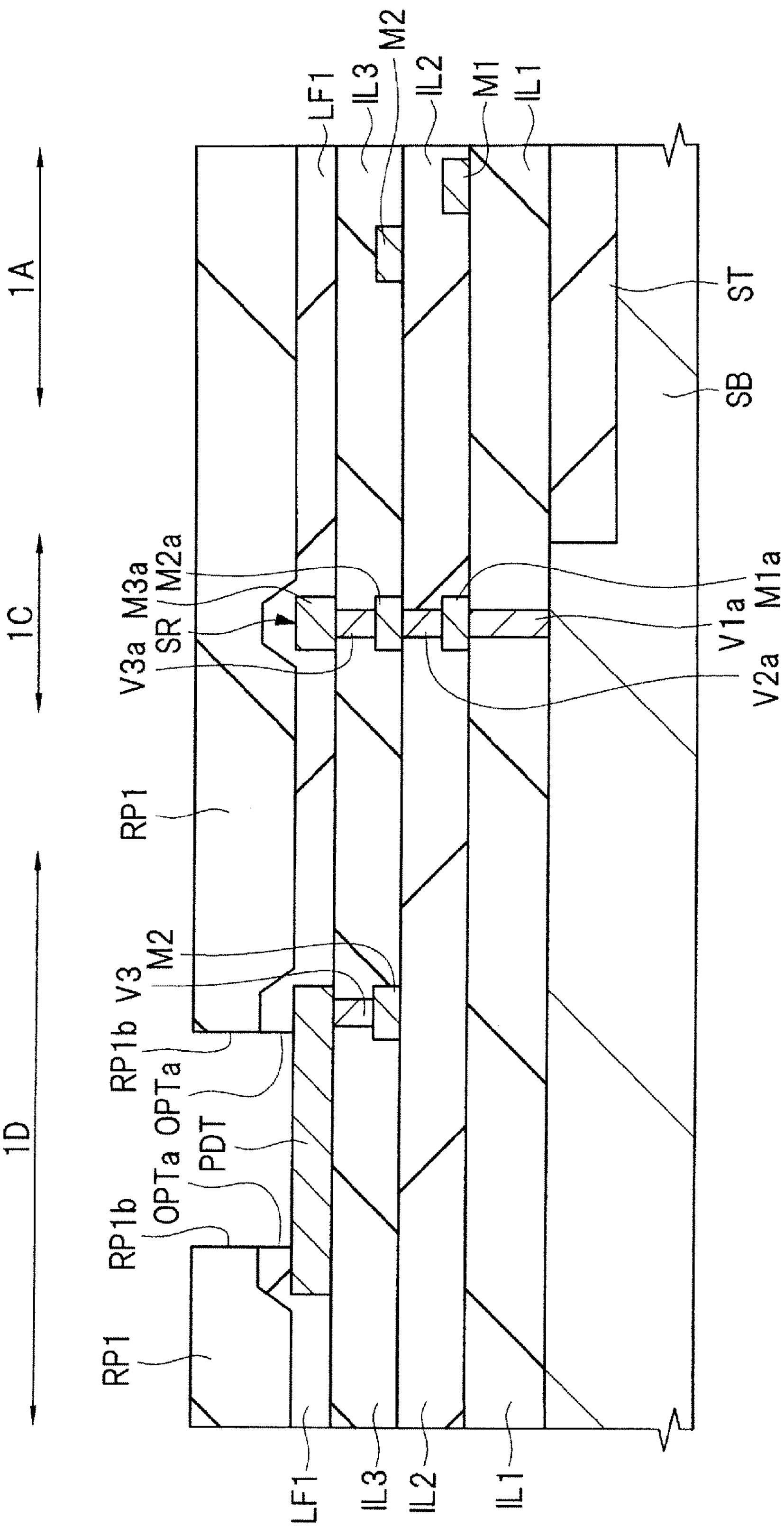
FIG. 32 is a main-portion cross-sectional view of the semiconductor device during the same manufacturing step as that shown in FIG. 31.
Figure 33:
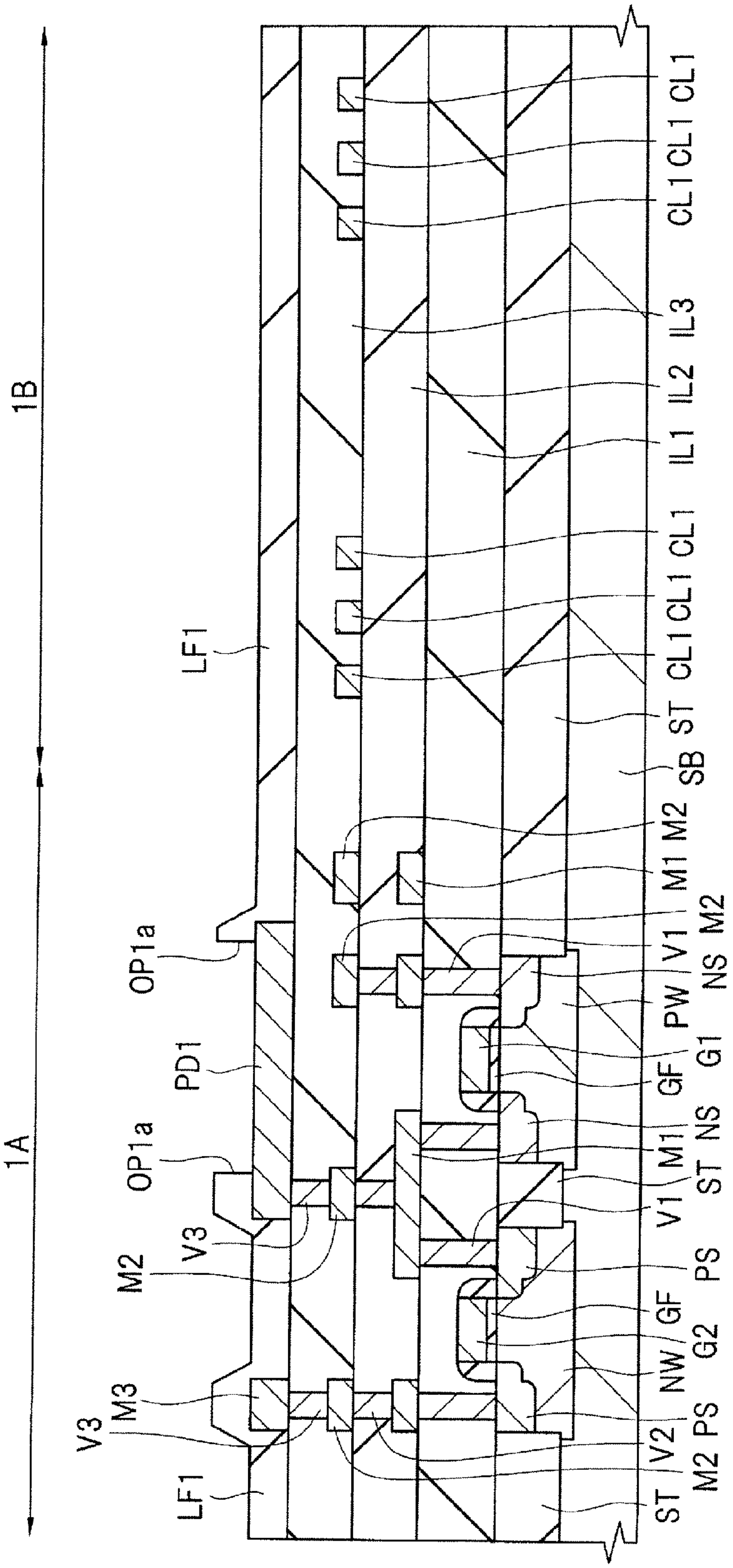
FIG. 33 is a main-portion cross-sectional view of the semiconductor device during a manufacturing step subsequent to that shown in FIG. 31.
Figure 34:
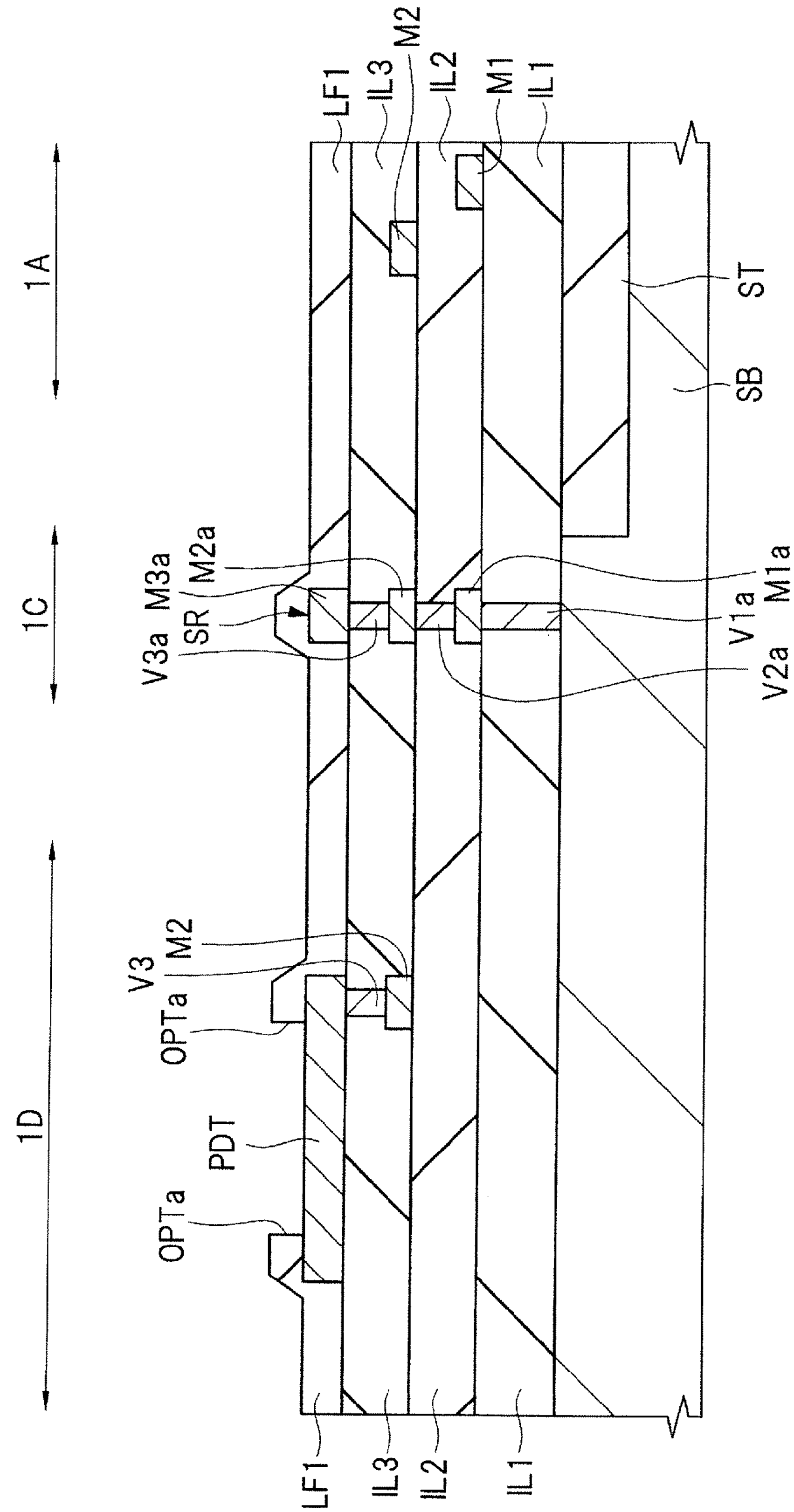
FIG. 34 is a main-portion cross-sectional view of the semiconductor device during the same manufacturing step as that shown in FIG. 33.

The openings OP1*a* and OPTa can be formed as follows. That is, after the silicon dioxide film LF1 is deposited, as shown in FIGS. 29 and 30, a resist pattern (photoresist pattern or mask layer) RP1 is formed over the silicon dioxide film LF1 using a photolithographic technique. Then, as shown in FIGS. 31 and 32, using the resist pattern RP1 as an etching mask, the silicon dioxide film LF1 is etched (dry-etched) to form the silicon dioxide film LF1 with the openings OP1*a* and OPTa. Then, the resist pattern RP1 is removed. This stage is shown in FIGS. 33 and 34.

The resist pattern RP1 has an opening RP1*a* for forming the opening OP1*a*, and an opening RP1*b* for forming the opening OPTa. The silicon dioxide film LF1 exposed from the opening RP1*a* of the resist pattern PR1 is etched and removed, resulting in the formation of the opening OP1*a* in the silicon dioxide film LF1. The silicon dioxide film LF1 exposed from the opening RP1*b* of the resist pattern RP1 is removed by etching, resulting in the formation of the opening OPTa in the silicon dioxide film LF1. As a result, the opening OP1*a* of the silicon dioxide film LF1 is formed by alignment with the opening RP1*a* of the resist pattern RP1, and the opening OPTa of the silicon dioxide film LF1 is formed by alignment with the opening RP1*b* of the resist pattern RP1.

The opening OP1*a* is formed so as to extend through the silicon dioxide film LF1. From the opening OP1*a*, at least a portion of the pad PD1 is exposed. The opening OPTa is also formed so as to extend through the silicon dioxide film LF1. From the opening OPTa, at least a portion of the pad PDT is exposed.

When the opening OP1*a* is formed in the silicon dioxide film LF1, the pad PD1 is exposed from the opening OP1 of the silicon dioxide film LF1. At this time, it is preferable that at least a portion of the upper surface of the pad PD1 is exposed from the opening OP1*a* of the silicon dioxide film LF1, and the side surfaces (side walls) of the pad PD1 are covered with the silicon dioxide film LF1 without being exposed from the opening OP1*a* of the silicon dioxide film LF1. That is, it is preferable that, in plan view, the opening OP1*a* of the silicon dioxide film LF1 overlaps the pad PD1, and the opening OP1*a* of the silicon dioxide film LF1 is included in the pad PD1. In other words, it is preferable that the outer periphery of the opening OP1*a* of the silicon dioxide film LF1 is located inside the outer periphery of the pad PD1.

When the opening OPTa is formed in the silicon dioxide film LF1, the test pad PDT is exposed from the opening OPTa of the silicon dioxide film LF1. At this time, it is preferable that at least a portion of the upper surface of the test pad PDT is exposed from the opening OPTa of the silicon dioxide film LF1, and the side surfaces (side walls) of the test pad PDT are covered with the silicon dioxide film LF1 without being exposed from the opening OPTa of the silicon dioxide film LF1. That is, it is preferable that, in plan view, the opening OPTa of the silicon dioxide film LF1 overlaps the test pad PDT, and the opening OPTa of the silicon dioxide film LF1 is included in the pad PDT. In other words, it is preferable that the outer periphery of the opening OPTa of the silicon dioxide film LF1 is located inside the outer periphery of the test pad PDT.

When the openings OP1*a* and OPTa are formed in the silicon dioxide film LF1, the pad PD1 is exposed from the opening OP1*a* of the silicon dioxide film LF1, and the pad PDT is exposed from the opening OPTa of the silicon dioxide film LF1. However, since the state where the wires M3 and the seal ring wire M3*a* other than the pads PD1 and PDT are covered with the silicon dioxide film LF1 is maintained, the wires M3 and the seal ring wire M3a are not exposed. Since the state where the wires M3 and the seal ring wire M3a other than the pads PD1 and PDT are covered with the silicon dioxide film LF1 is maintained thereafter, the wires M3 and the seal ring wire M3a are not exposed.

Note that "in plan view" refers to the case where a target object is viewed in a plane parallel with the main surface of the semiconductor substrate SB.

Figure 35:
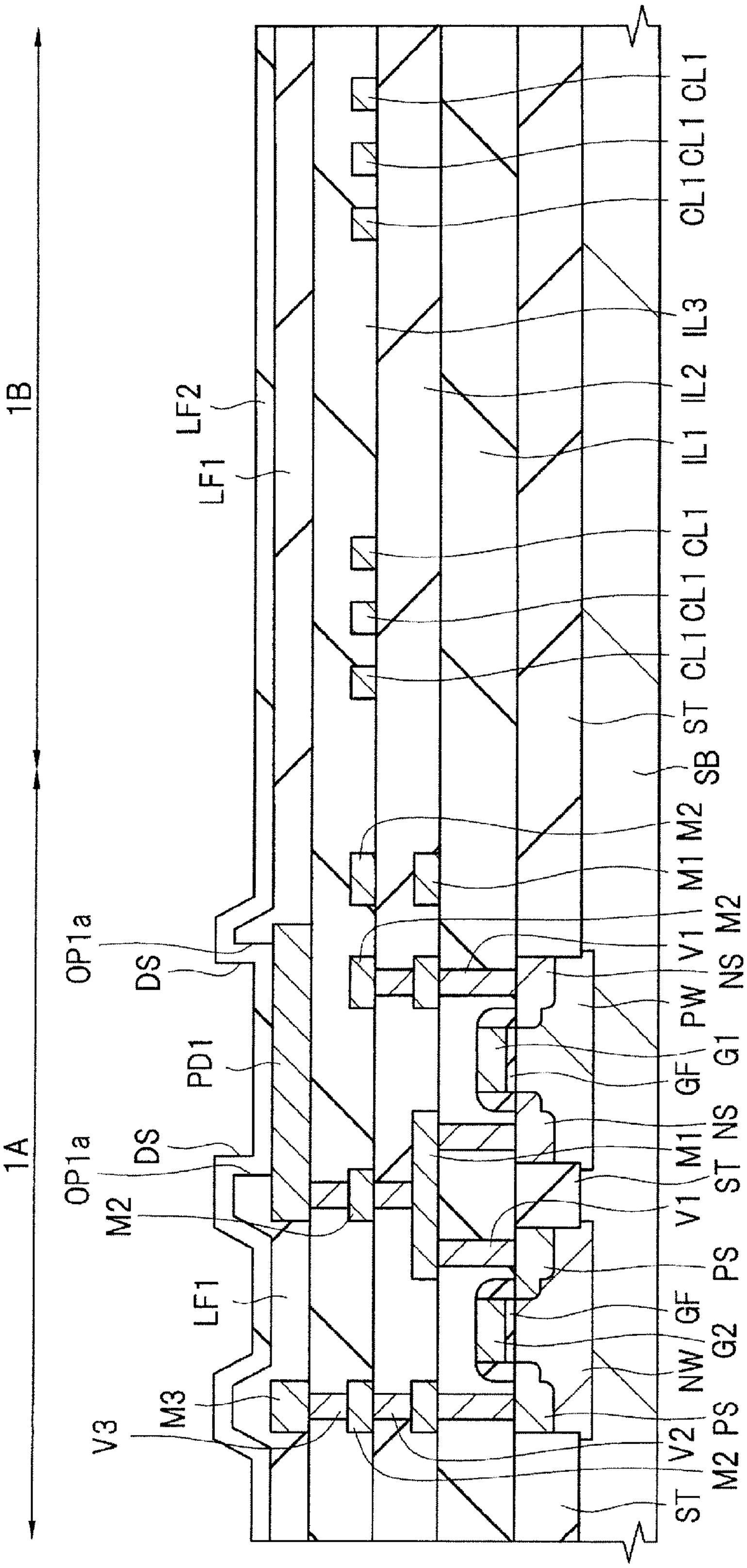
FIG. 35 is a main-portion cross-sectional view of the semiconductor device during a manufacturing step subsequent to that shown in FIG. 33.
Figure 36:
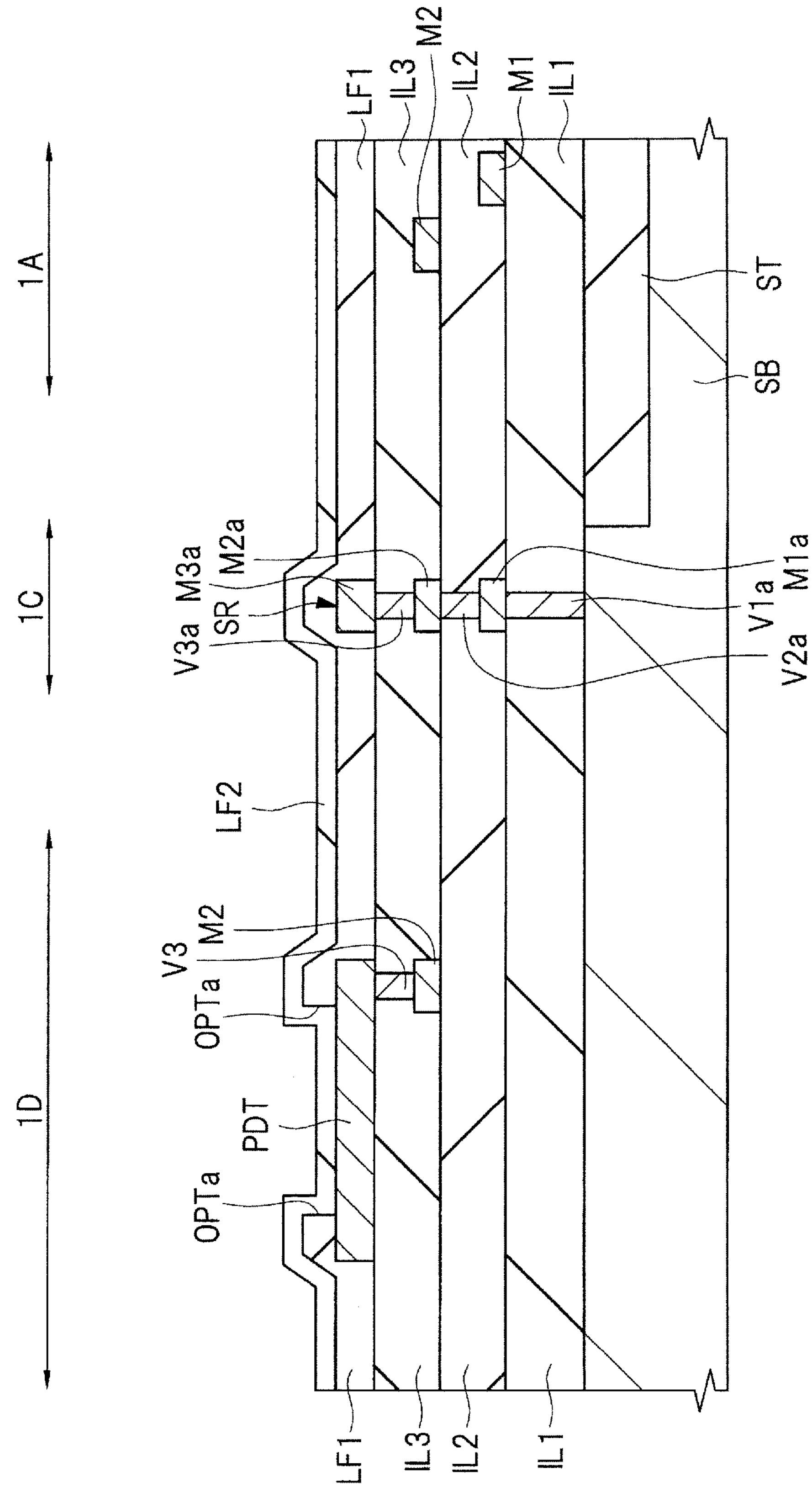
FIG. 36 is a main-portion cross-sectional view of the semiconductor device during the same manufacturing step as that shown in FIG. 35.

Next, as shown in FIGS. 35 and 36, over the main surface (entire main surface) of the semiconductor substrate SB, i.e., over the silicon dioxide film LF1, the silicon nitride film LF2 is formed so as to cover the pads PD1 and PDT. The silicon nitride film LF2 can be formed by a CVD method or the like. As a method of depositing the silicon nitride film LF2, a plasma CVD method is particularly appropriate. The thickness of the silicon nitride film LF2 (formed film thickness) can be controlled to, e.g., about 0.5 to 3 μm.

Since the silicon nitride film LF2 is formed over the entire main surface of the semiconductor substrate SD, the silicon nitride film LF2 is consequently formed over the silicon dioxide film LF1, the pad PD1 exposed from the opening OP1a of the silicon dioxide film LF1, and the test pad PDT exposed from the opening OPTa of the silicon dioxide film LF1. At the stage prior to the deposition of the silicon nitride film LF2, the pad PD1 is exposed from the opening OP1a of the silicon dioxide film LF1. However, when the silicon nitride film LF2 is deposited, the pad PD1 exposed from the opening OP1a of the silicon dioxide film LF1 is covered with the silicon nitride film LF2. This brings the pad PD1 into an unexposed state. Also, at the stage prior to the deposition of the silicon nitride film LF2, the test pad PDT is exposed from the opening OPTa of the silicon dioxide film LF1. However, when the silicon nitride film LF2 is deposited, the test pad PDT exposed from the opening OPTa of the silicon dioxide film LF1 is covered with the silicon nitride film LF2. This brings the test pad PDT into an unexposed state.

Next, in the silicon nitride film LF2, the opening OP1b is formed. The opening OP1b is formed by selectively removing the silicon nitride film LF2 over the pad PD1. The opening OP1b is formed so as to be included in the pad PD1 in plan view.

Figure 37:
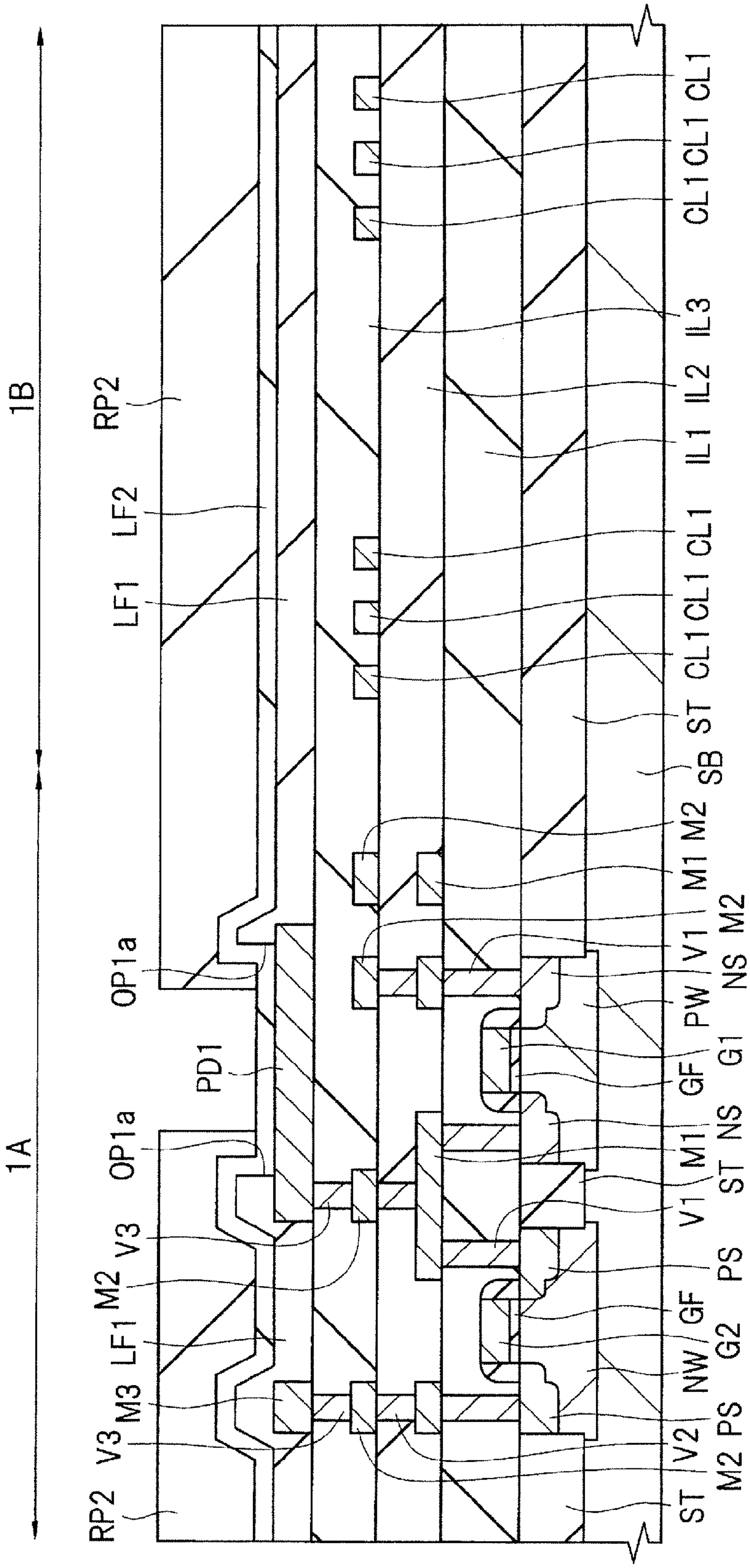
FIG. 37 is a main-portion cross-sectional view of the semiconductor device during a manufacturing step subsequent to that shown in FIG. 35.
Figure 38:
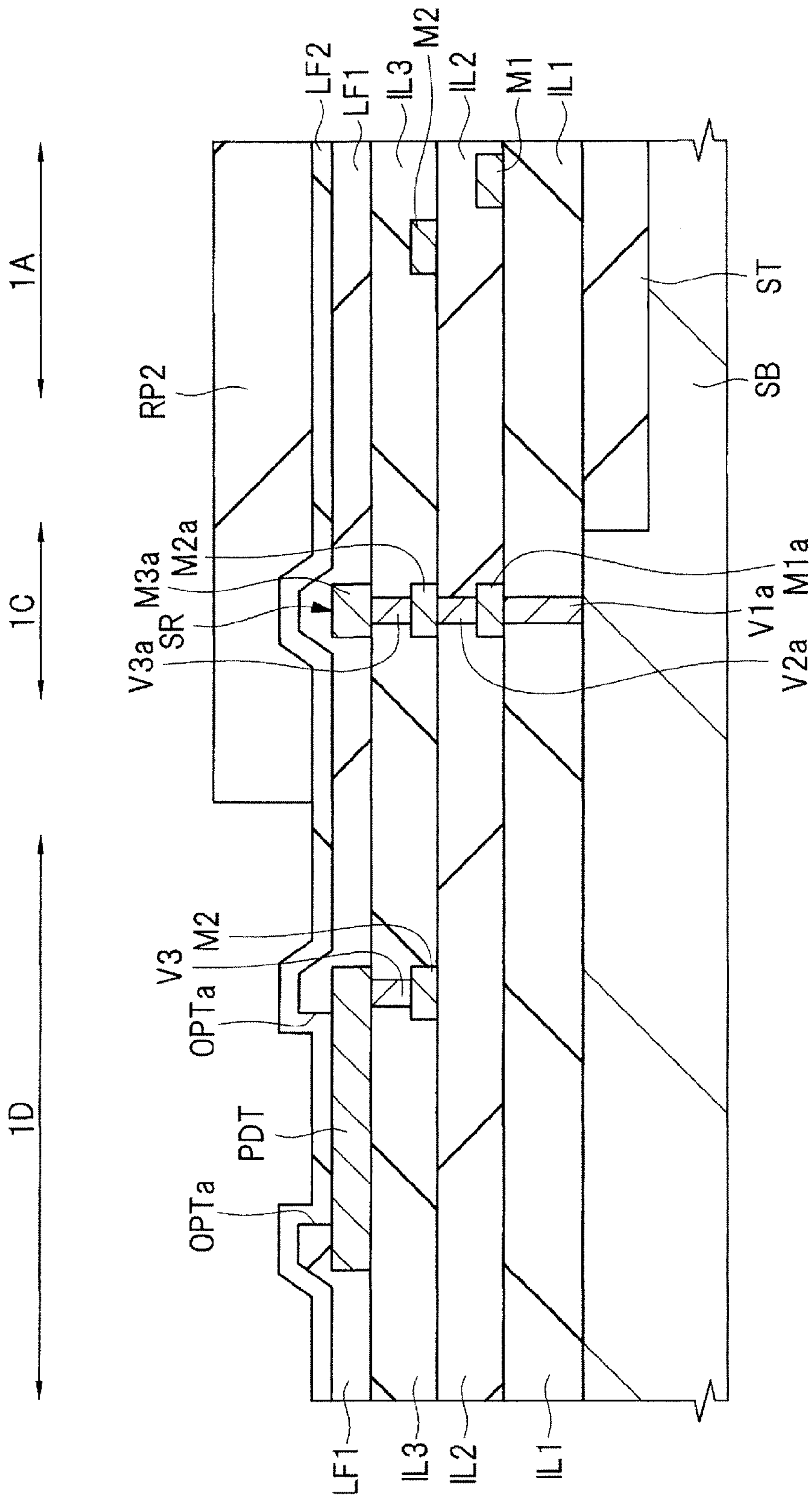
FIG. 38 is a main-portion cross-sectional view of the semiconductor device during the same manufacturing step as that shown in FIG. 37.
Figure 39:
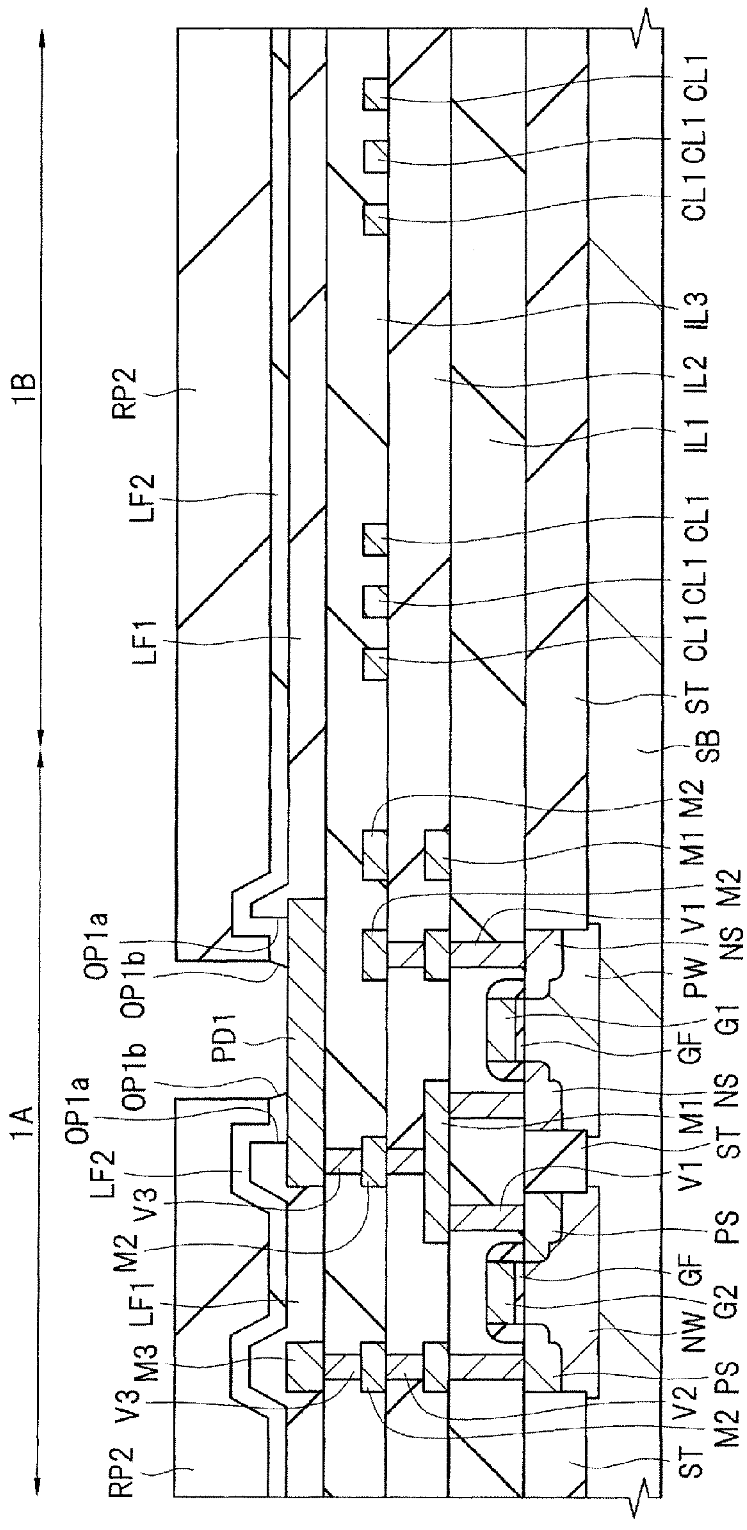
FIG. 39 is a main-portion cross-sectional view of the semiconductor device during a manufacturing step subsequent to that shown in FIG. 37.
Figure 40:
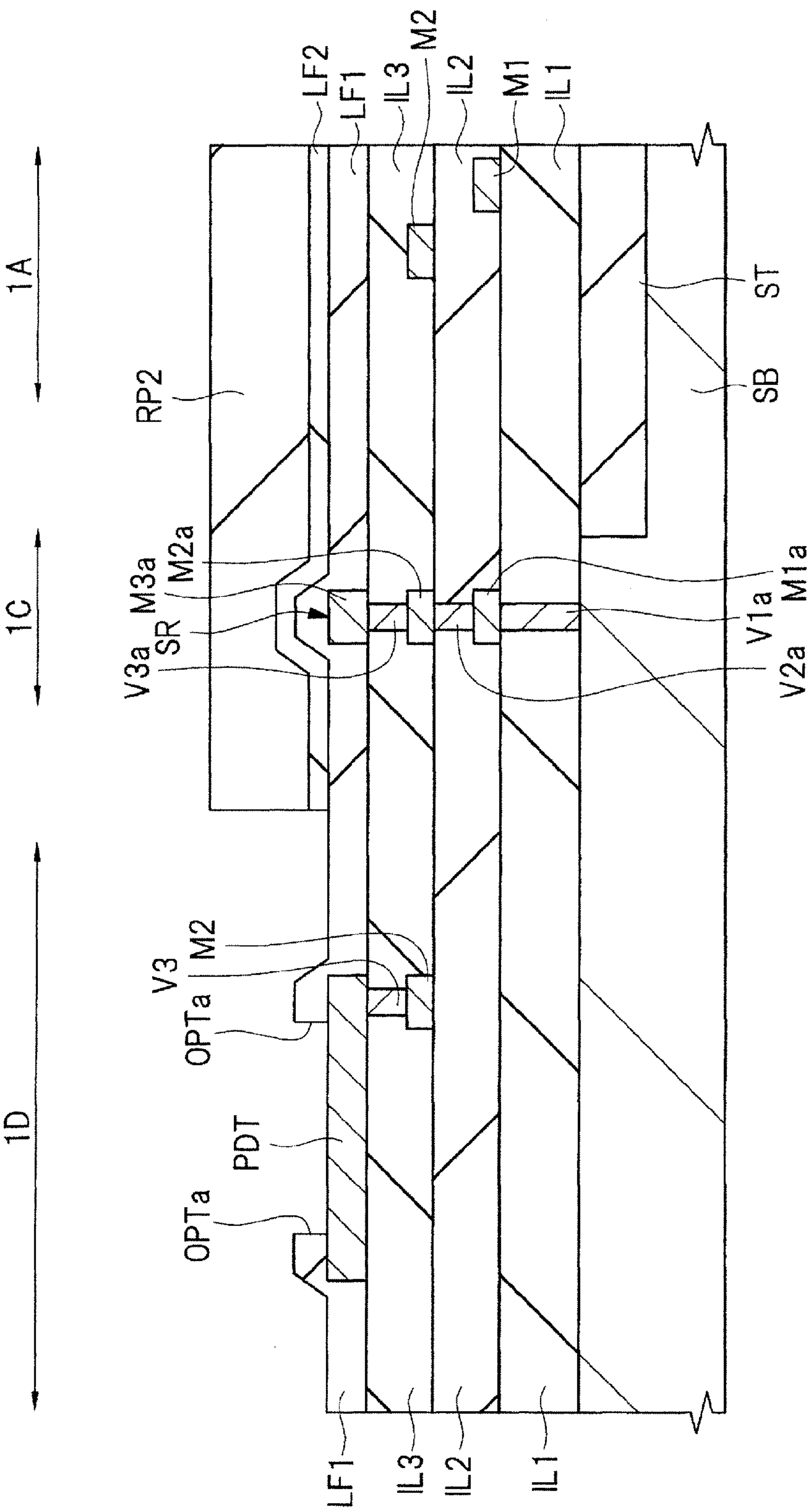
FIG. 40 is a main-portion cross-sectional view of the semiconductor device during the same manufacturing step as that shown in FIG. 39.
Figure 41:
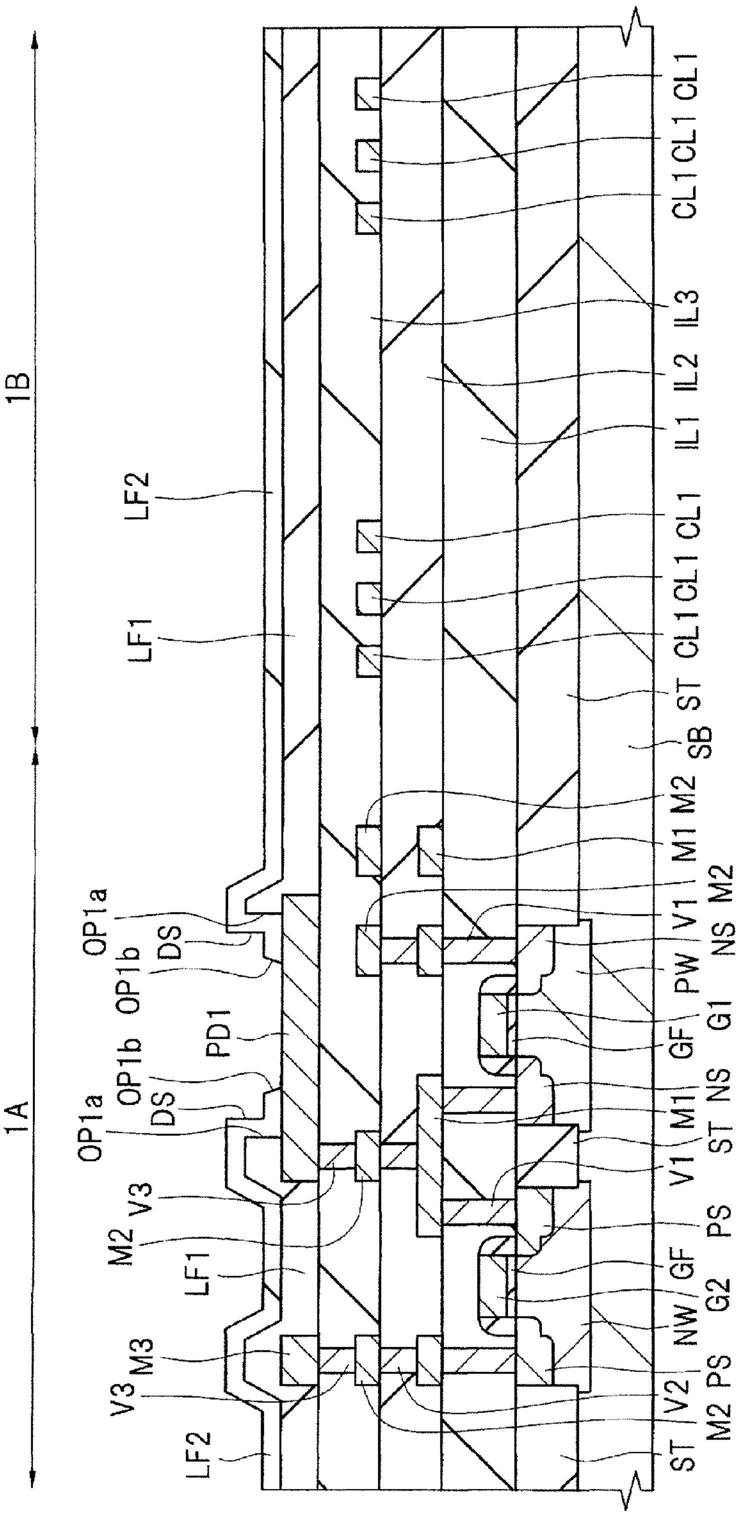
FIG. 41 is a main-portion cross-sectional view of the semiconductor device during a manufacturing step subsequent to that shown in FIG. 39.
Figure 42:
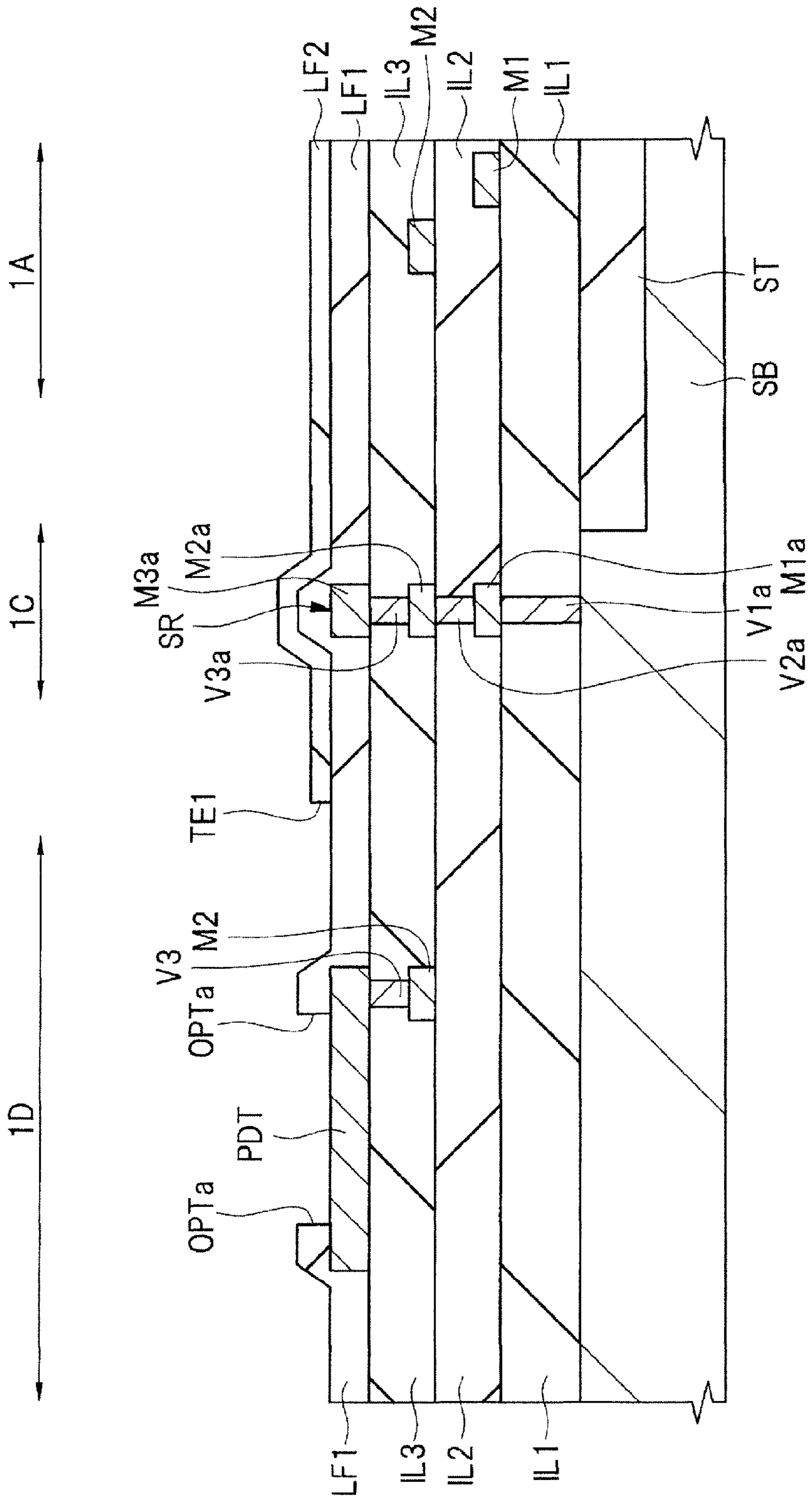
FIG. 42 is a main-portion cross-sectional view of the semiconductor device during the same manufacturing step as that shown in FIG. 41.

The opening OP1b can be formed as follows. That is, after the silicon nitride film LF2 is deposited, as shown in FIGS. 37 and 38, a resist pattern (photoresist pattern or mask layer) PR2 is formed over the silicon nitride film LF2 using a photolithographic technique. Then, as shown in FIGS. 39 and 40, using the resist pattern RP2 as an etching mask, the silicon nitride film LF2 is subjected to etching (dry etching) to be formed with the opening OP1b, while being removed from the scribe region 1D. Then, the resist pattern RP2 is removed. This stage is shown in FIGS. 41 and 42. The opening OP1b is formed so as to extend through the silicon nitride film LF2. From the opening OP1b, at least a portion of the pad PD1 is exposed.

As can be also seen from FIG. 41 and FIGS. 4 and 5 described above, the opening OP1b is formed so as to be included in the opening OP1a in plan view. That is, the two-dimensional size (plane area) of the opening OP1b of the silicon nitride film LF2 is smaller than the two-dimensional size (plane area) of the opening OP1a of the silicon dioxide film LF1. Consequently, in plan view, the opening OP1b of the silicon nitride film LF2 is included in the opening OP1a of the silicon dioxide film LF1. In other words, the two-dimensional size (plane area) of the opening OP1a of the silicon dioxide film LF1 is larger than the two-dimensional size (plane area) of the opening OP1b of the silicon nitride film LF2. In plan view, the opening OP1a of the silicon dioxide film LF1 includes the opening OP1b of the silicon nitride film LF2. That is, in plan view, the opening OP1b of the silicon nitride film LF2 overlaps the opening OP1a of the silicon dioxide film LF1, and the outer periphery of the opening OP1b of the silicon nitride film LF2 is located inside the outer periphery of the opening OP1a of the silicon dioxide film LF1.

As a result, at the stage where the silicon nitride film LF2 is deposited, the inner wall of the opening OP1a of the silicon dioxide film LF1 is in a state covered with the silicon nitride film LF2. Even when the opening OP1b is formed in the silicon nitride film LF2 thereafter, the inner wall of the opening OP1a of the silicon dioxide film LF1 remains in the state covered with the silicon nitride film LF2.

That is, in the case where the opening OP1b of the silicon nitride film LF2 has a portion located outside the opening OP1a of the silicon dioxide film LF1 in plan view, when the opening OP1b is formed in the silicon nitride film LF2, the inner wall of the opening OP1a of the silicon dioxide film LF1 is consequently uncovered with the silicon nitride film LF2 and exposed. By contrast, in the case where the opening OP1b of the silicon nitride film LF2 is included in the opening OP1a of the silicon dioxide film LF1 in plan view as in the present embodiment, even when the opening OP1b is formed in the silicon nitride film LF2, the inner wall of the opening OP1a of the silicon dioxide film LF1 is in the state covered with the silicon nitride film LF2. As a result, in the two-dimensional region where the pad PD1 is formed, the silicon dioxide film LF1 is covered with the silicon nitride film LF2 and therefore is not exposed. The state is maintained during and even after the formation of the opening OP1b. That is, after the deposition of the silicon nitride film LF2, the silicon dioxide film LF is not exposed.

Preferably, the inner wall of the opening OP1b of the silicon nitride film LF2 is tapered. This facilitates subsequent formation of the redistribution wire RW over the inner wall of the opening OP1b of the silicon nitride film LF2.

The upper surface of the silicon nitride film LF2 is formed with a stepped portion DS resulting from the inner wall of the opening OP1a of the silicon dioxide film LF1. More preferably, the stepped portion DS is covered with the resin film LF3 at the stage where the resin film LF3 is formed later and the opening OP1c is formed in the resin film LF3. This reduces the underlying level difference when the redistribution wire RW is formed later and allows easy formation of the redistribution wire RW.

Preferably, the silicon nitride film LF2 is removed from the entire scribe region 1D. This is because, when there is the silicon nitride film LF2 in the scribe region 1D, in the dicing step described later, a crack resulting from the cutting of the silicon nitride film LF2 in the scribe region 1D by a dicing blade may extend along the silicon nitride film LF2 even into the chip region. Therefore, the silicon nitride film LF2 is preferably removed from the scribe region 1D. This prevents the situation where, in the dicing step described later, the silicon nitride film LF2 in the scribe region in is cut by the dicing blade and thus eliminates the possibility that the crack resulting from the cutting of the silicon nitride film LF2 in the scribe region 1D by the dicing blade extends along the silicon nitride film LF2 even into the chip region. Consequently, an end portion TE1 of the silicon nitride film LF2 formed by removing the silicon nitride film LF2 from the entire scribe region 1D is located in the chip region.

Accordingly, as shown in FIGS. 37 and 38, the silicon nitride film LF2 is preferably etched using the resist pattern RP2 as an etching mask in the state where the resist pattern RP2 is not formed over the silicon nitride film LF2 in the scribe region 1D. That is, when the silicon nitride film LF2 is etched using the resist pattern RP2 as an etching mask, the silicon nitride film LF2 in the scribe region 1D is left exposed without being covered with the resist pattern RP2. As a result, when the silicon nitride film LF2 is etched (dry-etched) using the resist pattern RP2 as an etching mask, the opening OP1*b* is formed in the silicon nitride film LF2 to be located over the pad PD1, while the silicon nitride film LF2 is etched and removed from the entire scribe region 1D. By removing the silicon nitride film LF2 from the scribe region 1D, in the scribe region 1D, the test pad PDT is brought into a state exposed from the opening OPTa of the silicon dioxide film LF1.

When not only the silicon nitride film LF2, but also the silicon dioxide film LF1 is removed from the scribe region 1D, there is no insulating film covering the outer peripheral portion of the upper surface of the test pad PDT and the side surfaces thereof. This undesirably exposes the entire upper surface and entire side surfaces of the test pad PDT. In this case, the test pad PDT is more likely to peel off. In addition, it becomes difficult to perform a probe test using the test pad PDT. Accordingly, the silicon nitride film LF2 is removed from the scribe region 1D, but the silicon dioxide film LF1 is left in the scribe region 1D. This brings the portions (the entire side surfaces and the outer peripheral portion of the upper surface) of the test pad PDT into a state covered with the silicon dioxide film LF1. In this manner, it is possible to prevent the test pad PDT from peeling off. It is also possible to allow the probe test using the test pad PDT to be easily performed. When the silicon dioxide film is cut by a dicing blade, a crack is less likely to be formed therein than when the silicon nitride film is cut by the dicing blade. As a result, even when the silicon dioxide film LF1 is left in the scribe region 1D, the possibility of crack formation can significantly be reduced compared to the case where the silicon nitride film LF2 is left.

Figure 43:
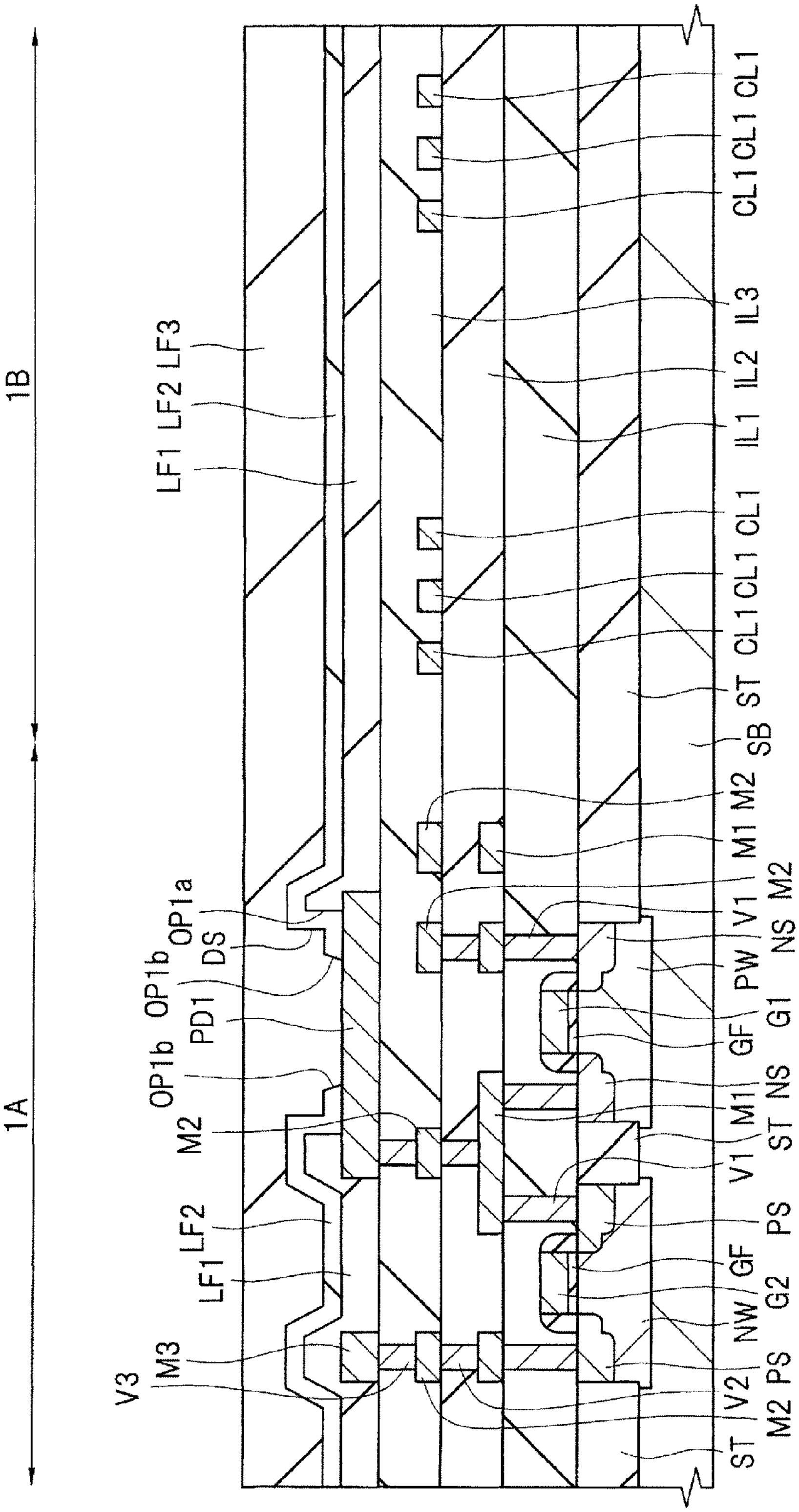
FIG. 43 is a main-portion cross-sectional view of the semiconductor device during a manufacturing step subsequent to that shown in FIG. 41.
Figure 44:
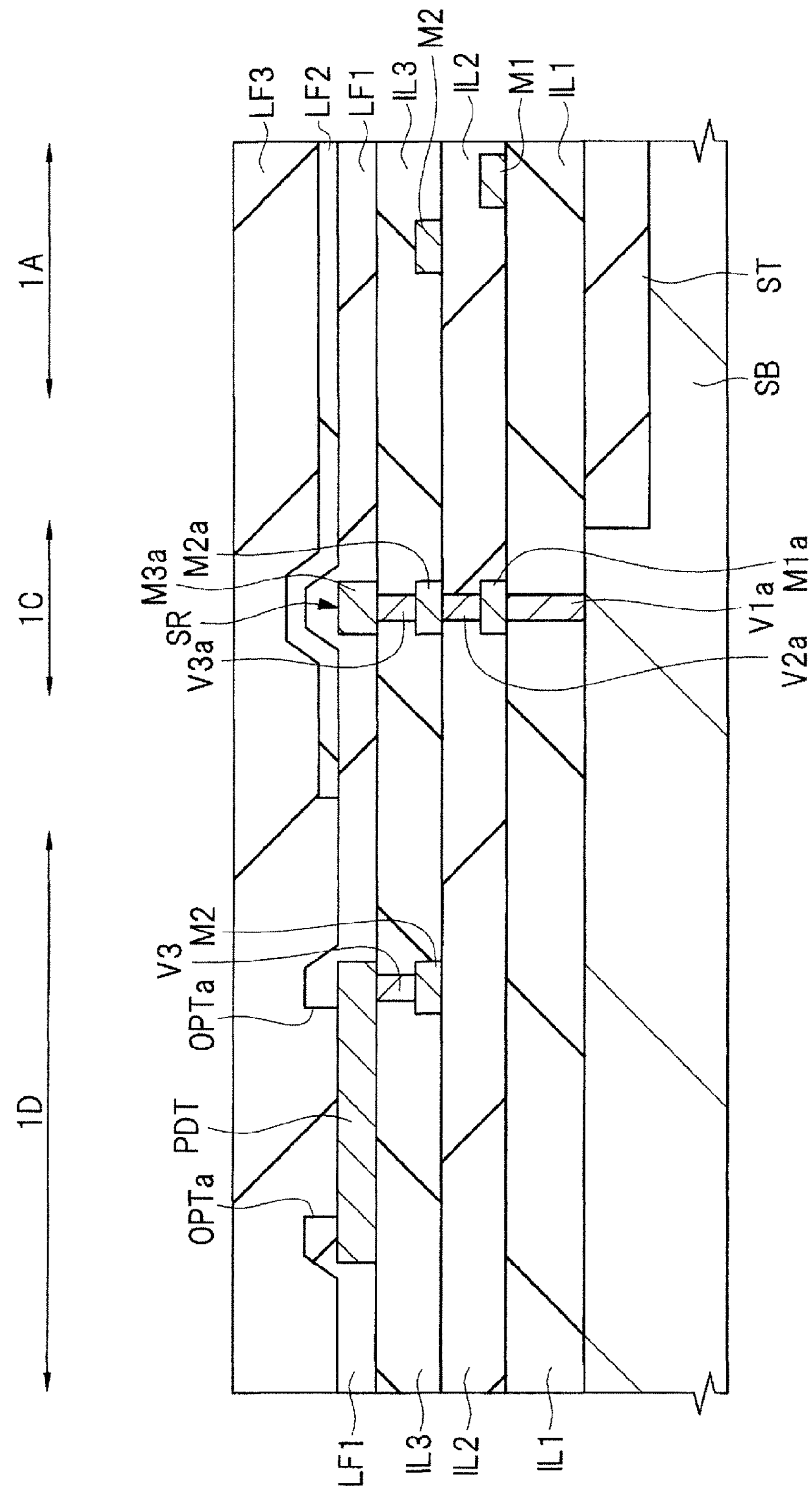
FIG. 44 is a main-portion cross-sectional view of the semiconductor device during the same manufacturing step as that shown in FIG. 43.

Next, as shown in FIGS. 43 and 44, over the main surface (entire main surface) of the semiconductor substrate SB, i.e., over the silicon nitride film LF2, the resin film LF3 is formed so as to cover the pads PD1 and PDT. Since the resin film LF3 is formed over the entire main surface of the semiconductor substrate SB, the resin film LF3 is consequently formed over the silicon nitride film LF2 and over the pad PD1 exposed from the opening OP1*b* of the silicon nitride film LF2. However, since the silicon nitride film LF2 has been removed from the scribe region 1D prior to the formation of the resin film LF3, the resin film LF3 is consequently formed over the silicon dioxide film LF1 and over the test pad PDT exposed from the opening OPTa of the silicon dioxide film LF1.

As the resin film LF3, a polyimide film or the like can be used appropriately. The resin film LF3 can be formed by, e.g., a coating method. Specifically, using a so-called spin coating (roll-on coating) method, a solution of a polyimide precursor is applied to the main surface of the semiconductor substrate SB, while the semiconductor substrate SB is rotated. By subsequently drying the applied solution of the polyimide precursor, a polyimide film as the resin film LF3 can be formed. The thickness of the resin film LF3 (formed film thickness) can be controlled to, e.g., about 1 to 20 μm.

Since the resin film LF3 is formed over the entire main surface of the semiconductor substrate SB, in the chip region, the resin film LF3 is formed over the silicon nitride film LF2 and over the pad PD1 exposed from the opening OP1*b* of the silicon nitride film LF2. On the other hand, in the scribe region 1D, the resin film LF3 is formed over the silicon dioxide film LF1 and over the test pad PDT exposed from the opening OPTa of the silicon dioxide film LF1. At the stage prior to the deposition of the resin film LF3, the pad PD1 is exposed from the opening OP1*b* of the silicon nitride film LF2 while, in the scribe region 1D, the test pad PDT is exposed from the opening OPTa of the silicon dioxide film LF1. However, when the resin film LF3 is deposited, the pad PD1 exposed from the opening OP1*b* of the silicon nitride film LF2 and the test pad PDT exposed from the opening OPTa of the silicon dioxide film LF1 are covered with the resin film LF3. This brings each of the pad PD1 and the test pad PDT into an unexposed state.

Figure 45:
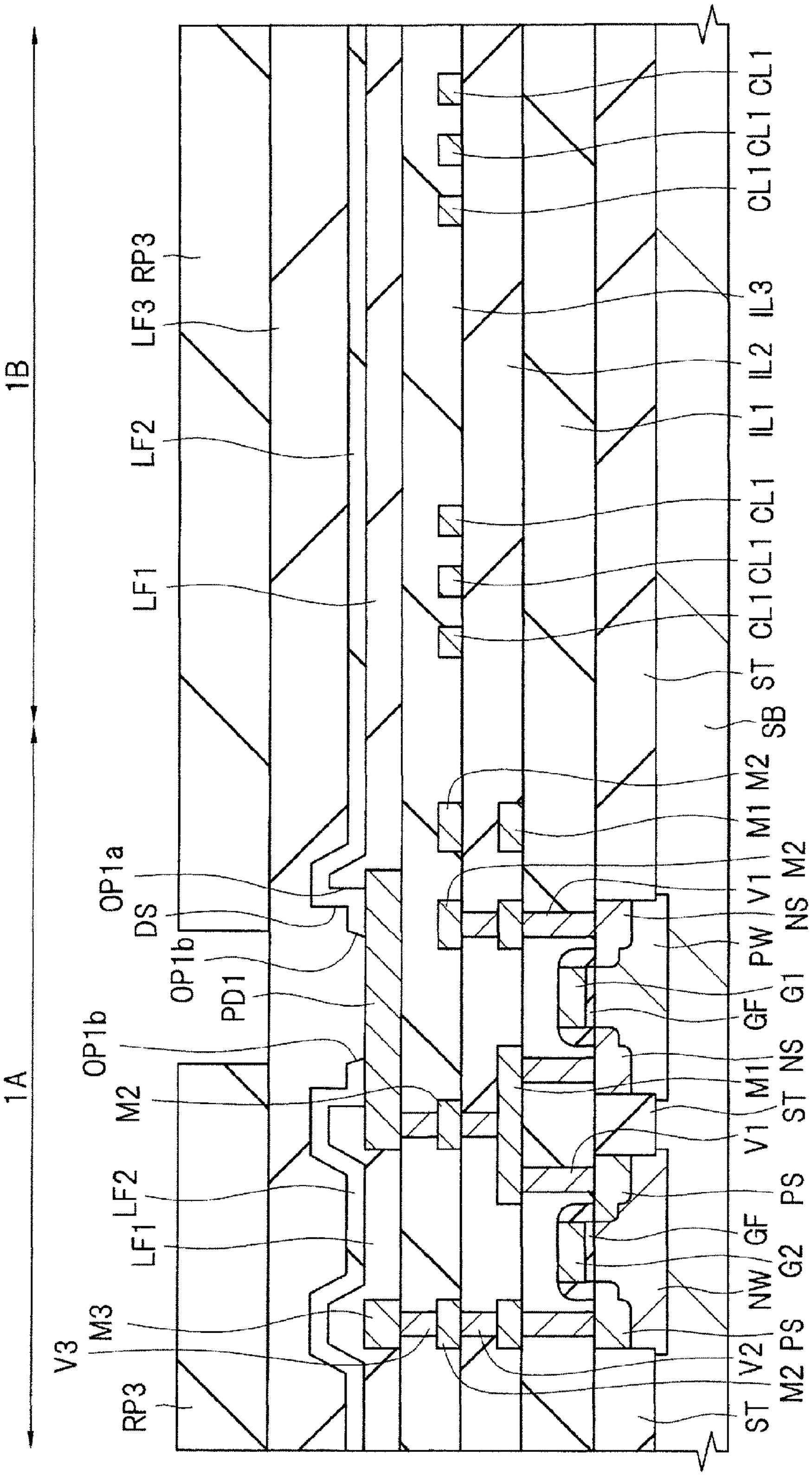
FIG. 45 is a main-portion cross-sectional view of the semiconductor device during a manufacturing step subsequent to that shown in FIG. 43.
Figure 46:
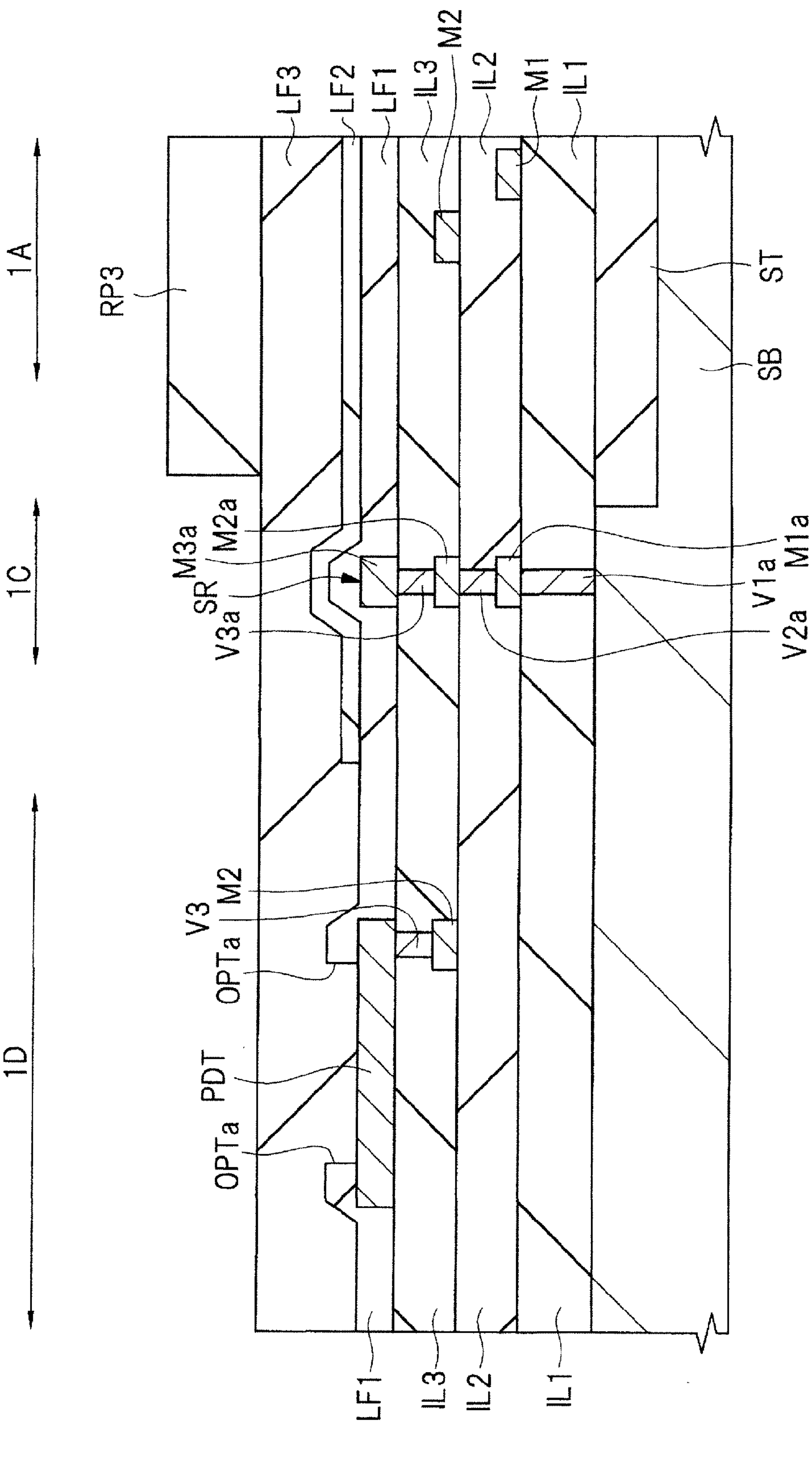
FIG. 46 is a main-portion cross-sectional view of the semiconductor device during the same manufacturing step as that shown in FIG. 45.
Figure 47:
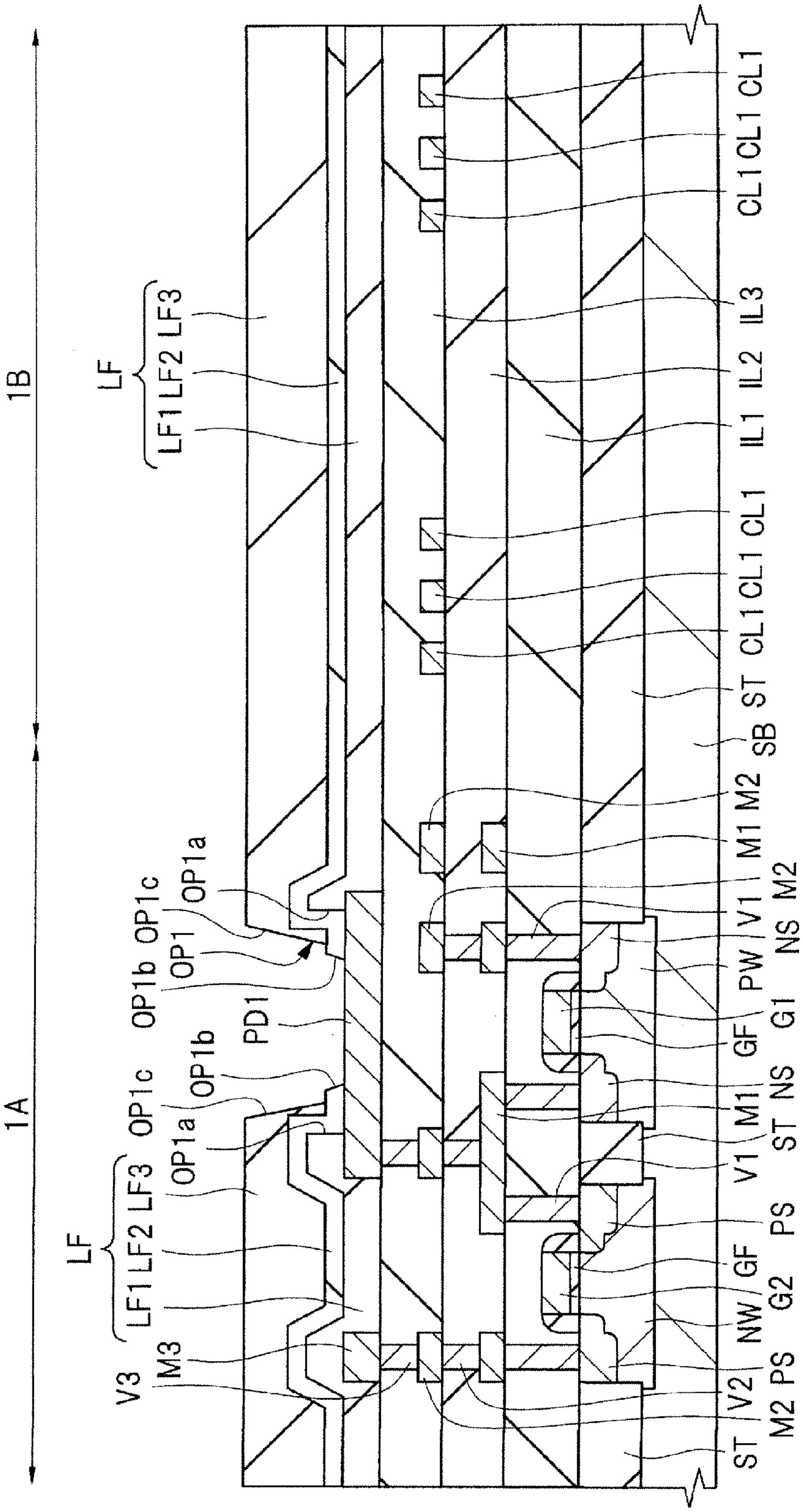
FIG. 47 is a main-portion cross-sectional view of the semiconductor device during a manufacturing step subsequent to that shown in FIG. 45.
Figure 48:
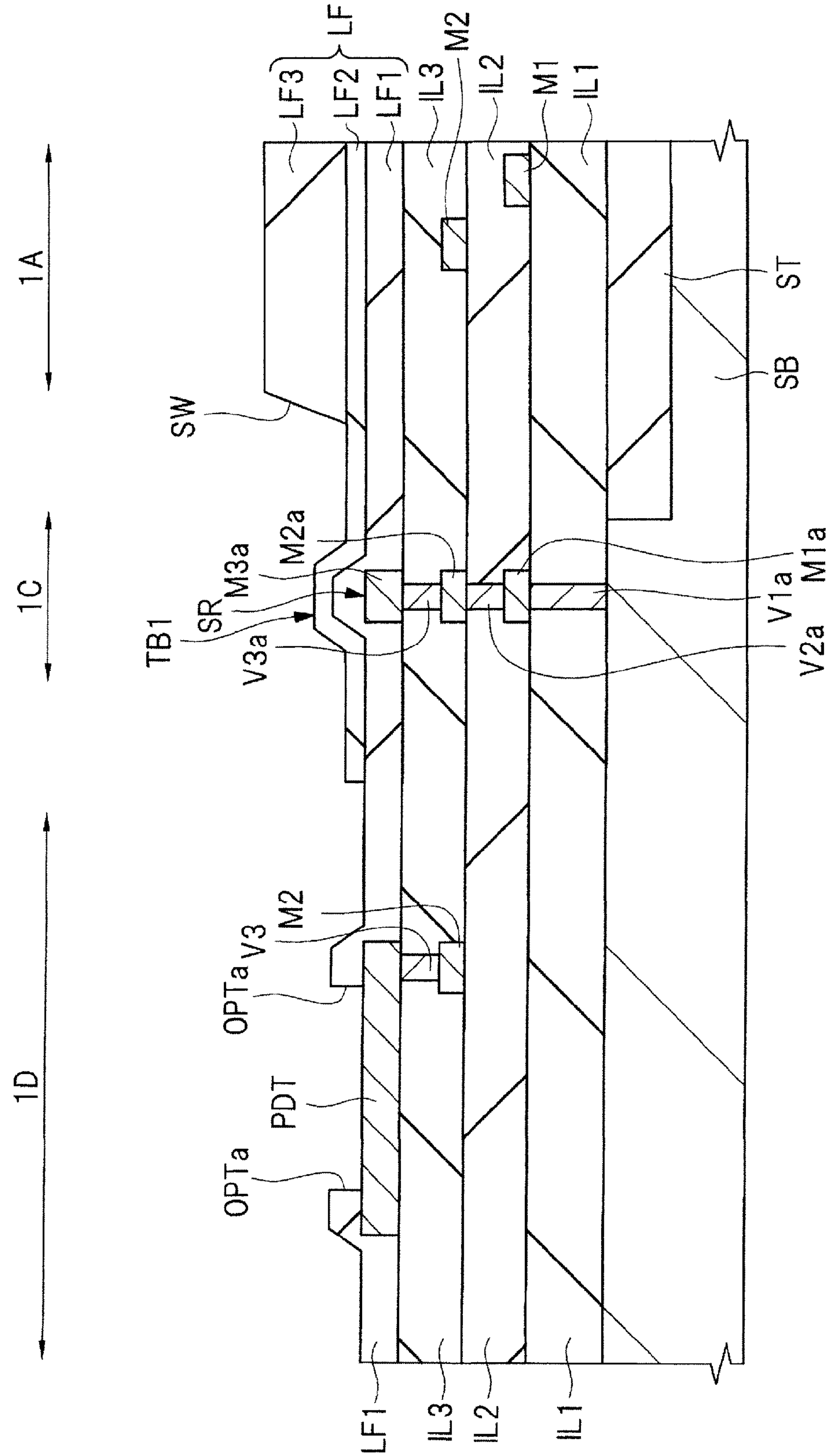
FIG. 48 is a main-portion cross-sectional view of the semiconductor device during the same manufacturing step as that shown in FIG. 47.

Next, in the resin film LF3, the opening OP1*c* is formed. For example, the opening OP1*c* can be formed as follows. That is, the resin film LF3 is formed as a photosensitive resin film. Then, as shown in FIGS. 45 and 46, over the resin film LF3 made of a photosensitive resin, a resist pattern (photoresist pattern or mask layer) RP3 is formed using a photolithographic technique. Then, using the resist pattern PR3 as a mask, the resin film LF3 made of the photosensitive resin is exposed to light. As a result, the portion of the resin film LF3 which is uncovered with the resist pattern RP3 and exposed is exposed to light. Subsequently, the resist pattern RP3 is removed and then the resin film LF3 made of the photosensitive resin film is subjected to development treatment. In this manner, the exposed portion (portion uncovered with the resist pattern RP3 and exposed to light) of the resin film LF3 is removed. By the exposure and the development treatment, the portion of the resin film LF3 to be formed with the opening OP1*c* is selectively removed. As a result, it is possible to form the opening OP1*c* in the resin film LF3, as shown in FIG. 47, and remove the resin film LF3 from the scribe region 1D, as shown in FIG. 48. Note that FIGS. 47 and 48 correspond to the same process stage. Thereafter, heat treatment is performed to cure the resin film LF3. The opening OP1*c* is formed so as to extend through the resin film LF3 and, from the opening OP1*c*, at least a portion of the pad PD1 is exposed.

In another embodiment, by dry-etching the resin film LF3 using the resist pattern RP3 formed over the resin film LF3 as an etching mask, it is also possible to form the opening OP1*c* in the resin film LF3 and remove the resin film LF3 from the scribe region 1D. In that case, the resin film LF3 need not be a photosensitive resin film.

When the opening OP1*c* is formed in the resin film LF3, the portion of the resin film LF3 which is formed in the scribe region 1D is also removed. That is, by subjecting the resin film LF3 made of the photosensitive resin to exposure and development, the portion of the resin film LF3 to be formed with the opening OP1*c* is selectively removed. At this time, the portion of the resin film LF3 which is formed in the scribe region 1D is also subjected to exposure and development to be removed.

There are two reasons for removing the resin film LF3 from the scribe region 1D as follows. The first reason is that, when there is the resin film LF3 in the scribe region 1D, in the dicing step described later, a crack may result from the cutting of the resin film LF3 in the scribe region 1D by a dicing blade and extend along the resin film LF3 even into the chip region. Accordingly, it is preferable to remove the resin film LF3 from the scribe region 1D. This prevents the cutting of the resin film LF3 by the dicing blade in the dicing step described later. Thus, it is possible to eliminate the possibility that the crack results from the cutting of the resin film LF3 in the scribe region 1D by the dicing blade and extends along the resin film LF3 even into the chip region. The second reason is that, when the dicing step is performed in the state where the resin film LF3 is formed in the scribe region 1D, the resin film is hard to cut with the dicing blade so that it is difficult to perform the dicing step. However, when the resin film LF3 has been removed from the scribe region 1D, there is no need to cut the resin film LF3 with the dicing blade so that the dicing step is easily performed.

By removing the resin film LF3 from the scribe region 1D, in the scribe region 1D, a state is reached in which the test pad PDT is exposed from the opening OPTa of the silicon dioxide film LF1.

As can be also seen from FIG. 47 and FIGS. 4 and 5 described above, the opening OP1*c* is formed so as to include the opening OP1*b* in plan view. That is, the two-dimensional size (plane area) of the opening OP1*c* of the resin film LF3 is larger than the two-dimensional size (plane area) of the opening OP1*b* of the silicon nitride film LF2. Accordingly, in plan view, the opening OP1*c* of the resin film LF3 includes the opening OP1*b* of the silicon nitride film LF2. In other words, the two-dimensional size (plane area) of the opening OP1*b* of the silicon nitride film LF2 is smaller than the two-dimensional size (plane area) of the opening OP1*c* of the resin film LF3. Accordingly, in plan view, the opening OP1*b* of the silicon nitride film LF2 is included in the opening OP1*c* of the resin film LF3. That is, in plan view, the opening OP1*c* of the resin film LF3 overlaps the opening OP1*b* of the silicon nitride film LF2, and the outer periphery of the opening OP1*c* of the resin film LF3 is outside the opening OP1*b* of the silicon nitride film LF2.

As a result, at the stage where the resin film LF3 is deposited, the inner wall of the opening OP1*b* of the silicon nitride film LF2 is in a state covered with the resin film LF3. However, when the opening OP1*c* is formed in the resin film LF3 thereafter, the inner wall of the opening OP1*b* of the silicon nitride film LF2 is brought into an exposed state uncovered with the resin film LF3.

That is, in the case where the opening OP1*c* of the resin film LF3 is included in the opening OP1*b* of the silicon nitride film LF2 in plan view, even when the opening OP1*c* is formed in the resin film LF3, the inner wall of the opening OP1*b* of the silicon nitride film LF2 remains in the state covered with the resin film LF3. By contrast, in the case where the opening OP1*c* of the resin film LF3 includes the opening OP1*b* of the silicon nitride film LF2 in plan view as in the present embodiment, when the opening OP1*c* is formed in the resin film LF3, the inner wall of the opening OP1*b* of the silicon nitride film LF2 is brought into the exposed state uncovered with the resin film LF3.

Preferably, the inner wall of the opening OP1*c* of the resin film LF3 is tapered. This facilitates subsequent formation of the redistribution wire RW over the inner wall of the opening OP1*c* of the resin film LF3.

Thus, the multi-layer film (multi-layer insulating film) LF having the opening OP1 exposing at least a portion of the pad PD1 is formed. From the opening OP1 of the multi-layer film LF, the top surface of the pad PD1 is exposed. However, a portion of the pad PD1, i.e., the portion of the pad PD1 which does not overlap the opening OP1 in plan view is in a state covered with the multi-layer film LF. Specifically, the state has been provided where, while the center portion of the pad PD1 is not covered with the multi-layer film LF, the outer peripheral portion of the pad PD1 is covered with the multi-layer film LF. The state is maintained even in the subsequent steps.

The multi-layer film LF includes the silicon dioxide film LF1, the silicon nitride film LF2, and the resin film LF3. The multi-layer film LF has the opening OP1 exposing at least a portion of the pad PD1. The opening OP1 is formed of the opening OP1*c* of the resin film LF3, the opening OP1*b* of the silicon nitride film LF2, and the opening OP1*a* of the silicon dioxide film LF1.

However, since the inner wall of the opening OP1*a* of the silicon dioxide film LF1 is covered with the silicon nitride film LF2, the inner wall of the opening OP1 of the multi-layer film LF is formed of the inner wall of the opening OP1*c* of the resin film LF3, the inner wall of the opening OP1*b* of the silicon nitride film LF2, and the upper surface of the silicon nitride film LF2 which is located between the respective inner walls of the openings OP1*c* and OP1*b* and uncovered with the resin film LF3.

In this manner, as shown in FIGS. 9 to 48, the semiconductor substrate SB is subjected to a wafer process. The wafer process is referred to also as a pre-process. In general, the wafer process refers to a process in which various elements (such as MISFETs), wiring layers (which are the wires M1, M2, and M3 herein), pad electrodes (which are the pads PD1 and PDT herein) are formed over the main surface of a semiconductor wafer (semiconductor substrate SB), a surface protective film (which is the multi-layer film LF) is formed, and then a state is finally reached where an electric test can be performed on each of the plurality of chip regions formed in the semiconductor wafer using a probe or the like. As described above, each of the chip regions of the semiconductor wafer corresponds to the region of the semiconductor wafer from which one semiconductor chip is obtained.

As a result, in the semiconductor wafer subjected to the wafer process, the multi-layer film LF serves as the uppermost layer and also serves as the surface protective film. On the other hand, the wires M3 in the third wiring layer serve as the uppermost-layer wires, and the third wiring layer forms the pads PD1 and PDT.

Next, using the test pad PDT formed in the scribe region 1D, a probe test (wafer test) is performed to conduct an electrical test on each of the chip regions of the semiconductor wafer (semiconductor substrate SB). Specifically, a test probe (probe needle or in-depth probe) is brought into contact with the test pad PDT (more specifically, the test pad PDT exposed from the opening OPTa of the silicon dioxide film LF1) formed in the scribe region 1D of the semiconductor wafer (semiconductor substrate SB) to conduct the electrical test on each of the chip regions. The test pad PDT formed in the scribe region 1D is electrically coupled (specifically, electrically coupled via the wires M1, M2, M3, and the like) to a circuit in the chip region which is adjacent to the scribe region 1D. Accordingly, it is possible to conduct the electrical test on each of the chip regions using the test pad PDT. On the basis of the result of the probe test, each of the chip regions of the semiconductor wafer (semiconductor substrate SB) is selectively determined to be a non-defective product or a defective product or data on the result of measurement in the probe test is fed back to each of the manufacturing process steps. In this manner, the result of the probe test or the data on the result of measurement in the probe test can be used for improvements in manufacturing yield and reliability.

The test pad PDT is formed in the scribe region 1D, while the pad PD1 is formed in each of the chip regions. The pad PD1 provided in each of the chip regions may be or may not be used for the probe test (wafer test). When the pad PD1 provided in each of the chip regions is not used for the probe test (wafer test), the probe test is performed using the test pad PDT formed in the scribe region 1D. When the pad PD1 provided in each of the chip regions is used for the probe test (wafer test), the probe test is performed using both of the test pad PDT formed in the scribe region 1D and the pad PD1 provided in the chip region. When the pad PD1 provided in each of the chip regions is used for the probe test (wafer test), the test probe (probe needle or in-depth probe) is brought into contact with the pad PD1 exposed from the opening OP1 of the multi-layer film LF.

Figure 49:
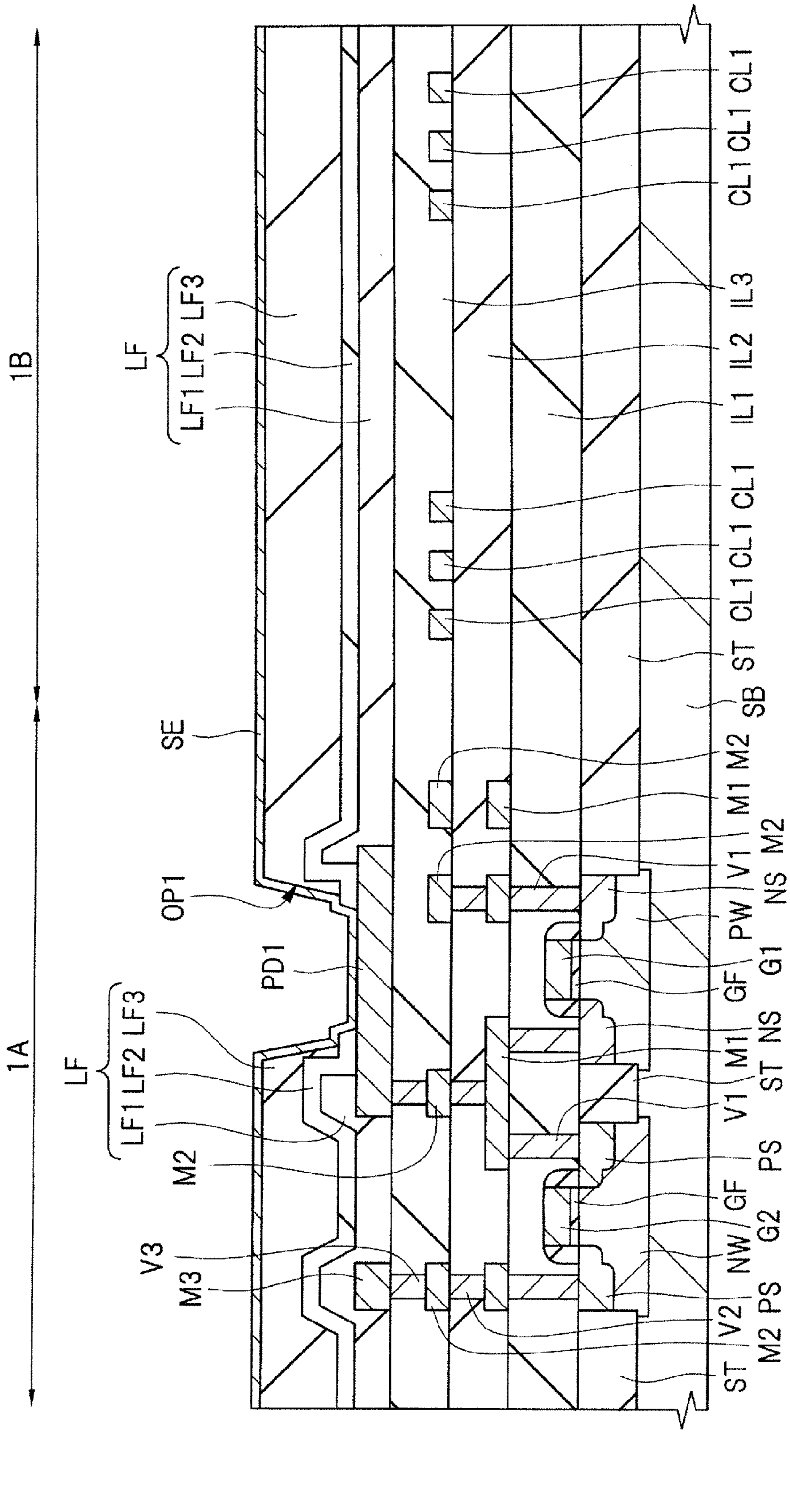
FIG. 49 is a main-portion cross-sectional view of the semiconductor device during a manufacturing step subsequent to that shown in FIG. 47.

After the structure shown in FIGS. 47 and 48 described above is obtained by a wafer process (pre-process) as described above, the probe test is performed. Then, as shown in FIG. 49, over the main surface (entire main surface) of the semiconductor substrate SB, i.e., over the multi-layer film LF1 including the pad PD1 exposed from the opening OP1 of the multi-layer film LF, a seed film (seed layer) SE is formed. The seed film SE is intended to function as a seed layer (power supply layer) for electrolytic plating later.

The seed film SE is made of a multi-layer film including, e.g., a chromium (Cr) film, a copper (Cu) film over the chromium (Cr) film, and the like. The seed film SE can be formed by, e.g., a sputtering method. Thus, over the multi-layer film LF including the pad PD1 exposed at the bottom portion of the opening OP1 and the inner wall of the opening OP1, the seed film SE is formed. The top surface of the multi-layer film LF is formed of the resin film LF3, except for the opening OP1. As a result, the seed film SE is formed over the resin film LF3 so as to come in contact with the resin film LF3.

The thickness of the seed film SE can be controlled such that, e.g., the chromium (Cr) film has a thickness of about 75 nm and the copper (Cu) film has a thickness of about 250 nm. Of the seed film SE, the lower-layer chromium (Cr) film can function as a barrier conductor film and has the functions of, e.g. preventing copper diffusion and improving adhesion to the resin film LF3. However, the lower-layer film of the seed film SE is not limited to the chromium (Cr) film. For example, a titanium (Ti) film, a titanium tungsten (TiW) film, a titanium nitride (TiN) film, a tungsten (W) film, or the like can also be used.

Note that, from the scribe region 1D, as described above, the resin film LF3 and the silicon nitride film LF2 have been removed. Consequently, in the scribe region 1D, the seed film SE is formed over the silicon dioxide film LF1 including the pad PDT exposed from the opening OPTa of the silicon dioxide film LF1, though not shown herein.

Figure 50:
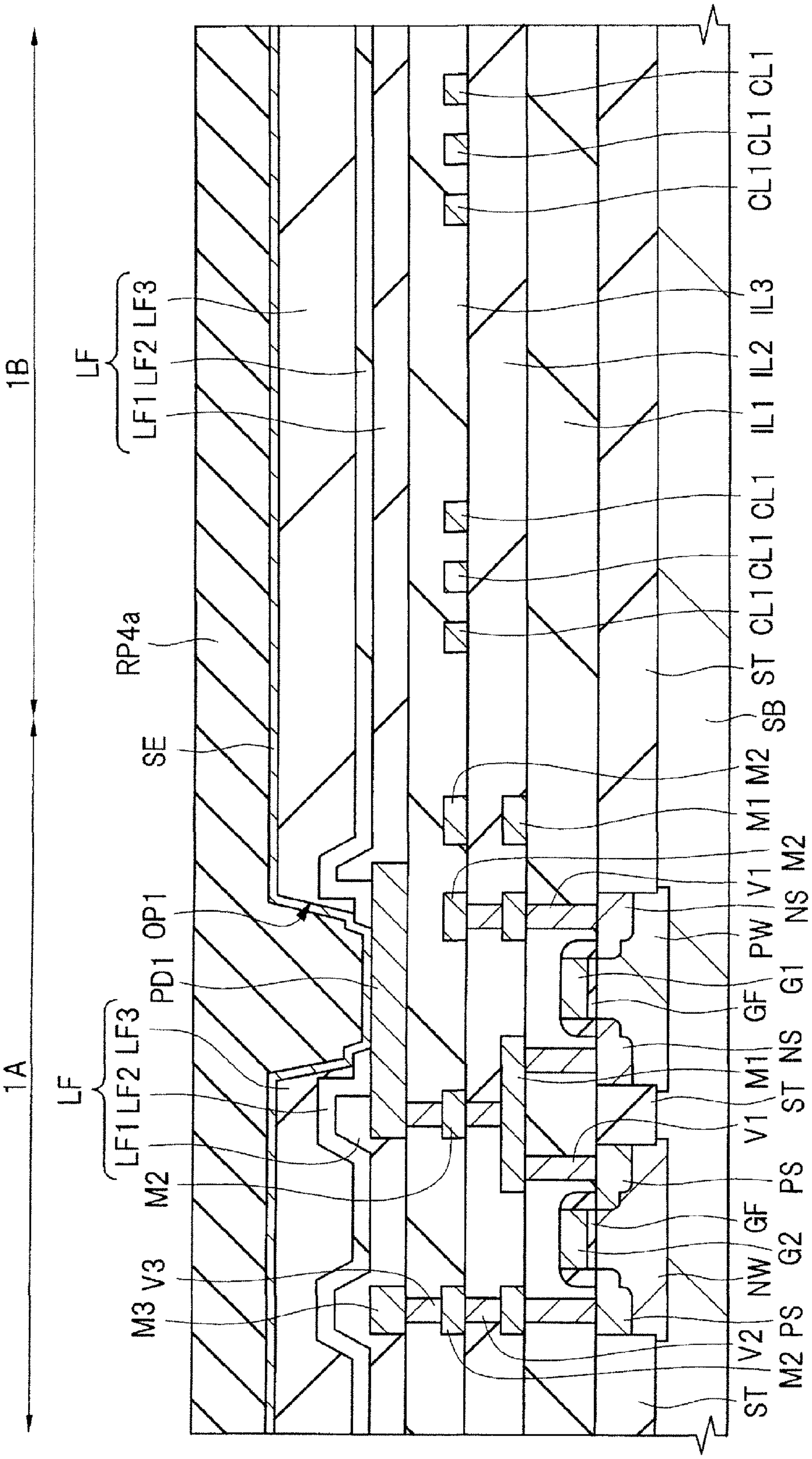
FIG. 50 is a main-portion cross-sectional view of the semiconductor device during a manufacturing step subsequent to that shown in FIG. 49.
Figure 51:
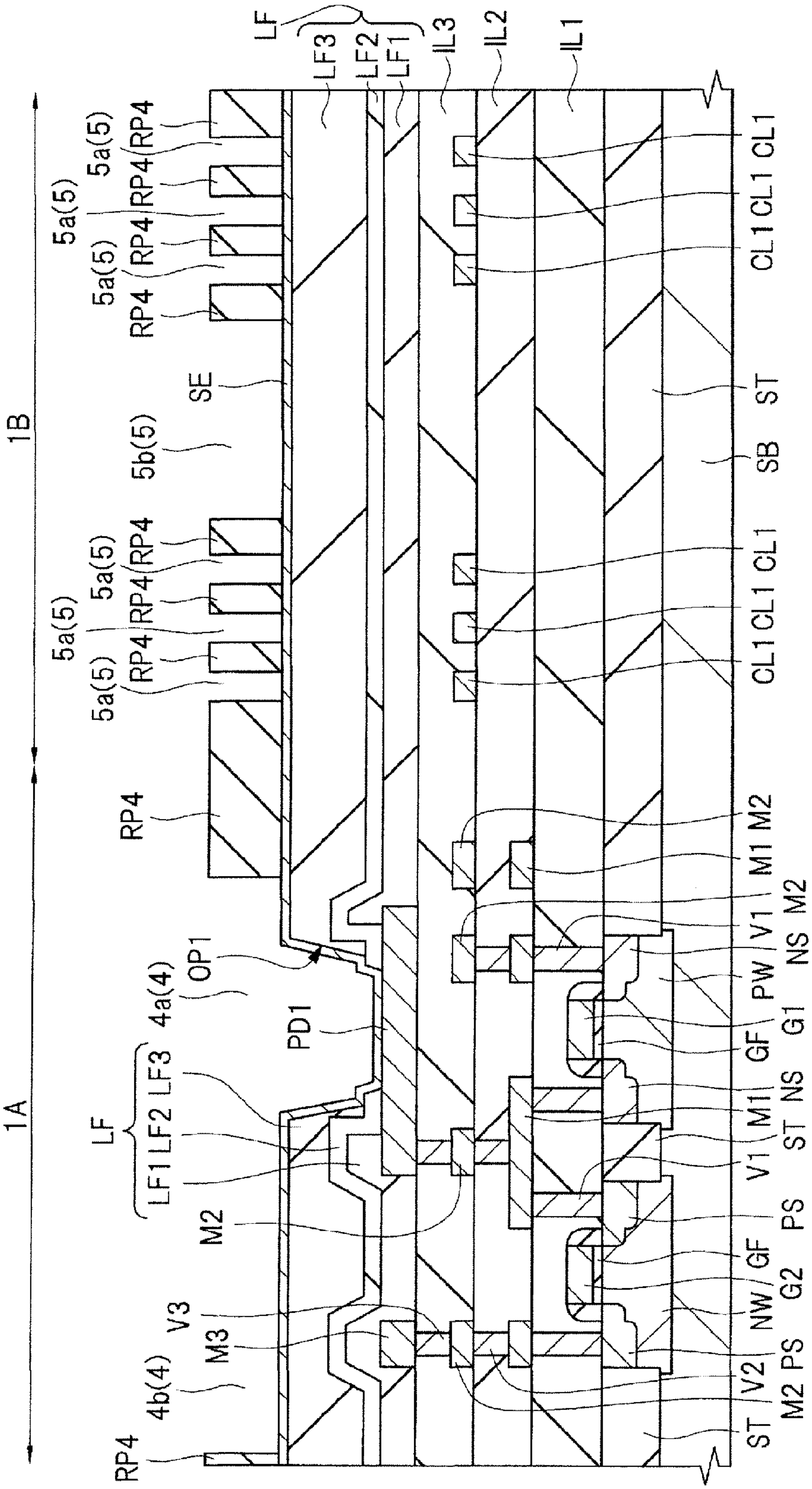
FIG. 51 is a main-portion cross-sectional view of the semiconductor device during a manufacturing step subsequent to that shown in FIG. 50.

Next, as shown in FIG. 50, over the seed film SE, a resist film (photoresist film) RP4*a* is formed. Then, using a photolithographic method (specifically, by performing exposure and development), the resist film RP4*a* is patterned to form a resist pattern (photoresist pattern or mask layer) RP4 made of the patterned resist film RP4*a* over the seed film SE, as shown in FIG. 51.

The resist pattern RP4 is formed in the region other than the regions where the redistribution wire RW, the pad PD2, the coil CL2, and the pad PD3 are to be formed. In each of the region where the redistribution wire RW is to be formed, the region where the pad PD2 is to be formed, the region where the coil CL2 is to be formed, and the region where the pad PD3 is to be formed, the seed film SE is exposed. That is, the resist pattern RP4 has openings (grooves) in the region where the redistribution wire RW is to be formed, in the region where the pad PD2 is to be formed, in the region where the coil CL2 is to be formed, and in the region where the pad PD3 is to be formed.

Figure 52:
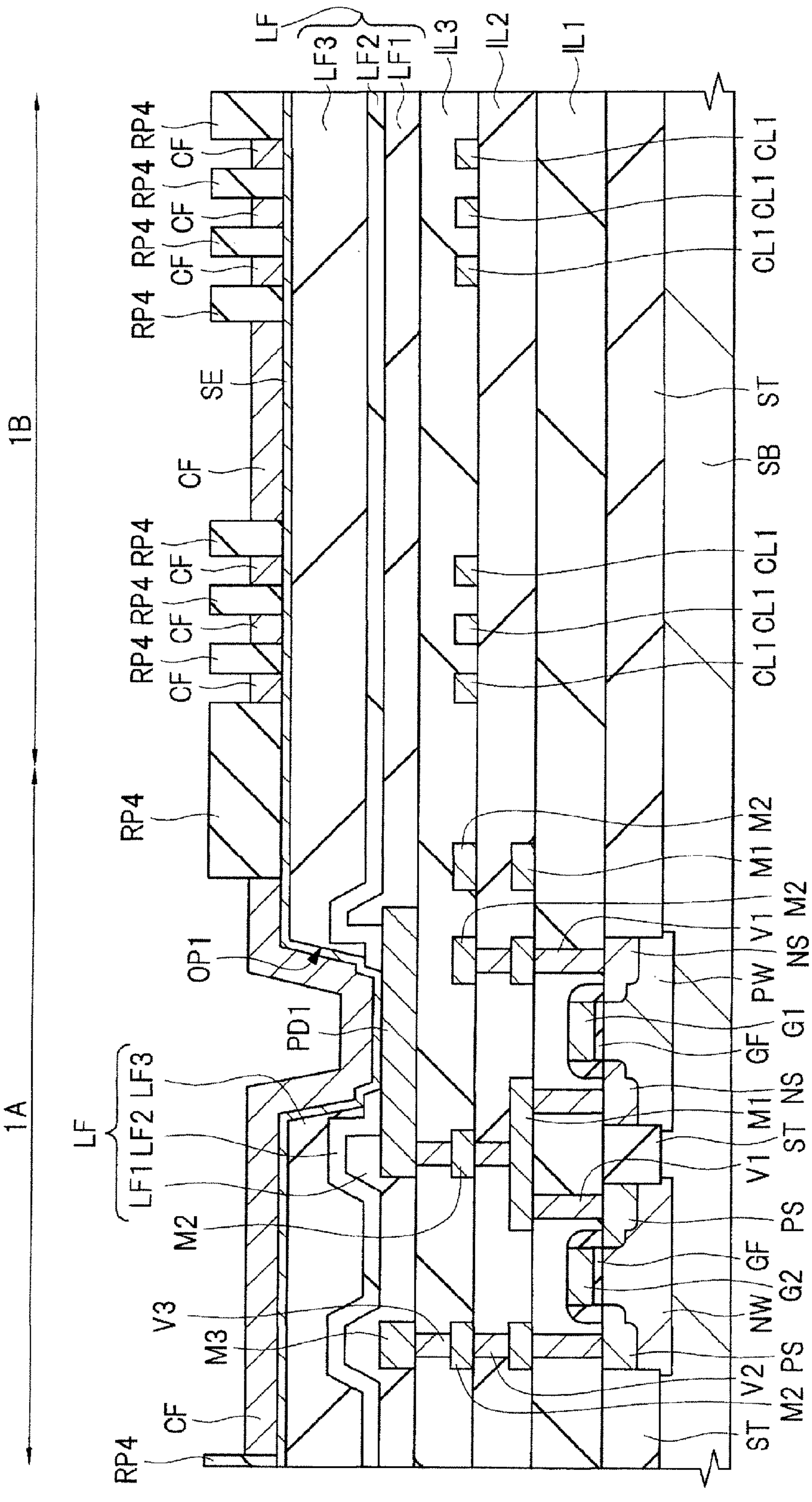
FIG. 52 is a main-portion cross-sectional view of the semiconductor device during a manufacturing step subsequent to that shown in FIG. 51.

Next, as shown in FIG. 52, over the seed film SE exposed from each of the openings (grooves) of the resist pattern RP4, the copper (Cu) film CF is formed as a conductive film by an electrolytic plating method. Thus, the copper film CF is selectively formed over the seed film SE in the region uncovered with the resist pattern RP4. The thickness of the copper film CF can be controlled to, e.g., 4 to 10 μm. The copper film CF is a conductive film (main conductive film) for forming the redistribution wire RW, the pad PD2, the coil CL2, and the pad PD3. The copper film CF is formed in each of the region where the redistribution wire RW is to be formed, the region where the pad PD2 is to be formed, the region where the coil CL2 is to be formed, and the region where the pad PD3 is to be formed.

Next, over the resist pattern RP4 including the copper film CF, another resist film (photoresist film) is formed. Then, using a photolithographic method (specifically, by performing exposure and development), the resist film is patterned to form a resist pattern (photoresist pattern or mask layer) RP5 made of the patterned resist film, as shown in FIG. 53.

The resist pattern RP5 is formed over the region of the pad PD2 other than the region thereof where the underlying metal film UM is to be formed. In the region where the underlying metal film UM is to be formed, the copper film CF is exposed. That is, the resist pattern RP5 has an opening in the region where the underlying metal film UM is to be formed.

Figure 53:
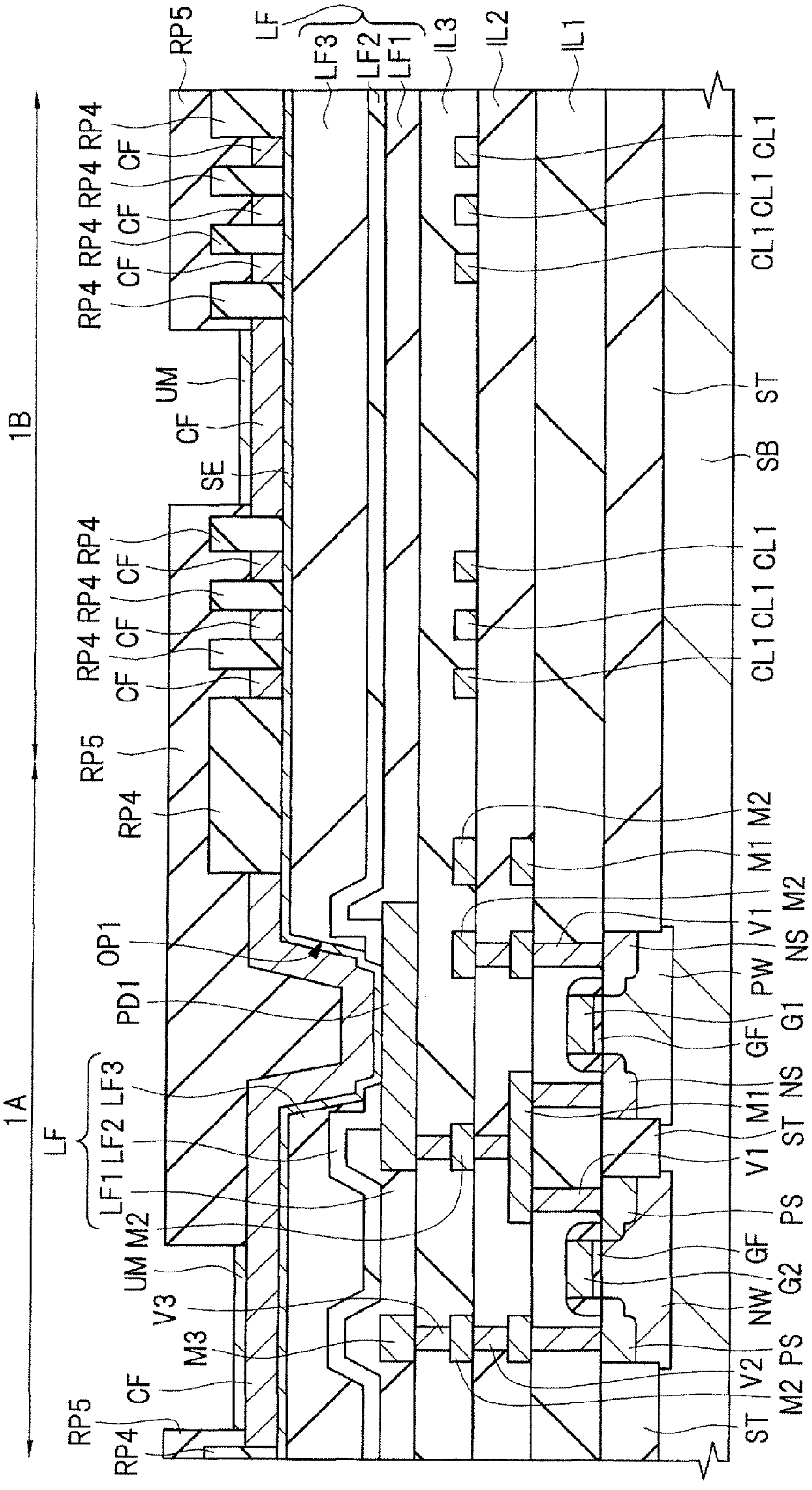
FIG. 53 is a main-portion cross-sectional view of the semiconductor device during a manufacturing step subsequent to that shown in FIG. 52.

Next, as shown in FIG. 53, over the copper film CF exposed from the opening of the resist pattern RP5, the underlying metal film UM is formed by an electrolytic plating method. Thus, the underlying metal film UM is formed over the copper film CG in the region uncovered with the resist pattern RP5. The underlying metal film UM is formed over the portion of the copper film CF which serves as the pad PD2 and over the portion of the copper film CF which serves as the pad PD3. The underlying metal film UM is made of a multi-layer film including, e.g., a nickel (Ni) film, and a gold (Au) film over the nickel (Ni) film or the like. At this time, the thickness of the nickel (Ni) film can be controlled to, e.g., about 1.5 μm, and the thickness of the gold (Au) film can be controlled to, e.g., about 2 μm.

Figure 54:
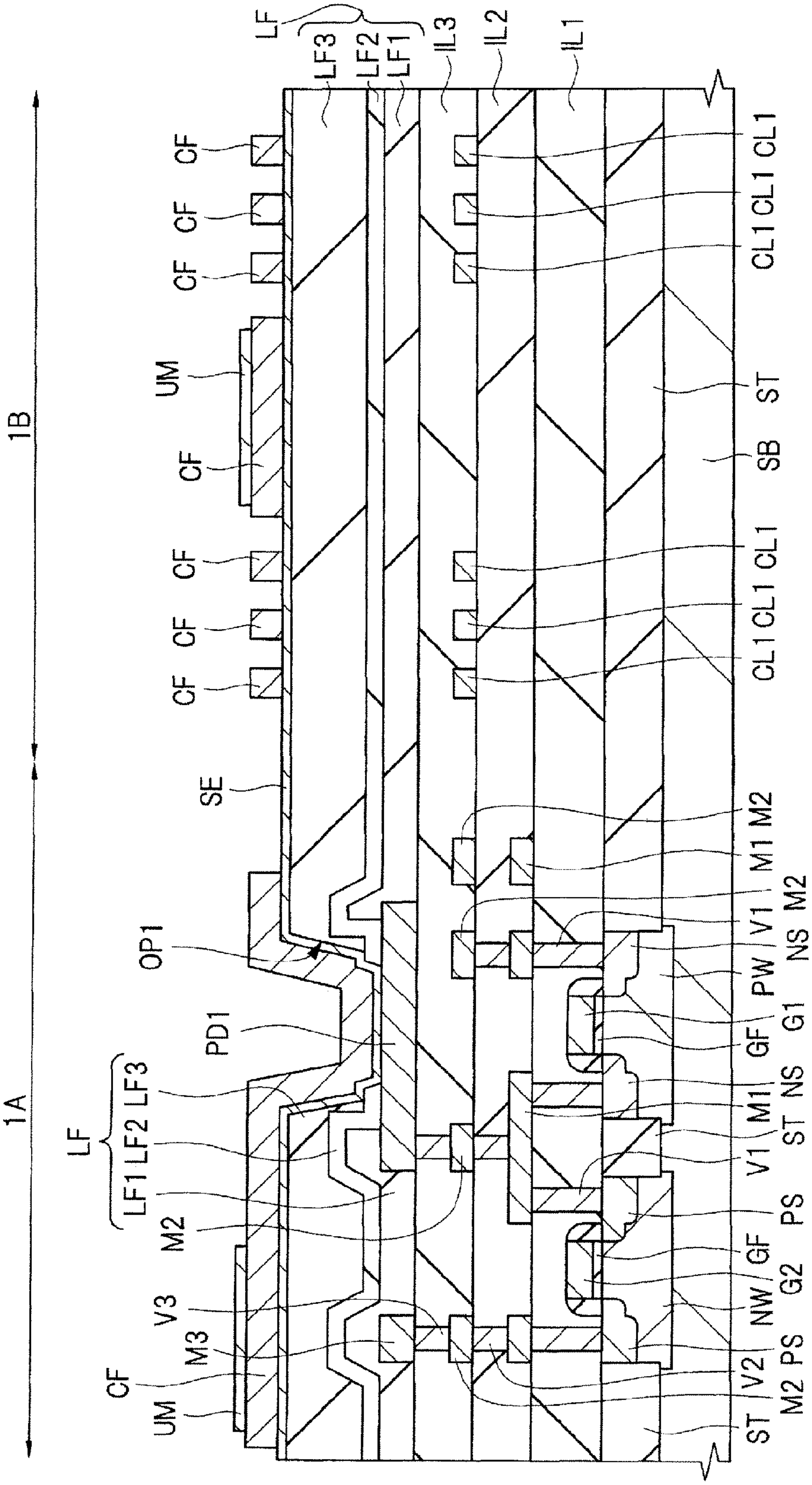
FIG. 54 is a main-portion cross-sectional view of the semiconductor device during a manufacturing step subsequent to that shown in FIG. 53.

Next, as shown in FIG. 54, the resist patterns RP5 and RP4 are removed. As a result, the copper film CF is exposed and also the seed film SE in the region where the copper film CF is not formed (i.e., the portion of the seed film SE which is uncovered with the copper film CF) is exposed.

In the present embodiment, the description has been given of the case where, after the copper film CF is formed, the resist pattern RP5 is formed without removing the resist pattern RP4, the underlying metal film UM is subsequently formed, and then the resist patterns RP5 and RP4 are removed. In another embodiment, it is also possible to form the copper film CF, then remove the resist pattern RP4, subsequently form the resist pattern RP5, then form the underlying metal film UM, and then remove the resist pattern RP5.

Figure 55:
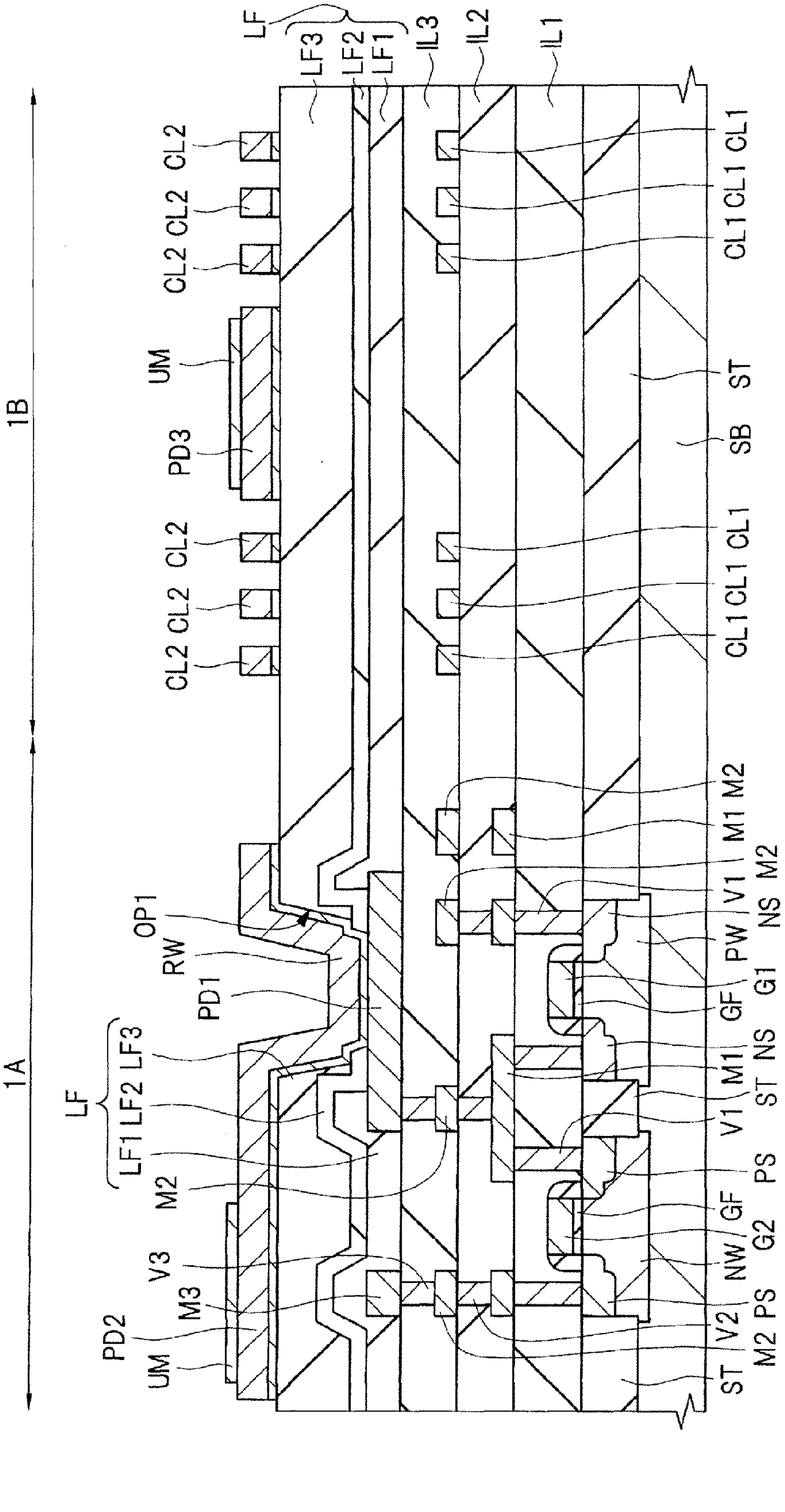
FIG. 55 is a main-portion cross-sectional view of the semiconductor device during a manufacturing step subsequent to that shown in FIG. 54.

Next, as shown in FIG. 55, the portion of the seed film SE which is uncovered with the copper film CF is removed by etching. At this time, the portion of the seed film SE which is uncovered with the copper film CF, i.e., the seed film SE located under the copper film CF is not removed and remains. At this time, the etching is preferably performed to such a degree that the portion the seed film SE which is uncovered with the copper film CF is removed, but the copper film CF and the underlying metal film UM are not excessively etched.

Thus, the redistribution wire RW, the pad PD2, the coil CL2, and the pad PD3 each made of the seed film SE and the copper film CF are formed. That is, each of the redistribution wire RW, the pad PD2, the coil CL2, and the pad PD3 is made of a multi-layer film including the seed film SE, and the copper film CF over the seed film SE.

The redistribution wire RW, the pad PD2, the coil CL2, and the pad PD3 are formed over the resin film LF3 of the multi-layer film LF. However, the redistribution wire RW is formed over the multi-layer film LF including the pad PD1 exposed from the opening OP1 and electrically coupled to the pad PD1. The redistribution wire RW is coupled also to the pad PD2. Specifically, the pad PD2 is formed integrally with the redistribution wire RW. Accordingly, the pads PD1 and PD2 are electrically coupled to each other via the redistribution wire RW. The coil CL2 is coupled to the pad PD3. Specifically, the pad PD3 is formed integrally with the coil CL2.

Note that, over the copper film CF forming the pad PD2 and the copper film CF forming the pad PD3, the underlying metal film UM is formed. The underlying metal film UM over the pad PD2 can also be regarded as a part of the pad PD2. Also, the underlying metal film UM over the pad PD3 can be regarded as a part of the pad PD3.

In the present embodiment, the description has been given of the case where copper (Cu) is used as the main material of the redistribution wire RW (i.e., the case where the copper film CF is used as the main conductor film of the redistribution wire RW). In another embodiment, it is also possible to use gold (Au) as the main material of the redistribution wire RW (i.e., it is also possible to use a gold film as the main conductor film of the redistribution wire RW instead of the copper film CF). Each of the pad PD2, the coil CL2, and the pad PD3 is formed of the conductive film in the same layer as that of the redistribution wire RW. Accordingly, when copper (Cu) is used as the main material of the redistribution wire RW, the main material of each of the pad PD2, the coil CL2, and the pad PD3 is also copper (Cu) and, when gold (Au) is used as the main material of the redistribution wire RW, the main material of each of the pad PD2, the coil CL2, and the pad PD3 is also gold (Au). When gold (Au) is used as the main material of the redistribution wire RW, gold (Au) having high corrosion resistance can improve corrosion resistance. On the other hand, when copper (Cu) is used as the main material of the redistribution wire RW as in the present embodiment, copper (Cu) having low resistance and low price can improve the performance of the redistribution wire RW and reduce manufacturing cost.

Figure 56:
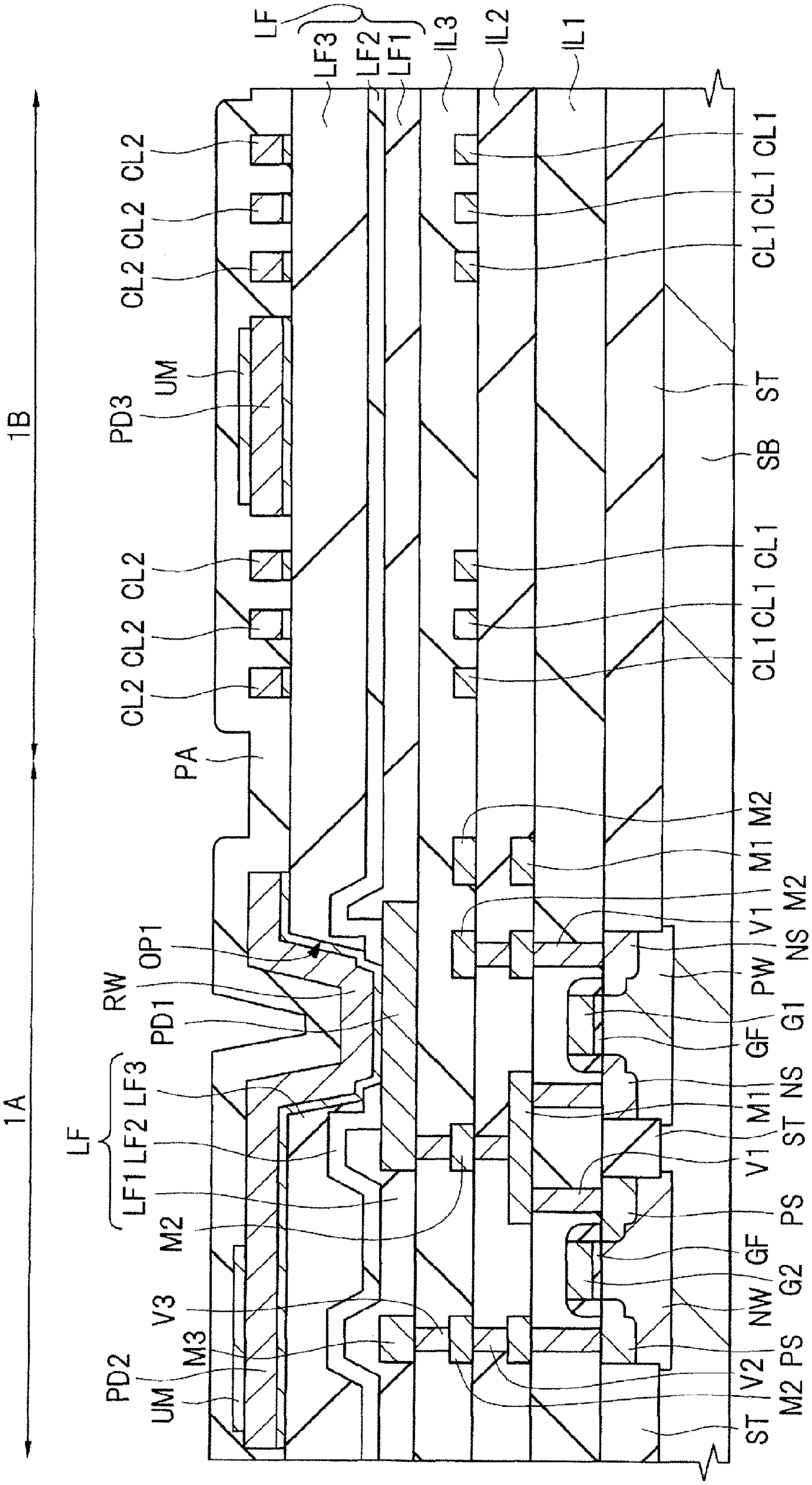
FIG. 56 is a main-portion cross-sectional view of the semiconductor device during a manufacturing step subsequent to that shown in FIG. 55.

Next, as shown in FIG. 56, over the main surface (entire main surface) of the semiconductor substrate SB, i.e., over the multi-layer film LF, the insulating protective film (surface protective film, insulating film, or protective insulating film) PA is formed so as to cover the redistribution wire RW, the pad PD2, the coil CL2, and the pad PD3. As the protective film PA, a resin film is used preferably and, e.g., a polyimide film can be used appropriately.

The protective film PA can be formed by, e.g., a coating method. Specifically, using a so-called spin coating (roll-on coating) method, a solution of a polyimide precursor is applied to the main surface of the semiconductor substrate SB, while the semiconductor substrate SB is rotated. Then, by drying the applied solution of the polyimide precursor, a polyimide film can be formed as the protective film PA.

Figure 57:
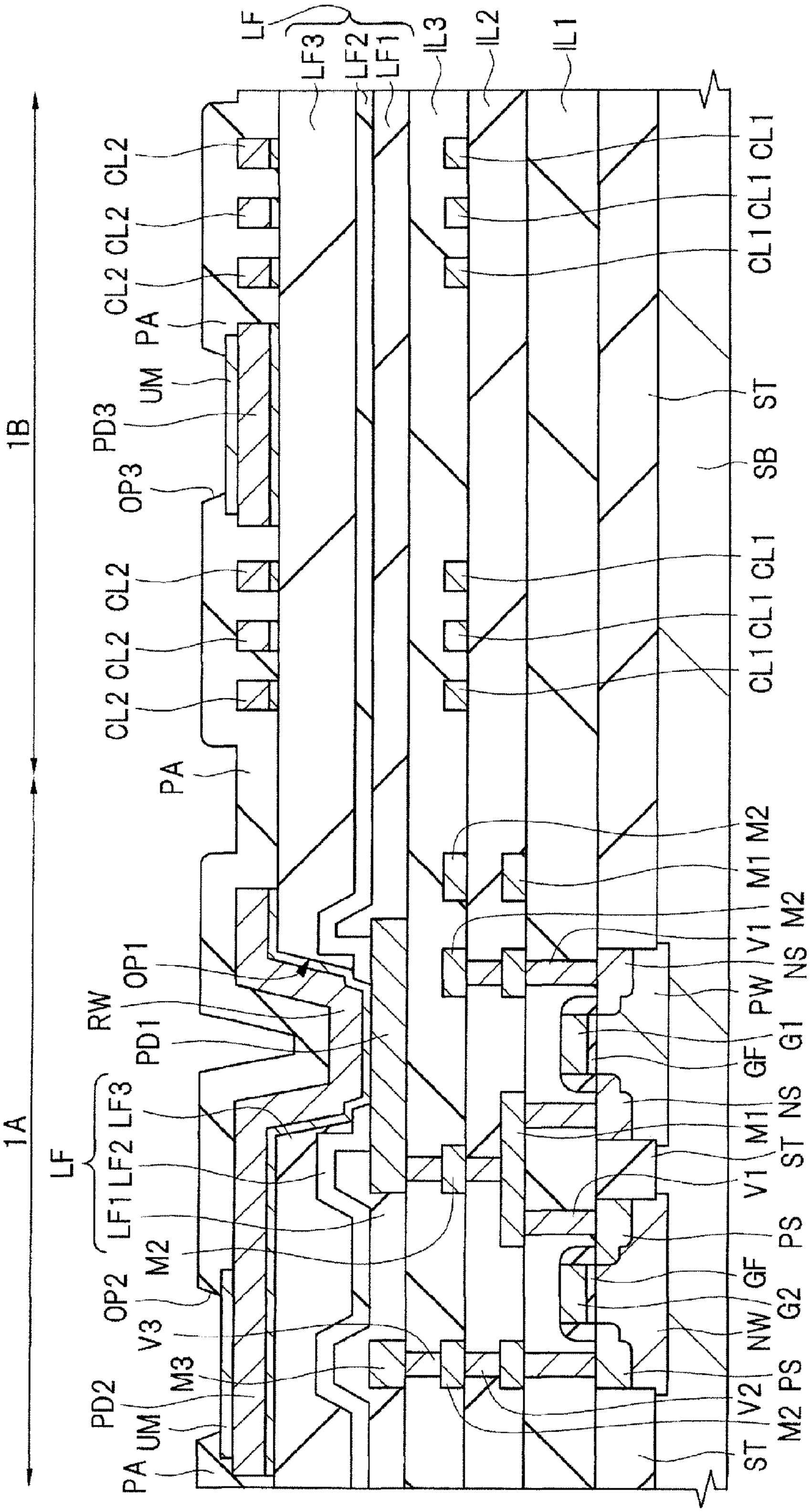
FIG. 57 is a main-portion cross-sectional view of the semiconductor device during a manufacturing step subsequent to that shown in FIG. 56.

Next, as shown in FIG. 57, in the protective film PA, the openings OP2 and OP3 are formed. For example, the openings OP2 and OP3 can be formed as follows. That is, by forming a photosensitive resin film as the protective film PA and subjecting the protective film PA made of the photosensitive resin to exposure and development, the portions of the protective film PA to be formed with the openings OP2 and OP3 are selectively removed to thus form the openings OP3 and OP3 in the protective film PA. Then, heat treatment is performed to cure the protective film PA. The openings OP2 and OP3 are formed so as to extend through the protective film PA. From the opening OP2, at least a portion of the pad PD2 is exposed and, from the opening OP3, at least a portion of the pad PD3 is exposed. When the underlying metal films UM are formed over the pads PD2 and PD3, the underlying metal film UM over the pad PD2 is exposed from the opening OP2 and the underlying film UM over the pad PD3 is exposed from the opening OP3.

In manufacturing a semiconductor package, when wire bonding is performed on the pads PD2 and PD3, the bonding wires BW described later are coupled to the respective underlying metal films UM exposed from the openings OP2 and OP3. By providing the underlying metal films UM, it is possible to easily and properly couple conductive coupling members such as the bonding wires (BW) to the pads PD2 and PD3.

In another embodiment, it is also possible to form the opening OP2 in the protective film PA by dry-etching the protective film PA using a photoresist layer formed over the protective film PA using a photolithographic technique as an etching mask. In that case, the protective film PA need not be a photosensitive resin film.

The pads PD2 and PD3 (or the underlying metal films UM over the pads PD2 and PD3) are exposed from the openings OP2 and OP3 of the protective film PA. The redistribution wire RW and the coil CL2 are covered and protected with the protective film PA. By using a resin film (organic insulating film) made of a polyimide resin or the like as the uppermost-layer protective film PA, the relatively soft resin film (organic insulating film) is provided in an uppermost layer to allow easy handling of semiconductor chips.

Figure 58:
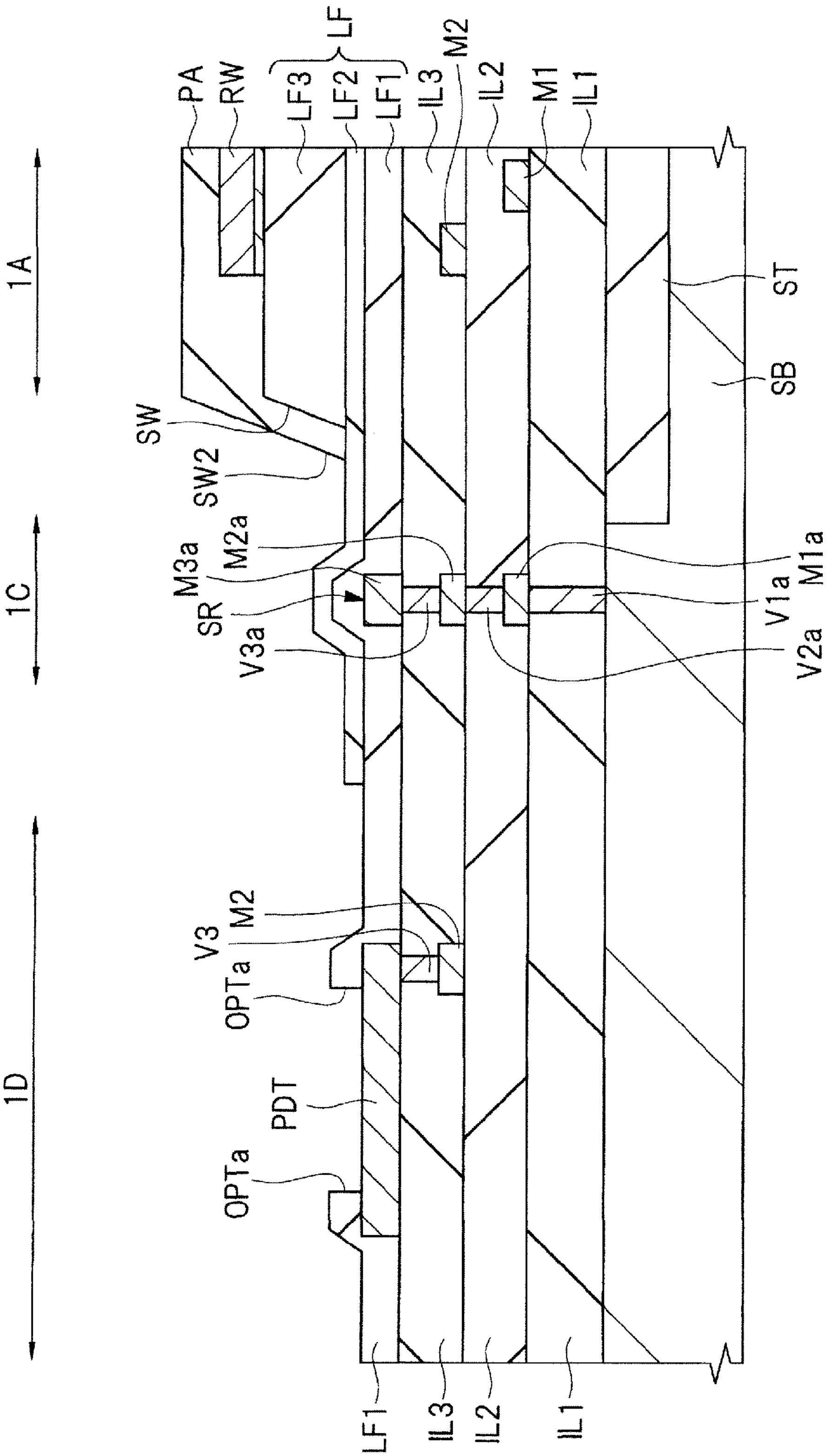
FIG. 58 is a main-portion cross-sectional view of the semiconductor device during the same manufacturing step as that shown in FIG. 57.
Figure 59:
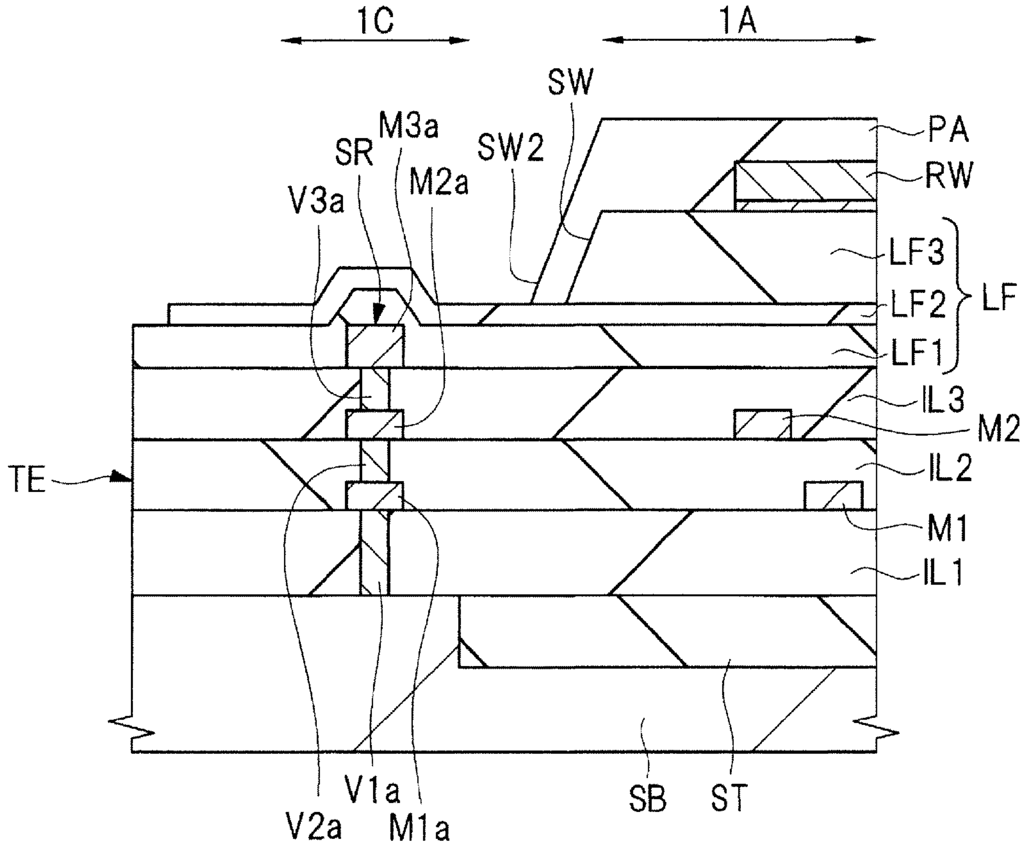
FIG. 59 is a main-portion cross-sectional view of the semiconductor device during a manufacturing step subsequent to that shown in FIG. 58.

When the openings OP2 and OP3 are formed in the protective film PA as shown in FIG. 57, as shown in FIG. 58, the portion of the protective film PA which is formed in the scribe region 1D is also removed. Here, FIGS. 57 and 58 correspond to the same process stage. For example, when the portions of the protective film PA to be formed with the openings OP2 and OP3 are selectively removed by subjecting the protective film PA made of a photosensitive resin to exposure and development, the portion of the protective film PA which is formed in the scribe region 1D is also subjected to exposure and development to be removed. The reason for removing the protective film PA from the scribe region 1D is substantially the same as the reason for removing the resin film LF3 from the scribe region 1D described above.

Thus, in the scribe region 1D, the silicon nitride film LF2, the resin film LF3, and the protective film PA have been removed so that the silicon dioxide film LF1 serves as the uppermost-layer film.

Then, by performing a dicing step, the semiconductor substrate SB is subjected to cutting (dicing) to be divided (singulated) into a plurality of semiconductor chips. That is, the semiconductor substrate SB is cut along the scribe region 1D. In this manner, from the individual chip regions of the semiconductor substrate SB (semiconductor wafer), the semiconductor chips are obtained. Since the semiconductor substrate SB and the multi-layer structure over the semiconductor substrate SB are cut in the scribe region 1D, the scribe region in is cut and removed. FIG. 59 corresponds to a structure obtained by cutting and removing the scribe region 1D from the structure shown in FIG. 58 by dicing. FIG. 59 corresponds to FIG. 7 described above. A cut surface resulting from dicing serves as the side surface TE of the semiconductor device (semiconductor chip). Prior to dicing, the semiconductor substrate SB may also be subjected to back-surface grinding to be thinned.

<About Main Characteristic Features and Effects of Semiconductor Device (Semiconductor Chip)>

In the present embodiment, the semiconductor device (semiconductor chip) has the coil CL1 formed over the semiconductor substrate SB via first insulating films (which are the interlayer insulating films IL1 and IL2 herein), a second insulating film (which is the interlayer insulating film IL3 herein) formed over the semiconductor substrate SB so as to cover the first insulating films and the coil CL1, and the pad PD1 formed over the second insulating film and located at a position not overlapping the coil CL1 in plan view. The semiconductor device (semiconductor chip) further has the multi-layer film LF formed over the second insulating film and having the opening OP1 exposing the pad PD1, the coil CL2 formed over the multi-layer film LF and located over the coil CL1, and the redistribution wire RW (first wire) formed over the multi-layer film LF including the pad PD1 exposed from the opening OP1 and electrically coupled to the pad PD1. The coils CL1 and CL2 are not coupled to each other via a conductor, but are magnetically coupled to each other.

One of the main characteristic features of the present embodiment is that the multi-layer film LF includes the silicon dioxide film LF1, the silicon nitride film LF2 over the silicon dioxide film LF1, and the resin film LF3 over the silicon nitride film LF2, and the silicon dioxide film LF1, the silicon nitride film LF2, and the resin film LF3 are interposed also between the coils CL1 and CL2.

The multi-layer film LF is an insulating film formed after the formation of the pad PD1 and before the formation of the redistribution wire RW and the coil CL2. Consequently, the pad PD1 is partly covered with the multi-layer film LF and, over the multi-layer film LF, the coil CL2 and the redistribution wire RW are formed. Therefore, in the case of performing a test step (probe test) using the pad PD1, the multi-layer film LF can function as an uppermost-layer film (surface protective film). The pad PD1 is partly covered with the multi-layer film LF because the portion of the pad PD1 which does not overlap the opening OP1 in plan view is covered with the multi-layer film LF1. Specifically, the center portion of the pad PD1 is not covered with the multi-layer film LF, while the outer peripheral portion of the pad PD1 is covered with the multi-layer film LF.

In the present embodiment, it is important to provide the multi-layer film LF as a multi-layer film in which the silicon dioxide film LF1, the silicon nitride film LF2, and the resin film LF3 are stacked in this order. Since the multi-layer film LF is interposed between the coils CL1 and CL2, the silicon dioxide film LF1, the silicon nitride film LF2, and the resin film LF3 are consequently interposed between the coils CL1 and CL2.

When comparisons are made between the respective dielectric breakdown voltages of a silicon dioxide film, a silicon nitride film, and a resin film (e.g., polyimide film), the dielectric breakdown voltage of the silicon dioxide film is the easiest to increase and the dielectric breakdown voltage of the resin film (e.g., polyimide film) is the next easiest to increase. That is, when comparisons are made between the respective dielectric breakdown voltages of the silicon dioxide film, the silicon nitride film, and the resin film (e.g., polyimide film) per unit thickness, the dielectric breakdown voltage of the silicon dioxide film is the highest and the dielectric breakdown voltage of the resin film (e.g., polyimide film) is the next highest. Between the coils CL1 and CL2, a large potential difference may be produced. Therefore, in terms of improving the reliability of a semiconductor chip having the coils CL1 and CL2, the reliability of a semiconductor package including the semiconductor chip, or the reliability of an electronic device using the semiconductor package, it is desirable to maximize the dielectric breakdown voltage between the coils CL1 and CL2. Accordingly, by allowing the multi-layer film LF interposed between the coils CL1 and CL2 to include the silicon dioxide film LF1, it is possible to improve the dielectric breakdown voltage between the coils CL1 and CL2. In other words, by interposing the silicon dioxide film LF1 having a relatively high dielectric breakdown voltage per unit thickness between the coils CL1 and CL2, it is possible to improve the dielectric breakdown voltage between the coils CL1 and CL2.

However, since the silicon dioxide film has a moisture absorbing property, it is undesirable to use the silicon dioxide film as an uppermost-layer film (top surface film). When the test step (probe test) is performed using the pad PD1, the top surface of the multi-layer film LF serves as the uppermost surface. When the silicon dioxide film absorbs moisture, the reliability of the semiconductor device may be degraded. Additionally, when the resin film (e.g., polyimide film) is formed directly over the silicon dioxide film, the moisture in the resin film (e.g., polyimide film) may be diffused and absorbed in the silicon dioxide film.

To prevent this, in the present embodiment, the silicon dioxide film LF1 is not provided in the uppermost layer of the multi-layer film LF and the resin film is not formed directly over the silicon dioxide film LF1. That is, in the present embodiment, over the silicon dioxide film LF1, the silicon nitride film LF2 is formed so as to come in contact with the silicon dioxide film LF1. By forming the silicon nitride film LF2 over the silicon dioxide film LF1, it is possible to inhibit or prevent the silicon dioxide film LF1 from absorbing moisture.

To increase the dielectric breakdown voltage between the coils CL1 and CL2, there are an approach which increases the dielectric breakdown voltage of the insulating film interposed between the coils CL1 and CL2 per unit thickness and an approach which increases the thickness of the insulating film. Since the silicon dioxide film LF1 has a high dielectric breakdown voltage per unit thickness, in terms of improving the dielectric breakdown voltage, the thickness of the silicon dioxide film LF1 is preferably maximized. However, in terms of film deposition, it is not easy to increase the thickness thereof. In addition, when the thickness of the silicon dioxide film LF1 is excessively increased, the semiconductor substrate SB (semiconductor wafer) may easily warp during manufacturing. On the other hand, since the dielectric breakdown voltage of the silicon nitride film per unit thickness is not so high, in terms of improving the dielectric breakdown voltage, it is disadvantageous to increase the dielectric breakdown voltage by increasing the thickness of the silicon nitride film. Accordingly, in the present embodiment, the dielectric breakdown voltage between the coils CL1 and CL2 is increased by allowing the multi-layer film LF to include also the resin film LF3. That, when it is attempted to increase the dielectric breakdown voltage only by increasing the thickness of the silicon dioxide film LF1, there is the possibility that manufacturing difficulty is encountered in forming the silicon dioxide film thick or the semiconductor substrate SB (semiconductor wafer) warps. However, when it is attempted to increase the dielectric breakdown voltage by also providing the resin film LF3, such a possibility can be eliminated. However, since the silicon dioxide film LF1 may absorb moisture, by interposing the silicon nitride film LF2 between the silicon dioxide film LF1 and the resin film LF3, not by directly forming the resin film LF3 over the silicon dioxide film LF1, it is possible to prevent the silicon dioxide film LF1 from absorbing moisture.

Thus, by allowing the multi-layer film LF to include the silicon dioxide film LF1, the present embodiment has improved the dielectric breakdown voltage. In addition, by allowing the multi-layer film LF to include also the resin film LF3, the present embodiment has further improved the dielectric breakdown voltage, while eliminating manufacturing difficulty and preventing the occurrence of the problem that the semiconductor substrate SB (semiconductor wafer) warps during manufacturing. Moreover, by interposing the silicon nitride film LF2 during the silicon dioxide film LF1 and the resin film LF3, the present embodiment has prevented the occurrence of the problem that the silicon dioxide film LF1 absorbs moisture. Thus, it is important to provide the multi-layer film LF as the multi-layer film in which the silicon dioxide film LF1, the silicon nitride film LF2, and the resin film LF3 are stacked in this order. This can improve the reliability of the semiconductor device (semiconductor chip) having the coils CL1 and CL2. This can also improve the reliability of the semiconductor package (semiconductor device) having the coils CL1 and CL2 or the reliability of the electronic device using the semiconductor package.

Providing the resin film LF3 in the uppermost layer of the multi-layer film LF can also offer the advantage that, when the test step (probe test) is performed using the pad PD1, the test step is easily performed and handling is easily performed. That is, in the test step (probe test), the resin film LF3 forms the uppermost surface and, as the uppermost surface is softer, handling is more easily performed. From this viewpoint, a polyimide film is appropriate as the resin film LF3. Since the polyimide film is soft (flexible), the polyimide film forming the uppermost surface in the test step (probe test) allows the test step and handling to be easily performed.

When formed over the semiconductor substrate (semiconductor wafer), a silicon dioxide film and a polyimide film have stresses in opposite directions. Consequently, the semiconductor substrate (semiconductor wafer) warps in opposite directions. Accordingly, when the polyimide film is used as the resin film LF3, it is possible to cancel out the stress of the silicon dioxide film LF1 with the stress of the polyimide film and inhibit or prevent the semiconductor substrate SB (semiconductor wafer) from warping due to the stress of the silicon dioxide film LF1. This can also achieve the effect of inhibiting or preventing the semiconductor substrate SB (semiconductor wafer) from warping during manufacturing.

The silicon nitride film LF2 also has the function of preventing the silicon dioxide film LF1 from absorbing moisture. Accordingly, the thickness of the silicon nitride film LF2 is more preferably not less than 0.5 μm. This can reliably prevent the silicon diode film LF1 from absorbing moisture.

Since the silicon nitride film LF2 has the dielectric breakdown voltage per unit thickness which is lower than that of the silicon dioxide film LF1, in terms of improving the dielectric breakdown voltage, an approach which increases the thickness of the silicon dioxide film LF1 to improve the dielectric breakdown voltage is advantageous over an approach which increases the thickness of the silicon nitride film LF2 to improve the dielectric breakdown voltage. In addition, as compared to the silicon dioxide film, the silicon nitride film is more likely to cause the warping of the semiconductor substrate (semiconductor wafer) when formed over the semiconductor substrate (semiconductor wafer). Accordingly, when the silicon nitride film LF2 is excessively thickened, the warping of the semiconductor substrate (semiconductor wafer) may occur.

To prevent this, the thickness of the silicon dioxide film LF1 is more preferably thicker (larger) than the thickness of the silicon nitride film LF2. In other words, the thickness of the silicon nitride film LF2 is thinner (smaller) than the thickness of the silicon dioxide film LF1. This can improve the dielectric breakdown voltage between the coils CL1 and CL2 and also inhibit or prevent the semiconductor substrate SB (semiconductor wafer) from warping. From this viewpoint, the thickness of the silicon nitride film LF2 is more preferably not more than 3 μm. Here, the respective thicknesses of the silicon dioxide film LF1 and the silicon nitride film LF2 correspond to the respective thicknesses of the silicon dioxide film LF1 and the silicon nitride film LF2 between the coils CL1 and CL2.

Note that, in FIG. 86 described later, a thickness T1 as the thickness of the silicon dioxide film LF1, a thickness T2 as the thickness of the silicon nitride film LF2, and a thickness T3 as the thickness of the resin film LF3 are shown. As described above, the thickness T1 of the silicon dioxide film LF1 is preferably thicker (larger) than the thickness T2 of the silicon nitride film LF2 (i.e., $T1>T2$ is satisfied).

The laminate film LF also has the opening OP1 exposing the pad PD1. The center portion of the pad PD1 is uncovered with the multi-layer film LF, but the outer peripheral portion of the pad PD1 is covered with the multi-layer film LF. The opening OP1 of the multi-layer film LF is formed of the opening OP1*a* of the silicon dioxide film LF1, the opening OP1*b* of the silicon nitride film LF2, and the opening OP1*c* of the resin film LF3.

In the present embodiment, as also shown in FIGS. 4 and 5 described above, it is more preferable that the opening OP1*b* of the silicon nitride film LF2 is included in the opening OP1*a* of the silicon dioxide film LF1 in plan view and the inner wall of the opening OP1*a* of the silicon dioxide film LF1 is covered with the silicon nitride film LF2. As a result, at the inner wall of the opening OP1*a* of the silicon dioxide film LF1 also, the top surface of the silicon dioxide film LF1 is covered with the silicon nitride film LF2. This can more reliably prevent the silicon dioxide film LF1 from absorbing moisture. That is, unlike in the present embodiment, when the inner wall of the opening OP1*a* of the silicon dioxide film LF1 is uncovered with the silicon nitride film LF2, the silicon dioxide film LF1 may absorb moisture from the inner wall of the opening OP1*a* of the silicon dioxide film LF1. By contrast, when the inner wall of the opening OP1*a* of the silicon dioxide film LF1 is covered with the silicon nitride film LF2, it is possible to prevent the silicon dioxide film LF1 from absorbing moisture from the inner wall of the opening OP1*a* of the silicon dioxide film LF1. This can more reliably prevent the silicon dioxide film LF1 from absorbing moisture.

In the present embodiment, as also shown in FIGS. 4 and 5 described above, it is more preferable that the opening OP1*b* of the silicon nitride film LF2 is included in the opening OP1*c* of the resin film LF3 in plan view and the inner wall of the opening OP1*b* of the silicon nitride film LF2 is uncovered with the resin film LF3. Consequently, the exposed area of the pad PD1 (area of the portion of the pad PD1 which is exposed from the opening OP1 of the multi-layer film LF) is defined by the opening OP1*b* of the silicon nitride film LF2. This can inhibit variations in the exposed area of the pad PD1. That is, the amount of post-deposition contraction of a resin film (e.g., polyimide film) is larger than that of a silicon nitride film. Accordingly, the two-dimensional size (plane area) of the opening OP1*c* of the resin film LF3 is more likely to vary than the two-dimensional size (plane area) of the opening OP1*b* of the silicon nitride film LF2. However, if the inner wall of the opening OP1*b* of the silicon nitride film LF2 is kept from being covered with the resin film LF3, the exposed area of the pad PD1 is defined by the opening OP1*b* of the silicon nitride film LF2. As a result, even when the amount of contraction of the resin film LF3 varies, the exposed area of the pad PD1 is not affected thereby. This can inhibit variations in the exposed area of the pad PD1. Therefore, it is possible to more easily and properly perform the test step (probe test) using the pad PD1.

In the present embodiment, it is also more preferable that the stepped portion DS in the upper surface of the silicon nitride film LF2 formed due to the inner wall of the opening OP1*a* of the silicon dioxide film LF1 is covered with the resin film LF3. This reduces a level difference in an underlay over which the redistribution wire RW is to be formed and thus allows the redistribution wire RW to be more easily and properly formed. Therefore, it is possible to more properly form the redistribution wire RW using a plating method. Moreover, since a plating film is less likely to undergo disconnection, it is possible to improve the reliability of the redistribution wire RW.

In the present embodiment, it is also preferable that the inner wall of the opening OP1*b* of the silicon nitride film LF2 is tapered and the inner wall of the opening OP1*c* of the resin film LF3 is tapered. This allows easy formation of the redistribution wire RW extending from over the pad PD1 to over the multi-layer film and allows more proper formation of the redistribution wire RW. For example, when a (power-supply) underlying seed layer (corresponding to the foregoing seed film SE) for forming the redistribution wire RW by electrolytic plating is formed by a sputtering method or the like, it is possible to properly form the seed layer and prevent defective formation of the seed layer. This can prevent a disconnection failure in the seed layer and allow the plating layer for the redistribution wire RW to be properly formed.

Here, when the inner wall of the opening OP1*b* of the silicon nitride film LF2 is tapered, the inner wall of the opening OP1*b* is inclined from a direction perpendicular to the main surface of the semiconductor substrate SB. Consequently, the upper portion of the opening OP1*b* has a size (two-dimensional size) larger than that of the bottom portion thereof. Also, when the inner wall of the opening OP1*c* of the resin film LF3 is tapered, the inner wall of the opening OP1*c* is inclined from the direction perpendicular to the main surface of the semiconductor substrate SB. Consequently, the upper portion of the opening OP1*c* has a size (two-dimensional size) larger than that of the bottom portion thereof.

Preferably, the silicon dioxide film LF1 is formed by an HDP-CVD method (where HDP stands for High Density Plasma). Since the silicon dioxide film LF1 is the lowermost-layer film in the multi-layer film LF, the silicon dioxide film LF1 is formed so as to come in contact with the wires (which are the wires M3 herein) in the same layer as that of the pad PD1 and cover the wires (which are the wires M3). To increase the dielectric breakdown voltage, the silicon dioxide film LF1 is preferably thickened. Even when the silicon dioxide film LF1 is thickened, to allow the space between adjacent wires (which are the wires M3 herein) in the same layer as that of the pad PD1 to be filled with the silicon dioxide film LF1, a film deposition method having an excellent fillability is preferably used appropriately. A silicon dioxide film formed by the HDP-CVD method has an excellent fillability. Accordingly, by forming the silicon dioxide film LF1 by the HDP-CVD method, it is possible to increase the thickness of the silicon dioxide film LF1, while preventing defective filling of the space between the wires (which are the wires M3) in the same layer as that of the pad PD1. This can further improve the reliability of the semiconductor device. Note that a silicon dioxide film formed by the HDP-CVD method is referred to as an HDP-CVD oxide film. When the silicon dioxide film LF1 is formed by the HDP-CVD method, the density of a plasma during the film deposition is preferably set to about $1\times10^{11}$ to $1\times10^{12}/cm^3$. In normal plasma CVD, not in high-density plasma CVD, the density of a plasma is typically about $1\times10^{9}$ to $1\times10^{10}/cm^3$.

Also, as described above, the multi-layer structure of the insulating films between the coils CL2 and CL1 located over and under the insulating films is inventively improved to achieve an improvement in the dielectric breakdown voltage between the coils CL2 and CL1 or the like. In this manner, the reliability of the semiconductor device is improved. The coil CL2 and the redistribution wire RW are formed in the same layer and, in plan view, the shortest distance between the coil CL2 and the redistribution wire RW is preferably larger than the distances (vertical distances) between the coils CL2 and CL1. This can also ensure the dielectric breakdown voltage between the coil CL2 and the redistribution wire RW. The shortest distance between the coil CL2 and the redistribution wire RW in plan view can be set to a value of, e.g., not less than 100 μm.

Most preferably, the resin film LF3 is a polyimide film. The polyimide film has a high solvent resistance, a high heat resistance, and a high mechanical strength. As the resin film LF3, instead of the polyimide film, another organic insulating film made of, e.g., an epoxy-based resin, a PEO-based resin, an acrylic resin, or a WRP-based resin can also be used.

In the present embodiment, in the multi-layer film LF, the silicon nitride film LF2 is used as the insulating film to be interposed between the silicon dioxide film LF1 and the resin film LF3. In another embodiment, an oxynitride silicon film (silicon oxynitride film or SiON film) can also be used appropriately instead of the silicon nitride film LF2. That is, in another embodiment, between the silicon dioxide film LF1 and the resin film LF3, the oxynitride silicon film (silicon oxynitride film or SiON film) can also be interposed.

<About Other Inventive Improvements Related to Manufacturing of Semiconductor Device>

Next, a description will be given of other inventive improvements (first to fourth inventive improvements) in the manufacturing of the semiconductor device in the present embodiment.

<About First Inventive Improvement>

First, a description will be given of the first inventive improvement. The first inventive improvement is related to the resin film LF3.

Figure 60:
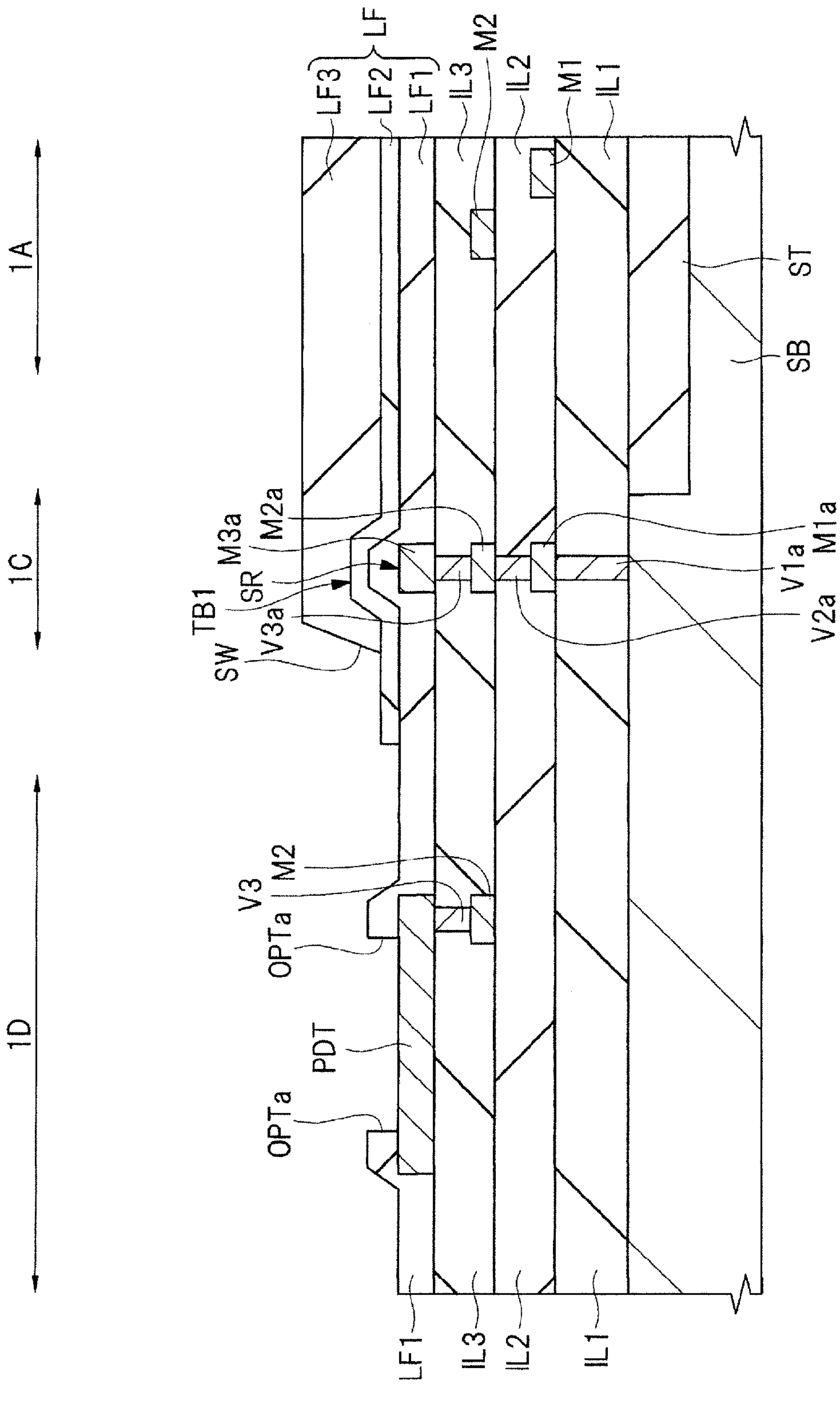
FIG. 60 is an illustrative view of a first inventive improvement.
Figure 61:
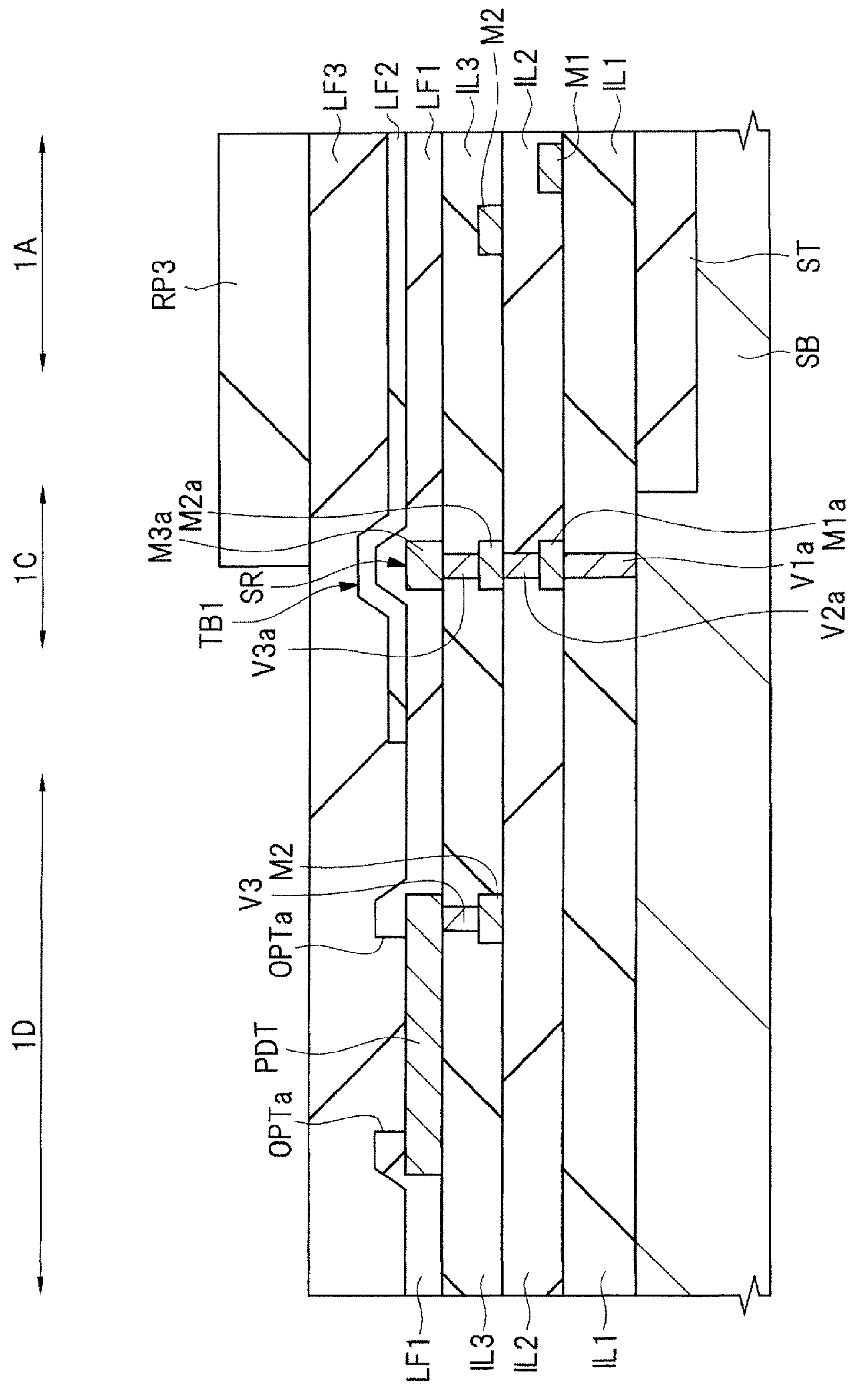
FIG. 61 is an illustrative view of the first inventive improvement.
Figure 62:
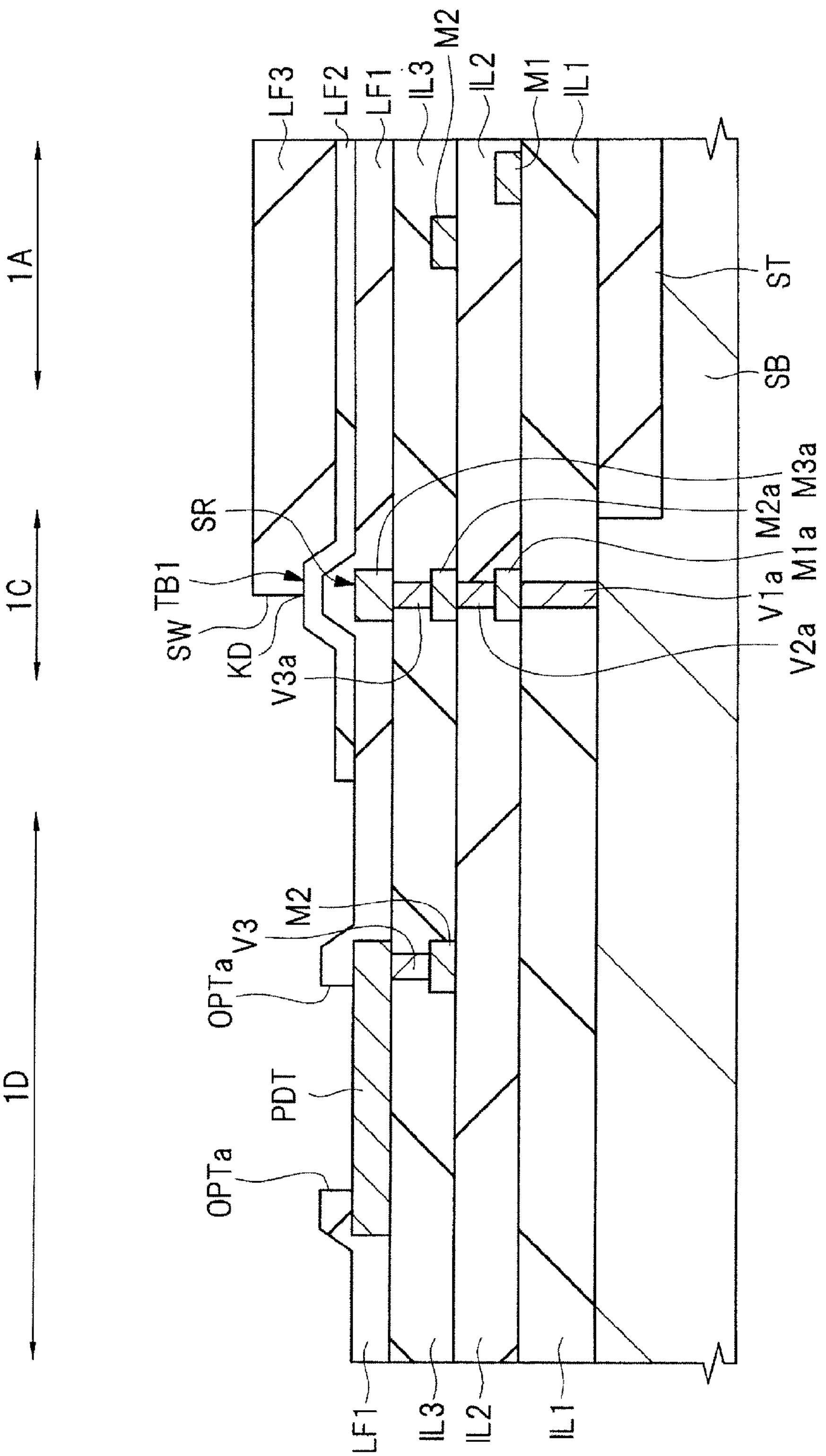
FIG. 62 is an illustrative view of the first inventive improvement.
Figure 63:
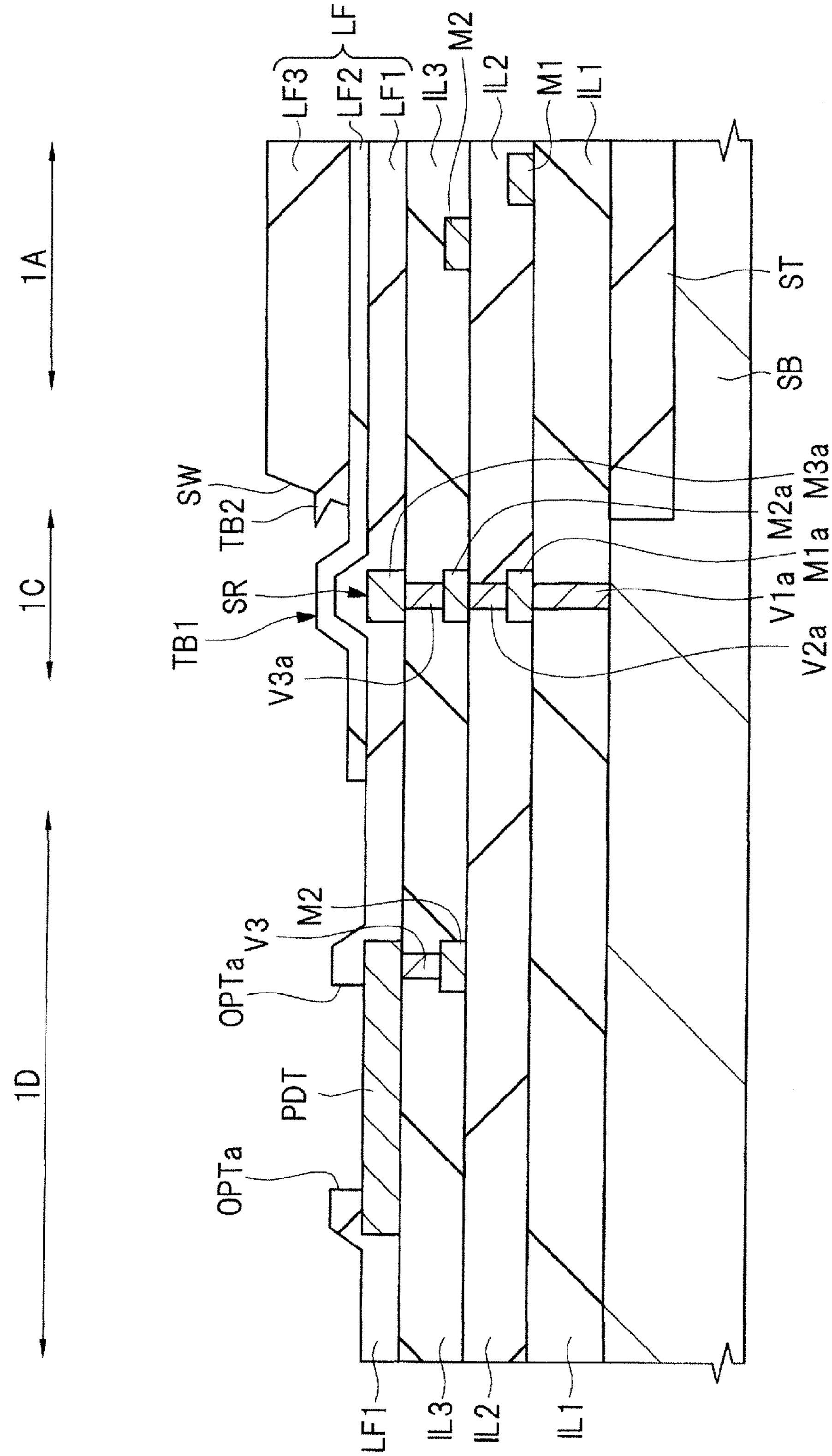
FIG. 63 is an illustrative view of the first inventive improvement.
Figure 64:
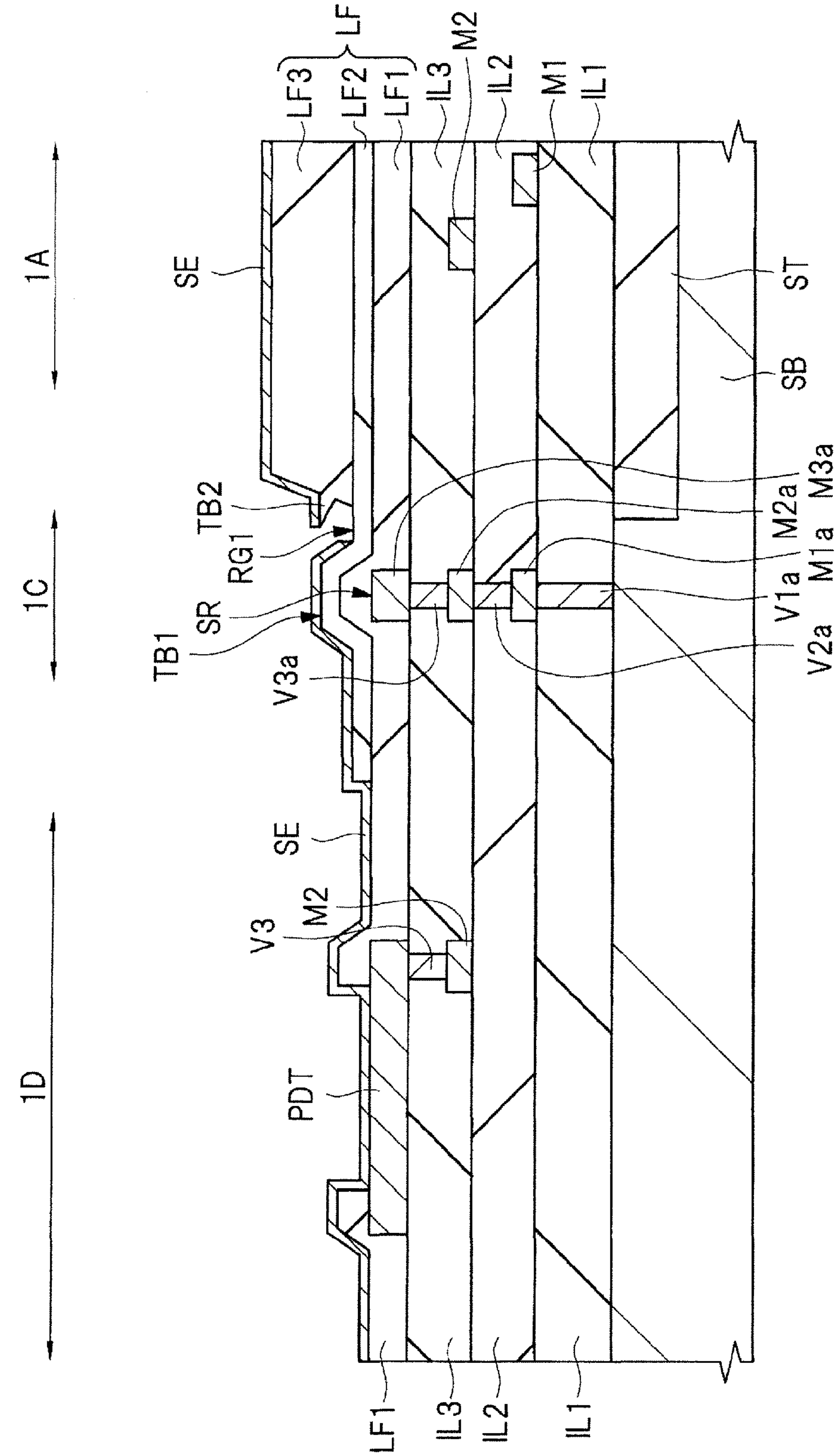
FIG. 64 is an illustrative view of the first inventive improvement.
Figure 65:
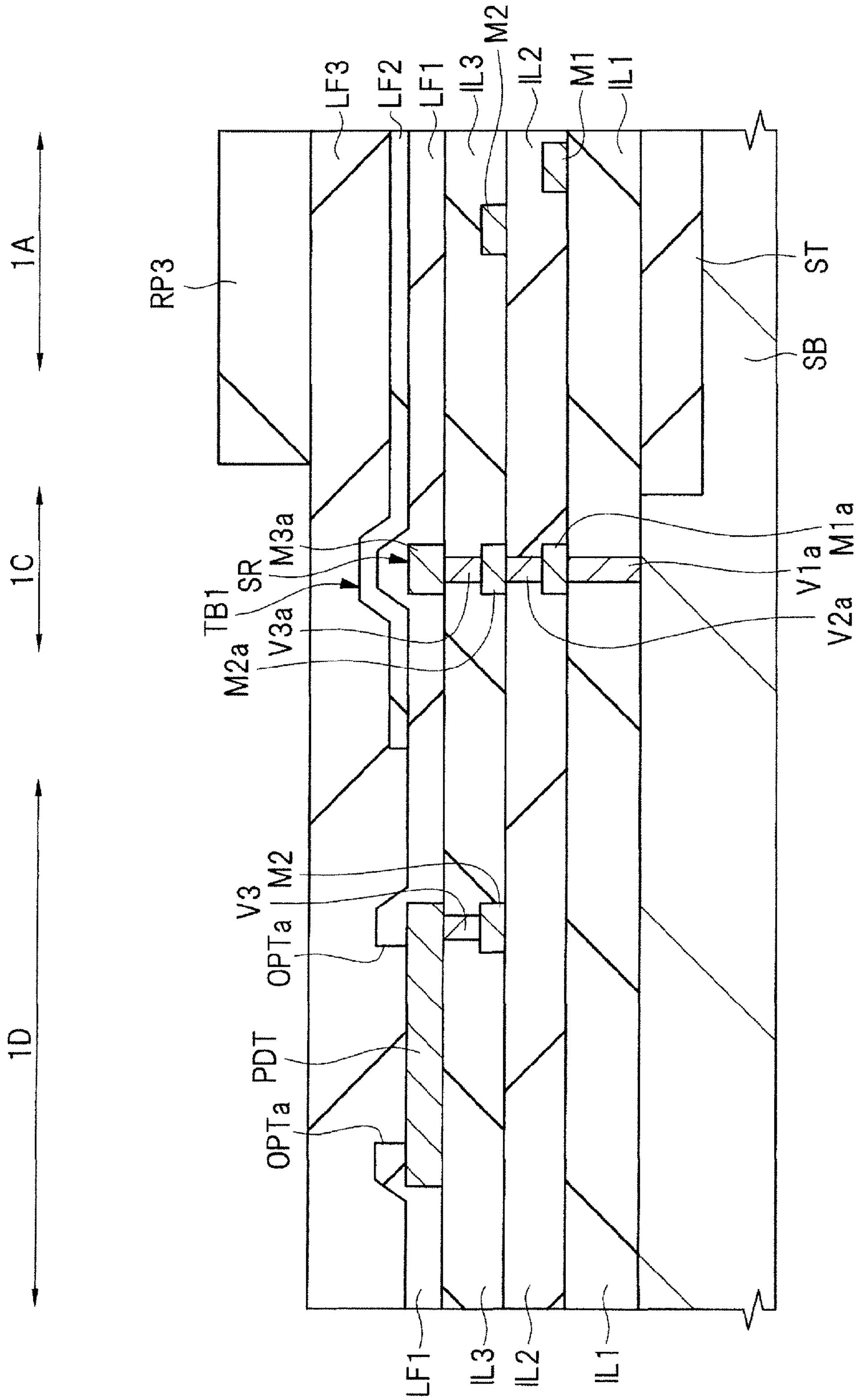
FIG. 65 is an illustrative view of the first inventive improvement.
Figure 66:
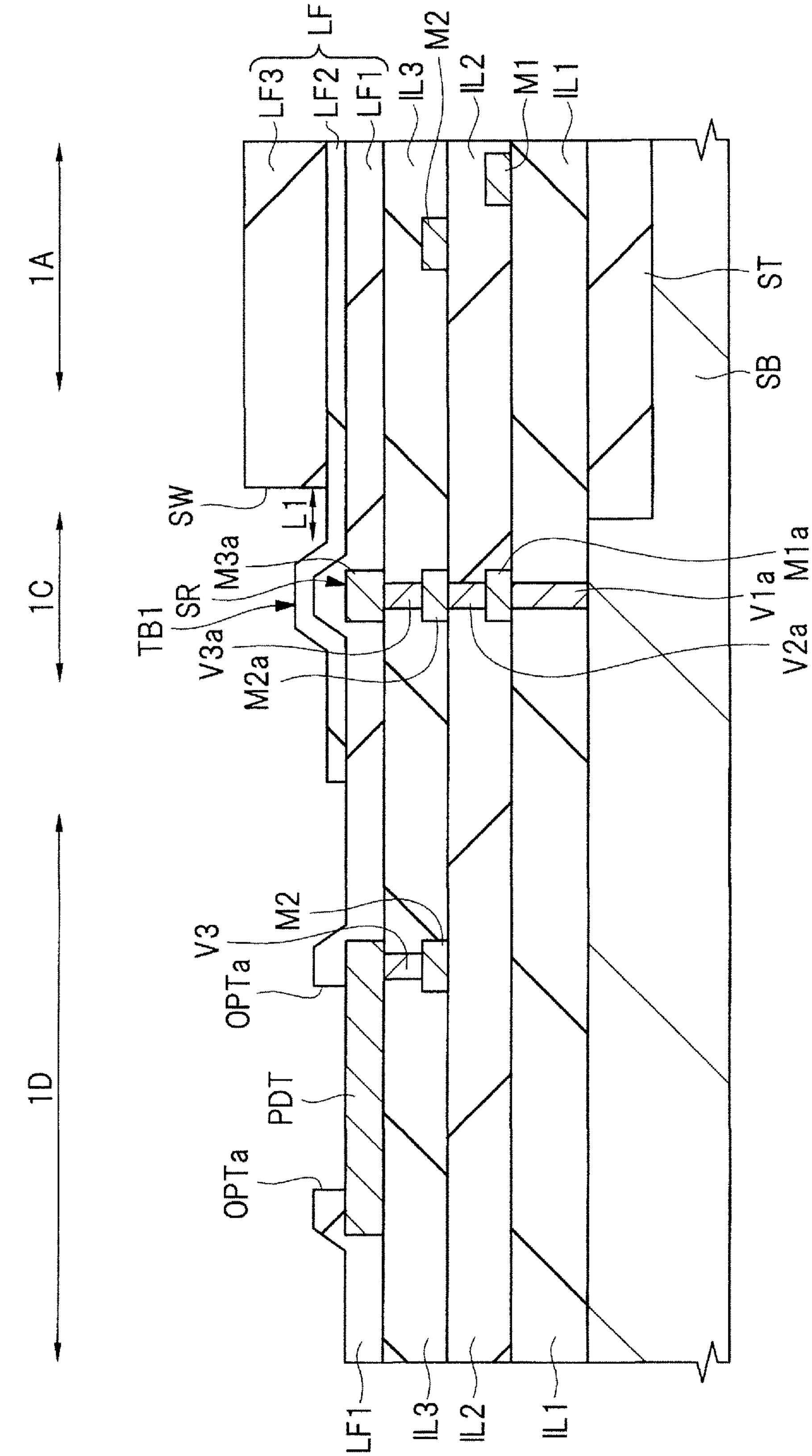
FIG. 66 is an illustrative view of the first inventive improvement.
Figure 67:
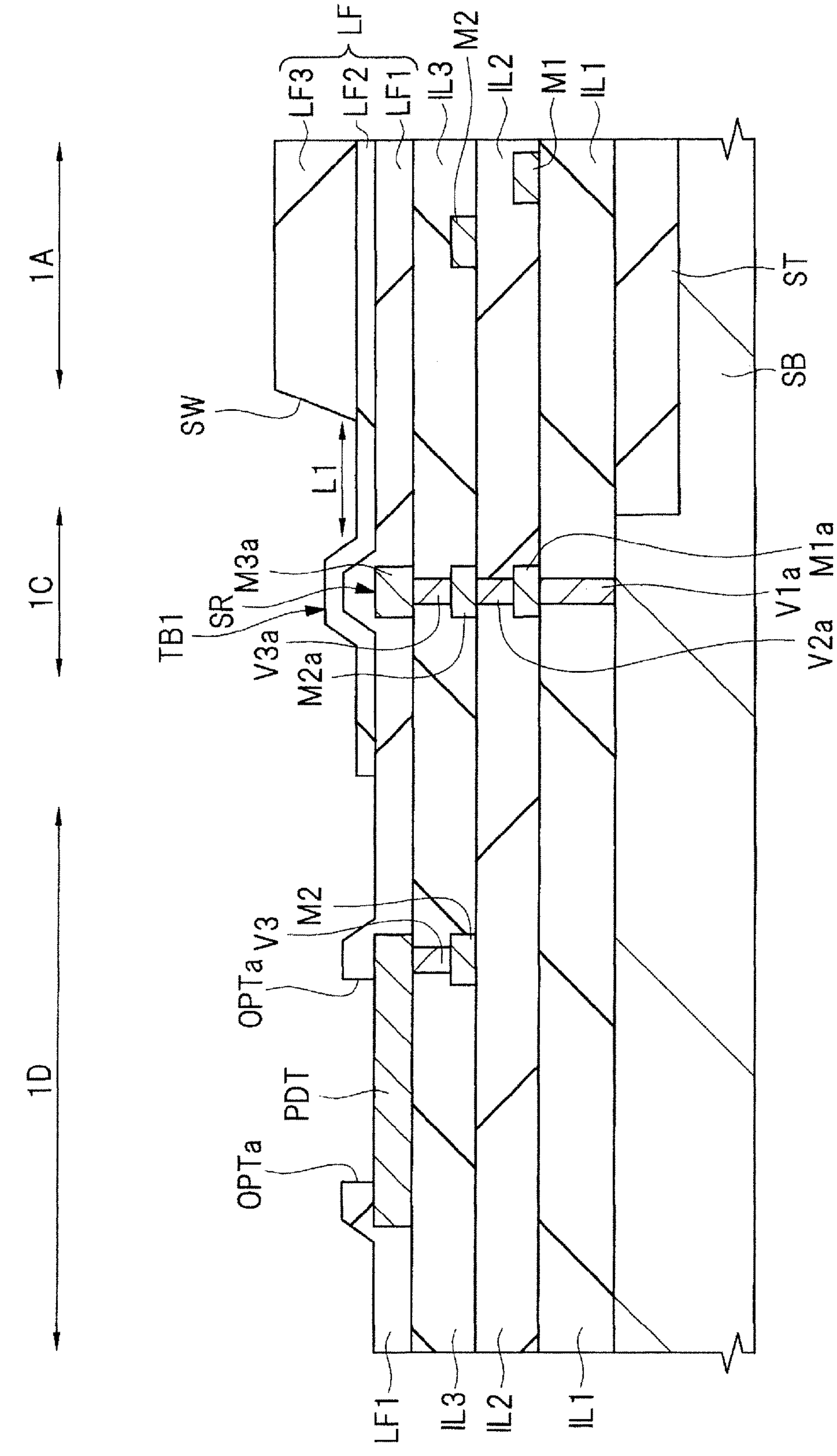
FIG. 67 is an illustrative view of the first inventive improvement.
Figure 68:
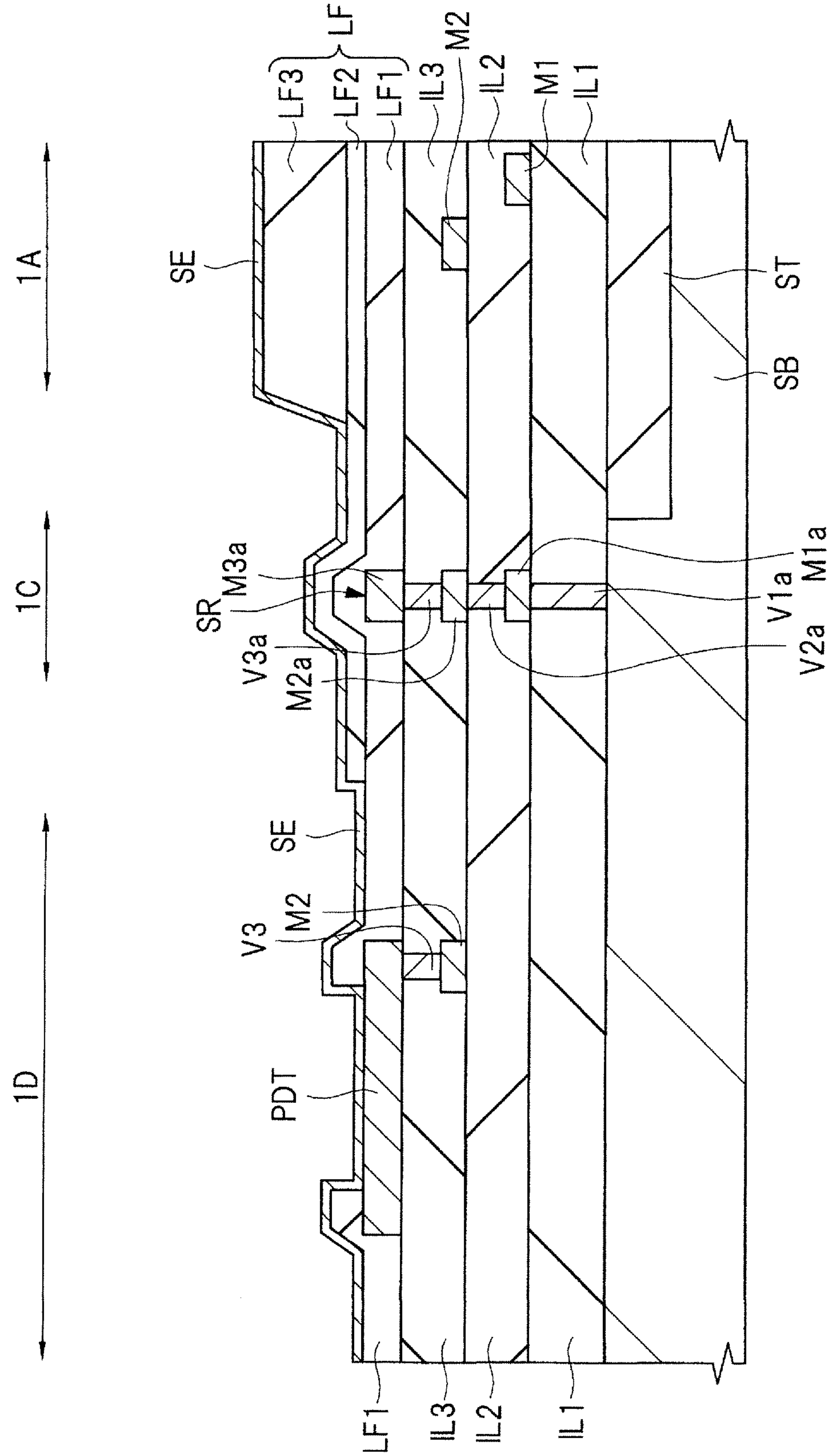
FIG. 68 is an illustrative view of the first inventive improvement.

FIGS. 60 to 68 are illustrative views of the first inventive improvement. FIG. 60 shows the stage where, after the deposition of the resin film LF3 made of a photosensitive resin film, the resin film LF3 has been subjected to exposure and development and then to heat treatment to be cured. FIGS. 61 to 64 show a sequence of steps, of which FIG. 61 shows the stage (stage corresponding to FIG. 46 described above) where the resist pattern RP3 has been formed over the resin film LF3, and FIG. 62 shows the stage where, after the stage shown in FIG. 61, the resin film LF3 has been exposed to light, then the resist pattern RR3 has been removed, and the resin film LF3 has been subjected to development treatment (accordingly, the stage before heat treatment for curing is performed). FIG. 63 shows the stage (stage corresponding to FIG. 48 described above) where, after the stage shown in FIG. 62, the resin film LF3 has been subjected to heat treatment to be cured, and FIG. 64 shows the stage (stage corresponding to FIG. 49 described above) where, after the stage shown in FIG. 63, the seed film SE has been formed. FIGS. 65 to 68 show a sequence of steps, of which FIG. 65 shows the stage (stage corresponding to FIG. 46 described above) where the resist pattern RP3 has been formed over the resin film LF3, and FIG. 66 shows the stage where, after the stage shown in FIG. 65, the resin film LF3 has been exposed to light, then the resist pattern RP3 has been removed, and the resin film LF3 has been subjected to development treatment (accordingly, the stage before heat treatment for curing is performed). FIG. 67 shows the stage (stage corresponding to FIG. 48 described above) where, after the stage shown in FIG. 66, the resin film LF3 has been subjected to heat treatment to be cured. FIG. 68 shows the stage (stage corresponding to FIG. 49 described above) where, after the stage shown in FIG. 67, the seed film SE has been formed.

In the case of FIG. 60, a side wall SW (side wall SW in FIG. 60) forming the outer periphery of the resin film LF3 after cured by heat treatment is located outside the seal ring SR. In the case of FIGS. 61 to 64 and in the case of FIGS. 65 to 68, the side wall SW (side wall SW in FIGS. 63 and 67) forming the outer periphery of the resin film LF3 after cured by heat treatment is located inside the seal ring SR.

The outside of the seal ring SR corresponds to the one of both sides of the seal ring SR which is closer to the scribe region 1D in plan view. The inside of the seal ring SR corresponds to the other of both sides of the seal ring SR which is further away from the scribe region 1D (i.e., which is closer to the center of the chip region) in plan view. The peripheral circuit formation region 1A and the transformer formation region 1B are located inside the seal ring SR.

Thus, over the main surface (entire main surface) of the semiconductor substrate SB, i.e., over the silicon nitride film LF2 (over the silicon dioxide film LF1 in the scribe region 1D), the resin film LF3 as the photosensitive resin film is formed and then subjected to exposure and development to be patterned (see FIGS. 43 to 48 described above). Specifically, the opening OP1*c* is formed in the resin film LF3, while the resin film LF3 is removed from the scribe region 1D. At this time, the resin film LF3 is removed from the scribe region 1D so that the outer periphery of the resin film LF3 is formed in the chip region. That is, the side wall SW forming the outer periphery of the resin film LF3 is formed in the chip region (see FIG. 48 described above).

Here, the resin film LF3 is made of a photosensitive resin film. After deposited, the resin film LF3 is subjected to exposure and development and then to heat treatment to be cured. When cured by heat treatment, the resin film LF3 contracts. That is, as a result of the heat treatment, the resin film LF3 contracts while being cured. As a result, the position of the side wall SW forming the outer periphery of the resin film LF3 at the stage where the exposure and development has been performed is different from the position thereof at the stage where the resin film LF3 has been cured by heat treatment.

The seal ring SR has the function of preventing the crack formed in the dicing step from extending to the inside of the seal ring SR. However, when there is an insulating film extending over the seal ring SR from the inside of the seal ring SR to the outside thereof, the possibility that the crack extends along the insulating film to the inside of the seal ring SR cannot be eliminated. Therefore, in terms of maximizing the reliability of the semiconductor device, it is desirable not to use the structure in which, at the stage where the resin film LF3 has been cured by heat treatment, the side wall SW forming the outer periphery of the resin film LF3 is located outside the seal ring SR, as shown in FIG. 60. That is, the structure in which the side wall SW of the resin film LF3 is located outside the seal ring SR at the stage where the resin film LF3 has been cured by heat treatment, as shown in FIG. 60, does not allow elimination of the possibility that the crack extends along the resin film LF3 to the inside of the seal ring SR. Therefore, it is desirable not to use such a structure.

In the case of FIGS. 61 to 64, at the stage (stage shown in FIG. 62) where the resin film LF3 has been subjected to exposure and development, the side wall SW of the resin film LF3 is located over a protruding portion (projecting portion) TB1 resulting from the seal ring SR. At the stage (stage shown in FIG. 63) where the resin film LF3 has been cured by heat treatment, the side wall SW of the resin film LF3 is located inside the seal ring SR and also inside the protruding portion TB1 resulting from the seal ring SR.

Here, the protruding portion (projecting portion) TB1 resulting from the seal ring SR is formed over the top surface (upper surface) of the silicon nitride film LF2 so as to cover the seal ring SR (more specifically, the seal ring wire M3*a* forming the seal ring SR) and thus reflect the underlying protruding shape (protruding shape formed of the seal ring wire M3*a*). The protruding portion TB1 is formed conformal to the seal ring SR (more specifically, the seal ring wire M3*a* forming the seal ring SR). Consequently, the protruding portion TB1 is formed at a position overlapping the seal ring SR (more specifically, the seal ring wire M3*a* forming the seal ring SR) in plan view.

Note that the outside of the protruding portion TB1 corresponds to the one of both sides of the protruding portion TB1 which is closer to the scribe region 1B. The inside of the protruding portion TB1 corresponds to the other of both sides of the protruding portion TB1 which is further away from the scribe region 1D (i.e., which is closer to the center of the chip region). The peripheral circuit formation region 1A and the transformer formation region 1B are present inside the protruding portion TB1.

The structure in which, at the stage where the resin film LF3 has been cured by heat treatment, the side wall SW of the resin film LF3 is located inside the seal ring SR and also inside the protruding portion TB1 resulting from the seal ring SR, as shown in FIG. 63, allows elimination of the possibility that the crack extends along the resin film LF3 to the inside of the seal ring SR. In this point, the structure in FIG. 63 is preferred to the structure in FIG. 60.

However, as a result of study, the present inventors have found that, when the side wall SW of the resin film LF3 is located over the protruding portion TB1 resulting from the seal ring SR at the stage where the resin film LF3 has been subjected to exposure and development, as shown in FIG. 62, the following problem may arise.

That is, when the side wall SW of the resin film LF3 is located over the protruding portion TB1 resulting from the seal ring SR at the stage where the resin film LF3 has been subjected to exposure and development, as shown in FIG. 62, at the stage where the resin film LF3 is cured by heat treatment, a protruding portion (projecting portion) TB2 is likely to be formed at the side surface SW of the resin film LF3, as schematically shown in FIG. 63. When the resin film LF3 is cured by heat treatment, a lower end portion (corner portion) KD of the side wall SW of the resin film LF3 which is located over the protruding portion LF3 in FIG. 62 becomes the protruding portion TB2 of the side wall SW of the resin film LF3 in FIG. 63.

In the case where the side wall SW of the resin film LF3 is formed with the protruding portion TB2, when the seed film SE is formed, a region RG1 under the protruding portion TB2 is covered with the protruding portion TB2, as schematically shown in FIG. 64. This prevents the seed film SW from being formed in the region RG1. The seed film SE functions as a power-supply conductive film when the copper film CF is formed by an electrolytic plating method. However, when the side wall SW of the resin film LF3 is formed with the protruding portion TB2 and the seed film SE is not formed under the protruding portion TB2 (in the region RG1), a problem (defective plating) may arise when the copper film CF is formed. Examples of the defective plating include the formation of a region where a plating film is not formed and variations in the thickness of plating. Therefore, in terms of maximizing the reliability of the semiconductor device, it is desirable not to use the structure in which, at the stage where the resin film LF3 has been subjected to exposure and development (i.e., at the stage before the resin film LF3 is cured by heat treatment), the side wall SW of the resin film LF3 is located over the protruding portion TB resulting from the seal ring SR, as shown in FIG. 62.

In the case of FIGS. 65 to 68, at either of the stage (stage shown in FIG. 66) where the resin film LF3 has been subjected to exposure and development and the stage (stage shown in FIG. 67) where the resin film LF3 has been cured by heat treatment, the side wall SW of the resin film LF3 is located inside the seal ring SR and also inside the protruding portion TB1 resulting from the seal ring SR.

That is, when the side wall SW of the resin film LF3 is located over the protruding portion TB1 resulting from the seal ring SR at the stage where the resin film LF3 has been subjected to exposure and development as shown in FIG. 62, at the stage where the resin film LF3 is cured by heat treatment, the protruding portion TB2 is likely to be formed at the side wall SW of the resin film LF3, as shown in FIG. 63. By contrast, when the side wall SW of the resin film LF3 is located inside the seal ring SR and also inside the protruding portion TB1 resulting from the seal ring SR at the stage where the resin film LF3 has been subjected to exposure and development, as shown in FIG. 66, it is possible to prevent the protruding portion TB2 from being formed at the side wall SW of the resin film LF3 at the stage where the resin film LF3 is cured by heat treatment. That is, in FIG. 67, the protruding portion. TB2 has not been formed at the side wall SW of the resin film LF3. This can prevent the formation of the region where the seed film SW is not formed due to the protruding portion TB2 when the seed film SE is formed, as shown in FIG. 68. Therefore, it is possible to prevent a problem (defective plating) from occurring when the copper film CF is formed. For example, it is possible to prevent the formation of the region where the plating film is not formed, variations in the thickness of plating, and the like.

When the side wall SW of the resin film LF3 is located outside the seal ring SR at the stage when the resin film LF3 has been cured by heat treatment, as shown in FIG. 60, a crack may extend along the resin film LF3 to the inside of the seal ring SR. By contrast, when the side wall SW of the resin film LF3 is located inside the seal ring SR and also inside the protruding portion TB1 resulting from the seal ring SR at the stage where the resin film LF3 has been cured by heat treatment, as shown in FIG. 67, the possibility that the crack extends along the resin film LF3 to the inside of the seal ring SR can be eliminated since the resin film LF3 is present only inside the seal ring SR.

Accordingly, in the present embodiment, it is preferable to adopt the case shown in FIGS. 65 to 68. That is, at either of the stage (stage shown in FIG. 66) where the resin film LF3 has been subjected to exposure and development and the stage (stage shown in FIG. 67) where the resin film LF3 has been cured by heat treatment, the side wall SW of the resin film LF3 is surely located inside the seal ring SR and also inside the protruding portion TB1 resulting from the seal ring SR. This is the first inventive improvement. This can improve the reliability of the semiconductor device. This can also improve the manufacturing yield of the semiconductor device.

Note that, after the resin film LF3 is subjected to exposure and development, when the resin film LF3 is cured by heat treatment, the resin film LF3 does not expand, but contracts. Therefore, as long as the side wall SW of the resin film LF3 is located inside the seal ring SR and also inside the protruding portion TB1 at the stage where the resin film LF3 has been subjected to exposure and development, as shown in FIG. 66, even when the resin film LF3 is cured by heat treatment, the side wall SW of the resin film LF3 is located inside the seal ring SR and also inside the protruding portion TB1 resulting from the seal ring SR, as shown in FIG. 67.

However, since the resin film LF3 contracts when cured by heat treatment, a distance (space) L1 between the side wall SW of the resin film LF3 and the protruding portion TB1 resulting from the seal ring SR is larger at the stage (stage shown in FIG. 67) where the resin film LF3 has been cured by heat treatment than at the stage (stage shown in FIG. 66) where the resin film LF3 has been subjected to exposure and development. That is, the distance L1 (distance L1 between the side wall SW of the resin film LF3 and the protruding portion TB1) in FIG. 67 is larger than the distance L1 (distance L1 between the side wall SW of the resin film LF3 and the protruding portion TB1) in FIG. 66. At the stage (stage shown in FIG. 66) where the resin film LF3 has been subjected to exposure and development, the side wall SW of the resin film LF3 is generally perpendicular to the main surface of the semiconductor substrate SB. However, at the stage (stage shown in FIG. 67) where the resin film LF3 has been cured by heat treatment, the side wall SW of the resin film LF3 is inclined from the direction perpendicular to the main surface of the semiconductor substrate SB and tapered. That is, at the stage (stage shown in FIG. 66) where the resin film LF3 has been subjected to exposure and development, the angle formed between the lower surface of the resin film LF3 and the side wall SW thereof is approximately 90°. However, at the stage (stage shown in FIG. 67) where the resin film LF3 has been cured by heat treatment, an acute angle (less than 90°) is formed between the lower surface of the resin film LF3 and the side wall SW thereof.

It is more preferable that, at the stage (stage shown in FIG. 66) where the resin film LF3 has been subjected to exposure and development, the distance (space) L1 between the side wall SW of the resin film LF3 and the protruding portion TB1 resulting from the seal ring SR is set to a value of not less than 1 μm. Thus, even when the position of the side wall SW of the resin film LF3 slightly varies due to variations in manufacturing conditions or the like, it is possible to reliably locate the side wall SW of the resin film LF3 inside the seal ring SR and also inside the protruding portion TB1 resulting from the seal ring SR. Therefore, it is possible to more reliably prevent the problem described above which may occur in the case of FIG. 60 described above or in the case of FIGS. 61 to 64 described above.

In the case of forming the protective film PA having the openings OP2 and OP3, it is also preferable that a side wall SW2 forming the outer periphery of the protective film PA is located inside the seal rings SR (see FIGS. 57 and 58 described above). For example, in the case of forming a photosensitive resin film as the protective film PA, it is preferable that, at the stage (stage shown in FIGS. 57 and 58 described above) where the protective film PA made of the photosensitive resin has been subjected to exposure and development and then to heat treatment to be cured, the side wall SW2 forming the outer periphery of the protective film PA is located inside the seal ring SR. This can eliminate the possibility that a crack extends along the protective film PA to the inside of the seal ring SR.

Therefore, it is preferable that each of the side wall SW forming the outer periphery of the resin film LF3 and the side wall SW2 forming the outer periphery of the protective film PA is located inside the seal ring SR (see FIG. 58 described above). This allows the dicing step to be performed in the state where each of the side wall SW forming the outer periphery of the resin film LF3 and the side wall SW2 forming the outer periphery of the protective film PA is located inside the seal ring SR. This can more reliably prevent the crack formed in the dicing step from extending to the inside of the seal ring SR.

As also shown in FIG. 58 described above, the side wall SW of the resin film LF3 can also be covered with the protective film PA. This can enhance the effect of protecting the resin film LF3 with the protective film PA. When the side wall SW of the resin film LF3 is covered with the protective film PA, the side wall SW2 of the protective film PA is closer to the seal ring SR than the side wall SW of the resin film LF3.

<About Second Inventive Improvement>

Next, a description will be given of the second inventive improvement.

FIGS. 69 to 75 are illustrative views for illustrating the second inventive improvement. FIGS. 69 to 75 show the area of the scribe region 1D where the test pad PDT is formed.

The second inventive improvement is related to the silicon dioxide film LF1.

Figure 69:
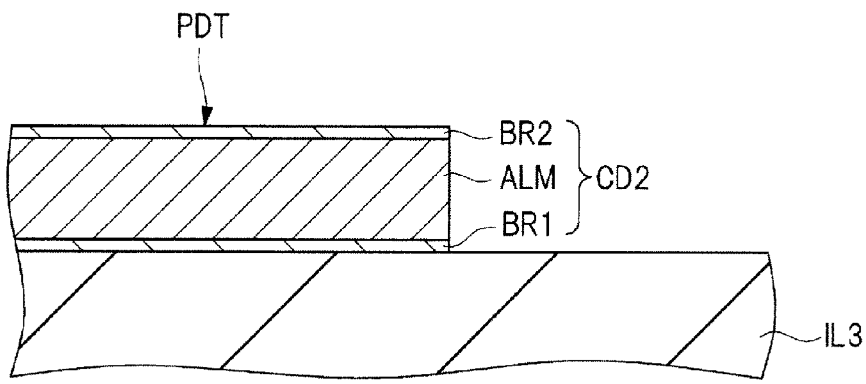
FIG. 69 is an illustrative view of a second inventive improvement.

FIG. 69 corresponds to the stage (i.e., stage shown in FIGS. 25 and 26 described above) where the wires M3 and M3*a* and the pads PD1 and PDT have been formed by patterning the foregoing conductive film CD2 using a photolithographic technique and an etching technique.

As described above, the wires M3, the seal ring wire M3*a*, the pad PD1, and the test pad PDT are formed by patterning the common conductive film CD2. As a result, the wires M3, the seal ring wire M3*a*, the pad PD1, and the test pad PDT have the same layer structure. Here, it is preferable that the wires M3 and M3*a* are aluminum wires and the pads PD1 and PDT are aluminum pads. In this case, it is preferable to use, as the conductive film CD2, a multi-layer film including a barrier conductor film BR1, an aluminum film ALM over the barrier conductor film BR1, and a barrier conductor film BR2 over the aluminum film ALM. As a result, each of the wires M3, the seal ring wire M3*a*, the pad PD1, and the test pad PDT is formed of the multi-layer film including the barrier conductor film BR1, the aluminum film ALM over the barrier conductor film BR1, and the barrier conductor film BR2 over the aluminum film ALM. FIG. 69 shows the case where the test pad PDT is formed using the conductive film CD2 made of the multi-layer film including the barrier conductor film BR1, the aluminum film ALM over the barrier conductor film BR1, and the barrier conductor film BR2 over the aluminum film ALM. Each of the barrier conductor films BR1 and BR2 is made of, e.g., a titanium film, a titanium nitride film, or a multi-layer film thereof. The aluminum film ALM is made of aluminum or an aluminum alloy. When the aluminum film ALM is made of an aluminum alloy, an aluminum-rich aluminum alloy (in which the composition ratio of aluminum is not less than 50 at %) is used preferably.

Figure 70:
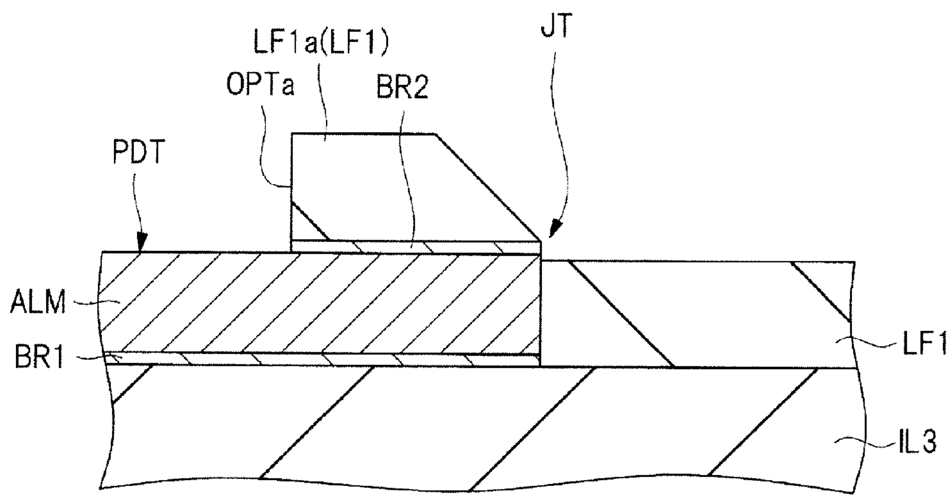
FIG. 70 is an illustrative view of the second inventive improvement.
Figure 71:
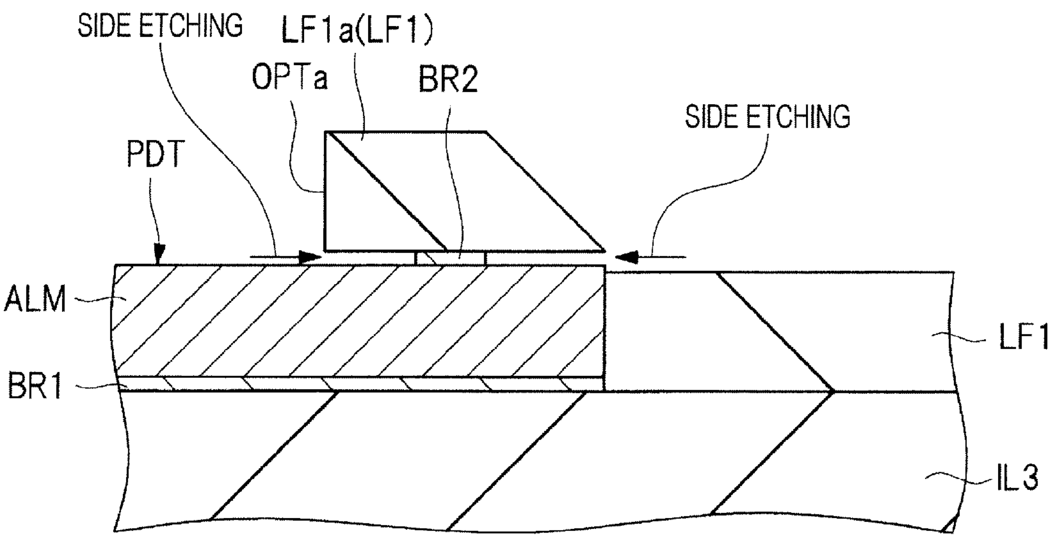
FIG. 71 is an illustrative view of the second inventive improvement.

FIGS. 70 and 71 are illustrative views of the problem to be solved which serves as the basis of the second inventive improvement and correspond to the stage (i.e., the same process stage as shown in FIGS. 41 and 42 described above) where the silicon nitride film LF2 has been formed and then the opening OP1*b* has been formed in the silicon nitride film LF2 using a photolithographic technique and an etching technique.

When each of the wires M3 and M3*a* and the pads PD1 and PDT is formed of the multi-layer film including the barrier conductor film BR1, the aluminum film ALM, and the barrier conductor film BR2, in the etching step (etching step shown in FIGS. 31 and 32 described above) for forming the openings OP1*a* and OPTa in the silicon dioxide film LF1, the barrier conductor film BR2 of each of the pads PD1 and PDT is exposed and the exposed barrier conductor film BR2 may also be etched. That is, from the pad PD1, the portion of the barrier conductor film BR2 which is exposed from the opening OP1*a* is removed while, from the opening OP1*a*, the aluminum film ALM forming the pad PD1 is exposed. On the other hand, from the test pad PDT, the portion of the barrier conductor film BR2 which is exposed from the opening OPTa is removed while, from the opening OPTa, the aluminum film ALM forming the test pad PDT is exposed (see FIG. 70).

Then, after the silicon nitride film LF2 is formed, the etching step (etching step shown in FIGS. 39 and 40 described above) for forming the opening OP1*b* in the silicon nitride film LF2 is performed. The etching step (etching step shown in FIGS. 39 and 40 described above) for forming the opening OP1*b* in the silicon nitride film LF2 after the deposition of the silicon nitride film LF2 will be hereinafter referred to as the etching step for the silicon nitride film LF2.

As described above, in the etching step for the silicon nitride film LF2, the silicon nitride film LF2 is removed from the entire scribe region 1D. Consequently, in the scribe region 1D, substantially the entire top surface of the silicon dioxide film LF1 is exposed, as can also be seen from FIG. 40 described above. Accordingly, in the etching step for the silicon nitride film LF2, the etching of the silicon dioxide film LF1 also proceeds to a degree in the scribe region 1D. At this time, since the silicon dioxide film LF1 has been etched, an upper-surface end portion JT of the pad PDT covered with the silicon dioxide film LF1 may be exposed, as shown in FIG. 70. In addition, there may also be a case where, at the stage where the silicon dioxide film LF1 has been deposited, the coverage of the side wall of the pad PDT with the silicon dioxide film LF1 is poor and the upper-surface end portion JT of the pad PDT is uncovered with the silicon dioxide film LF1 and exposed. In that case also, in the etching step for the silicon nitride film LF2, the upper-surface end portion JT of the pad PDT is exposed, as shown in FIG. 70.

When the upper-surface end portion JT of the pad PDT covered with the silicon dioxide film LF1 is exposed in the etching step for the silicon nitride film LF2, the portion of the silicon dioxide film LF1 which is located over the test pad PDT peels off. The silicon dioxide film LF1 that has peeled off may form a foreign substance and cause contamination. When the silicon dioxide film LF1 that has peeled off forms the foreign substance and causes contamination, the reliability of the semiconductor device may deteriorate. Therefore, it is desirable to maximally inhibit or prevent the silicon dioxide film LF1 from peeling off. It is assumed here that the portion of the silicon dioxide film LF1 which is located over the test pad PDT is designated by a reference numeral LF1*a* and referred to as a silicon dioxide film portion LF1*a*.

Specifically, when the upper-surface end portion JT of the pad PDT covered with the silicon dioxide film LF1 is exposed in the etching step for the silicon nitride film LF2, the silicon dioxide film portion LF1*a* is separated from the portion of the silicon dioxide film LF1 which is located lateral to the test pad PDT. As a result, the silicon nitride film portion LF1*a* is likely to peel off to form a foreign substance. Also, when the upper-surface end portion JT of the pad PDT covered with the silicon dioxide film LF1 is exposed, the phenomenon in which the silicon dioxide film portion LF1*a* is likely to peel off is accelerated by the side etching of the barrier conductor film BR2 immediately under the silicon dioxide film portion LF1*a*, as schematically shown in FIG. 71. That is, when the upper-surface end portion JT of the pad PDT is exposed in the etching step for the silicon nitride film LF2, the barrier conductor film BR2 of the pad PDT is also side-etched from the upper-surface end portion JT of the pad PDT. Since the barrier conductor film BR2 immediately under the silicon dioxide film portion LF1*a* has been side-etched and removed, the silicon dioxide film portion LF1 easily peels off.

The phenomenon of the peeling off of the silicon dioxide film portion LF1*a* is particularly likely to occur when the HDP-CVD method is used as a method of depositing the silicon dioxide film LF1. This is because, since the HDP-CVD method is a film deposition method which shows a high fillability to a space, but is rather poor in the coverage of the side walls of the wires M3 and M1*a* and the pads PD1 and PDT, when the silicon dioxide film LF1 is deposited using the HDP-CVD method, the upper-surface end portion JT of the pad PDT is likely to be exposed in the etching step for the silicon nitride film LF2.

Note that, irrespective of the method of depositing the silicon dioxide film LF1 or the like, in the etching step for the silicon nitride film LF2, the presence of the silicon nitride film LF2 prevents the upper-surface end portion of the pad PD1 from being exposed. As a result, there is no possibility that the silicon dioxide film LF1 peels off the pad PD1, but the silicon dioxide film LF1 (LF1*a*) may peel off the test pad PDT provided in the scribe region 1D.

Accordingly, in the present embodiment, as the second inventive improvement, the following improvement is made.

Figure 72:
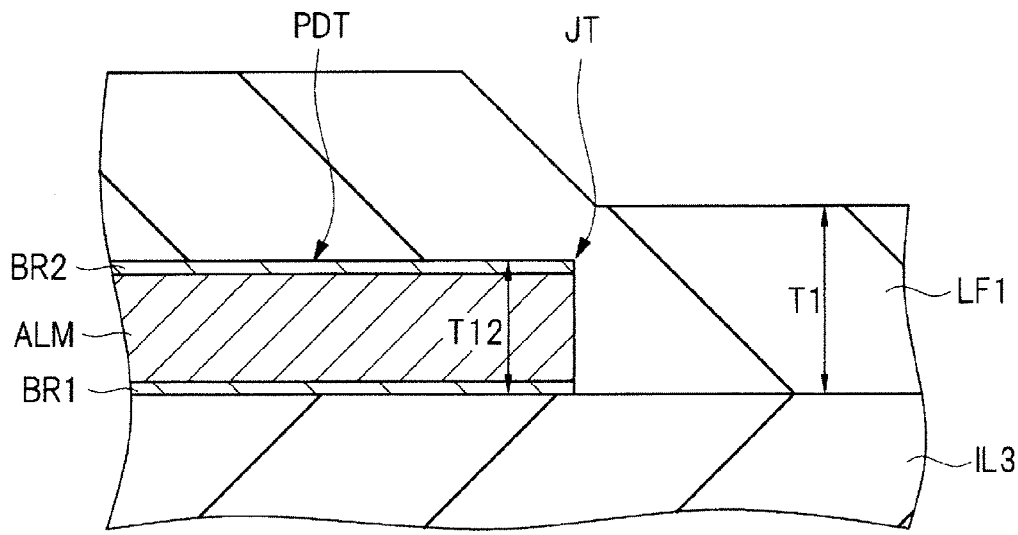
FIG. 72 is an illustrative view of the second inventive improvement.
Figure 73:
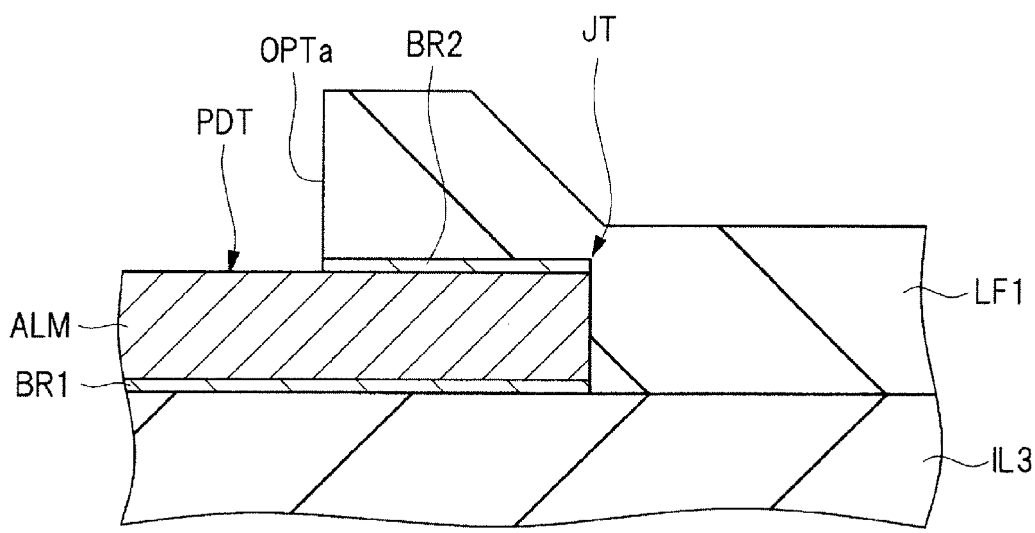
FIG. 73 is an illustrative view of the second inventive improvement.
Figure 74:
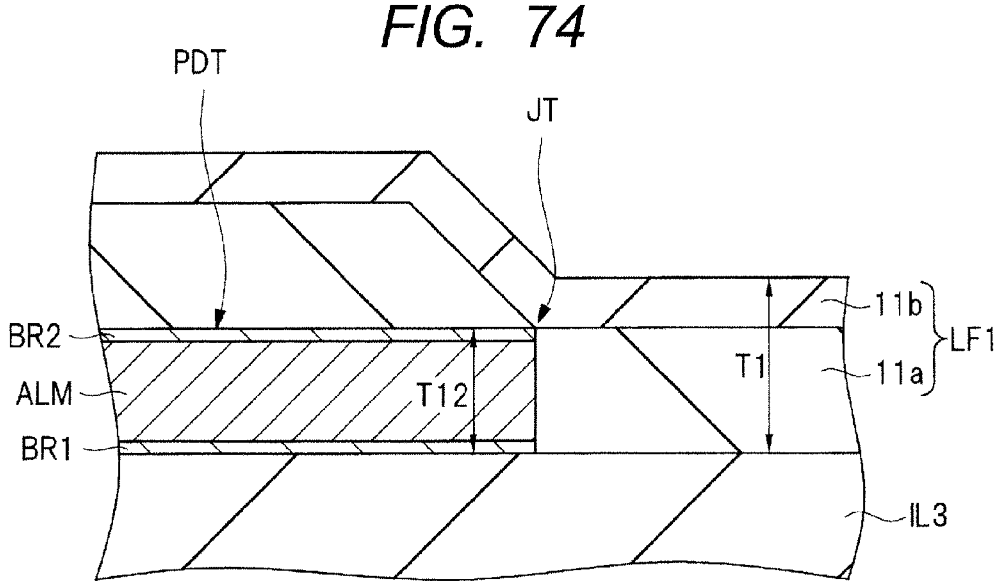
FIG. 74 is an illustrative view of the second inventive improvement.
Figure 75:
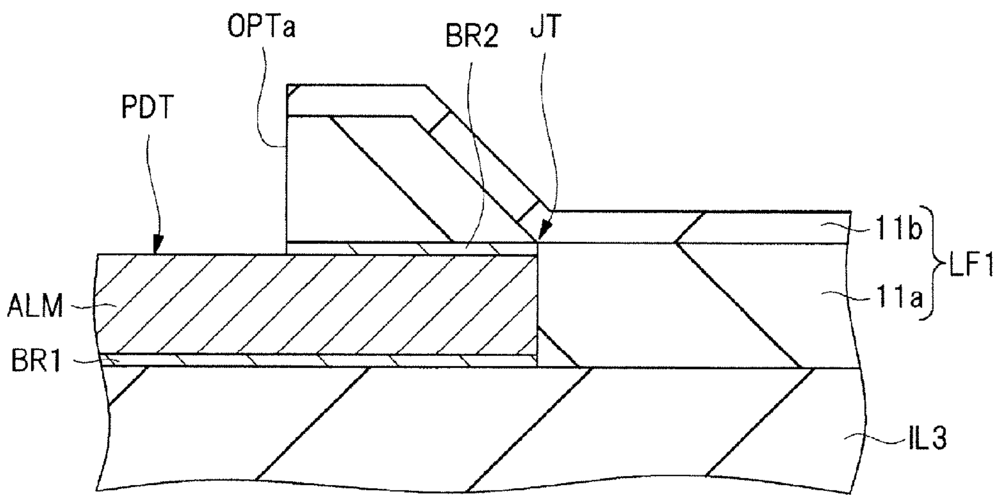
FIG. 75 is an illustrative view of the second inventive improvement.

FIGS. 72 to 75 are illustrative views of the specific content of the second inventive improvement. FIG. 72 corresponds to the stage (i.e., the same process stage as shown in FIGS. 27 and 28 described above) where the silicon dioxide film LF1 has been formed. FIG. 73 corresponds to the stage (i.e., the same process stage as shown in FIGS. 41 and 42 described above) where, after the stage shown in FIG. 72, the openings OP1*a* and OPTa have been formed in the silicon dioxide film LF1, the silicon nitride film LF2 has been subsequently formed, and then the opening OP1*b* has been formed in the silicon nitride film LF2 using a photolithographic technique and an etching technique. FIG. 74 corresponds to the stage (the same process stage as shown in FIGS. 27 and 28 described above) where the silicon dioxide film LF1 has been formed. FIG. 75 corresponds to the stage (i.e., the same process stage as shown in FIGS. 41 and 42 described above) where, after the stage shown in FIG. 74, the openings OP1*a* and OPTa have been formed in the silicon dioxide film LF1, the silicon nitride film LF2 has been subsequently formed, and then the opening OP1*b* has been formed in the silicon nitride film LF2 using a photolithographic technique and an etching technique.

That is, in the present embodiment, it is preferable that, as also shown in FIG. 72, the thickness (formed film thickness) T1 of the silicon dioxide film LF1 is increased to be larger (thicker) than a thickness T12 of the test pad PDT. In other words, it is preferable that the thickness (formed film thickness) T1 of the silicon dioxide film LF1 is increased to be larger (thicker) than a thickness (formed film thickness) T11 (which is shown in FIG. 24) of the conductive film CD2.

Here, each of the thicknesses of the wires M3 and M3*a* and the pads PD1 and PDT corresponds to the thickness (formed film thickness) T11 of the conductive film CD2. Accordingly, the thickness T12 of the pad PDT is the same as the thickness (formed film thickness) T11 of the conductive film CD2. Note that the thickness T12 of the pad PDT corresponds not to the thickness of the pad PDT in the region where the barrier conductive film BR2 has been removed, but to the thickness of the pad PDT in the region or state (stage) where the barrier conductor film BR2 has not been removed. Accordingly, the thickness T12 of the pad PDT also includes the thickness of the barrier conductor film BR2.

When the thickness T1 of the silicon dioxide film LF1 is smaller than the thickness T11 of the conductive film CD2, i.e., when the thickness T1 of the silicon dioxide film LF1 is smaller than the thickness T12 of the test pad PDT, the thickness of the portion of the silicon dioxide film LF1 which is adjacent to the upper-surface end portion JT of the pad PDT is reduced. As a result, in the etching step for the silicon nitride film LF2, the upper-surface end portion JT of the pad PDT is likely to be exposed.

By contrast, when the thickness T1 of the silicon dioxide film LF1 is increased to be larger (thicker) than the thickness T11 of the conductive film CD2, i.e., when the thickness T1 of the silicon dioxide film LF1 is increased to be larger (thicker) than the thickness T12 of the test pad PDT as shown in FIG. 72, it is easier to ensure the thickness of the portion of the silicon dioxide film LF1 which is adjacent to the upper-surface end portion JT of the pad PDT. As a result, it is possible to inhibit or prevent the phenomenon in which, in the etching step for the silicon nitride film LF2, the upper-surface end portion JT of the pad PDT is exposed. That is, even when the etching step for the silicon nitride film LF2 is performed, as shown in FIG. 73, the state where the upper-surface end portion JT of the pad PDT is covered with the silicon dioxide film LF1 can be maintained. Therefore, it is possible to inhibit or prevent the phenomenon in which the portion of the silicon dioxide film LF1 which is located over the test pad PDT peels off to form a foreign substance and thus improve the reliability of the semiconductor device. It is also possible to improve the manufacturing yield of the semiconductor device.

In the present embodiment, it is more preferable that the thickness T1 of the silicon dioxide film LF1 is increased to be larger (thicker) than the thickness T11 of the conductive film CD2 by 0.5 μm or more. That is, it is more preferable that the thickness T1 of the silicon dioxide film LF1 is increased to be larger (thicker) than the thickness T12 of the test pad PDT by 0.5 μm or more. This can more reliably ensure the thickness of the portion of the silicon dioxide film LF1 which is adjacent to the upper-surface end portion JT of the pad PDT. Consequently, it is possible to more reliably inhibit or prevent the phenomenon in which, in the etching step for the silicon nitride film LF2, the upper-surface end portion JT of the pad PDT is exposed. Therefore, it is possible to more reliably inhibit or prevent the phenomenon in which the portion of the silicon dioxide film LF1 which is located over the test pad PDT peels off to form a foreign substance and thus further improve the reliability of the semiconductor device.

When the silicon dioxide film LF1 is excessively thickened, the film deposition step may be more difficult to perform and the semiconductor substrate SB (semiconductor wafer) may be more likely to warp. Accordingly, it is more preferable that the thickness T1 of the silicon dioxide film LF1 is controlled to 6 μm or less. This allows the step of depositing the silicon dioxide film LF1 to be more easily performed and can inhibit or prevent the semiconductor substrate SB (semiconductor wafer) from warping due to the silicon dioxide film LF1.

In the present embodiment, it is also more preferable to use, as the silicon dioxide film LF1, a multi-layer film including a silicon dioxide film (which is an HDP oxide film 11*a* herein) formed using the HDP-CVD method, and a silicon dioxide film (which is a PTEOS film 11*b* herein) formed over the silicon dioxide film (HDP oxide film 11) using a plasma CVD method. Such a case is shown in FIGS. 74 and 75.

Here, the HDP oxide film is a silicon dioxide film formed using the HDP-CVD method (wherein HDP stands for High Density Plasma). The PTEOS film is a silicon dioxide film formed using TEOS (Tetraethoxysilane referred to also as tetra ortho silicate) as a raw material and using a plasma CVD method (not the HDP-CVD method, but a normal plasma CVD method).

The HDP-CVD method shows a high fillability to a space (such as, e.g., the space between the adjacent wires M3). Accordingly, by using an HDP oxide film as the silicon dioxide film LF1, the fillability of the silicon dioxide film LF1 can be enhanced. From this viewpoint, the HDP-CVD method is appropriate as the method of depositing the silicon dioxide film LF1. However, the HDP-CVD method showing a high fillability to a space is poor in the coverage of the side walls of the pads PD1 and PDT. As a result, when the entire silicon dioxide film LF1 is deposited using the HDP-CVD method, the upper-surface end portion JT of the pad PDT is likely to be exposed in the etching step for the silicon nitride film LF2.

By contrast, when the multi-layer film including the HDP oxide film 11*a* and the PTEOS film 11*b* over the HDP oxide film 11*a* is used as the silicon dioxide film LF1, as shown in FIG. 74, it is possible to ensure the coverage of the side walls of the pads PD1 and PDT with the PTEOS film 11*b*, while ensuring the fillability using the HDP oxide film 11*a*. That is, when the entire silicon dioxide film LF1 is formed of an HDP oxide film, the thickness of the portion of the silicon dioxide film LF1 which is adjacent to the upper-surface end portion JT of the pad PDT is likely to be reduced. However, by using the multi-layer film including the HDP oxide film 11*a* and the PTEOS film 11*b* over the HDP oxide film 11*a* as the silicon dioxide film LF1, it is easier to increase the thickness of the portion of the silicon dioxide film LF1 which is adjacent to the upper-surface end portion JT of the pad PDT. This can more reliably inhibit or prevent the phenomenon in which, in the etching step for the silicon nitride film LF2, the upper-surface end portion JT of the pad PDT is exposed. Therefore, by using the multi-layer film including the HDP oxide film 11*a* and the PTEOS film 11*b* over the HDP oxide film 11*a* as the silicon dioxide film LF1, it is possible to improve the fillability of the silicon dioxide film LF1 and also prevent the phenomenon in which the portion of the silicon dioxide film LF1 which is located over the test pad PDT peels off to form a foreign substance. This can further improve the reliability of the semiconductor device. In addition, since the film deposition rate (film deposition speed) of the PTEOS film is higher than that of an HDP oxide film, by using the multi-layer film including the HDP oxide film 11*a* and the PTEOS film 11*b* over the HDP oxide film 11*a*, not a single-layer HDP oxide film as the silicon dioxide film LF1, the throughput of the semiconductor device can be improved.

In the case where the multi-layer film including the HDP oxide film 11*a* and the PTEOS film 11*b* over the HDP oxide film 11*a* is used as the silicon dioxide film LF1, it is more preferable that the thickness of the HDP oxide film 11*a* is not less than ½ of the thickness T12 of the test pad PDT. This allows even the space between the wires M3 in the same layer as that of the test pad PDT or the like to be more reliably filled with the silicon dioxide film LF1.

For example, it is possible to control the thickness of the HDP oxide film 11*a* to about 0.5 to 1 times the thickness T12 of the test pad PDT and control the thickness of the PTEOS film 11*b* to about, e.g., 0.5 to 1 μm.

<About Third Inventive Improvement>

Next, a description will be given of the third inventive improvement.

Figure 76:
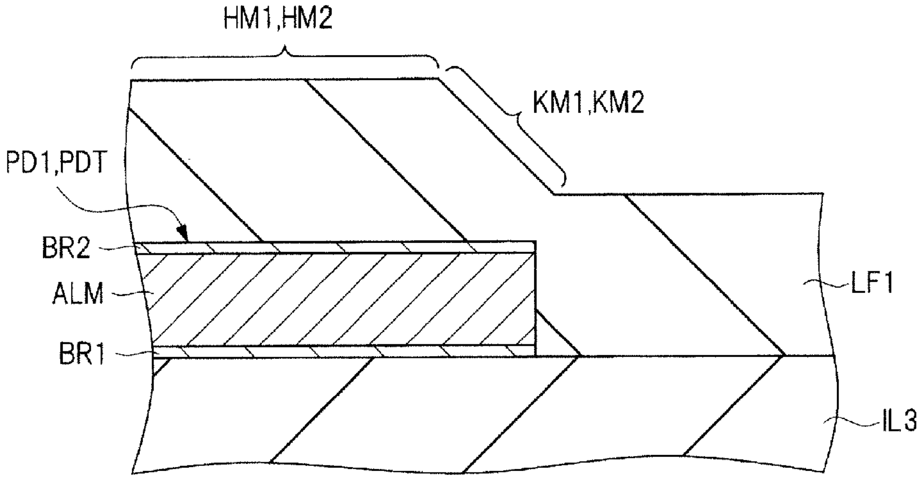
FIG. 76 is an illustrative view of a third inventive improvement.

FIGS. 76 to 60 are illustrative views for illustrating the third inventive improvement.

The third inventive improvement is related to the step of forming the openings OP1*a* and OPTa in the silicon dioxide film LF1.

As described above, by etching the silicon dioxide film LF1 using the resist pattern RP1 as an etching mask, the openings OP1*a* and OPTa are formed in the silicon dioxide film (see FIGS. 27 to 34 described above). For this purpose, the resist pattern RP1 has the opening RP1*a* for forming the opening OP1*a* and the opening RP1*b* for forming the opening OPTa. Through the etching and removal of the silicon dioxide film LF1 exposed at the bottom portion of the opening RP1*a* of the resist pattern RP1, the opening OP1*a* is formed. Through the etching and removal of the silicon dioxide film LF1 exposed at the bottom portion of the opening RP1*b* of the resist pattern RP1, the opening OPTa is formed.

When the entire silicon dioxide film LF1 is formed of an HDP oxide film or when the silicon dioxide film LF1 is formed of the multi-layer film including an HDP oxide film, it is preferable that the inner wall (side wall or side surface) of the opening RP1*a* of the resist pattern RP1 is located not over an inclined surface KM1 of the silicon dioxide film LF1, but over a flat surface HM1 of the silicon dioxide film LF1. It is also preferable that the inner wall (side wall or side surface) of the opening RP1*b* of the resist pattern RP1 is located not over an inclined surface KM2 of the silicon dioxide film LF1, but over a flat surface HM2 of the silicon dioxide film LF1. The reason for this will be described below.

Figure 77:
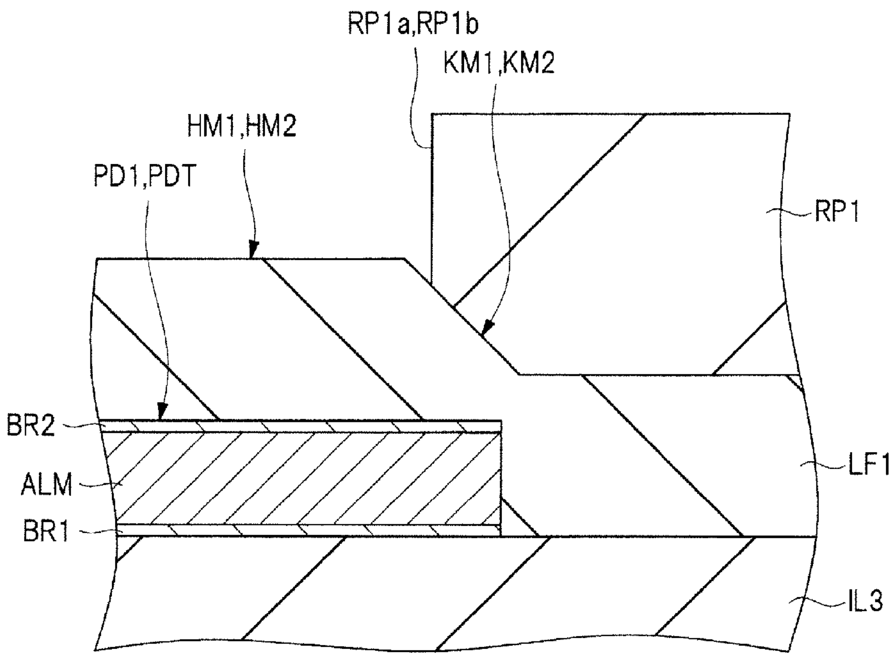
FIG. 77 is an illustrative view of the third inventive improvement.
Figure 78:
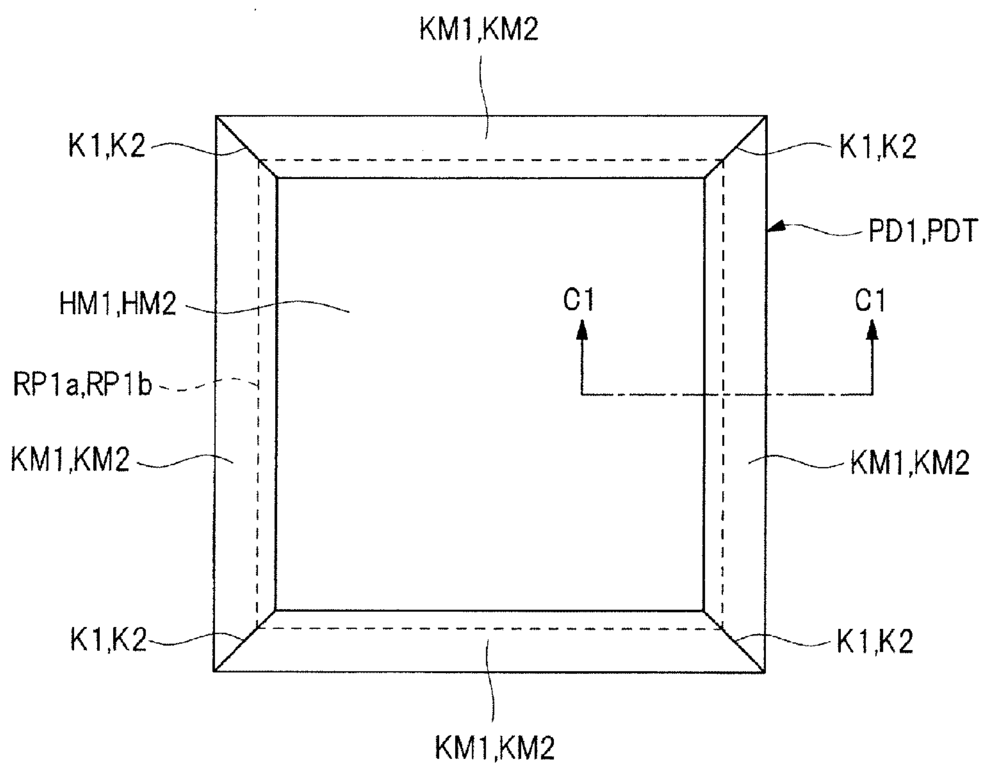
FIG. 78 is an illustrative view of the third inventive improvement.

FIG. 76 is a cross-sectional view of the stage (i.e., the same process stage as shown in FIGS. 27 and 28 described above) where the silicon dioxide film LF1 has been formed. FIG. 76 shows the cross-sectional view of the region in the vicinity of the end portion of the pad PD1 or the region in the vicinity of the end portion of the pad PDT. For simpler illustration, the region in the vicinity of the end portion of the pad PD1 and the region in the vicinity of the end portion of the pad PDT are shown in one cross-sectional view (FIG. 76). FIG. 77 is a cross-sectional view of the stage (i.e., the same process stage as shown in FIGS. 29 and 30 described above) where, after the stage shown in FIG. 76, the resist pattern RP1 has been formed over the silicon dioxide film LF1. FIG. 78 is a plan view of the same process stage as shown in FIG. 77. FIG. 78 shows the plan view of the region where the pad PD1 is formed or the region where the pad PDT is formed. In FIG. 78, the positions of the openings RP1*a* and RP1*b* of the resist pattern RP1 are shown by the dotted lines. The cross-sectional view at the position along the line C1-C1 in FIG. 78 substantially corresponds to FIG. 77.

The HDP-CVD method is a film deposition method which shows a high fillability to a space, but is poor in the coverage of the side walls of the pads PD1 and PDT. Accordingly, when the entire silicon dioxide film LF1 is formed of an HDP oxide film or when the silicon dioxide film LF1 is formed of a multi-layer film including an HDP oxide film, as schematically shown in FIG. 76, the silicon dioxide film LF1 over each of the pads PD1 and PDT has a generally trapezoidal shape in cross-sectional view. That is, over the outer peripheral portion (peripheral portion) of the upper surface of each of the pads PD1 and PDT, the top surfaces of the silicon dioxide films LF1 are the inclined surfaces KM1 and KM2 which are each inclined at a predetermined angle from the upper surfaces of the pads (PD1 and PDT). Over the regions of the respective upper surfaces of the pads PD1 and PDT which are located inside the outer peripheral portions thereof, the top surfaces of the silicon dioxide film LF1 are the flat surfaces HM1 and HM2 which are generally parallel with the upper surfaces of the pads (PD1 and PDT).

Here, the flat surface HM1 of the silicon dioxide film LF1 corresponds to the portion of the top surface of the silicon dioxide film LF1 which is formed over the upper surface of the pad PD1 and substantially parallel with the upper surface of the pad PD1. Accordingly, the flat surface HM1 of the silicon dioxide film LF1 is substantially parallel with the upper surface of the pad PD1. On the other hand, the inclined surface KM1 of the silicon dioxide film LF1 corresponds to the portion of the top surface of the silicon dioxide film LF1 which is formed over the upper surface of the pad PD1 and inclined at a predetermined angle from the upper surface of the pad PD1. The angle of inclination of the inclined surface KM1 is more than 0° and less than 90°. The inclined surface KM1 also functions to join (connect) the upper surface of the portion of the silicon dioxide film LF1 which is located over the interlayer insulating film IL3 around the pad PD1 to the flat surface HM1. Also, the flat surface HM2 of the silicon dioxide film LF1 corresponds to the portion of the top surface of the silicon dioxide film LF1 which is formed over the upper surface of the test pad PDT and substantially parallel with the upper surface of the pad PDT. Accordingly, the flat surface HM2 of the silicon dioxide film LF1 is substantially parallel with the upper surface of the test pad PDT. On the other hand, the inclined surface KM2 of the silicon dioxide film LF1 corresponds to the portion of the top surface of the silicon dioxide film LF1 which is formed over the upper surface of the test pad PDT and inclined at a predetermined angle from the upper surface of the test PDT. The angle of inclination of the inclined surface KM2 is more than 0° and less than 90°. The inclined surface KM2 also functions to join (connect) the upper surface of the portion of the silicon dioxide film LF1 which is located over the interlayer insulating film IL3 around the pad PDT to the flat surface HM2.

As shown in FIGS. 77 and 78, when the inner wall (side surface) of the opening RP1*a* of the resist pattern (photoresist pattern) RP1 is located over the inclined surface KM1 of the silicon dioxide film LF1 or when the inner wall (side wall or side surface) of the opening RP1*b* of the resist pattern RP1 is located over the inclined surface KM2 of the silicon dioxide film LF1, a crack is likely to be formed in the resist pattern RP1. The problem is particularly likely to occur when the entire silicon dioxide film FL1 is formed of an HDP oxide film or when the silicon dioxide film LF1 is formed of a multi-layer film including an HDP oxide film. The crack is likely to be formed in the resist pattern RP1 for a reason as shown below.

First, attention is focused on the portion of the silicon dioxide film LF1 which is formed over the pad PD1. A boundary K1 between the adjacent inclined surfaces KM1 is angulated and, when the inner wall of the opening RP1*a* of the resist pattern RP1 is located over the inclined surface KM1 of the silicon dioxide film LF1, the inner wall of the opening RP1*a* of the resist pattern RP1 traverses the angulated boundary K1 between the inclined surfaces KM1. Consequently, in the resist pattern RP1, a crack is likely to be formed to extend from the corner of the boundary K1 as a starting point. The same applies to the portion of the silicon dioxide film LF1 which is formed over the test pad PDT. That is, a boundary K2 between the adjacent inclined surfaces KM2 is angulated and, when the inner wall of the opening RP1*b* of the resist pattern RP1 is located over the inclined surface KM2 of the silicon dioxide film LF1, the inner wall of the opening RP1*b* of the resist pattern RP1 traverses the angulated boundary K2 between the inclined surfaces KM2. Consequently, in the resist pattern RP1, a crack is likely to be formed to extend from the angulated boundary K2 as a starting point. When the entire silicon dioxide film LF1 is formed of an HDP oxide film or when the silicon dioxide film LF1 is formed of a multi-layer film including an HDP oxide film, the boundary K1 between the adjacent inclined surface KM1 or the boundary K2 between the adjacent inclined surfaces KM2 tends to be angulated. Accordingly, a crack is particularly likely to be formed in the resist pattern RP1. When a crack is formed in the resist pattern RP1, in etching the silicon dioxide film LF1 using the resist pattern RP1 as an etching mask, an etchant enters from the crack in the resist pattern RP1 to cut the silicon dioxide film LF1. This leads to the situation where, e.g., a part of the silicon dioxide film LF1 located over the test pad PDT peels off. The silicon dioxide film LF1 that has peeled off may form a foreign substance and cause contamination. Therefore, it is desirable to maximally inhibit or prevent the phenomenon in which a crack is formed in the resist pattern RP1.

Accordingly, in the present embodiment, the following inventive improvement is made as the third inventive improvement.

Figure 79:
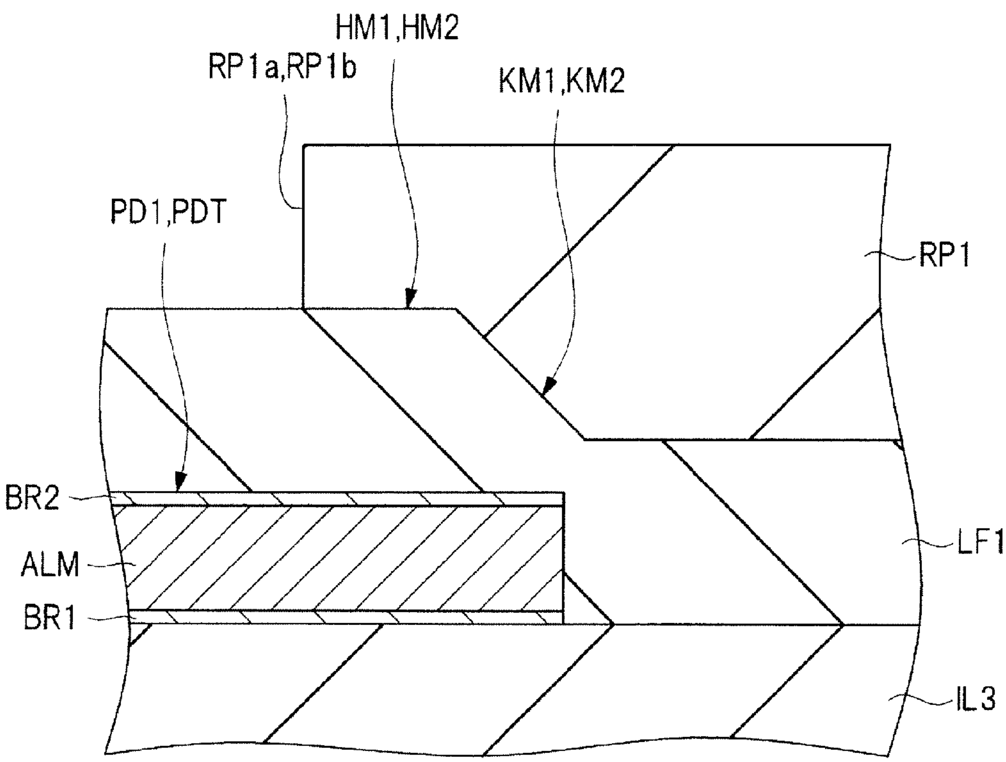
FIG. 79 is an illustrative view of the third inventive improvement.
Figure 80:
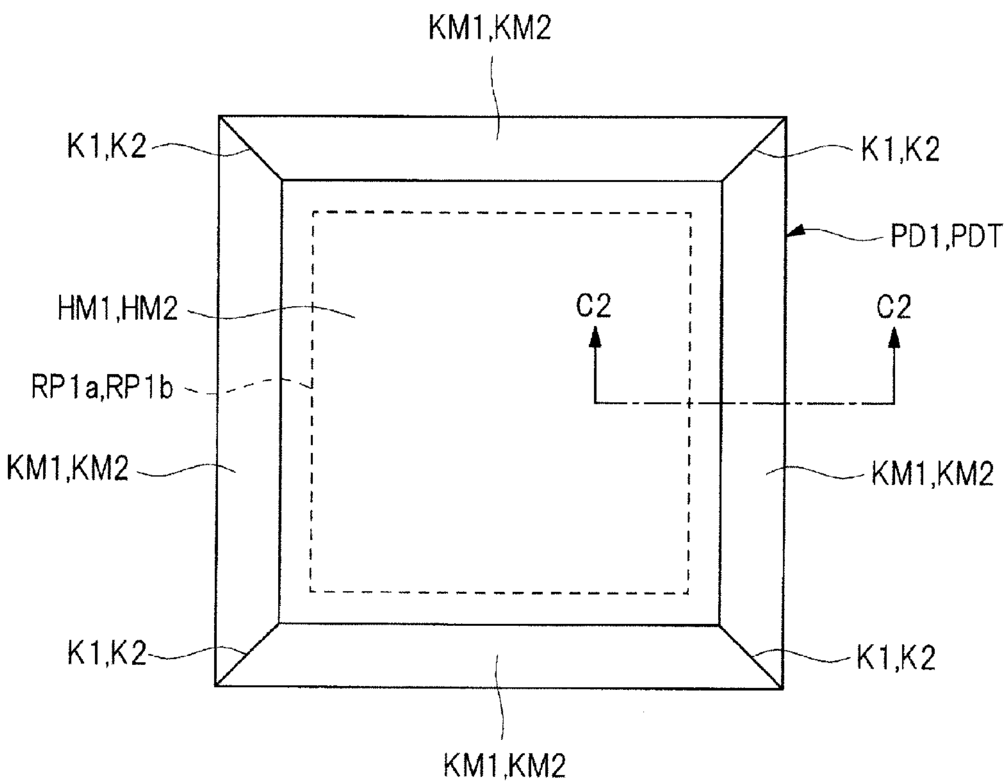
FIG. 80 is an illustrative view of the third inventive improvement.

FIG. 79 is a cross-sectional view of the stage (i.e., the same process stage as shown in FIGS. 29 and 30 described above) where, after the stage shown in FIG. 76, the resist pattern RP1 has been formed over the silicon dioxide film LF1. FIG. 80 is a plan view of the same process stage as shown in FIG. 79. FIG. 80 shows the plan view of the region where the pad PD1 is formed or the region where the pad PDT is formed. In FIG. 80, the positions of the openings RP1*a* and RP1*b* of the resist pattern RP1 are shown by the dotted lines. The cross-sectional view at the position along the line C2-C2 in FIG. 80 substantially corresponds to FIG. 79.

In the present embodiment, as shown in FIGS. 79 and 80, it is preferable that the inner wall of the opening RP1*a* of the resist pattern (photoresist pattern) RP1 is located not over the inclined surface KM1 of the silicon dioxide film LF1, but over the flat surface HM1 of the silicon dioxide film LF1. This prevents the inner wall of the opening RP1*a* of the resist pattern RP1 from traversing the angulated boundary K1 between the inclined surfaces KM1. Therefore, it is possible to inhibit or prevent a crack from being formed in the resist pattern RP1 to extend from the angulated boundary K1 as a starting point. It is also preferable that the inner wall of the opening RP1*b* of the resist pattern RP1 is located not over the inclined surface KM2 of the silicon dioxide film LF1, but over the flat surface HM2 of the silicon dioxide film LF1. This prevents the inner wall of the opening RP1*b* of the resist pattern RP1 from traversing the angulated boundary K2 between the inclined surfaces KM2. Therefore, it is possible to inhibit or prevent a crack from being formed in the resist pattern RP1 to extend from the angulated boundary K2 as a starting point. By thus successfully inhibiting or preventing the formation of a crack in the resist pattern RP1, it is possible to improve the reliability of the semiconductor device. It is also possible to improve the manufacturing yield of the semiconductor device. In addition, it is easier to manage the steps of manufacturing the semiconductor device.

When the entire silicon dioxide film LF1 is formed of an HDP oxide film or when the silicon dioxide film LF1 is formed of a multi-layer film including an HDP oxide film, the boundary K1 between the adjacent inclined surfaces KM1 or the boundary K2 between the adjacent inclined surfaces KM2 tends to be angulated. Accordingly, when applied to the prevention thereof, the third inventive improvement achieves an extremely large effect.

<About Fourth Inventive Improvement>

Next, a description will be given of the fourth inventive improvement.

The fourth inventive improvement is related to the formation of the redistribution wire RW, the pad PD2, the coil CL2, and the pad PD3.

As described above, after the resist film (photoresist film) RP4*a* is formed over the seed film SE and then patterned using a photolithographic method (specifically, by performing exposure and development) to form the resist pattern RP4, the copper film CF is formed over the seed film SE exposed from the openings (grooves) of the resist pattern RP4 by an electrolytic plating method (see FIGS. 49 to 52). The copper film CF is the main conductor film of each of the redistribution wire RW, the pad PD2, the coil CL2, and the pad PD3.

The resist pattern RP4 is formed in the region other than the regions where the redistribution wire RW, the pad PD2, the coil CL2, and the pad PD3 are to be formed. In each of the region where the redistribution wire RW is to be formed, the region where the pad PD2 is to be formed, the region where the coil CL2 is to be formed, and the region where the pad PD3 is to be formed, the seed film SE is exposed. That is, the resist pattern RP4 has the openings (grooves) in the region where the redistribution wire RW is to be formed, the region where the pad PD2 is to be formed, the region where the coil CL2 is to be formed, and the region where the pad PD3 is to be formed. Consequently, the copper film CF is formed in each of the region where the redistribution wire RW is to be formed, the region where the pad PD2 is to be formed, the region where the coil CL2 is to be formed, and the region where the pad PD3 is to be formed.

It is assumed here that the opening (groove) formed in the region of the resist pattern RP4 where the redistribution wire RW is to be formed is designated by a reference numeral 4*a* and referred to as the opening (groove) 4*a* and the opening (groove) formed in the region of the resist pattern RP4 where the pad PD2 is to be formed is designated by a reference numeral 4*b* and referred to as the opening (groove) 4*b* (see FIG. 51). It is also assumed that the opening (groove) formed in the region of the resist pattern RP4 where the coil CL2 is to be formed is designated by a reference numeral 5*a* and referred to as the opening (groove) 5*a* and the opening (groove) formed in the region of the resist pattern RP4 where the pad PD3 is to be formed is designated by a reference numeral 5*b* and referred to as the opening (groove) 5*b* (see FIG. 51). The copper film CF formed over the seed film SE exposed from the opening 4*a* forms the redistribution wire RW, and the copper film CF formed over the seed film SE exposed from the opening 4*b* forms the pad PD2. Also, the copper film CF formed over the seed film SE exposed from the opening 5*a* forms the coil CL2, and the copper film CF formed over the seed film SE exposed from the opening 5*b* forms the pad PD3. Consequently, the opening 4*a* is formed in the same shape (pattern) and at the same position as those of the redistribution wire RW formed later, and the opening 4*b* is formed in the same shape (pattern) and at the same position as those of the pad PD2 formed later. Also, the opening 5*a* is formed in the same shape (pattern) and at the same position as those of the coil CL2 formed later, and the opening 5*b* is formed in the same shape (pattern) and at the same position as those of the pad PD3 formed later.

Note that, as described above, the pad PD2 is formed integrally with the redistribution wire RW and connected thereto. Accordingly, the region where the pad PD2 is to be formed is connected to the region where the redistribution wire RW is to be formed. Consequently, the opening 4*b* formed in the region where the pad PD2 is to be formed is connected to the opening 4*a* formed in the region where the redistribution wire RW is to be formed. Therefore, it is assumed that a combination of the openings 4*a* and 4*b* is referred to as an opening (groove) 4. The opening 4*a* is an opening (groove) for forming the redistribution wire RW. The opening 4*b* is an opening (groove) for forming the pad PD2. The opening 4 is an opening (groove) for forming the redistribution wire RW and the pad PD2.

Also, as described above, the pad PD3 is formed integrally with the coil CL2 and connected thereto. Accordingly, the region where the pad PD3 is to be formed is connected to the region where the coil CL2 is to be formed. Consequently, the opening 5*b* formed in the region where the pad PD3 is to be formed is connected to the opening 5*a* formed in the region where the coil CL2 is to be formed. Therefore, it is assumed that a combination of the openings 5*a* and 5*b* is referred to as an opening (groove) 5. The opening 5*a* is an opening (groove) for forming the coil CL2. The opening 5*b* is an opening (groove) for forming the pad PD3. The opening 5 is an opening (groove) for forming the coil CL2 and the pad PD3.

The opening 5*a* is the opening (groove) for forming the coil CL2 and has the same pattern as that of the coil CL2. Accordingly, the opening Sa has the pattern in which the groove having approximately the same width as the line width of the coil CL2 circles. The line width (wire width) of the coil CL2 is smaller (narrower) than the line width (wire width) of the redistribution wire RW. That is, the coil CL2 has the pattern more minute than those of the redistribution line RW and the pad PD2. Accordingly, the opening 5*a* for forming the coil CL2 has the pattern more minute than that of the opening 4 for forming the redistribution wire RW and the pad PD2.

Thus, in the present embodiment, the resist pattern RP4 having the opening 4 for forming the redistribution wire RW and the pad PD2 and the opening 5 for forming the coil CL2 and the pad PD3 is formed by subjecting the resist film RP4*a* to exposure and development.

Here, to properly form the opening 4 for forming the redistribution wire RW and the pad PD2, it is desirable to increase a dose in the exposure of the resist film RP4*a* to a degree. The reason for this is as follows.

When the resist film RP4*a* is formed over the seed film SW, the opening OP1 of the multi-layer film LF is internally filled with the resist film RP4*a* over the seed film SE. Accordingly, the thickness of the resist film RP4*a* is relatively thicker in the region two-dimensionally overlapping the opening OP1 of the multi-layer film LF than in the other region (see FIG. 50). Since the redistribution wire RW needs to be formed also over the pad PD1 exposed from the opening OP1 of the multi-layer film LF, the opening 4 for forming the redistribution wire RW and the pad PD2 (specifically, the opening 4*a* for forming the redistribution wire RW) is formed so as to overlap the opening OP1 of the multi-layer film LF in plan view. More specifically, the opening 4 for forming the redistribution wire RW and the pad PD2 is formed so as to include the opening OP1 of the multi-layer film LF in plan view. When the resist film RP4*a* is exposed to light, unless the portion of the resist film RP4*a* which is intended to fill the opening OP1 of the multi-layer film LF (the portion of the resist film RP4*a* which overlaps the opening OP1 in plan view) is sufficiently illuminated with the light, underexposure may occur and, after development treatment, a part of the resist film RP4*a* may remain over the seed film SE at the bottom portion of the opening OP1 of the multi-layer film LF. The remaining of the resist film RP4*a* over the seed film SE at the bottom portion of the opening OP1 of the multi-layer film LF leads to the situation where the redistribution wire RW cannot successfully be formed over the pad PD1 exposed from the opening OP1 of the multi-layer film LF. Therefore, it is desirable to maximally prevent the phenomenon in which, after the development treatment, the resist film RP4*a* remains over the seed film SE at the bottom portion of the opening OP1 of the multi-layer film LF.

Accordingly, when the resist film RP4*a* is exposed to light to form the opening 4, it is desirable to allow light (exposing light) to satisfactorily reach the bottom portion of the opening OP1 of the multi-layer film LF and sufficiently illuminate the portion of the resist film RP4*a* which is intended to fill the opening OP1 of the multi-layer film LF, and thus prevent the occurrence of underexposure. Therefore, to properly form the opening 4 for forming the redistribution wire RW and the pad PD2, it is desirable to increase the dose in the exposure of the resist film RP4*a* to a degree.

However, in terms of properly forming the opening 5 for forming the coil CL2 and the pad PD3, it is desirable to reduce the dose in the exposure of the resist film RP4*a* to a degree.

That is, when the dose is high, it is difficult to form a minute pattern in the photoresist pattern. For example, when a photoresist pattern having grooves corresponding to a coil pattern is formed by subjecting a photoresist film to exposure and development, if the dose increases, the width of each of the grooves increases to reduce the space between the adjacent grooves. As a result, the grooves corresponding to the coil pattern may not be able to be formed successfully. On the other hand, even when the dose is increased, if the line width (wire width) of the coil pattern and the line-to-line space thereof are increased to allow the grooves corresponding to the coil pattern in the photoresist pattern to be successfully formed, the area occupied by the coil is increased to consequently increase the two-dimensional size (plane area) of the semiconductor device.

Accordingly, in terms of properly forming the opening 4 for forming the redistribution wire RW and the pad PD2, it is desirable to increase the dose in the exposure of the resist film RP4*a* to a degree while, in terms of properly forming the opening 5 for forming the coil CL2 and the pad PD3, it is desirable to reduce the dose in the exposure of the resist film RP4*a* to a degree. That is, the opening 4 for forming the redistribution wire RW and the pad PD2 and the opening 5 for forming the coil CL2 and the pad PD3 show opposite requirements related to an optimum dose.

Accordingly, in the present embodiment, as the fourth inventive improvement, exposure treatment for forming the opening 4 for forming the redistribution wire RW and the pad PD2 and exposure treatment for forming the opening 5 for forming the coil CL2 and the pad PD3 are individually performed. In addition, the dose in the exposure treatment for forming the opening 5 for forming the coil CL2 and the pad PD3 is set lower than the dose in the exposure treatment for forming the opening 4 for forming the redistribution wire RW and the pad PD2. In other words, the dose in the exposure treatment for forming the opening 4 for forming the redistribution wire RW and the pad PD2 is set higher than the dose in the exposure treatment for forming the opening 5 for forming the coil CL2 and the pad PD3.

Figure 81:
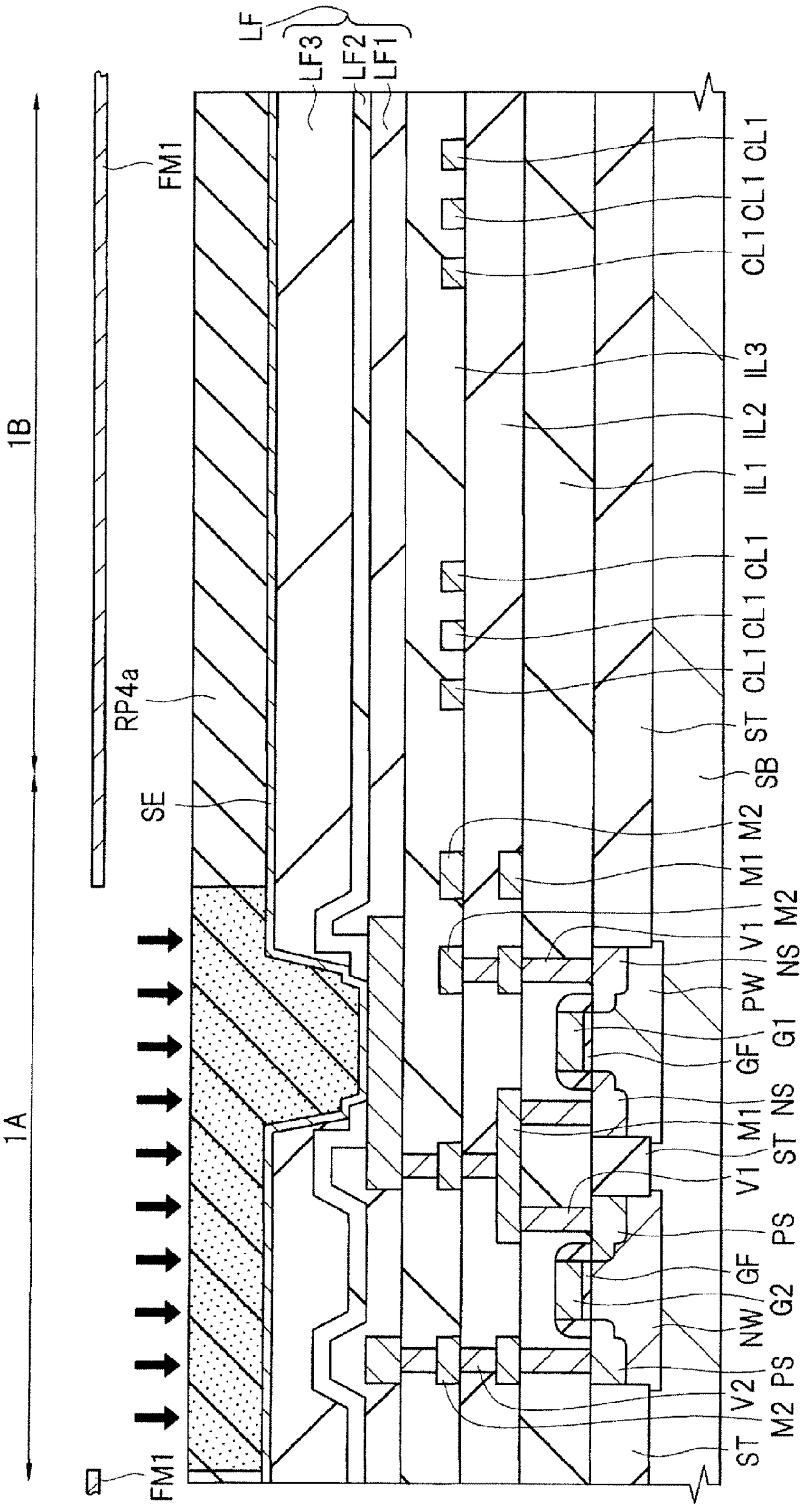
FIG. 81 is an illustrative view of a fourth inventive improvement.
Figure 82:
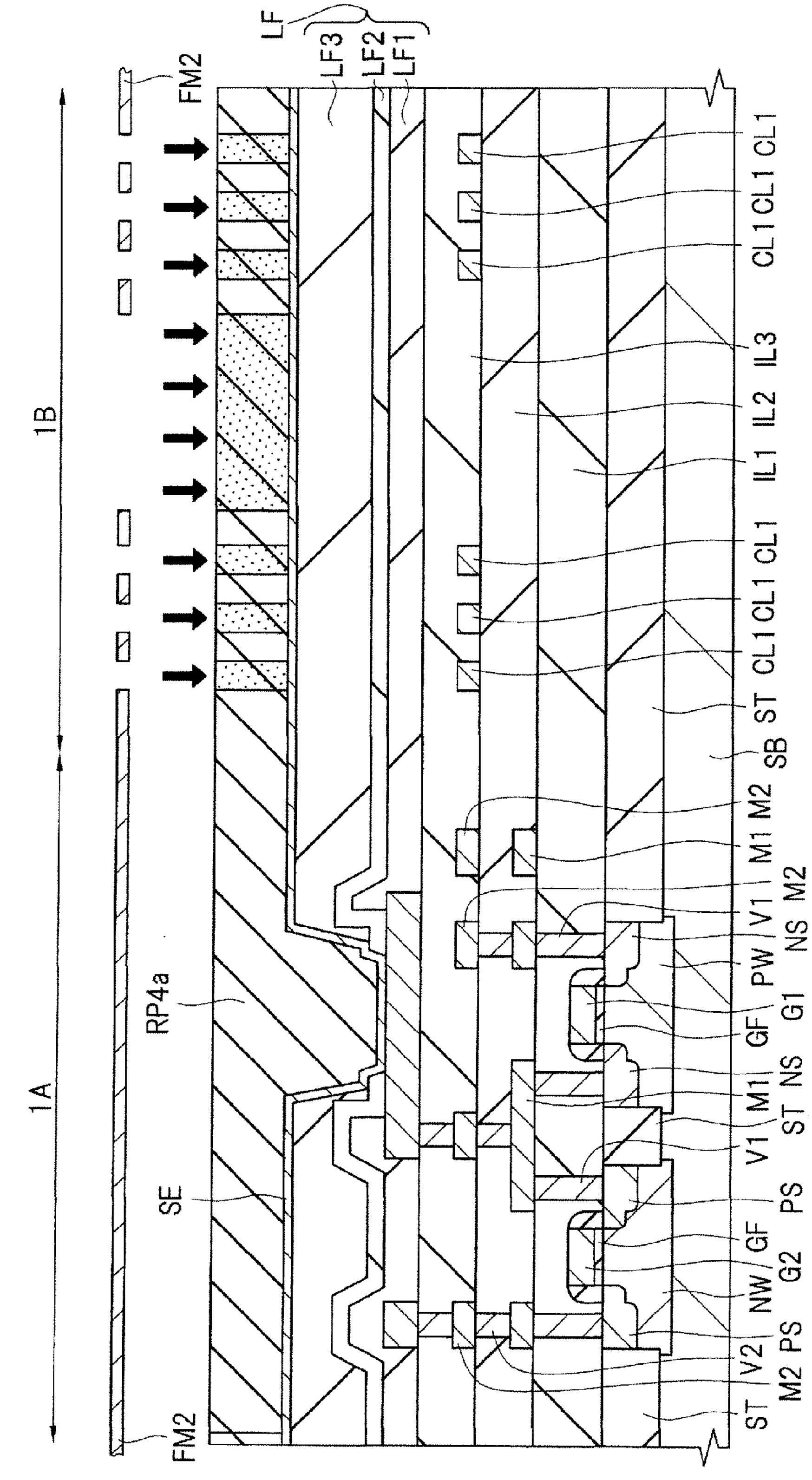
FIG. 82 is an illustrative view of the fourth inventive improvement.

The fourth inventive improvement will be specifically described with reference to FIGS. 81 and 82. FIGS. 81 and 82 are illustrative views of the fourth inventive improvement. FIGS. 81 and 82 show the step of exposing the resist film RP4*a* (photoresist film) to light after forming the resist film RP4*a*, as shown in FIG. 50 described above.

As shown in FIG. 50 described above, after the resist film RP4*a* is formed over the seed film SE, as shown in FIG. 81, the resist layer RP4*a* is subjected to exposure treatment (first exposure treatment). In the first exposure treatment, treatment which exposes the resist film RP4*a* to light is performed using a photomask (reticle) FM1 which allows the region to be formed with the opening 4 to be illuminated with the light (exposing light) and keeps the region to be formed with the opening 5 from being illuminated with the light (exposing light). In FIG. 81, for easier understanding, the region (exposed region) of the resist film RP4*a* which has been illuminated with the light (exposing light) in the first exposure treatment is hatched with dots.

In the first exposure treatment (exposure treatment shown in FIG. 81), the region of the resist film RP4*a* to be formed with the opening 4 (accordingly, the regions thereof to be formed with the redistribution wire RW and the pad PD2) is illuminated with and exposed to the light (exposing light). However, the region of the resist film RP4*a* to be formed with the opening 5 (accordingly, the region thereof to be formed with the coil CL2 and the pad PD3) is not illuminated with and exposed to the light (exposing light). That is, in the first exposure treatment, to the resist film RP4*a*, the same patterns as those of the redistribution wire RW and the pad PD2, which will be formed later, are transferred by exposure.

Next, as shown in FIG. 82, the resist layer RP4*a* is subjected to exposure treatment (second exposure treatment). In the second exposure treatment, treatment (second exposure treatment) which exposes the resist film RP4*a* to light is performed using a photomask (reticle) FM2 which allows the region to be formed with the opening 5 to be illuminated with the light (exposing light) and keeps the region to be formed with the opening 4 from being illuminated with the light (exposing light). In FIG. 82, for easier understanding, the region (exposed region) of the resist film RP4*a* which has been illuminated with the light (exposing light) in the second exposure treatment is hatched with dots.

In the second exposure treatment (exposure treatment shown in FIG. 82), the region of the resist film RP4*a* to be formed with the opening 5 (i.e., the regions thereof to be formed with the coil CL2 and the pad PD3) is illuminated with and exposed to the light (exposing light). However, the region of the resist film RP4*a* to be formed with the opening (i.e., the regions thereof to be formed with the redistribution wire RW and the pad PD2) is not illuminated with and exposed to the light (exposing light). That is, in the second exposure treatment, to the resist film RP4*a*, the same patterns as those of the coil CL2 and the pad PD3, which will be formed later, are transferred by exposure.

That is, the region of the resist film RP4*a* to be formed with the opening 4 is illuminated with (i.e., exposed to) the light (exposing light) in the first exposure treatment, but is not illuminated with (i.e., exposed to) the light (exposing light) in the second exposure treatment. On the other hand, the region of the resist film RP4*a* to be formed with the opening 5 is illuminated with (i.e., exposed to) the light (exposing light) in the second exposure treatment, but is not illuminated with (i.e., exposed to) the light (exposing light) in the first exposure treatment.

Thus, to the resist film RP4*a*, the patterns of the redistribution wire RW and the pad PD2 are transferred by exposure in the first exposure treatment (exposure treatment shown in FIG. 81) and the patterns of the coil CL2 and the pad PD3 are transferred by exposure in the second exposure treatment (exposure treatment shown in FIG. 82). The dose in the first exposure treatment (exposure treatment shown in FIG. 81) is set higher than the dose in the second exposure treatment (exposure treatment shown in FIG. 82). In other words, the dose in the second exposure treatment (exposure treatment shown in FIG. 82) is set lower than the dose in the first exposure treatment (exposure treatment shown in FIG. 81).

After the first exposure treatment (exposure treatment shown in FIG. 81) and the second exposure treatment (exposure treatment shown in FIG. 82), the resist film RP4*a* is subjected to development treatment to form the resist pattern RP4 having the openings 4 and 5, as shown in FIG. 51 described above. Then, as described above, over the seed film SE exposed from the resist pattern RP4, a conductive film (which is the copper film CF herein) for the coil CL2 and the redistribution wire RW is formed by an electrolytic plating method (see FIG. 52 described above).

In the first exposure treatment and the second exposure treatment, the different photomasks are used. The photomask FM1 used in the first exposure treatment is not the same as the photomask FM2 used in the second exposure treatment. That is, the photomask FM1 used in the first exposure treatment has a mask pattern corresponding to the opening 4 (mask pattern accordingly corresponding to the redistribution wire RW and the pad PD2), but does not have a mask pattern corresponding to the opening 5 (mask pattern accordingly corresponding to the coil CL2 and the pad PD3). On the other hand, the photomask FM2 used in the second exposure treatment has the mask pattern corresponding to the opening 5 (mask pattern accordingly corresponding to the coil CL2 and the pad PD3), but does not have the mask pattern corresponding to the opening 4 (mask pattern accordingly corresponding to the redistribution wire RW and the pad PD2).

Heretofore, the description has been given of the case where the first exposure treatment (exposure treatment shown in FIG. 81) which exposes the region to be formed with the opening 4 is performed first, and the second exposure treatment (exposure treatment shown in FIG. 82) which exposes the region to be formed with the opening 5 is performed later. However, the order in which the first exposure treatment and the second exposure treatment are performed may also be reversed. That is, it is also possible to perform the second exposure treatment (exposure treatment shown in FIG. 82) which exposes the region to be formed with the opening 5 first, and perform the first exposure treatment (exposure treatment shown in FIG. 81) which exposes the region to be formed with the opening 4 later.

In the fourth inventive improvement, by individually performing the exposure treatment (first exposure treatment) for forming the opening 4 for forming the redistribution wire RW and the pad PD2 and the exposure treatment (second exposure treatment) for forming the coil CL2 and the pad PD3, it is possible to provide different doses in the exposure treatment for forming the opening 4 and the exposure treatment for forming the opening 5.

By setting the dose in the second exposure treatment (exposure treatment shown in FIG. 82) for forming the opening higher than the dose in the first exposure treatment (exposure treatment shown in FIG. 81) for forming the opening 4, the opening 4 for forming the redistribution wire RW and the pad PD2 can be formed with a relatively high dose. This allows the opening 4 for forming the redistribution wire RW and the pad PD2 to be properly formed. Specifically, since the dose in the exposure of the resist film RP4*a* in the first exposure treatment is high, it is possible to allow the light (exposing light) to satisfactorily reach the bottom portion of the opening OP1 of the multi-layer film LF and sufficiently illuminate the portion of the resist film RP4*a* which is intended to fill the opening OP1 of the multi-layer film LF, and thus prevent the occurrence of underexposure. As a result, it is possible to reliably prevent a part of the resist film RP4*a* from remaining over the seed film SE at the bottom portion of the opening OP1 of the multi-layer film LF even after the development treatment due to underexposure. This allows the opening 4 for forming the redistribution wire RW and the pad PD2 to be properly formed and thus allows the redistribution wire RW and the pad PD2 to be properly formed. Therefore, it is possible to improve the reliability of the semiconductor device. It is also possible to improve the manufacturing yield of the semiconductor device.

In other words, by setting the dose in the first exposure treatment (exposure treatment shown in FIG. 81) for forming the opening 4 lower than the dose in the second exposure treatment (exposure treatment shown in FIG. 82) for forming the opening 5, the opening 5 for forming the coil CL2 and the pad PD3 can be formed with a relatively low dose. This allows the opening 5 for forming the coil CL2 and the pad PD3 to be properly formed. Specifically, it is possible to inhibit or prevent the phenomenon in which the excessive dose undesirably increases the width (groove width or line width) of the opening (groove) Sa for forming the coil CL2. This allows the opening 5 for forming the coil CL2 and the pad PD3 to be properly formed and thus allows the coil CL2 and the pad PD3 to be properly formed. Therefore, it is possible to improve the reliability of the semiconductor device. It is also possible to improve the manufacturing yield of the semiconductor device. In addition, since the dose in the exposure treatment for forming the opening 5 for forming the coil CL2 and the pad PD3 can be set relatively low, even when the coil pattern of the coil CL2 to be formed is designed to have a small line width (wire width) and a small line-to-line space (inter-line space), the opening (groove) 5*a* for forming the coil CL2 corresponding thereto can properly be formed. Therefore, it is possible to reduce the area occupied by the coil CL2 and reduce the size (area) of the semiconductor device.

By thus using the fourth inventive improvement, it is possible to form the opening 4 for forming the redistribution wire RW and the pad PD2 with a high dose and form the opening 5 for forming the coil CL2 and the pad PD3 with a low dose. This allows the resist pattern RP4 having the opening 4 for forming the redistribution wire RW and the pad PD2 and the opening 5 for forming the coil CL2 and the pad PD3 to be more properly formed. As a result, any of the redistribution wire RW, the pad PD2, the coil CL2, and the pad PD3 can properly be formed. Therefore, it is possible to further improve the reliability of the semiconductor device. It is also possible to further improve the manufacturing yield of the semiconductor device.

It is more preferable that, in the exposure treatment (first exposure treatment for forming the opening 4 for forming the redistribution wire RW and the pad PD2, multi-wavelength light including a g-line, an h-line, and an i-line is used. When the multi-wavelength light including the g-line, the h-line, and the i-line is used, the dose is easily increased. That is, in the first exposure treatment (exposure treatment shown in FIG. 81) for forming the opening 4 for forming the redistribution wire RW and the pad PD2, the dose is increased. Since the use of the multi-wavelength light including the g-line, the h-line, and the i-line can enhance the use efficiency of light from a light source (lamp), the dose can efficiently be increased. In addition, since the use of the multi-wavelength light including the g-line, the h-line, and the i-line can enhance the use efficiency of the light from the light source (lamp), it is possible to suppress the heating of the light source (lamp), while increasing the dose. The suppression of the heating of the light source (lamp) leads to a reduction in the time required to cool the light source (lamp) and consequently to an improved throughput.

It is more preferable that, in the exposure treatment (second exposure treatment) for forming the opening 5 for forming the coil CL2 and the pad PD3, the i-line (single-wavelength light of the i-line) is used.

To form the minute wires, i.e., to form a photoresist pattern for minute wires, it is desirable to use an i-line at a short wavelength for exposure. Since the pattern of the coil CL2 is more minute (having a smaller wire width and a smaller space between adjacent wires) than that of the redistribution wire RW, exposure using the i-line at the short wavelength is appropriate for the formation of the opening (groove) 5*a* for forming the coil CL2.

The use of the i-line (single-wavelength light of the i-line) reduces the use efficiency of the light from the light source (lamp) so that the dose is less likely to be increased. An attempt to increase the dose results in significant heating of the light source (lamp). The significant heating of the light source (lamp) leads to an increase in the time required to cool the light source (lamp) and consequently to a reduced throughput.

However, in the second exposure treatment (exposure treatment shown in FIG. 82) for forming the opening 5 for forming the coil CL2 and the pad PD3, the dose is reduced. As a result, even when the i-line (single-wavelength light of the i-line) is used, it is possible to suppress the heating of the light source (lamp). The suppression of the heating of the light source (lamp) leads to a reduction in the time required to cool the light source (lamp) to allow an improvement in throughput. By forming the opening 5 for forming the coil CL2 and the pad PD3 through the exposure using the i-line (single-wavelength light of the i-line), the coil CL2 can more properly be formed.

For example, for the exposure treatment shown in FIG. 81 (first exposure treatment), the dose can be set to about 20 $kJ/m^2$ and the multi-wavelength light including the g-line, the h-line, and the i-line can be used. For the exposure treatment shown in FIG. 82 (second exposure treatment), the dose can be set to about 15 $kJ/m^2$ and the i-line (single-wavelength light of the i-line) can be used. Note that the specific numerical values of the doses can be changed appropriately in accordance with the depth of the opening OP1 (accordingly, the thickness of the multi-layer film LF), the wire width of the coil CL2, the space between the adjacent wires, or the like.

Here, the g-line has a wavelength of 436 nm, the h-line has a wavelength of 405 nm, and the i-line has a wavelength of 365 nm. Specifically, the g-line is a spectral line of mercury at a wavelength of 436 nm, the h-line is a spectral line of mercury at a wavelength of 405 nm, and the i-line is a spectral line of mercury at a wavelength of 365 nm. As a light source for exposure when the g-line, the h-line, and the i-line are used, a mercury lamp (high-voltage mercury lamp) or the like can be used appropriately.

A dose corresponds to a quantity of illuminating light (cumulative light quantity) per unit area in the region (exposed region) of the resist film (photoresist film) which has been illuminated with light (exposing light) during the exposure treatment. As the unit of the dose, e.g., $J/cm^2$ or $J/m^2$ can be used.

As the resist film RP4*a*, a positive resist film (photoresist film) can be used appropriately.

<About Configuration of Coils>

Next, a description will be given of a configuration of the coils forming the transformer TR1 formed in the semiconductor chip CP1.

Figure 83:
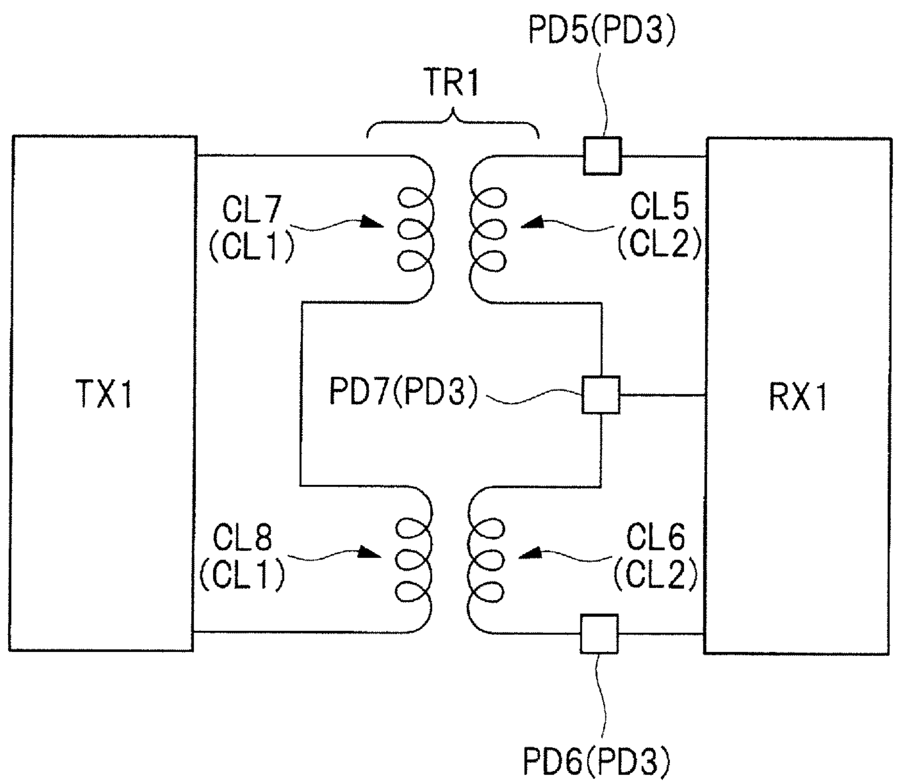
FIG. 83 is a circuit diagram showing a circuit configuration of a transformer formed in the semiconductor device in the embodiment.
Figure 84:
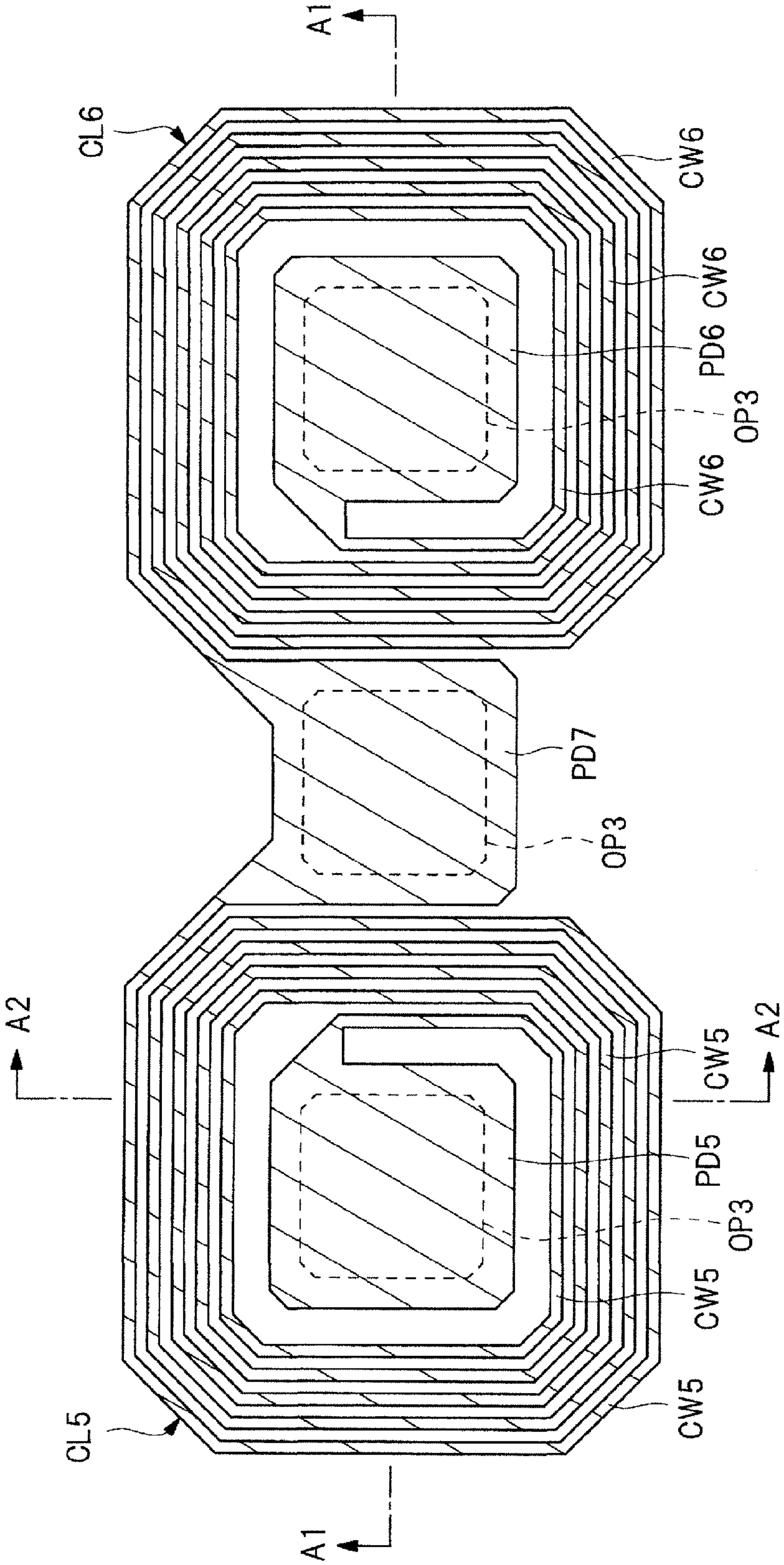
FIG. 84 is a main-portion plan view of the semiconductor device in the embodiment.
Figure 85:
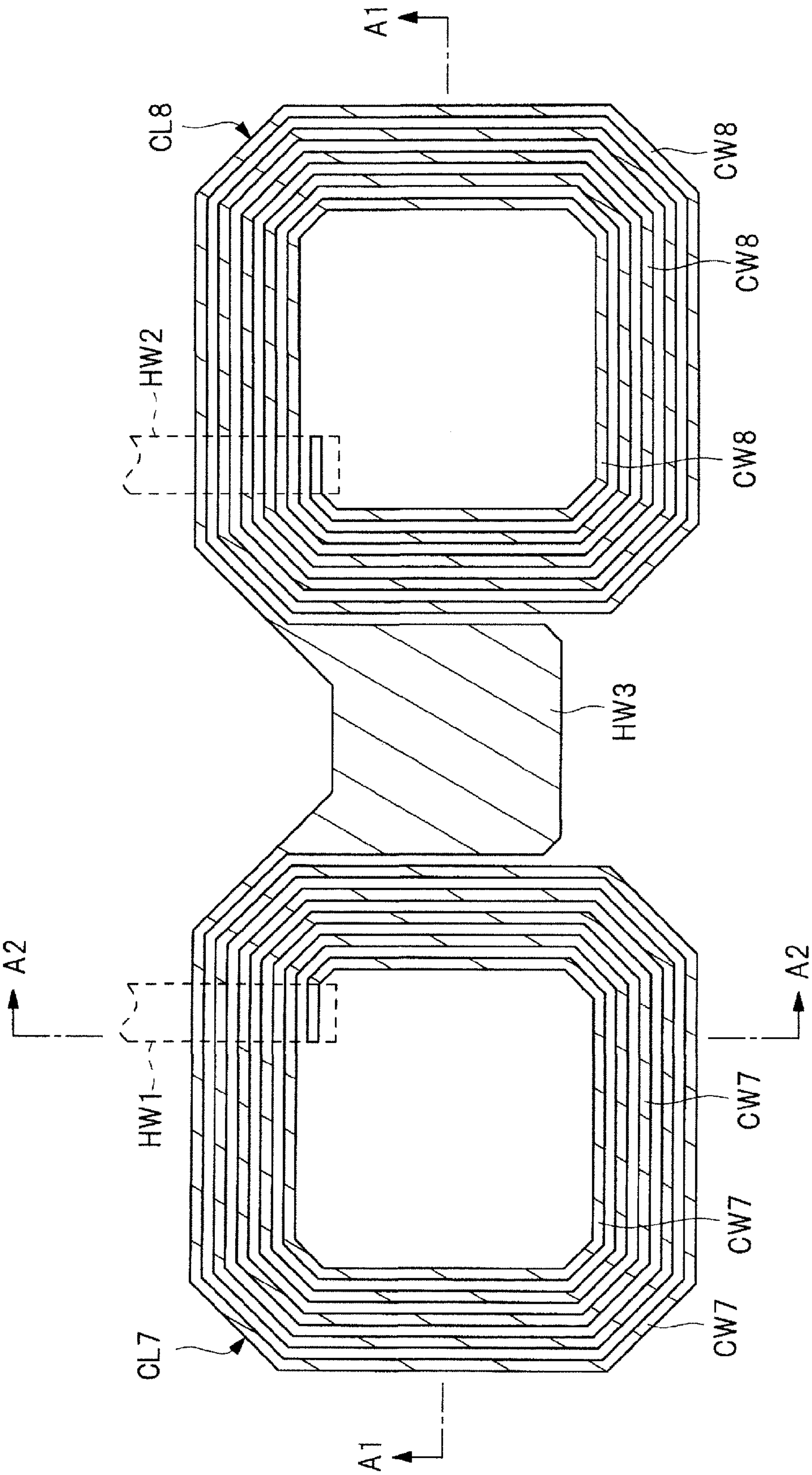
FIG. 85 is a main-portion plan view of the semiconductor device in the embodiment.

FIG. 83 is a circuit diagram showing a circuit configuration of the transformer TR1 formed in the semiconductor chip CP1. FIGS. 84 and 85 are main-portion plan views of the semiconductor chip CP1 in the present embodiment. FIGS. 84 and 85 show the plan views of the coils formed in the foregoing transformer formation region 1B. FIGS. 86 and 87 are main-portion cross-sectional views of the semiconductor chip CP1 in the present embodiment. FIGS. 86 and 87 show the cross-sectional views of the foregoing transformer formation region 1B.

Note that FIGS. 84 and 85 show the same two-dimensional region of the semiconductor chip CP1, but in different layers. FIG. 85 shows the layer under the layer shown in FIG. 84. Specifically, FIG. 84 shows the secondary-side coils (coils CL5 and CL6) of the transformer TR1 formed in the semiconductor chip CP1. FIG. 85 shows the primary-side coils (coils CL7 and CL8) of the transformer TR1 formed in the semiconductor chip CP1. For easier understanding of the relative positional relationship between the primary-side coils (CL7 and CL8) and lead-out wires (lead-out wires HM1 and HM2) therefor, the lead-out wires HW1 and HW2 are shown by the dotted lines in FIG. 85. The cross-sectional view along the line A1-A1 in each of FIGS. 84 and 85 corresponds to FIG. 86. The cross-sectional view along the line A2-A2 in each of FIGS. 84 and 85 corresponds to FIG. 87.

As described above, in the semiconductor chip CP1, the primary and secondary coils for the transformer TR1 are formed. Of the primary and secondary coils, the primary coil is formed on the lower side and the secondary coil is formed on the upper side. That is, the secondary coil is placed over the primary coil, and the primary coil is placed under the secondary coil.

Here, when each of the primary and secondary coils is formed of two coils, i.e., when the transformer TR1 is formed of two transformers and the two transformers are differentially operated, noise resistance increases.

Accordingly, in the present embodiment, as shown in FIG. 83, a configuration is used in which the primary coil (corresponding to the foregoing coil CL1*a*) of the transformer TR1 is formed of the coils CL7 and CL8 coupled in series, and the secondary coil (corresponding to the foregoing coil CL2*a*) of the transformer TR1 is formed of the coils CL5 and CL6 coupled in series between pads PD5 and PD6. In this case, the coils CL7 and CL5 are magnetically coupled (inductively coupled) to each other, and the coils CL8 and CL6 are magnetically coupled (inductively coupled) to each other. The coils CL7 and CL8 coupled in series are coupled to the transmission circuit TX1. Between the coils CL5 and CL6, a pad PD7 is electrically coupled. The coils CL5, CL6, CL7, and CL8, the pads PD5, PD6, and PD7, and the transmission circuit TX1 are formed in the semiconductor chip CP1. The pads PD5, PD6, and PD7 are coupled to the reception circuit RX1 in the semiconductor chip CP2 via conductive coupling members such as the bonding wires BW described later and the internal wiring of the semiconductor chip CP2.

As a result, when a transmission signal is sent from the transmission circuit TX1 to the coils CL7 and CL8 as the primary coil to allow a current to flow in the semiconductor chip CP1, an induced electromotive force is generated in the coils CL5 and CL6 as the secondary coil in accordance with a change in the current flowing in the coils CL7 and CL8 so that an induced current flows. The induced electromotive force or induced current generated in the coils CL5 and CL6 can be sensed from the pads PD5, PD6, and PD7 by the reception circuit RX1 in the semiconductor chip CP2 via conductive coupling members such as the bonding wires BW described later and the internal wiring of the semiconductor chip CP2. In this manner, the signal from the transmission circuit TX1 of the semiconductor chip CP1 can be transmitted by electromagnetic induction to the reception circuit RX1 of the semiconductor chip CP2 via the coils CL7, CL8, CL5, and CL6. Since a fixed potential (such as ground potential, GND potential, or power supply potential) is supplied from the semiconductor chip CP2 to the pad PD7, by sensing the induced electromotive force or induced current in the coil CL5 and the induced electromotive force or induced current in the coil CL6, it is possible to perform differential control (a differential control operation).

Referring to FIGS. 84 to 87, a description will be given below of a specific configuration of the coils CL5, CL6, CL7, and CL8 and the pads PD5, PD6, and PD7.

The coils CL7 and CL8 correspond to the foregoing coil CL1. The coils CL5 and CL6 correspond to the foregoing coil CL2. The pads PD5, PD6, and PD7 correspond to the foregoing pad PD3. That is, when the transformers shown in FIGS. 84 to 87 are applied to the structure shown in FIGS. 3 to 8 described above, to the manufacturing steps shown in FIGS. 9 to 59 described above, to and the first to fourth inventive improvements shown in FIGS. 60 to 82 described above, in FIGS. 3 to 82 described above, the foregoing coil CL1 is replaced with the coils CL7 and CL8 shown in FIGS. 84 to 87 and the foregoing coil CL2 is replaced with the coils CL5 and CL6 shown in FIGS. 84 to 87. In addition, in FIGS. 3 to 82 described above, the foregoing pad PD3 is replaced with the pads PD5, PD6, and PD7 shown in FIGS. 84 to 87.

First, a description will be given of a specific configuration of the coils CL5 and CL6 as the secondary coil and the pads (pad electrodes or bonding pads) PD5, PD6, and PD7 coupled thereto.

As shown in FIGS. 83 to 87, between the pads PD5 and PD6, the two coils (inductors) CL5 and CL6 are coupled in series. Between the coils CL5 and CL6, the pad PD7 is electrically coupled.

The coils CL5 and CL6 are formed in the same layer in the semiconductor chip CP1. The coil CL5 is formed of a coil wire CW5 winding in a spiral shape (coil shape or loop shape). The coil CL6 is formed of a coil wire CW6 winding in a spiral shape (coil shape or loop shape). Each of the coils CL5 and CL6 is two-dimensionally formed. Each of the coils CL5 and CL6 can also be regarded as an inductor. Since the coils CL5 and CL6 correspond to the foregoing coil CL2, the coils CL5 and CL6 are formed in the layer in which the foregoing coil CL2 is formed in accordance with the method of forming the coil CL2 described above. On the other hand, since the pads PD5, PD6, and PD7 correspond to the foregoing pad PD3, the pads PD5, PD6, and PD7 are formed in the layer in which the foregoing pad PD3 is formed in accordance with the method of forming the pad PD3 described above.

As shown in FIGS. 83 to 87, the two coils (inductors) CL7 and LC8 are coupled in series. The coils CL7 and LC8 are formed in the same layer as in the semiconductor chip CP1. The coil CL7 is formed of a coil wire CW7 winding in a spiral shape (coil shape or loop shape). The coil CL8 is formed of a coil wire CW8 winding in a spiral shape (coil shape or loop shape). Each of the coils CL7 and CL8 is two-dimensionally formed. Each of the coils CL7 and CL8 can also be regarded as an inductor. Since the coils CL7 and CL8 correspond to the foregoing coil CL1, the coils CL7 and CL8 are formed in the layer in which the foregoing coil CL1 is formed in accordance with the method of forming the coil CL1 described above.

Figure 86:
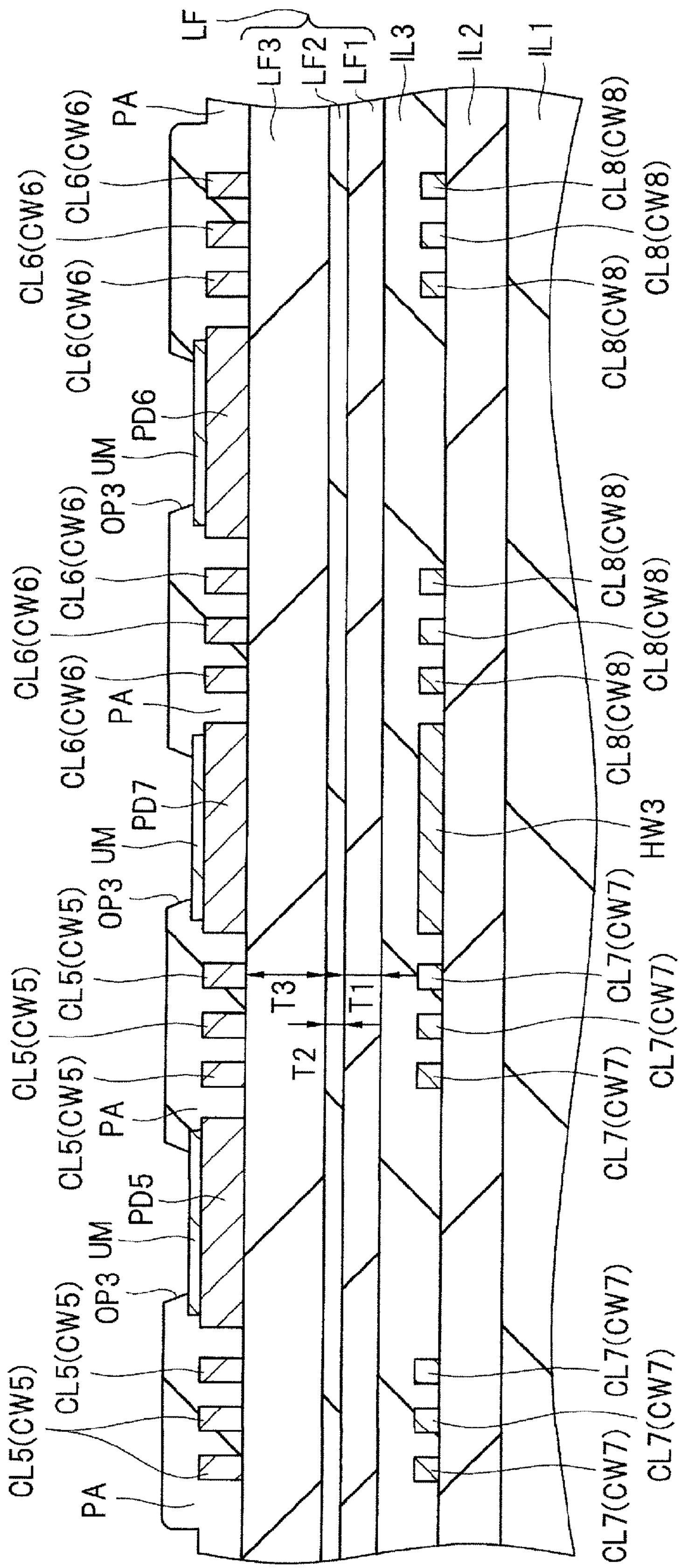
FIG. 86 is a main-portion cross-sectional view of the semiconductor device in the embodiment.
Figure 87:
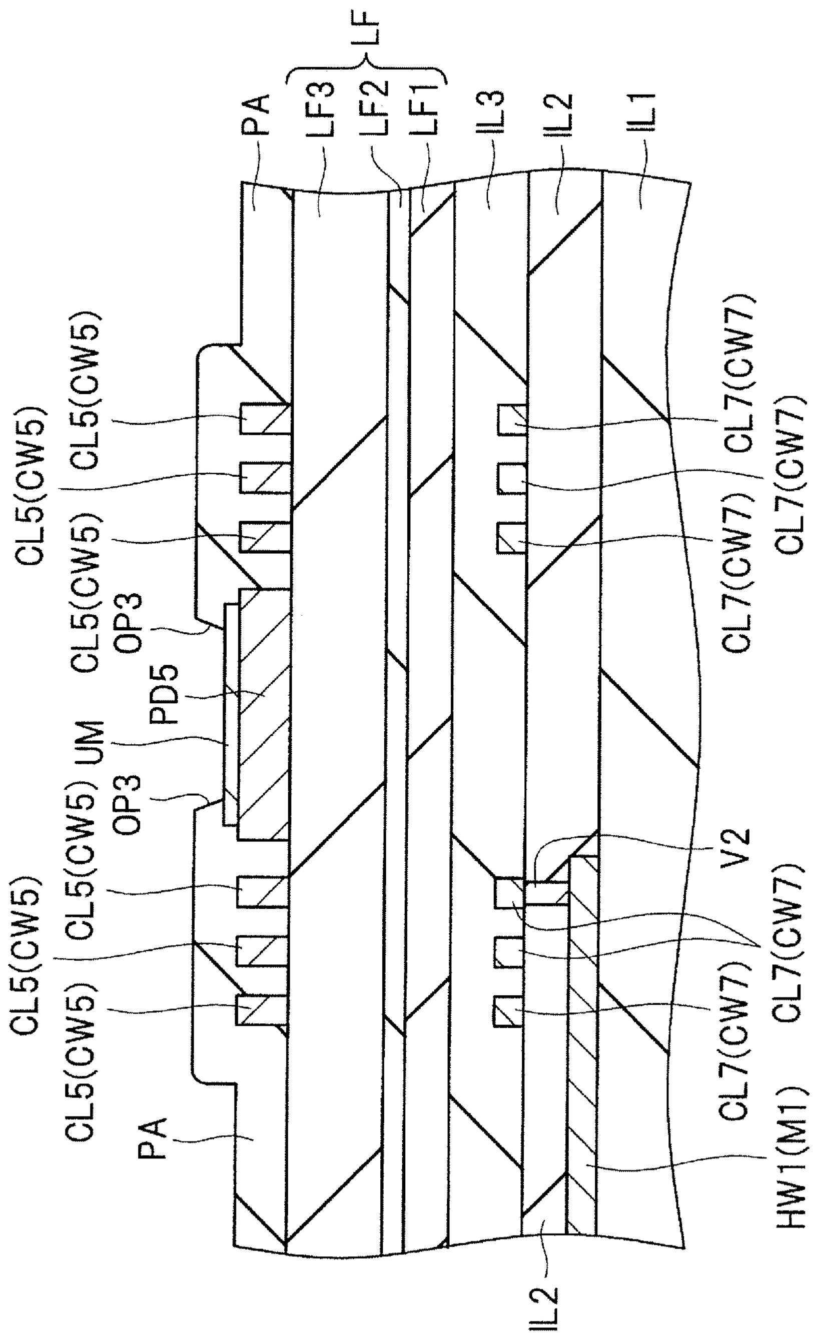
FIG. 87 is a main-portion cross-sectional view of the semiconductor device in the embodiment.

As can also be seen from FIGS. 86 and 87, in the semiconductor chip CP1, the coils CL7 and CL8 are formed in the layer under the layer in which the coils CL5 and CL6 are formed. That is, in the semiconductor chip CP1, the coils CL5 and CL6 are formed in the same layer, and the coils CL7 and CL8 are formed in the same layer. The coils CL7 and CL8 are formed in the layer under the layer in which the coils CL5 and CL6 are formed. The coils CL5 and CL6 are formed in the layer over the layer in which the coils CL7 and CL8 are formed.

The coil 7 is placed immediately under the coil CL5, while the coil 8 is placed immediately under the coil CL6. That is, the coil CL7 is placed so as to overlap the coil CL5 in plan view, while the coil CL8 is placed so as to overlap the coil CL6 in plan view. In other words, the coil CL5 is placed immediately over the coil CL7, while the coil CL6 is placed immediately over the coil CL8. That is, the coil CL5 is placed so as to overlap the coil CL7 in plan view, while the coil CL6 is placed so as to overlap the coil CL8 in plan view.

The coils CL5 and CL7 are magnetically coupled to each other, while the coils CL6 and CL8 are magnetically coupled to each other. That is, the coils CL5 and CL7 are not connected via a conductor, but are magnetically coupled to each other. Also, the coils CL6 and CL8 are not connected via a conductor, but are magnetically coupled to each other. On the other hand, the coils CL5 and CL6 are connected via a conductor, and the coils CL7 and CL8 are connected via a conductor.

The pads PD5, PD6, and PD7 correspond to the foregoing pad PD3. Since the coils CL5 and CL6 (coil wires CW5 and CW6) correspond to the foregoing coil CL2, the pads PD5, PD6, and PD7 and the coils CL5 and CL6 (coil wires CW5 and CW6) are formed in the same layer. The pads PD5, PD6, and PD7 and the coils CL5 and CL6 (coil wires CW5 and CW6) are also formed in the same layer as that of the foregoing redistribution wire RW and the foregoing pad PD2. Specifically, each of the coils CL5 and CL6 (coil wires CW5 and CW6) and the pads PD5, PD6, and PD7 is made of the multi-layer film including the foregoing seed film SE and the copper film CF over the seed film SE and formed over the foregoing resin film LF3. Over the respective top surfaces of the pads PD5, PD6, and PD7, the foregoing underlying metal films UM are formed. Each of the coils CL5 and CL6 (coil wires CW5 and CW6) is covered with the protective film PA in the uppermost layer of the semiconductor chip CP1. The pads PD5, PD6, and PD7 are exposed from the opening OP3 provided in the protective film PA. In FIG. 84, the opening OP3 is shown by the dotted line.

As shown in FIGS. 84 and 86, the pad PD5 is placed inside the spiral of the coil CL5. To the pad PD5, one end of the coil CL5 is coupled. That is, the coil wire CW5 coupled to the pad PD5 circles around the pad PD5 a plurality of times to form the coil CL5. In the case of FIG. 84, the coil wire CW5 coupled to the pad PD5 circles around the pad PD5 rightward (clockwise) to form the coil CL5. Since the individual windings of the coil wire CW5 do not cross each other, the coil wire CW5 coupled to the pad PD5 gradually shifts away from the pad PD5 every time the coil wire CW5 circles around the pad PD5 rightward (clockwise).

On the other hand, the pad PD6 is placed inside the spiral of the coil CL6. To the pad PD6, one end of the coil CL6 is coupled. That is, the coil wire CW6 coupled to the pad PD6 circles around the pad PD6 a plurality of times to form the coil CL6. In the case of FIG. 84, the coil wire CW6 coupled to the pad PD6 circles around the pad PD6 leftward (counterclockwise) to form the coil CL6. Since the individual windings of the coil wire CW6 do not cross each other, the coil wire CW6 coupled to the pad PD6 gradually shifts away from the pad PD6 every time the coil wire CW6 circles around the pad PD6 leftward (counterclockwise).

Here, "rightward" is synonymous to "clockwise", and "leftward" is synonymous to "counterclockwise". When the direction of winding (direction of the spiral) of a coil or a coil wire is mentioned, the direction of winding assumedly refers to the direction of winding of the coil or coil wire which winds from the inside of the spiral toward the outside thereof when the coil or coil wire is viewed from above. It is assumed that the winding of the coil or coil wire which seems to turn clockwise from the inside of the spiral toward the outside thereof is referred to as "rightward winding" and the winding of the coil or coil wire which seems to turn counterclockwise from the inside of the spiral toward the outside thereof is referred to as "leftward winding". For example, when the direction of winding of the coil CL5 of the semiconductor chip CP1 is mentioned, the winding of the coil CL5 which seems to turn clockwise from the inside of the spiral of the coil CL5 toward the outside thereof when the top surface side (the side formed with the pad) of the semiconductor chip CP1 is viewed from thereabove (FIGS. 84 to 85 correspond thereto) is assumedly referred to as "rightward winding". On the other hand, the winding of the coil CL5 which seems to turn counterclockwise from the inside of the spiral of the coil CL5 toward the outside thereof when the top surface side of the semiconductor chip CP1 is viewed from thereabove is assumedly referred to as "leftward winding".

The number of windings (number of turns) of the coil CL5 (coil wire CW5) and the number of windings (number of turns) of the coil CL6 (coil wire CW6) can be changed as necessary. However, the number of windings of the coil CL5 (coil wire CW5) and the number of windings of the coil CL6 (coil wire CW6) are preferably the same. Also, the size (diameter) of the coil CL5 and the size (diameter) of the coil CL6 are preferably the same. Also, the self-inductance of the coil CL5 and the self-inductance of the coil CL6 are preferably the same.

In FIG. 84, the direction of winding of the coil CL5 is rightward and the direction of winding of the coil CL6 is leftward. In another embodiment, the direction of winding of the coil CL5 can also be leftward and the direction of winding of the coil CL6 can also be rightward. In FIG. 84, the pad PD7 is placed between the coils CL5 and CL6. In another embodiment, the pad PD7 can also be placed in a region other than the region between the coils CL5 and CL6.

The other end (end portion opposite to the end coupled to the pad PD5) of the coil CL5 (coil wire CW5) and the other end (end portion opposite to the end coupled to the pad PD6) of the coil CL6 (coil wire CW6) are coupled to the pad PD7. Consequently, the foregoing other end of the coil CL5 (coil wire CW5) and the foregoing other end of the coil CL6 (coil wire CW6) are electrically coupled to each other via the pad PD7.

Here, the foregoing other end of the coil CL5 (coil wire CW5) corresponds to the outer end portion (outside the spiral) of the coil CL5 (coil wire CW5), and the foregoing other end of the coil CL6 (coil wire CW6) corresponds to the outer end portion (outside the spiral) of the coil CL6 (coil wire CW6). That is, the coil CL5 (coil wire CW5) has an inner end portion (inside the spiral) and the outer end portion (outside the spiral) which are opposite to each other. Of the inner and outer end portions of the coil CL5, the inner end portion is coupled to the pad PD5 and the outer end portion is coupled to the pad PD7. Also, the coil CL6 (coil wire CW6) has an inner end portion (inside the spiral) and the outer end portion (outside the spiral) which are opposite to each other. Of the inner and outer end portions of the coil CL6, the inner end portion is coupled to the pad PD6 and the outer end portion is coupled to the pad PD7. Consequently, in plan view, the pad PD7 is located between the coils CL5 and CL6 and also located between the pads PD5 and PD6. The respective sides (lengths of the sides) of the pads PD5, PD6, and PD7 can be substantially the same.

Since the coils CL5 and CL6 are formed over the resin film LF3, as shown in FIG. 84, the coils CL5 and CL6 (coil wires CW5 and CW6) are preferably provided with obtuse angles (angles larger than 90°) in plan view. This is because a resin film, especially a polyimide film, is weak to the right angle or acute angle of a metal pattern. By providing the coils CL5 and CL6 (coil wires CW5 and CW6) with obtuse angles (angles larger than 90°), it is possible to improve the reliability of each of the resin film LF3 under each of the coils CL5 and CL6 and the protective film PA covering each of the coils CL5 and CL6. This achieves a particularly large effect when the resin film LF3 under each of the coils CL5 and CL6 and the protective film PA covering each of the coils CL5 and CL6 are polyimide films. In the case of FIG. 84, each of the coils CL5 and CL6 (coil wires CW5 and CW6) has a generally octagonal shape so that each of the angles of the coils CL5 and CL6 (coil wires CW5 and CW6) is about 135°.

Next, a further description will be given of the coils CL7 and CL8 with reference to FIGS. 85 to 87.

As can also be seen from FIG. 85, no pad is placed inside the spiral of the coil CL7. The inner end portion (inside the spiral) of the coil CL7 (coil wire CW7) is electrically coupled to the lead-out wire HW1 placed in the layer under the layer of the coil wire CW7 via a via portion. The via portion is located between the coil wire CL7 and the lead-out wire HW1 to couple the coil wire CW7 to the lead-out wire HW1. In the case where the coil wire CW7 is formed in the same layer as the second wiring layer, the lead-out wire HW1 is formed in the same layer as the first wiring layer located immediately under the layer of the coil wire CW7, i.e., is formed of the wire M1. The foregoing via portion coupling the coil wire CW7 to the lead-out wire HW1 corresponds to the via portion V2. To the lead-out wire HW1, the wire in the same layer as that of the lead-out wire HW1 or the wire in a layer different from that of the lead-out wire HM1 is coupled. The lead-out wire HW1 is coupled to the wire corresponding to the transmission circuit TX1 formed in the semiconductor chip CP1 via the internal wiring of the semiconductor chip CP1.

The coil wire CW7 coupled to the lead-out wire HW1 via the via portion winds a plurality of times to form the coil CL7. It is preferable that, in the region (at the position) immediately under the pad PD5, the coil wire CW7 does not wind. The coil wire CW7 winds so as to surround the region (position) immediately under the pad PD5.

In the case of FIG. 85, the coil wire CW7 coupled to the lead-out wire HW1 via the via portion is formed to circle rightward (clockwise) around the region (position) immediately under the foregoing pad PD5. Since the individual wirings of the coil wire CW7 do not cross each other, the coil wire CW7 coupled to the lead-out wire HW1 via the via portion gradually shifts away from the center of the spiral every time the coil wire CW7 circles rightward (clockwise) around the region (position) immediately under the foregoing pad PD5.

Inside the spiral of the coil CL8, no pad is placed. The inner end portion (inside the spiral) of the coil CL8 (coil wire CW8) is electrically coupled to the lead-out wire HW2 placed in the layer under the layer of the coil wire CW8 via a via portion. The via portion is located between the coil wire CW8 and the lead-out wire HW2 to couple the coil wire CW8 to the lead-out wire HW2. In the case where the coil wire CW8 is formed in the same layer as the second wiring layer, the lead-out wire HW2 is formed in the same layer as the first wiring layer located immediately under the layer of the coil wire CW8, i.e., is formed of the wire M1. The foregoing via portion coupling the coil wire CW8 to the lead-out wire HW2 corresponds to the via portion V2. To the lead-out wire HW2, the wire in the same layer as that of the lead-out wire HW2 or the wire in a layer different from that of the lead-out wire HW2 is coupled. The lead-out wire HW2 is coupled to the wire corresponding to the transmission circuit TX1 formed in the semiconductor chip CP1 via the internal wiring of the semiconductor chip CP1.

The coil wire CW8 coupled to the lead-out wire HW2 via the via portion winds a plurality of times to form the coil CL8. It is preferable that, in the region (at the position) immediately under the pad PD6, the coil wire CW8 does not wind. The coil wire CW8 winds so as to surround the region (position) immediately under the pad PD6.

In the case of FIG. 85, the coil wire CW8 coupled to the lead-out wire HW2 via the via portion is formed to circle leftward (counterclockwise) around the region (position) immediately under the foregoing pad PD6. Since the individual wirings of the coil wire CW8 do not cross each other, the coil wire CW8 coupled to the lead-out wire HW2 via the via portion gradually shifts away from the center of the spiral every time the coil wire CW8 circles leftward (counterclockwise) around the region (position) immediately under the foregoing pad PD6.

The number of windings (number of turns) of the coil CL7 (coil wire CW7) and the number of windings (number of turns) of the coil CL8 (coil wire CW8) can be changed as necessary. However, the number of windings of the coil CL7 (coil wire CW7) and the number of windings of the coil CL8 (coil wire CW8) are preferably the same. Also, the size (diameter) of the coil CL7 and the size (diameter) of the coil CL8 are preferably the same. Also, the self-inductance of the coil CL7 and the self-inductance of the coil CL8 are preferably the same. Also, the mutual inductance between the magnetically coupled coils CL5 and CL7 and the mutual inductance between the magnetically coupled coils CL6 and CL8 are preferably the same. In FIG. 85, the direction of winding of the coil CL7 is rightward and the direction of winding of the coil CL8 is leftward. However, in another embodiment, the direction of winding of the coil CL7 can also be leftward and the direction of winding of the coil CL8 can also be rightward.

The outer end portion of the coil CL7 (coil wire CW7) and the outer end portion of the coil CL8 (coil wire CW8) are coupled to a coupling wire HW3 provided between the coils CL7 and CL8 and electrically coupled to each other via the coupling wire HW3. That is, of the inner end portion (inside the spiral) of the coil CL7 (coil wire CW7) and the outer end portion (outside the spiral) thereof, the inner end portion is coupled to the lead-out wire HW1 in the layer under the layer of the coil wire CW7 via a via portion and the outer end portion is coupled to the coupling wire HW3 in the same layer as that of the coil wire CW7. Also, of the inner end portion (inside the spiral) of the coil CL8 (coil wire CW8) and the outer end portion (outside the spiral) thereof, the inner end portion is coupled to the lead-out wire HW2 in the layer under the layer of the coil wire CW8 via a via portion and the outer end portion is coupled to the coupling wire HW3 in the same layer as that of the coil wire CW8. Consequently, one of the end portions (outer end portion) of the coil CL7 (coil wire CW7) is electrically coupled to one of the end portions (outer end portion) of the coil CL8 (coil wire CW8) via the coupling wire HW3.

Note that, in the coil CL7 or the coil wire CW7, the inner end portion (inside the spiral) and the outer end portion (outside the spiral) are opposite to each other. Also, in the coil CL8 or the coil wire CW8, the inner end portion (inside the spiral) and the outer end portion (outside the spiral) are opposite to each other.

The coupling wire HW3 is formed in the same layer as that of the coil CL7 (coil wire CW7) and the coil CL8 (coil wire CW8) and serves to electrically couple the outer end portion of the coil CL7 (coil wire CW7) to the outer end portion of the coil CL8 (coil wire CW8). Since the coupling wire HW3 is placed between the coils CL7 and CL8, when the pad PD7 is placed between the coils CL5 and CL6, the coupling wire HW3 is consequently located immediately under the pad PD7. The coupling wire HW3 can have substantially the same two-dimensional shape (two-dimensional size) as that of the pad PD7, but does not function as a pad (accordingly, coupling members such as bonding wires are not coupled thereto). This allows the coupling wire HW3 to also have a two-dimensional shape (two-dimensional size) different from that of the foregoing pad PD7. For example, it is also possible to couple the outer end portion of the coil CL7 (coil wire CW7) to the outer end portion of the coil CL8 (coil wire CW8) with the coupling wire HE3 having substantially the same width as those of the coil wires CW7 and CW8. Note that, when the coupling wire HW3 having a width larger than that of each of the coil wires CW7 and CW8 is provided between the coils CL7 and CL8 in plan view, wiring resistance can be reduced.

The coils CL7 and CL8 coupled in series correspond to the foregoing primary-side coil CL1*a* (accordingly, to the foregoing coil CL1) of the transformer TR1. The coils CL5 and CL6 coupled in series correspond to the foregoing secondary-side coil CL2*a* (accordingly, to the foregoing coil CL2) of the transformer TR1. The lead-out wires HW1 and HW2 are coupled to the transmission circuit TX1 formed in the semiconductor chip CP1 via the internal wiring (M1 to M3) of the semiconductor chip CP1. The foregoing pads PD5, PD6, and PD7 are coupled to the reception circuit RX1 formed in the semiconductor chip CP2 via conductive coupling members such as the bonding wires BW coupled to the pads PD5, PD6, and PD7, which will be described later, and the internal wiring of the semiconductor chip CP2.

As a result, when a transmission signal is sent from the transmission circuit TX1 to the lead-out wires HW1 and HW2, currents flow in the coils CL7 and CL8 coupled in series between the lead-out wires HW1 and HW2. At this time, since the coils CL7 and CL8 are coupled in series, the current flowing in the coil CL7 and the current flowing in the coil CL8 have substantially the same magnitude. The coils CL5 and CL7 are not connected via a conductor, but are magnetically coupled to each other. Also, the coils CL6 and CL8 are not connected via a conductor, but are magnetically coupled to each other. As a result, when currents flow in the primary-side coils CL7 and CL8, an induced electromotive force is generated in each of the secondary-side coils CL5 and CL6 in response to changes in the currents to allow an induced current to flow.

The foregoing transformer TR2 of the semiconductor chip CP2 can also be formed in the same manner as the transformer TR1 of the semiconductor chip CP1. Therefore, in the semiconductor chip CP2 also, it is possible to form the foregoing coils CL7 and CL8 as the foregoing coil CL1*b*, form the foregoing coils CL5 and CL6 as the foregoing coil CL2*b*, and form the foregoing pads PD5, PD6, and PD7 coupled to the coils CL5 and CL6.

The pad PD5 is placed inside the coil CL5 (coil wire CW5) (inside the spiral). The pad PD6 is placed inside the coil CL6 (coil wire CW6) (inside the spiral).

By placing the pad PD5 inside the coil CL5 (coil wire CW5), it is possible to couple the inner end portion of the coil CL5 to the pad PD5 without forming a lead-out wire (lead-out wire for coupling the pad PD5 to the coil CL5). Thus, a lead-out wire for the pad PD5 need not be formed in the layer under the layer of the coil CL5 (coil wire CW5). As a result, the dielectric breakdown voltage between the coils CL5 and CL7 becomes dominant as the breakdown voltage of the transformer to allow a further improvement in the breakdown voltage of the transformer. In addition, since the lead-out wire for the pad PD5 need not be formed, a via portion to be coupled to the lead-out wire also need not be formed. This can also reduce manufacturing cost and manufacturing time. The same also applies to the pad PD6 and the coil CL6.

Additionally, the inner end portion of the coil CL7 (coil wire CW7) is coupled to the lead-out wire HW1 in the layer under the layer of the coil wire CW7 via a via portion, and the inner end portion of the coil CL8 (coil wire CW8) is coupled to the lead-out wire HW2 in the layer under the layer of the coil wire CW8 via a via portion. In another embodiment, it is also possible to provide one or both of the lead-out wires HW1 and HW2 in the layer over the layer of the coils CL7 and CL8 and under the layer of the coils CL5 and CL6. In that case also, the lead-out wires HW1 and HW2 are formed in the layer under the layer of the multilayer film LF. However, in terms of improving the breakdown voltage, it is more advantageous to form both of the lead-out wires HW1 and HW2 in the layer under the layer of the coils CL7 and CL8. By doing so, the dielectric breakdown voltage between the coils CL5 and CL7 and the dielectric breakdown voltage between the coils CL6 and CL8 become dominant as the breakdown voltage of the transformer to allow a further improvement in the breakdown voltage of the transformer.

The lead-out wires HW1 and HW2 can also be provided with slits (openings). The slits can be formed in the lead-out wires HW1 and HW2 as slits having longer sides along the extending directions thereof. Each of the lead-out wires HW1 and HW2 can be provided with a single or plurality of slits. When currents are allowed to flow in the primary-side coils CL7 and CL8 or induced currents flow in the secondary-side coils CL5 and CL6, a magnetic flux is generated so as to extend through the coils CL5, CL6, CL7, and CL8. However, by providing the lead-out wires HW1 and HW2 with the slits, it is possible to inhibit or prevent an eddy current from being generated in each of the lead-out wires HW1 and HW2 under the influence of the magnetic flux.

In the present embodiment, the coils CL5 and CL6 are formed in the same layer, and the coils CL7 and CL8 are formed in the same layer. The coils CL7 and CL8 are formed in the layer under the layer of the coils CL5 and CL6. Of the coils CL5 and CL6 and the coils CL7 and CL8, the coils CL5 and CL6 to be coupled to the pads PD5, PD6, and PD7 are placed on the upper-layer side to allow the coils CL5 and CL6 to be easily coupled to the pads PD5, PD6, and PD7. Also, by forming the coils CL5 and CL6 in the same layer and forming the coils CL7 and CL8 in the same layer, it is possible to equalize the mutual inductance between the coils CL5 and CL7 and the mutual inductance between the coils CL6 and CL8. This allows the signal to be properly and easily transmitted via the coils CL5, CL6, CL7, and CL8. It is also possible to reduce the number of layers required to form each of the coils CL5, CL6, CL7, and CL8. This allows easy design of the semiconductor chips and is also advantageous to a reduction in the size of each of the semiconductor chips.

Also, as shown in FIG. 84, the inner end portion of the coil CL5 (coil wire CW5) is coupled to the pad PD5 and the inner end portion of the coil CL6 (coil wire CW6) is coupled to the pad PD6. The respective outer end portions of the coil CL5 (coil wire CW5) and the coil CL6 (coil wire CW6) are coupled to the pad PD7. It is preferable that the positions where the coils CL5 and CL6 (coil wires CW5 and CW6) are coupled to the pads PD5, PD6, and PD7 are located not at the middles of the sides of the pads PD5, PD6, and PD7, but in the vicinity of the corner portions of the pads PD5, PD6, and PD7. The positions at which the coils CL5 and CL6 (coil wires CW5 and CW6) are coupled to the pads PD5, PD6, and PD7 are likely to undergo the occurrence of disconnection. However, by locating the coupling positions at the corner portions of the pads PD5, PD6, and PD7, it is possible to inhibit or prevent the occurrence of disconnection at the foregoing coupling portions. There are the following two reasons for this.

First, a description will be given of the first reason. Disconnection at a position where a coil is coupled to a pad is likely to occur when a bonding wire is coupled later to the pad. Accordingly, when the coil-pad coupling position is at a longest possible distance from the wire bonding position (position where the bonding wire is coupled), disconnection is least likely to occur. The wire bonding position at each of the pads PD5, PD6, and PD7 is substantially the center portion of the pad. Therefore, by locating coil-pad coupling position not at the middle of the side of each of the pads PD5, PD6, and PD7, but in the vicinity of the corner portion thereof, it is possible to increase the distance between coil-pad coupling position and the wire bonding position. Thus, it is possible to inhibit or prevent disconnection at the positions where the coils CL5 and CL6 (coil wires CW5 and CW6) are coupled to the pads PD5, PD6, and PD7.

Next, a description will be given of the second reason. When wire bonding is performed on a pad, ultrasonic vibration is applied. The direction of the ultrasonic vibration is a direction (vertical direction or lateral direction) parallel with the sides of the pad. Accordingly, when the coil-pad coupling position is located at the middle of the side of each of the pads PD5, PD6, and PD7, the ultrasonic vibration is applied also to the coil-pad coupling position so that disconnection is likely to occur. By contrast, by locating the coil-pad coupling position not at the middle of the side of each of the pads PD5, PD6, and PD7, but in the vicinity of the corner portion of each of the pads PD5, PD6, and PD7, the ultrasonic-induced vibration is less likely to be applied to the coil-pad coupling position during wire bonding. Therefore, it is possible to inhibit or prevent disconnection at the positions where the coils CL5 and CL6 (coil wires CW5 and CW6) are coupled to the pads PD5, PD6, and PD7.

Accordingly, it is preferable that the positions where the coils CL5 and CL6 (coil wires CW5 and CW6) are coupled to the pads PD5, PD6, and PD7 are not at the middles of the sides of the pads PD5, PD6, and PD7, but in the vicinity of the corner portions of the pads PD5, PD6, and PD7. Here, each of the pads PD5, PD6, and PD7 has a generally rectangular two-dimensional shape, a two-dimensional shape obtained by truncating the corners of the rectangular shape, or a two-dimensional shape obtained by rounding off the corners of the rectangular shape. FIG. 84 shows the case where each of the pads PD5, PD6, and PD7 has a rectangular two-dimensional shape having truncated corners. When each of the pads PD5, PD6, and PD7 has a rectangular two-dimensional shape, the coils CL5 and CL6 (coil wires CW5 and CW6) may be coupled appropriately at positions shifted from the middles of the sides of the rectangular shape toward the corner portions, not at the middles of the sides thereof. When each of the pads PD5, PD6, and PD7 has a rectangular two-dimensional shape having truncated corners or rounded corners, the coils CL5 and CL6 (coil wires CW5 and CW6) may be coupled appropriately at positions shifted from the middles of the sides of the basically rectangular shape toward the corner portions, not at the middles of the sides of the basically rectangular shape.

It is more preferable to couple the coils CL5 and CL6 (coil wires CW5 and CW6) to the pads PD5, PD6, and PD7 at angles (inclination angles of, e.g., 45°) inclined from the sides of the rectangular shapes (or the sides of the basically rectangular two-dimensional shapes having truncated or rounded shapes) forming the two-dimensional shapes of the pads PD5, PD6, and PD7. This can more reliably inhibit or prevent disconnection at positions where the coils CL5 and CL6 (coil wires CW5 and CW6) are coupled to the pads PD5, PD6, and PD7.

<About Modifications of Configuration of Coils>

Figure 88:
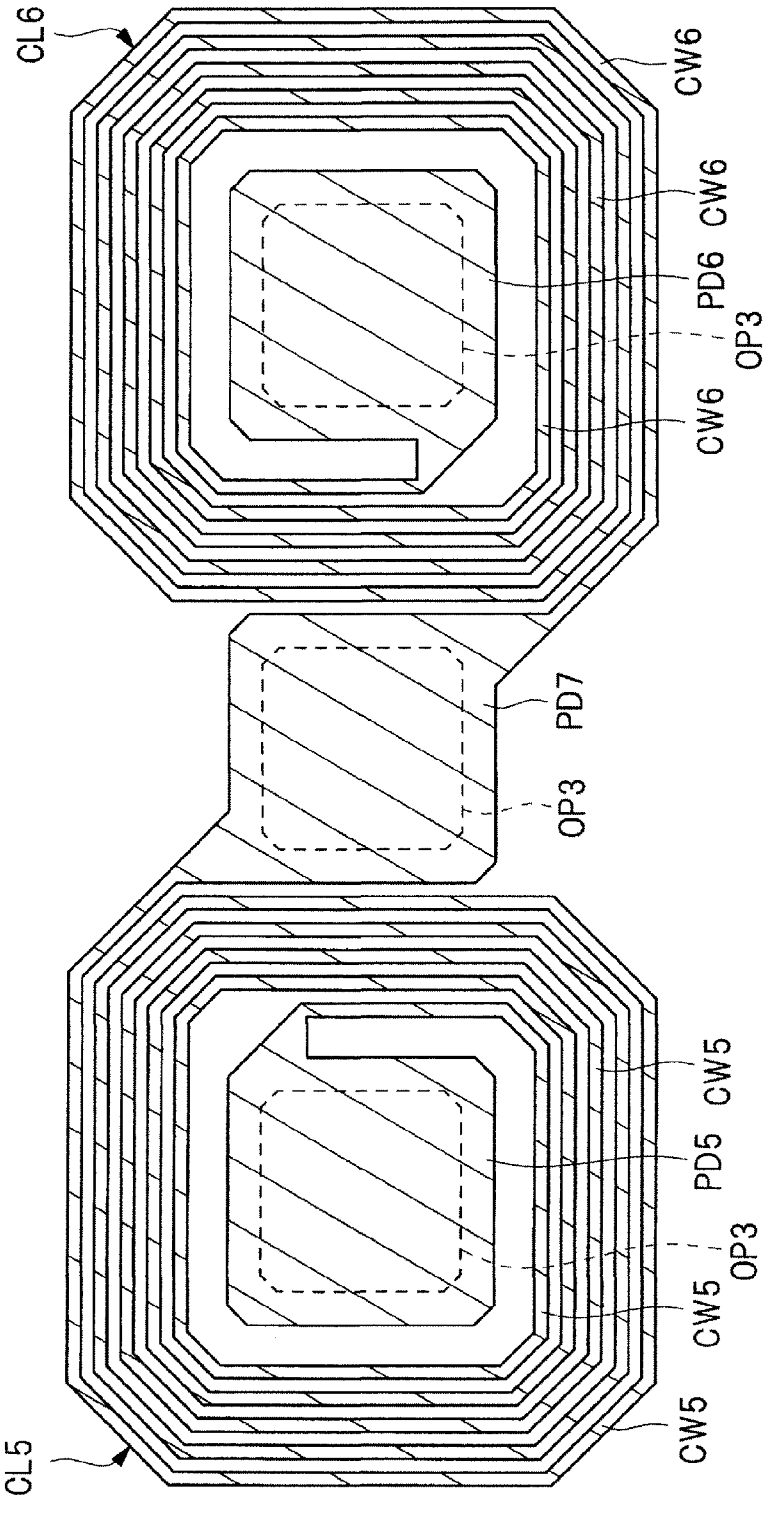
FIG. 88 is a main-portion plan view of a semiconductor device in a modification.
Figure 89:
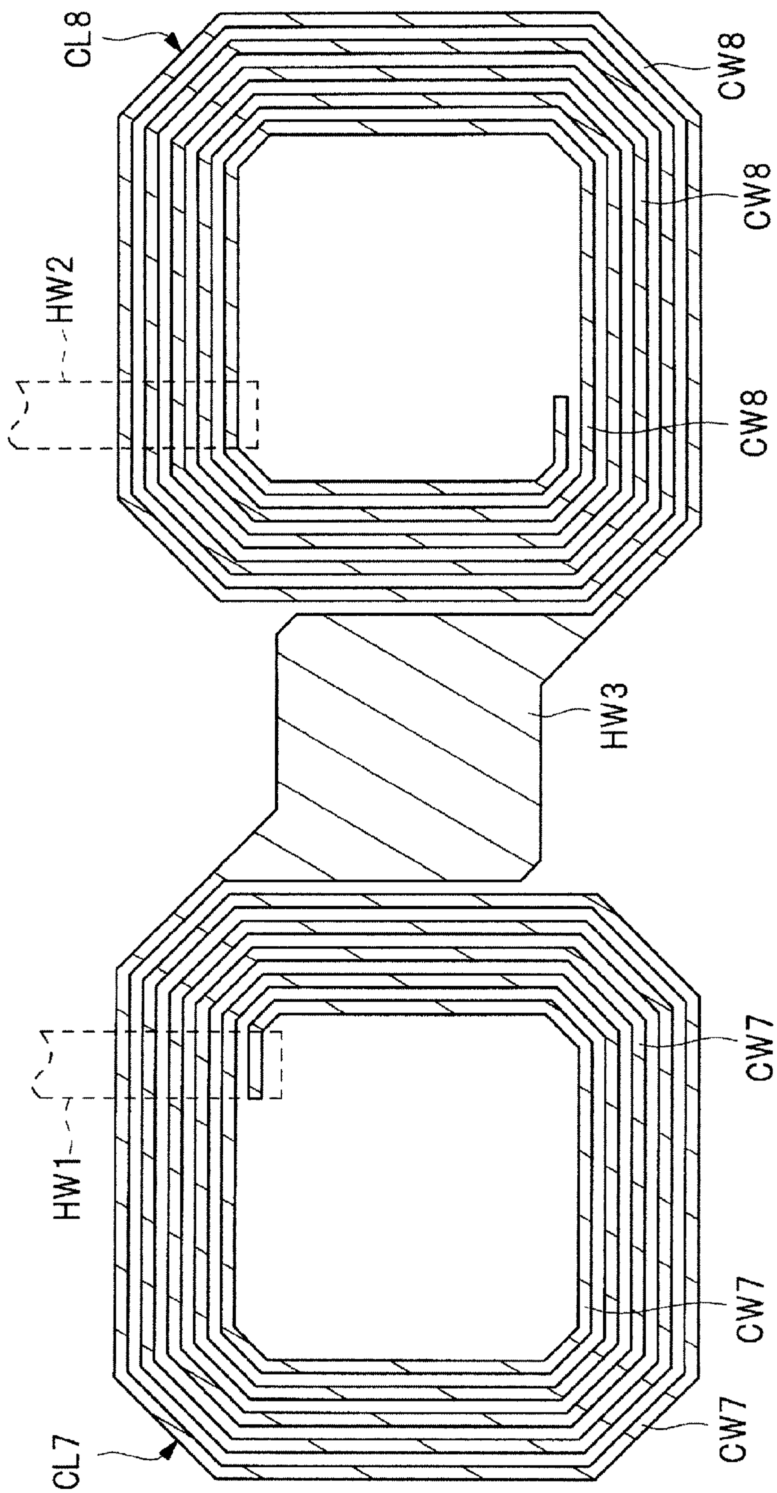
FIG. 89 is a main-portion plan view of the semiconductor device in the modification.

Next, a description will be given of modifications of the configuration of the coils forming the transformer formed in each of the semiconductor chips. FIGS. 88 and 89 are main-portion plan views of the modifications of the semiconductor chip CP1 (or semiconductor chip CP2). FIGS. 88 and 89 show the plan views of the coils formed in the foregoing transformer formation region 1B. FIG. 88 is a view corresponding to FIG. 84 described above and showing the secondary-side coils (coils CL5 and CL6) of the transformer formed in the semiconductor chip CP1 (or semiconductor chip CP2). FIG. 89 is a view corresponding to FIG. 85 described above and showing the primary-side coils (coils CL7 and CL8) of the transformer. For easier understanding of the relative positional relationship between the primary-side coils (CL7 and CL8) and the lead-out wires (lead-out wires HW1 and HW2) therefor, the lead-out wires HW1 and HW2 are shown by the dotted lines in FIG. 89.

In the case of FIGS. 84 and 85 described above, the primary-side coils CL7 and CL8 are wound in opposite directions, and the secondary-side coils CL5 and CL6 are wound in opposite directions. Specifically, one of the coils CL7 and CL8 is wound rightward and the other thereof is wound leftward, and one of the coils CL5 and CL6 is wound rightward and the other thereof is wound leftward.

By contrast, in the case of FIGS. 88 and 89, the primary-side coils CL7 and CL8 are wound in the same direction, and the secondary-side coils CL5 and CL6 are wound in the same direction. That is, both of the coils CL7 and CL8 are wound rightward or leftward, and both of the coils CL5 and CL6 are wound rightward or leftward. In the case of FIG. 89, both of the coils CL7 and CL8 are wound rightward. However, in another embodiment, it is also possible to wind both of the coils CL7 and CL8 leftward. Also, in the case of FIG. 88, both of the coils CL5 and CL6 are wound rightward. However, in another embodiment, it is also possible to wind both of the coils CL5 and CL6 leftward.

The configuration of the coils CL5, CL6, CL7, and CL8, the pads PD5, PD6, and PD7, and the lead-out wires HW1 and HW2 in FIGS. 88 and 89 is otherwise the same as described above with reference to FIGS. 83 to 87 so that a repeated description thereof is omitted herein.

In the case of FIGS. 84 and 85, the coils CL7 and CL8 are wound in opposite directions. Accordingly, when currents flow in the coils CL7 and CL8 coupled in series, the currents flow in the same direction in the coils CL7 and CL8, resulting in the generation of magnetic fluxes in the same direction in the coils CL7 and CL8. Consequently, when induced currents flow in the secondary-side coils CL5 and CL6, the current flowing in the coil CL5 and the current flowing in the coil CL6 are in the same direction. As a result, the magnetic flux generated by the induced current flowing in the coil CL5 so as to extend through the coil CL5 and the magnetic flux generated by the induced current flowing in the coil CL6 so as to extend through the coil CL6 are in the same direction. Therefore, when a signal is transmitted from the transmission circuit to the reception circuit via the transformer, the magnetic flux generated so as to extend through the magnetically coupled coils CL5 and CL7 and the magnetic flux generated so as to extend through the magnetically coupled coils CL6 and CL8 are in the same direction.

Here, the direction of a current in a coil (or direction in which the current flows) indicates the rightward (clockwise) direction or the leftward (counterclockwise direction) in which the current flows in the coil (or coil wire) when the coil is viewed from above. Accordingly, in the case of saying that the directions of currents in two coils are the same (or the directions in which currents flow in two coils are the same), the case corresponds to the situation where, when the two coils are viewed from above, the currents flow rightward (clockwise) or leftward (counterclockwise) in both of the two coils. On the other hand, in the case of saying that the directions of currents in two coils are opposite (or the directions in which currents flow in two coils are opposite), the case corresponds to the situation where, when the two coils are viewed from above, the current flows rightward (clockwise) in one of the two coils and the current flows leftward (counterclockwise) in the other coil.

By contrast, in the case of FIGS. 88 and 89 described above, the coils CL7 and CL8 are wound in the same direction. Accordingly, when currents flow in the coils CL7 and CL8 coupled in series, the currents flow in opposite directions in the coils CL7 and CL8, resulting in the generation of magnetic fluxes in opposite directions in the coils CL7 and CL8. Consequently, when induced currents flow in the secondary-side coils CL5 and CL6, the current flowing in the coil CL5 and the current flowing in the coil CL6 are in opposite directions. As a result, the magnetic flux generated by the induced current flowing in the coil CL5 so as to extend through the coil CL5 and the magnetic flux generated by the induced current flowing in the coil CL6 so as to extend through the coil CL6 are in opposite directions. Therefore, when a signal is transmitted from the transmission circuit to the reception circuit via the transformer, the magnetic flux generated so as to extend through the magnetically coupled coils CL5 and CL7 and the magnetic flux generated so as to extend through the magnetically coupled coils CL6 and CL8 are in opposite directions.

When the magnetic flux (magnetic field) extending through the coils CL5 and CL7 and the magnetic flux (magnetic field) extending through the coils CL6 and CL8 are in opposite directions, the magnetic flux (magnetic field) extending through the coil CL5 and the magnetic flux (magnetic field) extending through the coil CL6 can be connected in a loop shape (i.e., can be closed in a loop shape). Accordingly, in the case of FIGS. 88 and 89 described above, it is possible to inhibit or prevent the coils CL5 and CL6 from acting to cause the respective magnetic fluxes (magnetic fields) to cancel out each other and inhibit or prevent the coils CL7 and CL8 from acting to cause the respective magnetic fluxes (magnetic fields) to cancel out each other. As a result, when a signal is transmitted from the primary coil (CL7 and CL8) to the secondary coil (CL5 and CL6) using induced currents, it is possible to improve the intensity of the signal (intensity of the reception signal) sensed by the secondary coil (CL5 and CL6) Therefore, it is possible to further improve the performance of the semiconductor chip and consequently further improve the performance of the semiconductor device including the semiconductor chip.

Figure 90:
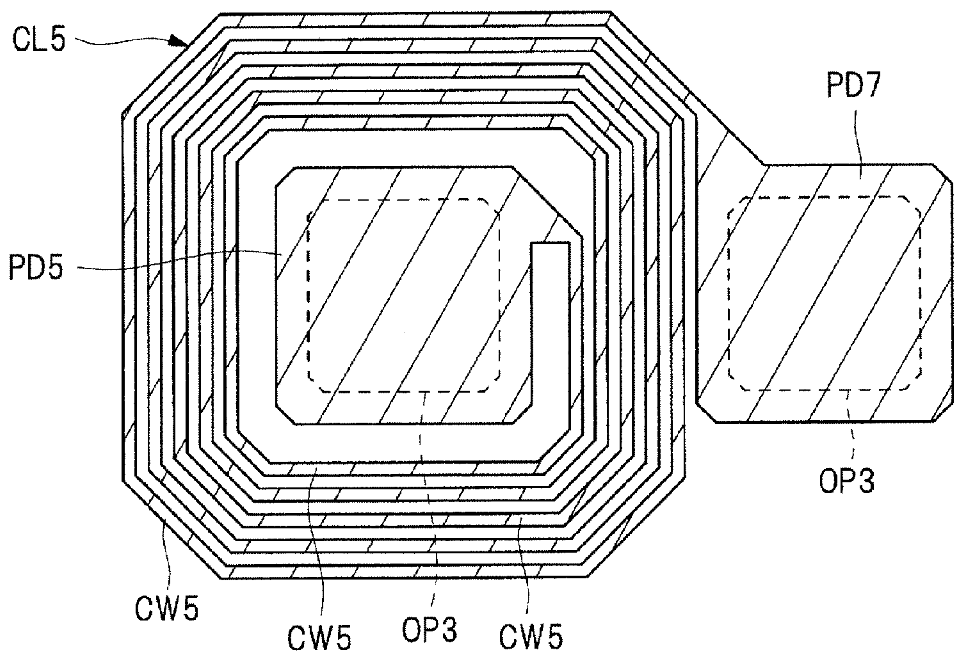
FIG. 90 is a main-portion plan view of a semiconductor device in another modification.
Figure 91:
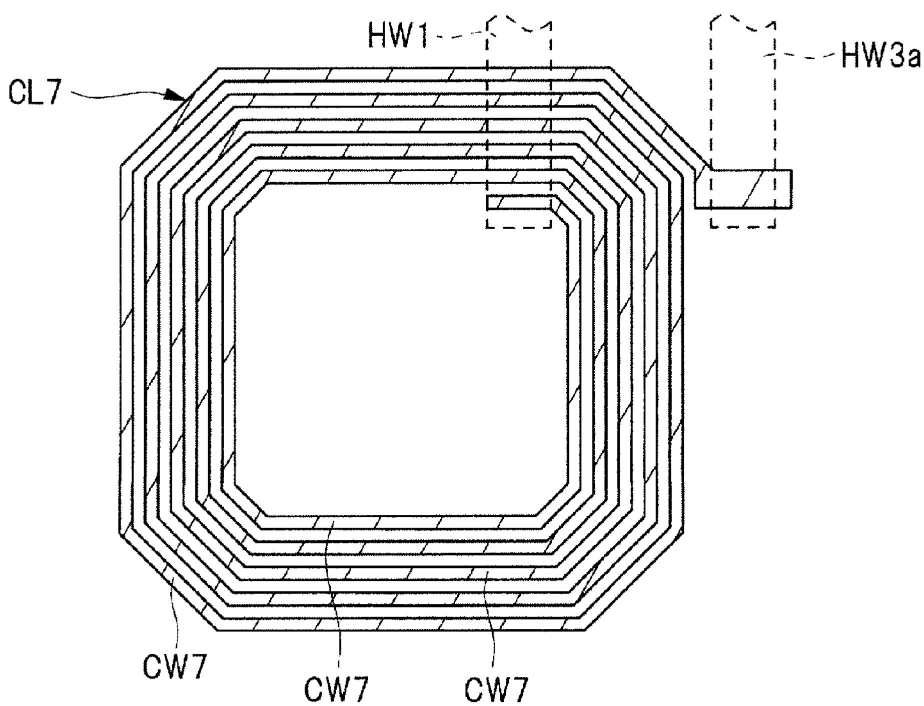
FIG. 91 is a main-portion plan view of the semiconductor device in the other modification.

Next, a description will be given of another modification of the configuration of the coils forming the transformer formed in the semiconductor chip. FIGS. 90 and 91 are main-portion plan views of the other modification of the semiconductor chip CP1 (or semiconductor chip CP2). FIGS. 90 and 91 show the plan views of the coils formed in the foregoing transformer formation region 1B. FIG. 90 is a view corresponding to FIG. 84 described above and showing the secondary-side coil (coil CL5) of the transformer formed in the semiconductor chip CP1 (or semiconductor chip CP2). FIG. 91 is a view corresponding to FIG. 85 described above and showing the primary-side coil (coil CL7) of the transformer. For easier understanding of the relative positional relationship between the primary-side coil (CL7) and the lead-out wires (lead-out wires HW1 and HW3*a*) therefor, the lead-out wires HW1 and HW3*a* are shown by the dotted lines in FIG. 91.

In the case of FIGS. 90 and 91 described above, the primary-side coil is formed of the single coil CL5, and the coil CL6 and the pad PD6 are not formed. Also, the secondary-side coil is formed of the single coil CL7, and the coil CL8 and the lead-out wire HW1 are not formed. The outer end portion of the coil CL7 is coupled to the lead-out wire HW3*a*, not to the lead-out wire HW3. The lead-out wire HW3*a* can be formed in the same layer as or a layer different from the layer of the coil CL7. FIG. 91 shows the case where the outer end portion of the coil CL7 is coupled to the lead-out wire HW3*a* provided in the same layer as that of the lead-out wire HW1 via a via portion. However, the lead-out wire HW3*a* may also be formed in the same layer as that of the coil CL7.

The configuration of the coils CL5 and CL7, the pads PD5 and PD7, and the lead-out wires HW1 and HW3*a* is otherwise the same as described above with reference to FIGS. 83 to 87 so that a repeated description thereof is omitted herein. The circuit configuration of the transformer is the same as in FIG. 1 described above. For example, in the case of applying the transformer in FIGS. 90 and 91 to the transformer TR1 in FIG. 1 described above, the coil CL5 corresponds to the foregoing coil CL1*a*, and the coil CL7 corresponds to the foregoing coil CL2*a*.

In the case of FIGS. 83 to 87 described above and in the case of FIGS. 88 and 89 described above, each of the primary and secondary coils is formed of two coils. That is, the foregoing transformer TR1 is formed of the two transformers and the two transformers can be differentially operated. This allows an improvement in noise resistance. On the other hand, in the case of FIGS. 90 and 91, each of the primary and secondary coils is formed of one coil. That is, the foregoing transformer TR1 is formed of one transformer. This can achieve a reduction in the size (area) of the semiconductor chip.

<About Example of Configuration of Semiconductor Package>

Next, a description will be given of an example of a configuration of the semiconductor package in the present embodiment. Note that the semiconductor package can also be regarded as the semiconductor device.

Figure 92:
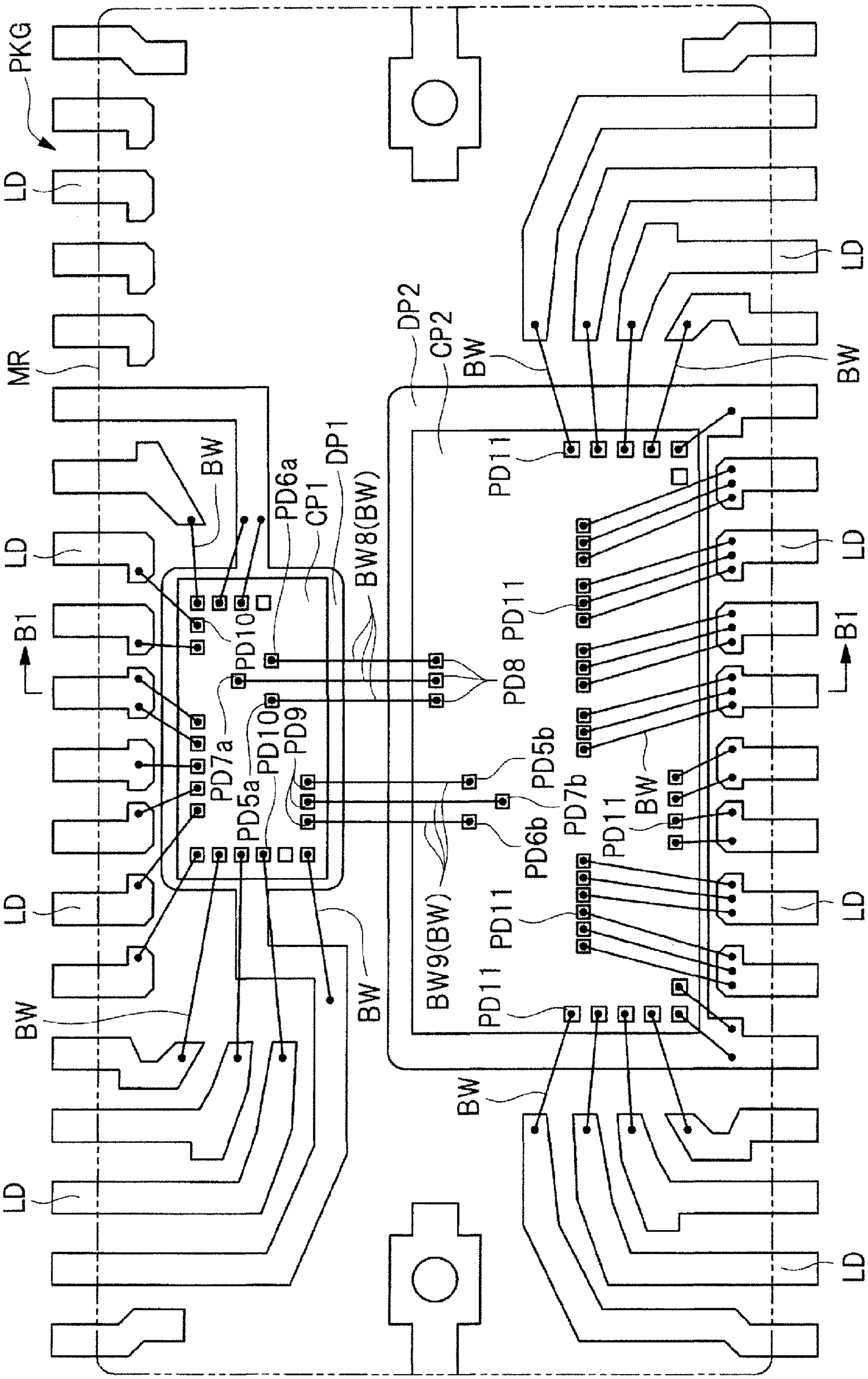
FIG. 92 is a plan view showing a semiconductor package in the embodiment.
Figure 93:
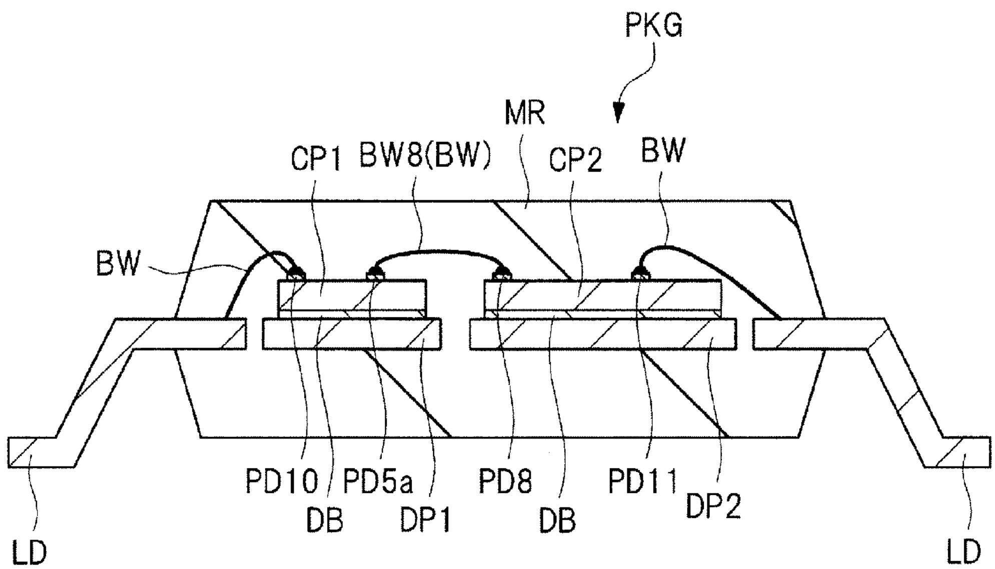
FIG. 93 is a cross-sectional view showing the semiconductor package in the embodiment.

FIG. 92 is a plan view showing the semiconductor package (semiconductor device) PKG in the present embodiment. FIG. 93 is a cross-sectional view of the semiconductor package PKG. Note that, in FIG. 92, the semiconductor package PKG is viewed through a sealing resin portion MR and the outer shape (outer periphery) of the sealing resin portion MR is shown by the two-dot-dash line. Also, the cross-sectional view along the line B1-B1 in FIG. 92 substantially corresponds to FIG. 93.

The semiconductor package PKG shown in FIGS. 92 and 93 includes the semiconductor chips CP1 and CP2. A specific description will be given below of a configuration of the semiconductor package PKG.

The semiconductor package PKG shown in FIGS. 92 and 93 includes the semiconductor chips CP1 and CP2, the die pads DP1 and DP2 on which the semiconductor chips CP1 and CP2 are respectively mounted, the plurality of leads LD each made of a conductor, the plurality of bonding wires BW providing coupling between the semiconductor chips CP1 and CP2 and between the semiconductor chips CP1 and CP2 and the plurality of leads LD, and the sealing resin portion MR sealing therein the semiconductor chips CP1 and CP2, the die pads DP1 and DP2, the leads LD, and the bonding wires BW.

The sealing resin portion (sealing portion, sealing resin, or sealed body) MR is made of, e.g., a resin material such as, e.g., a thermosetting resin material or the like and can also contain a filler or the like. With the sealing resin portion MR, the semiconductor chips CP1 and CP2, the die pads DP1 and DP2, the plurality of leads LD, and the plurality of bonding wires BW are sealed to be electrically and mechanically protected thereby. For example, the two-dimensional shape (outer shape) of the sealing resin portion MR crossing the thickness thereof can be, e.g., a rectangle (quadrilateral).

Over the top surface of the semiconductor chip CP1 as the main surface of the semiconductor chip CP1 to be formed with elements, a plurality of pads (pad electrodes or bonding pads) PD10 are formed. Each of the pads PD10 of the semiconductor chip CP1 is electrically coupled to the semiconductor integrated circuit (such as, e.g., the foregoing control circuit CC) formed in the semiconductor chip CP1. The pads PD10 correspond to the foregoing pad PD2 coupled to the foregoing redistribution wire RW in the semiconductor chip CP1.

Over the top surface of the semiconductor chip CP1, pads (pad electrodes or bonding pads) PD5*a*, PD6*a*, and PD7*a* respectively corresponding to the foregoing pads PD5, PD6, and PD7 are further formed.

That is, the semiconductor chip CP1 includes the foregoing transmission circuit TX1, the foregoing coils CL7 and CL8 (primary coil) coupled to the transmission circuit TX1, the foregoing coils CL5 and CL6 (secondary coil) magnetically coupled respectively to the coils CL7 and CL8, and the foregoing pads PD5, PD6, and PD7 coupled to the coils CL5 and CL6. The pad PD5 of the semiconductor chip CP1 corresponds to the pad PD5*a*. The pad PD6 of the semiconductor chip CP1 corresponds to the pad PD6*a*. The pad PD7 of the semiconductor chip CP1 corresponds to the pad PD7*a*.

The semiconductor chip CP1 further includes the foregoing reception circuit RX2, and a plurality of pads (pad electrodes or bonding pads) PD9 coupled to the reception circuit RX2. Consequently, over the top surface of the semiconductor chip CP1, the pads PD5*a*, PD6*a*, PD7*a*, PD9, and PD10 are formed. Note that, of the plurality of pads PD9 of the semiconductor chip CP1, the pad PD9 coupled to the pad PD7*b* of the semiconductor chip CP2 via the bonding wires BW supplies a fixed potential (such as ground potential, GND potential, or power supply potential).

Over the top surface of the semiconductor chip CP2 as the main surface of the semiconductor chip CP2 to be formed with elements, a plurality of pads PD11 are formed. Each of the pads PD11 of the semiconductor chip CP2 is electrically coupled to the semiconductor integrated circuit (such as, e.g., the foregoing drive circuit DR) formed in the semiconductor chip CP2. The pads PD11 correspond to the foregoing pad PD2 coupled to the foregoing redistribution wire RW in the semiconductor chip CP2.

Over the top surface of the semiconductor chip CP2, pads (pad electrodes or bonding pads) PD5*b*, PD6*b*, and PD7*b* respectively corresponding to the foregoing pads PD5, PD6, and PD7 are further formed.

That is, the semiconductor chip CP2 includes the foregoing transmission circuit TX2, the foregoing coils CL7 and CL8 (primary coil) coupled to the transmission circuit TX2, the foregoing coils CL5 and CL6 (secondary coil) magnetically coupled respectively to the coils CL7 and CL8, and the foregoing pads PD5, PD6, and PD7 coupled to the coils CL5 and CL6. The pad PD5 of the semiconductor chip CP2 corresponds to the pad PD5*b*. The pad PD6 of the semiconductor chip CP2 corresponds to the pad PD6*b*. The pad PD7 of the semiconductor chip CP2 corresponds to the pad PD7*b*.

The semiconductor chip CP2 further includes the foregoing reception circuit RX1, and a plurality of pads (pad electrodes or bonding pads) PD8 coupled to the reception circuit RX1. Consequently, over the top surface of the semiconductor chip CP2, the pads PD5*b*, PD6*b*, PD7*b*, PD8, and PD11 are formed. Note that, of the plurality of pads PD8 of the semiconductor chip CP2, the pad PD8 coupled to the pad PD7*a* of the semiconductor chip CP1 via the bonding wires BW supplies a fixed potential (such as ground potential, GND potential, or power supply potential).

It is assumed that, in the semiconductor chip CP1, the main surface formed with the pads PD5*a*, PD6*a*, PD7*a*, PD9, and PD10 are formed is referred to as the top surface of the semiconductor chip CP1 and the main surface opposite thereto is referred to as the back surface of the semiconductor chip CP1. It is also assumed that, in the semiconductor chip CP2, the main surface formed with the pads PD5*b*, PD6*b*, PD7*b*, PD8, and PD11 are formed is referred to as the top surface of the semiconductor chip CP2 and the main surface opposite thereto is referred to as the back surface of the semiconductor chip CP2.

The semiconductor chip CP1 is mounted (placed) over the upper surface of the die pad DP1 as the chip mounting portion such that the top surface of the semiconductor chip CP1 faces upward. The back surface of the semiconductor chip CP1 is bonded and fixed to the upper surface of the die pad DP1 via a die bonding material (adhesive material) DB.

The semiconductor chip CP2 is mounted (placed) over the upper surface of the die pad DP2 as the chip mounting portion such that the top surface of the semiconductor chip CP2 faces upward. The back surface of the semiconductor chip CP2 is bonded and fixed to the upper surface of the die pad DP2 via the die bonding material (adhesive material) DB.

The die pads DP1 and DP2 are spaced apart from each other via the material forming the sealing resin portion MR and electrically insulated from each other.

The leads LD are formed of a conductor and preferably made of a metal material such as copper (Cu) or a copper alloy. Each of the leads LD includes an inner lead portion as the portion of the lead LD which is located in the sealing resin portion MR, and an outer lead portion as the portion of the lead LD which is located outside the sealing resin portion MR. The outer lead portion of the lead LD protrudes from the side surface of the sealing resin portion MR to the outside of the sealing resin portion MR. The space between the respective inner lead portions of the adjacent leads LD is filled with the material forming the sealing resin portion MR. The outer lead portion of each of the leads LD can function as the external coupling terminal portion (external terminal) of the semiconductor package PKG. The outer lead portion of each of the leads LD has been subjected to bending such that the lower surface of the outer lead portion located in the vicinity of the end portion thereof is located at a level slightly lower than that of the lower surface of the sealing resin portion MR.

Each of the pads PD10 over the top surface of the semiconductor chip CP1 and each of the pads PD11 over the top surface of the semiconductor chip CP2 are electrically coupled to the respective inner lead portions of the leads LD via the bonding wires BW as the conductive coupling members. That is, the bonding wires BW having one ends thereof coupled to the individual pads PD10 over the top surface of the semiconductor chip CP1 have the other ends thereof coupled to the upper surfaces of the respective inner lead portions of the leads LD. Also, the bonding wires BW having one ends thereof coupled to the individual pads PD11 over the top surface of the semiconductor chip CP2 have the other ends thereof coupled to the upper surfaces of the respective inner lead portions of the leads LD. Note that the leads LD coupled to the pads PD10 of the semiconductor chip CP1 via the bonding wires BW are different from the leads LD coupled to the pads PD11 of the semiconductor chip CP2 via the bonding wires BW. Accordingly, the pads PD10 of the semiconductor chip CP1 are not coupled to the pads PD11 of the semiconductor chip CP2 via a conductor.

The pads PD5*a*, PD6*a*, and PD7*a* over the top surface of the semiconductor chip CP1 are electrically coupled to the individual pads PD8 over the top surface of the semiconductor chip CP2 via the bonding wires BW. On the other hand, the pads PD5*b*, PD6*b*, and PD7*b* over the top surface of the semiconductor chip CP2 are electrically coupled to the individual pads PD9 over the top surface of the semiconductor chip CP2 via the bonding wires BW.

The bonding wires BW are conductive coupling members (members for coupling). More specifically, the bonding wires BW are conductive wires and made of metal thin wires such as, e.g., gold (Au) wires or copper (Cu) wires. The bonding wires BW are sealed in the sealing resin portion MR and is not exposed from the sealing resin portion MR.

It is assumed there that the bonding wires BW providing coupling between the pads PD5*a*, and PD6*a*, and PD7*a* of the semiconductor chip CP1 and the pads PD8 of the semiconductor chip CP2 are each designated by a reference numeral BW8 and hereinafter referred to as bonding wires BW8. It is also assumed that the bonding wires BW providing coupling between the pads PD5*b*, and PD6*b*, and PD7*b* of the semiconductor chip CP2 and the pads PD9 of the semiconductor chip CP1 are each designated by a reference numeral BW9 and hereinafter referred to as bonding wires BW9.

The semiconductor chips CP1 and CP2 are coupled to each other by the bonding wires BW8 and BW9, but are not coupled to each other by the bonding wires BW (conductive coupling members) other than the bonding wires BW8 and BW9. Consequently, electric signals are transmitted between the semiconductor chips CP1 and CP2 only via paths extending from the pads PD5*a*, PD6*a*, and PD7*a* of the semiconductor chip CP1 to the pads PD8 of the semiconductor chip CP2 via the bonding wires BW8 and paths extending from the pads PD5*b*, PD6*b*, and PD7*b* of the semiconductor chip CP2 to the pads PD9 of the semiconductor chip CP1 via the bonding wires BW9.

The pads PD5*a*, PD6*a*, and PD7*a* of the semiconductor chip CP1 are coupled to the foregoing coils CL5 and CL6 (secondary coil) formed in the semiconductor chip CP1. However, the coils CL5 and CL6 are not connected to the circuits formed in the semiconductor chip CP1 via conductors (internal wiring), but are magnetically coupled to the foregoing coils CL7 and CL8 (primary coil) in the semiconductor chip CP1. As a result, only the signals transmitted by electromagnetic induction from the circuits (such as the foregoing transmission circuit TX1) formed in the semiconductor chip CP1 via the foregoing coils CL7 and CL8 (primary coil) and the foregoing coils CL5 and CL6 (secondary coil) in the semiconductor chip CP1 are input from the pads PD5*a*, PD6*a*, and PD7*a* to the semiconductor chip CP2 (the foregoing reception circuit RX1) via the bonding wires BW8.

Also, the pads PD5*b*, PD6*b*, and PD7*b* of the semiconductor chip CP2 are coupled to the foregoing coils CL5 and CL6 (secondary coil) formed in the semiconductor chip CP2. However, the coils CL5 and CL6 are not connected to the circuits formed in the semiconductor chip CP2 via conductors (internal wiring), but are magnetically coupled to the foregoing coils CL7 and CL8 (primary coil) in the semiconductor chip CP2. As a result, only the signals transmitted by electromagnetic induction from the circuits (such as the foregoing transmission circuit TX2) formed in the semiconductor chip CP2 via the foregoing coils CL7 and CL8 (primary coil) and the foregoing coils CL5 and CL6 (secondary coil) in the semiconductor chip CP2 are input from the pads PD5*b*, PD6*b*, and PD7*b* to the semiconductor chip CP1 (the foregoing reception circuit RX2) via the bonding wires BW9.

The semiconductor chips CP1 and CP2 have different voltage levels (reference potentials). For example, the drive circuit DR drives the load LOD such as a motor. Specifically, the drive circuit DR drives or controls the switch (switching element) of the load LOD, such as a motor, and changes the state of the switch. Accordingly, when the switch of the object to be driven is turned ON, the reference potential (voltage level) of the semiconductor chip CP2 may rise to a voltage substantially equal to the power supply voltage (operating voltage) of the switch of the object to be driven. The power supply voltage is considerably high (e.g., about several hundreds of volts to several thousands of volts). As a result, a large difference is produced between the respective voltage levels (reference potentials) of the semiconductor chips CP1 and CP2. That is, when the switch of the object to be driven is ON, to the semiconductor chip CP2, a voltage (of, e.g., about several hundreds of volts to several thousands of volts) higher than the power supply voltage (of, e.g., about several volts to several tens of volts) supplied to the semiconductor chip CP1 is supplied.

However, as described above, it is only the signals transmitted by electromagnetic induction via the primary coil (CL7 and CL8) and the secondary coil (CL5 and CL6) in the semiconductor chip CP1 or only the signals transmitted by electromagnetic induction via the primary coil (CL7 and CL8) and the secondary coil (CL5 and CL6) in the semiconductor chip CP2 that are electrically transmitted between the semiconductor chips CP1 and CP2. Accordingly, even when the voltage level (reference potential) of the semiconductor chip CP1 is different from the voltage level (reference potential) of the semiconductor chip CP2, it is possible to properly prevent the voltage level (reference potential) of the semiconductor chip CP2 from being input to the semiconductor chip CP1 or prevent the voltage level (reference potential) of the semiconductor chip CP1 from being input to the semiconductor chip CP2. That is, even when the switch of the object to be driven is turned ON and the reference potential (voltage level) of the semiconductor chip CP2 rises to a voltage substantially equal to the power supply voltage (of, e.g., about several hundreds of volts to several thousands of volts) of the switch of the object to be driven, it is possible to properly prevent the reference potential of the semiconductor chip CP2 from being input to the semiconductor chip CP1. Therefore, it is possible to properly transmit electric signals between the semiconductor chips CP1 and CP2 having different voltage levels (reference potentials). This can enhance the reliability of the semiconductor chips CP1 and CP2. This can also improve the reliability of the semiconductor package PKG. This can also improve the reliability of the electronic device using the semiconductor package PKG.

In addition, since signal transmission between the semiconductor chips is performed using the magnetically coupled coils, it is possible to improve the reliability, while achieving a reduction in the size of the semiconductor package PKG.

For example, the semiconductor package PKG can be manufactured as follows. That is, first, a lead frame in which the die pads DP1 and DP2 and the plurality of leads LD are connected to a fame casing is provided, and a die bonding step is performed to respectively mount the semiconductor chips CP1 and CP2 over the die pads DP1 and DP2 of the lead frame via the die bonding material (adhesive material) DB and bond the semiconductor chips CP1 and CP2 thereto. Then, a wire bonding step is performed. Thus, the plurality of pads PD10 of the semiconductor chip CP1 are electrically coupled to the plurality of leads LD via the plurality of bonding wires BW. On the other hand, the plurality of pads PD11 of the semiconductor chip CP2 are electrically coupled to the plurality of other leads LD via the plurality of other bonding wires BW. The plurality of pads PD5*a*, PD6*a*, and PD7*a* of the semiconductor chip CP1 are electrically coupled to the plurality of pads PD8 of the semiconductor chip CP2 via the plurality of bonding wires BW8. On the other hand, the plurality of pads PD5*b*, PD6*b*, and PD7*b* of the semiconductor chip CP2 are electrically coupled to the plurality of pads PD9 of the semiconductor chip CP1 via the plurality of bonding wires BW9. Then, a resin sealing step is performed to form the sealing resin portion MR sealing therein the semiconductor chips CP1 and CP2, the die pads DP1 and DP2, the plurality of leads LD, and the plurality of bonding wires BW (including the bonding wires BW8 and BW9). Then, the plurality of leads LD having the respective inner lead portions thereof sealed in the sealing resin portion MR are cut from the fame casing of the lead frame. Subsequently, the outer lead portions of the plurality of leads LD are subjected to bending. In this manner, the semiconductor package PKG can be manufactured.

Here, a description will be given of exemplary use applications of a product in which the semiconductor package PKG is mounted. Examples of the product include an automobile, the motor control unit of an household electric device such as a clothes washer, a switching power supply, an illumination controller, a solar power generation controller, a mobile phone, and a mobile communication device.

For example, in an automotive use application, the semiconductor chip CP1 is a low-voltage chip to which a low power supply voltage is supplied. The power supply voltage supplied at that time is, e.g., about 5 V. On the other hand, the power supply voltage to the switch of the object to be driven by the drive circuit DR is a high voltage of, e.g., 600 V to 1000 V or more. When the switch is turned ON, the high voltage may be supplied to the semiconductor chip CP2.

The description has been given heretofore using the case where the package form of the semiconductor package PKG is a SOP (Small Outline Package) as an example. However, the semiconductor package PKG is also applicable to a package form other than the SOP.

Embodiment 2

Figure 94:
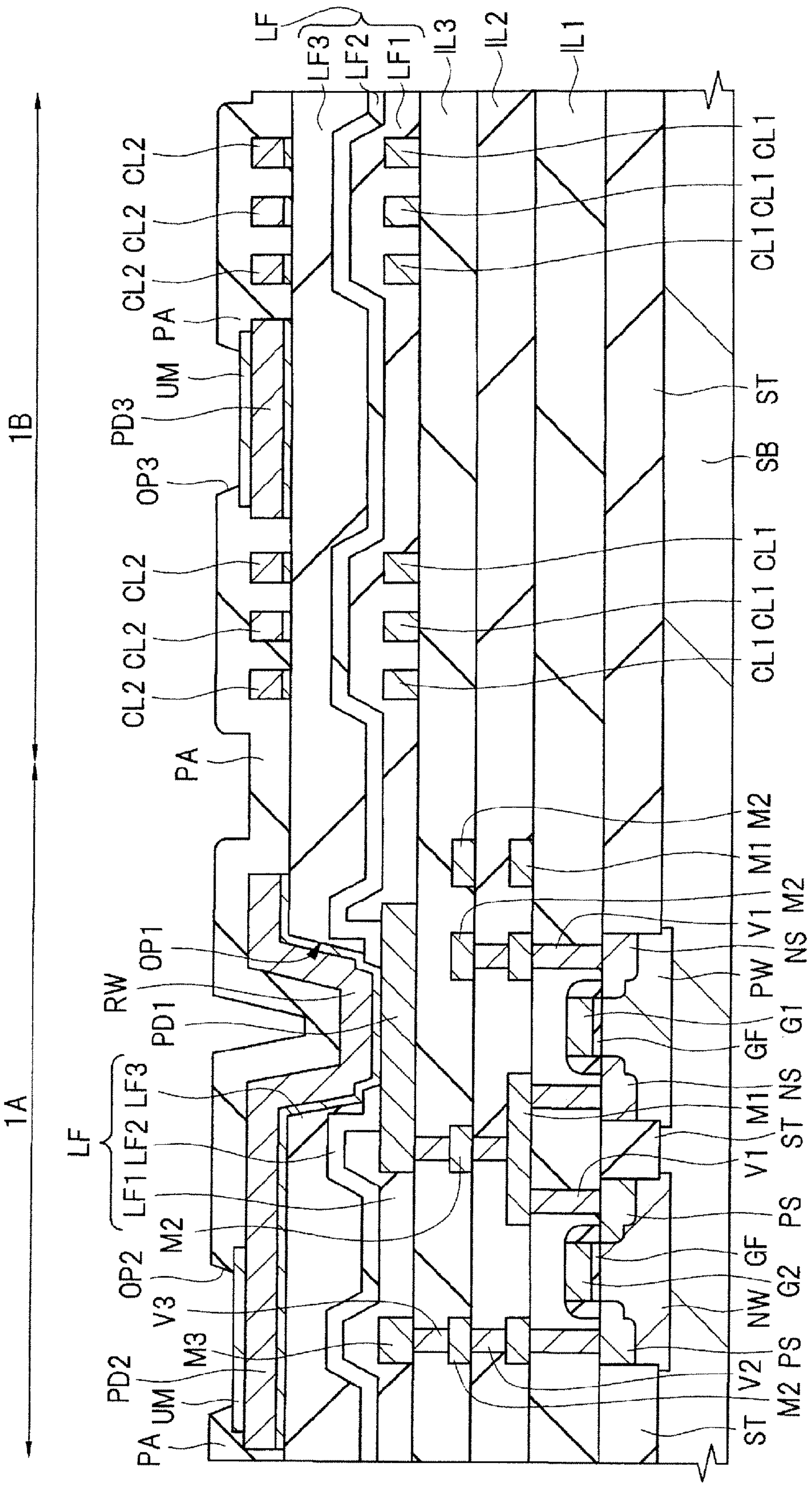
FIG. 94 is a main-portion cross-sectional view of a semiconductor device in another embodiment.

FIG. 94 is a main-portion cross-sectional view showing a cross-sectional structure of a semiconductor device in Embodiment 2 and corresponds to FIG. 3 in Embodiment 1 described above.

In Embodiment 1 described above, as also shown in FIG. 3 described above, the coil CL1 as the primary coil of the transformer is formed in the layer under the layer of the pad PD1. In the case of FIG. 3 described above, the coil CL1 is formed in the second wiring layer (i.e., in the same layer as that of the wires M2) immediately under the third wiring layer in which the pad PD1 is formed.

By contrast, in Embodiment 2, as also shown in FIG. 94, the coil CL1 as the primary coil of the transformer is formed in the same layer as that of the pad PD1. That is, the coil CL1 is formed in the third wiring layer (i.e., in the same layer as that of the wires ME3) in which the pad PD1 is formed. As a result, in Embodiment 2, the interlayer insulating film IL3 is not interposed between the coils CL1 and CL2, but only the multi-layer film LF is interposed therebetween. The silicon dioxide film LF1 of the multi-layer film LF is formed so as to come in contact with and cover the coil CL1.

The configuration of Embodiment 2 is otherwise basically the same as that of Embodiment 1 described above so that a repeated description thereof is omitted herein.

In Embodiment 2 also, substantially the same effects as described above in Embodiment 1 can be obtained. However, Embodiment 1 has the following advantage over Embodiment 2.

That is, in Embodiment 2, the multi-layer film LF is interposed between the coils CL1 and CL2 to ensure the dielectric breakdown voltage between the coils CL1 and CL2. On the other hand, in Embodiment 1 described above, not only the multi-layer film LF, but also the interlayer insulating film (interlayer insulating film IL3 in the case of FIG. 3 described above) is interposed between the coils CL1 and CL2. The multi-layer film LF and the interlayer insulating film ensure the dielectric breakdown voltage between the coils CL1 and CL2. Since the interlayer insulating film (interlayer insulating film IL3 in the case of FIG. 3 described above) is also interposed between the coils CL1 and CL2, a higher dielectric breakdown voltage can be provided between the coils CL1 and CL2 in Embodiment 1 described above than in Embodiment 2.

When the coil CL1 and the pad PD1 are provided in the same layer as in Embodiment 2, the thickness of the coil CL1 increases. This is because the thickness of the pad PD1 is thicker (larger) than the thicknesses of the wires (which are the wires M1 and M2 herein) in the layer under the layer of the pad PD1. When the coil CL1 is thick, it is difficult to fill the space between the adjacent wirings of the spiral coil wire forming the coil CL1 with the insulating film. Accordingly, it is necessary to relatively strictly manage the step of depositing the insulating film. By contrast, in Embodiment 1 described above, the coil CL1 is provided in the layer under the layer of the pad PD1. As a result, the thickness of the coil CL1 can be set thinner (smaller) than that of the thickness of the pad PD1. As a result, it is easier to fill the space between the adjacent windings of the spiral coil wire forming the coil CL1 with the insulating film. This allows easy management of the step of depositing the insulating film and consequently allows easy manufacturing of the semiconductor device. In addition, since it is possible to reliably fill the space between the adjacent wirings of the spiral coil wire forming the coil CL1 with the insulating film, the reliability of the semiconductor device can further be improved.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A method of manufacturing a semiconductor device, comprising steps of:

(a) forming a first insulating film over a semiconductor substrate;

(b) forming a first coil over the first insulating film;

(c) forming a second insulating film over the first insulating film such that the second insulating film covers the first coil;

(d) forming a first pad over the second insulating film and at a position not overlapping the first coil in plan view, while forming a test pad over the second insulating film in a scribe region;

(e) forming a multi-layer insulating film over the first insulating film, the multi-layer insulating film having a first opening exposing the first pad;

(f) performing a probe test using the test pad; and (g) after the step (e), forming a second coil and a first wire over the multi-layer insulating film, wherein the second coil is placed over the first coil, wherein the first and second coils are not electrically coupled to each other via a conductor, wherein the first wire is formed to extend from over the first pad to over the multi-layer insulating film and electrically coupled to the first pad, wherein the multi-layer insulating film includes a silicon dioxide film, a silicon nitride film over the silicon dioxide film, and a resin film over the silicon nitride film, wherein, in the step (d), an uppermost metal pattern of a seal ring is formed in a wiring layer in which the first pad is formed, wherein the step (e) includes the steps of:

(e1) forming the silicon dioxide film over the first insulating film such that the silicon dioxide film covers the first pad and the test pad;

(e2) forming a first resist pattern over the silicon dioxide film;

(e3) etching the silicon dioxide film using the first resist pattern as an etching mask to form the silicon dioxide film with a second opening exposing the first pad and a third opening exposing the test pad;

(e4) after the step (e3), removing the first resist pattern;

(e5) after the step (e4), forming the silicon nitride film over the silicon dioxide film such that the silicon nitride film covers the first pad, the uppermost metal pattern of the seal ring, and the test pad;

(e6) forming a second resist pattern over at least a portion of the silicon nitride film;

(e7) etching the silicon nitride film using the second resist pattern as an etching mask to form the silicon nitride film with a fourth opening exposing the first pad and to remove the silicon nitride film from the scribe region;

(e8) after the step (e7), removing the second resist pattern;

(e9) after the step (e8), forming the resin film over the silicon nitride film such that the resin film covers the first pad, the uppermost metal pattern of the seal ring, and the test pad; and (e10) after the step (e9), forming the resin film with a fifth opening exposing the first pad, while removing the resin film from the scribe region and from a region in which the uppermost metal pattern of the seal ring is formed, and wherein the resin film formed in step (e9) is made of a photosensitive resin film.

2. The method of manufacturing a semiconductor device according to claim 1, wherein the silicon dioxide film formed in the step (e1) has a thickness larger than a thickness of the test pad.

3. The method of manufacturing a semiconductor device according to claim 2, wherein, in the step (e1), the silicon dioxide film is formed by an HDP-CVD method.

4. The method of manufacturing a semiconductor device according to claim 2, wherein the silicon dioxide film formed in the step (e1) is made of a multi-layer film including a first silicon dioxide film formed by an HDP-CVD method, and a second silicon dioxide film formed over the first silicon dioxide film by a plasma CVD method.

5. The method of manufacturing a semiconductor device according to claim 1, wherein the first resist pattern formed in the step (e2) has a sixth opening for forming the second opening, and a seventh opening for forming the third opening, and wherein the seventh opening of the first resist pattern has an inner wall located over a flat surface of the silicon dioxide film over the test pad.

6. The method of manufacturing a semiconductor device according to claim 5, wherein the silicon dioxide film formed in the step (e1) is made of an HDP oxide film.

7. The method of manufacturing a semiconductor device according to claim 1, wherein, in the step (e6), the second resist pattern is not formed over the silicon nitride film in the scribe region.

8. The method of manufacturing a semiconductor device according to claim 1, further comprising, after the step (g), the step of:

(h) cutting the semiconductor substrate in the scribe region.

9. The method of manufacturing a semiconductor device according to claim 1, wherein the first wire and the second coil are not connected via a conductor, and wherein, in the step (g), over the multi-layer insulating film, a second pad coupled to the first wire and a third pad coupled to the second coil are also formed.

10. The method of manufacturing a semiconductor device according to claim 1, wherein the fourth opening is surrounded by the second opening in plan view, and wherein the silicon nitride film formed with the fourth opening by the step (e7) covers an inner wall of the second opening of the silicon dioxide film.

11. The method of manufacturing a semiconductor device according to claim 1, wherein the step (e10) includes the steps of:

(e11) forming a third resist pattern over the resin film;

(e12) after the step (e11), exposing the resin film to light;

(e13) after the step (e12), removing the third resist pattern;

(e14) after the step (e13), performing development treatment on the resin film to form the resin film with the fifth opening exposing the first pad and to remove the resin film from the scribe region; and (e15) after the step (e14), curing the resin film by heat treatment, and wherein a side wall forming an outer periphery of the resin film after the resin film is cured by the heat treatment in the step (e15) is located inside the seal ring metal pattern.

12. The method of manufacturing a semiconductor device according to claim 11, wherein a top surface of the silicon nitride film formed in the step (e5) is formed with a protruding portion resulting from the metal pattern, and wherein the side wall forming the outer periphery of the resin film at a stage where the development treatment has been performed in the step (e14) is located inside the protruding portion.

13. The method of manufacturing a semiconductor device according to claim 1, wherein the step (g) includes the steps of:

(g1) forming a seed film over the multi-layer insulating film including the first pad exposed from the first opening;

(g2) forming a resist layer over the seed film;

(g3) performing first exposure treatment on the resist layer;

(g4) performing second exposure treatment on the resist layer;

(g5) after the steps (g3) and (g4), performing development treatment on the resist layer to form a resist pattern; and (g6) forming a conductive film for the second coil and the first wire over the seed film exposed from the resist pattern by an electrolytic plating method, wherein, in the first exposure treatment, a pattern of the first wire is transferred by exposure, wherein, in the second exposure treatment, a pattern of the second coil is transferred by exposure, and wherein a dose in the first exposure treatment is higher than a dose in the second exposure treatment.

14. The method of manufacturing a semiconductor device according to claim 13, wherein, in the first exposure treatment, multi-wavelength light including a g-line, an h-line, and an i-line is used, and wherein, in the second exposure treatment, single-wavelength light of the i-line is used.

15. The method of manufacturing a semiconductor device according to claim 1, wherein, in plan view, the fifth opening is surrounded by the second opening, and the fourth opening is surrounded by the fifth opening.

16. The method of manufacturing a semiconductor device according to claim 1, wherein, after the step (e10), the resin film does not overlap with the uppermost metal pattern of the seal ring in plan view.

* * * * *